US011355338B2

(12) United States Patent
Ueda

(10) Patent No.: US 11,355,338 B2
(45) Date of Patent: Jun. 7, 2022

(54) METHOD OF DEPOSITING MATERIAL ONTO A SURFACE AND STRUCTURE FORMED ACCORDING TO THE METHOD

(71) Applicant: ASM IP Holding B.V., Almere (NL)

(72) Inventor: Shinya Ueda, Hachioji (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 16/867,385

(22) Filed: May 5, 2020

(65) Prior Publication Data

US 2020/0357631 A1 Nov. 12, 2020

Related U.S. Application Data

(60) Provisional application No. 62/846,424, filed on May 10, 2019.

(51) Int. Cl.

| | |
|---|---|
| ***H01L 21/02*** | (2006.01) |
| ***C23C 14/00*** | (2006.01) |
| ***H01J 37/32*** | (2006.01) |
| ***C23C 16/455*** | (2006.01) |

(52) U.S. Cl.

CPC ...... *H01L 21/0228* (2013.01); *C23C 14/0036* (2013.01); *C23C 16/45536* (2013.01); *H01J 37/32357* (2013.01); *H01J 37/32834* (2013.01); *H01L 21/0214* (2013.01); *H01L 21/0217* (2013.01); *H01L 21/02126* (2013.01); *H01L 21/02164* (2013.01); *H01L 21/02167* (2013.01); *H01L 21/02186* (2013.01); *H01L 21/02189* (2013.01); *H01L 21/02274* (2013.01); *H01J 2237/332* (2013.01)

(58) Field of Classification Search

None

See application file for complete search history.

(56) References Cited

U.S. PATENT DOCUMENTS

| | | | |
|---|---|---|---|
| D30,036 | S | 1/1899 | Rhind |
| D31,889 | S | 11/1899 | Gill |
| D56,051 | S | 8/1920 | Cohn |
| 2,059,480 | A | 11/1936 | Obermaier |
| 2,161,626 | A | 6/1939 | Loughner et al. |
| 2,240,163 | A | 4/1941 | Pick |
| 2,266,416 | A | 12/1941 | Duclos |
| 2,280,778 | A | 4/1942 | Andersen |
| D142,841 | S | 11/1945 | D'Algodt |
| 2,410,420 | A | 11/1946 | Bennett |

(Continued)

FOREIGN PATENT DOCUMENTS

| | | |
|---|---|---|
| AT | 520629 | 6/2019 |
| CN | 1186873 | 7/1998 |

(Continued)

OTHER PUBLICATIONS

CNIPA; Office Action dated Jan. 10, 2013 in Application No. 201080015699.9.

(Continued)

*Primary Examiner* — Asok K Sarkar

(74) *Attorney, Agent, or Firm* — Snell & Wilmer L.L.P.

(57) ABSTRACT

Methods of depositing material on a surface of a substrate are disclosed. The methods include exposing a surface of the substrate to a precursor within a reaction chamber to form adsorbed species on the surface and removing at least a portion of the adsorbed species prior to introducing a reactant to the reaction chamber.

20 Claims, 6 Drawing Sheets

(56) References Cited

U.S. PATENT DOCUMENTS

| | | | |
|---|---|---|---|
| 2,441,253 | A | 5/1948 | Sarver |
| 2,480,557 | A | 8/1949 | Cummins |
| 2,563,931 | A | 8/1951 | Harrison |
| 2,660,061 | A | 11/1953 | Lewis |
| 2,745,640 | A | 5/1956 | Cushman |
| 2,847,320 | A | 8/1958 | Bulloff |
| 2,990,045 | A | 6/1961 | Root |
| 3,038,951 | A | 6/1962 | Mead |
| 3,089,507 | A | 5/1963 | Drake et al. |
| 3,094,396 | A | 6/1963 | Flugge et al. |
| 3,197,682 | A | 7/1965 | Klass et al. |
| 3,232,437 | A | 2/1966 | Hultgren |
| 3,263,502 | A | 8/1966 | Springfield |
| 3,332,286 | A | 7/1967 | Strong |
| 3,410,349 | A | 11/1968 | Troutman |
| 3,420,622 | A | 1/1969 | Donges et al. |
| 3,588,192 | A | 6/1971 | Drutchas et al. |
| 3,634,740 | A | 1/1972 | Stevko |
| 3,647,387 | A | 3/1972 | Benson |
| 3,647,716 | A | 3/1972 | Koches |
| 3,713,899 | A | 1/1973 | Sebestyen |
| 3,718,429 | A | 2/1973 | Williamson |
| 3,796,182 | A | 3/1974 | Rosler |
| 3,814,128 | A | 6/1974 | Grantham |
| 3,833,492 | A | 9/1974 | Bollyky |
| 3,854,443 | A | 12/1974 | Baerg |
| 3,862,397 | A | 1/1975 | Anderson et al. |
| 3,867,205 | A | 2/1975 | Schley |
| 3,885,504 | A | 5/1975 | Baermann |
| 3,887,790 | A | 6/1975 | Ferguson |
| 3,904,371 | A | 9/1975 | Neti |
| 3,913,058 | A | 10/1975 | Nishio et al. |
| 3,913,617 | A | 10/1975 | van Laar |
| 3,916,270 | A | 10/1975 | Wachtler et al. |
| 3,947,685 | A | 3/1976 | Meinel |
| 3,960,559 | A | 6/1976 | Suzuki |
| 3,962,004 | A | 6/1976 | Sonneborn |
| 3,983,401 | A | 9/1976 | Livesay |
| 3,997,638 | A | 12/1976 | Manning et al. |
| 4,048,110 | A | 9/1977 | Vanderspurt |
| 4,054,071 | A | 10/1977 | Patejak |
| 4,058,430 | A | 11/1977 | Suntola et al. |
| 4,079,944 | A | 3/1978 | Durley et al. |
| 4,093,491 | A | 6/1978 | Whelpton et al. |
| 4,099,041 | A | 7/1978 | Berkman et al. |
| D249,341 | S | 9/1978 | Mertz |
| 4,126,027 | A | 11/1978 | Smith et al. |
| 4,134,425 | A | 1/1979 | Gussefeld et al. |
| 4,145,699 | A | 3/1979 | Hu et al. |
| 4,149,237 | A | 4/1979 | Freitas |
| 4,152,760 | A | 5/1979 | Freitas et al. |
| 4,157,751 | A | 6/1979 | Grundken et al. |
| 4,164,959 | A | 8/1979 | Wurzburger |
| 4,176,630 | A | 12/1979 | Elmer |
| 4,179,530 | A | 12/1979 | Koppl et al. |
| 4,181,330 | A | 1/1980 | Kojima |
| 4,184,188 | A | 1/1980 | Briglia |
| 4,194,536 | A | 3/1980 | Stine et al. |
| 4,217,463 | A | 8/1980 | Swearingen |
| 4,229,064 | A | 10/1980 | Vetter et al. |
| 4,234,449 | A | 11/1980 | Wolson et al. |
| 4,241,000 | A | 12/1980 | McCauley et al. |
| 4,314,763 | A | 2/1982 | Steigmeier et al. |
| 4,322,592 | A | 3/1982 | Martin |
| 4,324,611 | A | 4/1982 | Vogel et al. |
| 4,333,735 | A | 6/1982 | Hardy |
| 4,355,912 | A | 10/1982 | Haak |
| 4,384,918 | A | 5/1983 | Abe |
| 4,389,973 | A | 6/1983 | Suntola et al. |
| D269,850 | S | 7/1983 | Preisler et al. |
| 4,393,013 | A | 7/1983 | McMenamin |
| 4,401,507 | A | 8/1983 | Engle |
| 4,412,133 | A | 10/1983 | Eckes et al. |
| 4,413,022 | A | 11/1983 | Suntola et al. |
| 4,414,492 | A | 11/1983 | Harslet |
| 4,436,674 | A | 3/1984 | McMenamin |
| 4,444,990 | A | 4/1984 | Villar |
| D274,122 | S | 6/1984 | Stahel et al. |
| 4,454,370 | A | 6/1984 | Voznick |
| 4,455,193 | A | 6/1984 | Jeuch et al. |
| 4,465,716 | A | 8/1984 | Baber et al. |
| 4,466,766 | A | 8/1984 | Geren et al. |
| 4,479,831 | A | 10/1984 | Sandow |
| 4,480,284 | A | 10/1984 | Tojo et al. |
| 4,481,300 | A | 11/1984 | Hartnett et al. |
| 4,484,061 | A | 11/1984 | Zelinka et al. |
| 4,488,506 | A | 12/1984 | Heinecke et al. |
| 4,495,024 | A | 1/1985 | Bok |
| 4,496,828 | A | 1/1985 | Kusmierz et al. |
| 4,499,354 | A | 2/1985 | Hill et al. |
| 4,502,094 | A | 2/1985 | Lewin et al. |
| 4,504,439 | A | 3/1985 | Elter et al. |
| 4,512,113 | A | 4/1985 | Budinger |
| 4,512,841 | A | 4/1985 | Cunningham et al. |
| 4,520,116 | A | 5/1985 | Gentilman et al. |
| 4,520,421 | A | 5/1985 | Sakitani et al. |
| 4,527,005 | A | 7/1985 | McKelvey et al. |
| 4,534,816 | A | 8/1985 | Chen et al. |
| 4,535,628 | A | 8/1985 | Hope |
| 4,537,001 | A | 8/1985 | Uppstrom |
| 4,548,688 | A | 10/1985 | Mathews |
| 4,551,192 | A | 11/1985 | Di Milia et al. |
| 4,554,611 | A | 11/1985 | Lewin |
| 4,560,590 | A | 12/1985 | Bok |
| 4,570,328 | A | 2/1986 | Price et al. |
| 4,575,408 | A | 3/1986 | Bok |
| 4,575,636 | A | 3/1986 | Caprari |
| 4,578,560 | A | 3/1986 | Tanaka et al. |
| 4,579,080 | A | 4/1986 | Martin et al. |
| 4,579,378 | A | 4/1986 | Snyders |
| 4,579,623 | A | 4/1986 | Suzuki et al. |
| 4,581,520 | A | 4/1986 | Vu et al. |
| 4,590,326 | A | 5/1986 | Woldy |
| 4,611,966 | A | 9/1986 | Johnson |
| 4,620,998 | A | 11/1986 | Lalvani |
| 4,622,918 | A | 11/1986 | Bok |
| 4,624,728 | A | 11/1986 | Bithell et al. |
| D288,556 | S | 3/1987 | Wallgren |
| 4,653,541 | A | 3/1987 | Oehlschlaeger et al. |
| 4,654,226 | A | 3/1987 | Jackson et al. |
| 4,655,592 | A | 4/1987 | Allemand |
| 4,662,987 | A | 5/1987 | Bok |
| 4,664,769 | A | 5/1987 | Cuomo et al. |
| 4,670,126 | A | 6/1987 | Messer et al. |
| 4,681,134 | A | 7/1987 | Paris |
| 4,693,211 | A | 9/1987 | Ogami et al. |
| 4,700,089 | A | 10/1987 | Fujii et al. |
| 4,707,815 | A | 11/1987 | Yamasaki |
| 4,717,461 | A | 1/1988 | Strahl et al. |
| 4,718,637 | A | 1/1988 | Contin |
| 4,720,362 | A | 1/1988 | Gentilman et al. |
| 4,720,407 | A | 1/1988 | Sculke |
| 4,721,533 | A | 1/1988 | Phillippi et al. |
| 4,721,534 | A | 1/1988 | Phillippi et al. |
| 4,722,298 | A | 2/1988 | Rubin et al. |
| 4,724,272 | A | 2/1988 | Raniere et al. |
| 4,725,204 | A | 2/1988 | Powell |
| 4,735,259 | A | 4/1988 | Vincent |
| 4,738,618 | A | 4/1988 | Massey et al. |
| 4,738,748 | A | 4/1988 | Kisa |
| 4,747,367 | A | 5/1988 | Posa |
| 4,749,416 | A | 6/1988 | Greenspan |
| 4,750,520 | A | 6/1988 | Heim et al. |
| 4,753,192 | A | 6/1988 | Goldsmith et al. |
| 4,753,856 | A | 6/1988 | Haluska et al. |
| 4,756,794 | A | 7/1988 | Yoder |
| 4,764,076 | A | 8/1988 | Layman et al. |
| 4,770,590 | A | 9/1988 | Hugues et al. |
| 4,771,015 | A | 9/1988 | Kanai |
| 4,775,281 | A | 10/1988 | Prentakis |
| 4,776,744 | A | 10/1988 | Stonestreet et al. |
| 4,780,169 | A | 10/1988 | Stark et al. |
| 4,781,511 | A | 11/1988 | Harada et al. |
| 4,789,294 | A | 12/1988 | Sato et al. |

(56) References Cited

U.S. PATENT DOCUMENTS

| | | | |
|---|---|---|---|
| 4,790,258 | A | 12/1988 | Drage et al. |
| 4,802,441 | A | 2/1989 | Waugh |
| 4,804,086 | A | 2/1989 | Grohrock |
| 4,808,387 | A | 2/1989 | Datta et al. |
| 4,812,201 | A | 3/1989 | Sakai et al. |
| 4,812,217 | A | 3/1989 | George et al. |
| 4,821,674 | A | 4/1989 | deBoer et al. |
| 4,827,430 | A | 5/1989 | Aid et al. |
| 4,828,224 | A | 5/1989 | Crabb et al. |
| 4,830,515 | A | 5/1989 | Cortes |
| 4,837,113 | A | 6/1989 | Luttmer et al. |
| 4,837,185 | A | 6/1989 | Yau et al. |
| 4,854,263 | A | 8/1989 | Chang et al. |
| 4,854,266 | A | 8/1989 | Simson et al. |
| 4,857,137 | A | 8/1989 | Tachi et al. |
| 4,857,382 | A | 8/1989 | Liu et al. |
| 4,858,557 | A | 8/1989 | Pozzetti et al. |
| 4,863,374 | A | 9/1989 | Vukovich |
| 4,867,629 | A | 9/1989 | Iwasawa et al. |
| 4,871,523 | A | 10/1989 | Datta et al. |
| 4,874,273 | A | 10/1989 | Tokisue et al. |
| 4,880,982 | A | 11/1989 | Hoksaas |
| 4,882,199 | A | 11/1989 | Sadoway et al. |
| 4,886,162 | A | 12/1989 | Ambrogio |
| 4,916,091 | A | 4/1990 | Freeman et al. |
| 4,917,556 | A | 4/1990 | Stark et al. |
| 4,920,918 | A | 5/1990 | Adams et al. |
| 4,925,388 | A | 5/1990 | Iseki et al. |
| 4,931,135 | A | 6/1990 | Horiuchi et al. |
| 4,934,831 | A | 6/1990 | Volbrecht |
| 4,938,815 | A | 7/1990 | McNeilly |
| D309,702 | S | 8/1990 | Hall |
| 4,949,671 | A | 8/1990 | Davis et al. |
| 4,949,848 | A | 8/1990 | Kos |
| 4,950,624 | A | 8/1990 | Inuzima et al. |
| 4,956,538 | A | 9/1990 | Moslehi |
| 4,958,061 | A | 9/1990 | Wakabayashi et al. |
| D311,126 | S | 10/1990 | Crowley |
| 4,962,063 | A | 10/1990 | Maydan et al. |
| 4,963,506 | A | 10/1990 | Liaw et al. |
| 4,976,996 | A | 12/1990 | Monkowski et al. |
| 4,978,567 | A | 12/1990 | Miller |
| 4,984,904 | A | 1/1991 | Nakano et al. |
| 4,985,114 | A | 1/1991 | Okudaira |
| 4,986,215 | A | 1/1991 | Yamada |
| 4,987,102 | A | 1/1991 | Nguyen et al. |
| 4,987,856 | A | 1/1991 | Hey |
| 4,989,992 | A | 2/1991 | Piai |
| 4,991,614 | A | 2/1991 | Hammel |
| 5,002,632 | A | 3/1991 | Loewenstein et al. |
| 5,013,691 | A | 5/1991 | Lory et al. |
| 5,022,961 | A | 6/1991 | Izumi et al. |
| 5,027,746 | A | 7/1991 | Frijlink |
| 5,028,366 | A | 7/1991 | Harakal et al. |
| D320,148 | S | 9/1991 | Andrews |
| 5,049,029 | A | 9/1991 | Mitsui et al. |
| 5,053,247 | A | 10/1991 | Moore |
| 5,057,436 | A | 10/1991 | Ball |
| 5,060,322 | A | 10/1991 | Delepine |
| 5,061,083 | A | 10/1991 | Grimm et al. |
| 5,062,386 | A | 11/1991 | Christensen |
| 5,064,337 | A | 11/1991 | Asakawa et al. |
| 5,065,698 | A | 11/1991 | Koike |
| 5,067,437 | A | 11/1991 | Watanabe et al. |
| 5,069,591 | A | 12/1991 | Kinoshita |
| 5,071,258 | A | 12/1991 | Usher et al. |
| 5,074,017 | A | 12/1991 | Toya et al. |
| 5,082,517 | A | 1/1992 | Moslehi |
| 5,084,126 | A | 1/1992 | McKee |
| 5,088,444 | A | 2/1992 | Ohmine et al. |
| 5,097,890 | A | 3/1992 | Nakao |
| 5,098,638 | A | 3/1992 | Sawada |
| 5,098,865 | A | 3/1992 | MacHado |
| 5,104,514 | A | 4/1992 | Quartarone |
| 5,107,170 | A | 4/1992 | Ishikawa et al. |
| 5,108,192 | A | 4/1992 | Mailliet et al. |
| 5,110,407 | A | 5/1992 | Ono et al. |
| 5,114,683 | A | 5/1992 | Hirase |
| 5,116,018 | A | 5/1992 | Friemoth et al. |
| 5,117,121 | A | 5/1992 | Watanabe et al. |
| D327,534 | S | 6/1992 | Manville |
| 5,119,760 | A | 6/1992 | McMillan et al. |
| 5,124,272 | A | 6/1992 | Saito et al. |
| 5,125,358 | A | 6/1992 | Ueda et al. |
| 5,125,710 | A | 6/1992 | Gianelo |
| 5,130,003 | A | 7/1992 | Conrad |
| 5,134,965 | A | 8/1992 | Tokuda et al. |
| 5,137,286 | A | 8/1992 | Whitford |
| 5,151,296 | A | 9/1992 | Tokunaga |
| 5,154,301 | A | 10/1992 | Kos |
| 5,158,128 | A | 10/1992 | Inoue et al. |
| D330,900 | S | 11/1992 | Wakegijig |
| 5,167,716 | A | 12/1992 | Boitnott et al. |
| 5,167,761 | A | 12/1992 | Westendorp et al. |
| 5,174,881 | A | 12/1992 | Iwasaki et al. |
| 5,176,451 | A | 1/1993 | Sasada |
| 5,178,639 | A | 1/1993 | Nishi |
| 5,178,682 | A | 1/1993 | Tsukamoto et al. |
| 5,180,273 | A | 1/1993 | Sakaya et al. |
| 5,180,435 | A | 1/1993 | Markunas et al. |
| 5,181,779 | A | 1/1993 | Shia et al. |
| 5,182,232 | A | 1/1993 | Chhabra et al. |
| 5,183,511 | A | 2/1993 | Yamazaki et al. |
| 5,186,120 | A | 2/1993 | Ohnishi et al. |
| D333,606 | S | 3/1993 | Kanemitsu et al. |
| 5,192,717 | A | 3/1993 | Kawakami |
| 5,193,912 | A | 3/1993 | Saunders |
| 5,193,969 | A | 3/1993 | Rush et al. |
| 5,194,401 | A | 3/1993 | Adams et al. |
| 5,199,603 | A | 4/1993 | Prescott |
| 5,208,961 | A | 5/1993 | Lajoie |
| 5,213,650 | A | 5/1993 | Wang et al. |
| 5,219,226 | A | 6/1993 | James |
| 5,221,556 | A | 6/1993 | Hawkins et al. |
| 5,225,366 | A | 7/1993 | Yoder |
| 5,226,383 | A | 7/1993 | Bhat |
| 5,226,713 | A | 7/1993 | Matsumura |
| 5,226,967 | A | 7/1993 | Chen et al. |
| 5,228,114 | A | 7/1993 | Suzuki |
| 5,231,062 | A | 7/1993 | Mathers et al. |
| 5,232,508 | A | 8/1993 | Arena et al. |
| 5,234,526 | A | 8/1993 | Chen et al. |
| 5,242,501 | A | 9/1993 | McDiarmid |
| 5,242,539 | A | 9/1993 | Kumihashi et al. |
| 5,243,195 | A | 9/1993 | Nishi |
| 5,243,202 | A | 9/1993 | Mori et al. |
| 5,246,218 | A | 9/1993 | Yap et al. |
| 5,246,500 | A | 9/1993 | Samata et al. |
| 5,249,960 | A | 10/1993 | Monoe |
| 5,250,092 | A | 10/1993 | Nakano |
| 5,252,133 | A | 10/1993 | Miyazaki et al. |
| 5,252,134 | A | 10/1993 | Stauffer |
| 5,259,881 | A | 11/1993 | Edwards et al. |
| 5,261,167 | A | 11/1993 | Sakata |
| 5,266,526 | A | 11/1993 | Aoyama |
| 5,268,989 | A | 12/1993 | Moslehi et al. |
| 5,271,967 | A | 12/1993 | Kramer et al. |
| 5,273,609 | A | 12/1993 | Moslehi |
| 5,277,932 | A | 1/1994 | Spencer |
| 5,278,494 | A | 1/1994 | Obigane |
| 5,279,886 | A | 1/1994 | Kawai et al. |
| 5,279,986 | A | 1/1994 | Maloney et al. |
| 5,280,894 | A | 1/1994 | Witcraft et al. |
| 5,281,274 | A | 1/1994 | Yoder |
| 5,284,519 | A | 2/1994 | Gadgil |
| 5,288,684 | A | 2/1994 | Yamazaki et al. |
| 5,294,572 | A | 3/1994 | Granneman et al. |
| 5,294,778 | A | 3/1994 | Carman et al. |
| 5,295,777 | A | 3/1994 | Hodos |
| 5,298,089 | A | 3/1994 | Bowe et al. |
| 5,305,417 | A | 4/1994 | Najm et al. |
| 5,306,666 | A | 4/1994 | Izumi |
| 5,306,946 | A | 4/1994 | Yamamoto |
| 5,308,650 | A | 5/1994 | Krummel et al. |

(56) References Cited

U.S. PATENT DOCUMENTS

| | | | |
|---|---|---|---|
| 5,308,788 | A | 5/1994 | Fitch et al. |
| 5,310,410 | A | 5/1994 | Begin et al. |
| 5,310,456 | A | 5/1994 | Kadomura |
| 5,312,245 | A | 5/1994 | Brannen et al. |
| 5,313,061 | A | 5/1994 | Drew et al. |
| 5,314,538 | A | 5/1994 | Maeda et al. |
| 5,314,570 | A | 5/1994 | Ikegaya et al. |
| 5,315,092 | A | 5/1994 | Takahashi et al. |
| 5,320,218 | A | 6/1994 | Yamashita et al. |
| 5,326,427 | A | 7/1994 | Jerbic |
| 5,328,360 | A | 7/1994 | Yokokawa |
| 5,328,810 | A | 7/1994 | Lowrey et al. |
| 5,335,309 | A | 8/1994 | Fujii et al. |
| 5,336,327 | A | 8/1994 | Lee |
| 5,338,362 | A | 8/1994 | Imahashi |
| 5,340,261 | A | 8/1994 | Oosawa et al. |
| 5,346,961 | A | 9/1994 | Shaw et al. |
| 5,348,774 | A | 9/1994 | Golecki et al. |
| 5,350,480 | A | 9/1994 | Gray |
| 5,354,433 | A | 10/1994 | Granneman et al. |
| 5,354,580 | A | 10/1994 | Goela et al. |
| 5,356,478 | A | 10/1994 | Chen et al. |
| 5,356,672 | A | 10/1994 | Schmitt et al. |
| 5,360,269 | A | 11/1994 | Ogawa et al. |
| 5,362,328 | A | 11/1994 | Gardiner et al. |
| 5,364,667 | A | 11/1994 | Rhieu |
| D353,452 | S | 12/1994 | Groenhoff |
| 5,374,315 | A | 12/1994 | Deboer et al. |
| D354,898 | S | 1/1995 | Nagy |
| 5,378,501 | A | 1/1995 | Foster et al. |
| 5,380,367 | A | 1/1995 | Bertone |
| 5,382,311 | A | 1/1995 | Ishikawa et al. |
| 5,387,265 | A | 2/1995 | Kakizaki et al. |
| 5,388,945 | A | 2/1995 | Garric et al. |
| 5,393,577 | A | 2/1995 | Uesugi et al. |
| 5,397,395 | A | 3/1995 | Sano et al. |
| 5,403,630 | A | 4/1995 | Matsui et al. |
| 5,404,082 | A | 4/1995 | Hernandez et al. |
| 5,407,449 | A | 4/1995 | Zinger |
| 5,407,867 | A | 4/1995 | Iwasaki et al. |
| 5,413,813 | A | 5/1995 | Cruse et al. |
| 5,414,221 | A | 5/1995 | Gardner |
| 5,415,753 | A | 5/1995 | Hurwitt et al. |
| 5,418,382 | A | 5/1995 | Blackwood et al. |
| 5,421,893 | A | 6/1995 | Perlov |
| 5,422,139 | A | 6/1995 | Fischer |
| 5,423,942 | A | 6/1995 | Robbins et al. |
| 5,426,137 | A | 6/1995 | Allen |
| 5,427,824 | A | 6/1995 | Inushima et al. |
| 5,430,011 | A | 7/1995 | Tanaka et al. |
| 5,431,734 | A | 7/1995 | Chapple-Sokol et al. |
| 5,443,646 | A | 8/1995 | Yamada et al. |
| 5,443,648 | A | 8/1995 | Ohkase |
| 5,443,686 | A | 8/1995 | Jones et al. |
| 5,444,217 | A | 8/1995 | Moore |
| 5,447,294 | A | 9/1995 | Sakata et al. |
| 5,453,124 | A | 9/1995 | Moslehi et al. |
| D363,464 | S | 10/1995 | Fukasawa |
| 5,456,207 | A | 10/1995 | Gedridge et al. |
| 5,456,757 | A | 10/1995 | Aruga et al. |
| 5,461,214 | A | 10/1995 | Peck et al. |
| 5,462,899 | A | 10/1995 | Ikeda |
| 5,463,176 | A | 10/1995 | Eckert |
| 5,464,313 | A | 11/1995 | Ohsawa |
| 5,474,410 | A | 12/1995 | Ozawa et al. |
| 5,474,612 | A | 12/1995 | Sato et al. |
| 5,478,429 | A | 12/1995 | Komino et al. |
| 5,480,488 | A | 1/1996 | Bittner et al. |
| 5,480,818 | A | 1/1996 | Matsumoto et al. |
| 5,482,559 | A | 1/1996 | Imai et al. |
| 5,484,484 | A | 1/1996 | Yamaga et al. |
| 5,494,439 | A | 2/1996 | Goldstein et al. |
| 5,494,494 | A | 2/1996 | Mizuno et al. |
| 5,496,408 | A | 3/1996 | Motoda et al. |
| 5,501,740 | A | 3/1996 | Besen et al. |
| 5,503,875 | A | 4/1996 | Imai |
| 5,504,042 | A | 4/1996 | Cho et al. |
| 5,510,277 | A | 4/1996 | Cunningham et al. |
| 5,512,102 | A | 4/1996 | Yamazaki |
| 5,514,439 | A | 5/1996 | Sibley |
| 5,518,549 | A | 5/1996 | Hellwig |
| 5,518,780 | A | 5/1996 | Tamor et al. |
| 5,519,234 | A | 5/1996 | Paz de Araujo |
| 5,520,743 | A | 5/1996 | Takahashi et al. |
| 5,523,616 | A | 6/1996 | Yasuhide |
| 5,527,111 | A | 6/1996 | Lysen et al. |
| 5,527,417 | A | 6/1996 | Iida |
| 5,531,218 | A | 7/1996 | Krebs |
| 5,531,835 | A | 7/1996 | Fodor et al. |
| 5,537,311 | A | 7/1996 | Stevens |
| 5,540,059 | A | 7/1996 | Yokokawa |
| 5,540,821 | A | 7/1996 | Tepman |
| 5,540,898 | A | 7/1996 | Davidson |
| 5,554,557 | A | 9/1996 | Koh |
| 5,556,275 | A | 9/1996 | Sakata et al. |
| 5,558,717 | A | 9/1996 | Zhao et al. |
| 5,559,046 | A | 9/1996 | Oishi et al. |
| 5,562,383 | A | 10/1996 | Iwai et al. |
| 5,562,947 | A | 10/1996 | White et al. |
| 5,562,952 | A | 10/1996 | Nakahigashi et al. |
| 5,565,038 | A | 10/1996 | Ashley |
| 5,569,402 | A | 10/1996 | Meisser et al. |
| 5,574,247 | A | 11/1996 | Nishitani et al. |
| 5,576,629 | A | 11/1996 | Turner |
| 5,577,331 | A | 11/1996 | Suzuki |
| 5,583,736 | A | 12/1996 | Anderson et al. |
| 5,584,936 | A | 12/1996 | Pickering et al. |
| 5,584,963 | A | 12/1996 | Takahashi |
| 5,586,585 | A | 12/1996 | Bonora et al. |
| 5,589,002 | A | 12/1996 | Su |
| 5,589,110 | A | 12/1996 | Motoda et al. |
| 5,595,606 | A | 1/1997 | Fujikawa et al. |
| 5,601,641 | A | 2/1997 | Stephens |
| 5,602,060 | A | 2/1997 | Kobayashi et al. |
| 5,604,410 | A | 2/1997 | Vollkommer et al. |
| 5,611,448 | A | 3/1997 | Chen |
| 5,616,264 | A | 4/1997 | Nishi et al. |
| 5,616,947 | A | 4/1997 | Tamura |
| 5,621,982 | A | 4/1997 | Yamashita |
| 5,632,919 | A | 5/1997 | MacCracken et al. |
| 5,637,153 | A | 6/1997 | Niino et al. |
| D380,527 | S | 7/1997 | Velez |
| 5,645,646 | A | 7/1997 | Beinglass et al. |
| 5,650,013 | A | 7/1997 | Yamazaki |
| 5,650,351 | A | 7/1997 | Wu |
| 5,653,807 | A | 8/1997 | Crumbaker |
| 5,656,093 | A | 8/1997 | Burkhart et al. |
| 5,661,263 | A | 8/1997 | Salvaggio |
| 5,662,470 | A | 9/1997 | Huussen et al. |
| 5,663,899 | A | 9/1997 | Zvonar et al. |
| 5,665,608 | A | 9/1997 | Chapple-Sokol et al. |
| 5,667,592 | A | 9/1997 | Boitnott et al. |
| 5,670,786 | A | 9/1997 | Meyer et al. |
| 5,679,215 | A | 10/1997 | Barnes et al. |
| 5,681,779 | A | 10/1997 | Pasch et al. |
| D386,076 | S | 11/1997 | Moore |
| 5,683,517 | A | 11/1997 | Shan |
| 5,683,561 | A | 11/1997 | Hollars et al. |
| 5,685,912 | A | 11/1997 | Nishizaka |
| 5,685,914 | A | 11/1997 | Hills et al. |
| 5,690,742 | A | 11/1997 | Ogata et al. |
| 5,695,567 | A | 12/1997 | Kordina |
| 5,697,706 | A | 12/1997 | Ciaravino et al. |
| 5,698,036 | A | 12/1997 | Ishii et al. |
| 5,700,729 | A | 12/1997 | Lee et al. |
| 5,708,825 | A | 1/1998 | Sotomayor |
| 5,709,745 | A | 1/1998 | Larkin et al. |
| 5,711,811 | A | 1/1998 | Suntola et al. |
| 5,716,133 | A | 2/1998 | Hosokawa et al. |
| 5,718,574 | A | 2/1998 | Shimazu |
| 5,720,927 | A | 2/1998 | Cripe et al. |
| D392,855 | S | 3/1998 | Pillow |
| 5,724,748 | A | 3/1998 | Brooks |
| 5,728,223 | A | 3/1998 | Murakarni et al. |

(56) References Cited

U.S. PATENT DOCUMENTS 5,728,425 A 3/1998 Ebe et al.
5,730,801 A 3/1998 Tepman et al.
5,730,802 A 3/1998 Ishizumi et al.
5,732,597 A 3/1998 Devenyi
5,732,744 A 3/1998 Barr et al.
5,732,957 A 3/1998 Yu
5,736,314 A 4/1998 Hayes et al.
5,753,835 A 5/1998 Gustin
5,754,390 A 5/1998 Sandhu et al.
5,759,281 A 6/1998 Gurary et al.
5,761,328 A 6/1998 Solberg et al.
5,766,365 A 6/1998 Umutoy et al.
5,768,125 A 6/1998 Zinger et al.
5,769,952 A 6/1998 Komino
5,775,889 A 7/1998 Kobayashi et al.
5,777,838 A 7/1998 Tamagawa et al.
5,779,203 A 7/1998 Edlinger
5,781,693 A 7/1998 Ballance et al.
5,782,979 A 7/1998 Kaneno
5,790,750 A 8/1998 Anderson
5,791,782 A 8/1998 Wooten et al.
5,792,272 A 8/1998 Van Os et al.
5,796,074 A 8/1998 Edelstein et al.
5,801,104 A 9/1998 Schuegraf et al.
5,801,945 A 9/1998 Comer
5,804,505 A 9/1998 Yamada et al.
5,806,980 A 9/1998 Berrian
5,813,851 A 9/1998 Nakao
5,818,716 A 10/1998 Chin et al.
5,819,092 A 10/1998 Ferguson et al.
5,819,434 A 10/1998 Herchen et al.
5,820,366 A 10/1998 Lee
5,820,685 A 10/1998 Kurihra et al.
5,820,686 A 10/1998 Moore
5,826,129 A 10/1998 Hasebe et al.
5,827,420 A 10/1998 Shirazi et al.
5,827,435 A 10/1998 Samukawa
5,827,757 A 10/1998 Robinson, Jr. et al.
5,836,483 A 11/1998 Disel
5,837,058 A 11/1998 Chen et al.
5,837,320 A 11/1998 Hampden-Smith et al.
5,844,683 A 12/1998 Pavloski et al.
5,846,332 A 12/1998 Zhao et al.
5,851,293 A 12/1998 Lane et al.
5,851,294 A 12/1998 Young et al.
5,851,299 A 12/1998 Cheng et al.
5,852,445 A 12/1998 Yoshikawa et al.
5,852,879 A 12/1998 Schumaier
5,853,484 A 12/1998 Jeong
D403,949 S 1/1999 Nakamura
D404,370 S 1/1999 Kimura
D404,372 S 1/1999 Ishii
5,855,680 A 1/1999 Soininen et al.
5,855,681 A 1/1999 Maydan et al.
5,855,687 A 1/1999 DuBois et al.
5,855,726 A 1/1999 Soraoka et al.
5,857,777 A 1/1999 Schuh
5,861,233 A 1/1999 Sekine et al.
5,862,302 A 1/1999 Okase
5,863,123 A 1/1999 Lee et al.
5,865,205 A 2/1999 Wilmer
5,866,795 A 2/1999 Wang et al.
5,871,586 A 2/1999 Crawley et al.
5,872,065 A 2/1999 Sivaramakrishnan
5,873,942 A 2/1999 Park
5,877,095 A 3/1999 Tamura et al.
5,879,128 A 3/1999 Tietz et al.
5,879,459 A 3/1999 Gadgil et al.
5,880,980 A 3/1999 Rothacher et al.
5,882,165 A 3/1999 Maydan et al.
5,884,640 A 3/1999 Fishkin et al.
5,888,304 A 3/1999 Umotoy et al.
5,891,251 A 4/1999 MacLeish et al.
5,893,741 A 4/1999 Huang
5,897,348 A 4/1999 Wu
5,897,378 A 4/1999 Eriguchi
5,897,379 A 4/1999 Ulrich et al.
5,897,710 A 4/1999 Sato et al.
D409,894 S 5/1999 McClurg
5,904,170 A 5/1999 Harvey et al.
D411,516 S 6/1999 Imafuku et al.
5,908,672 A 6/1999 Ryu
5,915,200 A 6/1999 Tokumasu et al.
5,915,562 A 6/1999 Nyseth et al.
5,916,365 A 6/1999 Sherman
D412,270 S 7/1999 Fredrickson
5,920,798 A 7/1999 Higuchi et al.
5,928,426 A 7/1999 Aitchison
D412,512 S 8/1999 Boisvert
5,937,142 A 8/1999 Moslehi et al.
5,937,323 A 8/1999 Orczyk et al.
5,939,886 A 8/1999 Turner et al.
5,947,718 A 9/1999 Weaver
5,950,327 A 9/1999 Peterson et al.
5,950,925 A 9/1999 Fukunaga et al.
5,954,375 A 9/1999 Trickle et al.
5,961,775 A 10/1999 Fujimura
5,968,275 A 10/1999 Lee et al.
5,970,621 A 10/1999 Bazydola
5,972,196 A 10/1999 Murphy et al.
5,975,492 A 11/1999 Brenes
5,976,973 A 11/1999 Ohira et al.
5,979,506 A 11/1999 Aarseth
5,982,931 A 11/1999 Ishimaru
5,984,391 A 11/1999 Vanderpot et al.
5,987,480 A 11/1999 Donohue et al.
5,989,342 A 11/1999 Ikeda et al.
5,992,453 A 11/1999 Zimmer
5,997,588 A 12/1999 Goodwin
5,997,768 A 12/1999 Scully
5,998,870 A 12/1999 Lee et al.
6,000,732 A 12/1999 Scheler et al.
6,001,183 A 12/1999 Gurary et al.
6,001,267 A 12/1999 Van Os et al.
6,004,204 A 12/1999 Luxton et al.
D419,652 S 1/2000 Hall et al.
6,013,553 A 1/2000 Wallace
6,013,920 A 1/2000 Gordon et al.
6,014,677 A 1/2000 Hayashi et al.
6,015,459 A 1/2000 Jamison et al.
6,015,465 A 1/2000 Kholodenko et al.
6,017,779 A 1/2000 Miyasaka
6,017,818 A 1/2000 Lu
6,022,180 A 2/2000 Motoyama et al.
6,022,802 A 2/2000 Jang
6,024,799 A 2/2000 Chen et al.
6,025,117 A 2/2000 Nakano et al.
6,027,163 A 2/2000 Longenecker et al.
6,029,602 A 2/2000 Bhatnagar
6,030,900 A 2/2000 Grassi et al.
6,033,215 A 3/2000 Ohsawa
6,035,101 A 3/2000 Sajoto et al.
6,035,804 A 3/2000 Arami et al.
6,039,809 A 3/2000 Toyama et al.
6,042,652 A 3/2000 Hyun
6,044,860 A 4/2000 Neu
6,045,260 A 4/2000 Schwartz et al.
6,048,154 A 4/2000 Wytman
6,050,506 A 4/2000 Guo et al.
6,053,982 A 4/2000 Halpin et al.
6,053,983 A 4/2000 Saeki et al.
6,054,013 A 4/2000 Collins et al.
6,054,678 A 4/2000 Miyazaki
6,060,691 A 5/2000 Minami et al.
6,060,721 A 5/2000 Huang
6,063,196 A 5/2000 Li et al.
6,066,204 A 5/2000 Haven
6,068,441 A 5/2000 Raaijmakers et al.
6,071,572 A 6/2000 Mosely et al.
6,072,163 A 6/2000 Armstrong et al.
6,073,973 A 6/2000 Boscaljon et al.
6,074,154 A 6/2000 Ueda et al.
6,074,443 A 6/2000 Venkatesh
6,074,514 A 6/2000 Bjorkman et al.

(56) References Cited

U.S. PATENT DOCUMENTS

| | | | |
|---|---|---|---|
| 6,077,027 | A | 6/2000 | Kawamura et al. |
| 6,079,356 | A | 6/2000 | Umotoy et al. |
| 6,079,927 | A | 6/2000 | Muka |
| 6,083,321 | A | 7/2000 | Lei et al. |
| 6,086,677 | A | 7/2000 | Umotoy et al. |
| 6,090,212 | A | 7/2000 | Mahawili |
| 6,090,442 | A | 7/2000 | Klaus et al. |
| 6,090,659 | A | 7/2000 | Laibowitz et al. |
| 6,091,062 | A | 7/2000 | Pfahnl et al. |
| 6,093,252 | A | 7/2000 | Wengert et al. |
| 6,093,253 | A | 7/2000 | Lofgren |
| 6,093,611 | A | 7/2000 | Gardner et al. |
| 6,095,083 | A | 8/2000 | Rice et al. |
| 6,096,133 | A | 8/2000 | Yuuki et al. |
| 6,096,267 | A | 8/2000 | Kishkovich |
| 6,099,302 | A | 8/2000 | Hong et al. |
| 6,099,649 | A | 8/2000 | Schmitt et al. |
| 6,099,651 | A | 8/2000 | Sajoto et al. |
| 6,102,565 | A | 8/2000 | Kita et al. |
| 6,104,002 | A | 8/2000 | Hirose et al. |
| 6,104,011 | A | 8/2000 | Juliano |
| 6,104,401 | A | 8/2000 | Parsons |
| 6,106,625 | A | 8/2000 | Koai et al. |
| 6,106,678 | A | 8/2000 | Shufflebotham |
| 6,110,531 | A | 8/2000 | Paz de Araujo et al. |
| 6,113,703 | A | 9/2000 | Anderson et al. |
| 6,119,710 | A | 9/2000 | Brown |
| 6,121,061 | A | 9/2000 | Van Bilsen et al. |
| 6,121,158 | A | 9/2000 | Benchikha et al. |
| 6,122,036 | A | 9/2000 | Yamasaki et al. |
| 6,124,600 | A | 9/2000 | Moroishi et al. |
| 6,125,789 | A | 10/2000 | Gupta et al. |
| 6,126,744 | A | 10/2000 | Hawkins et al. |
| 6,126,848 | A | 10/2000 | Li et al. |
| 6,127,249 | A | 10/2000 | Hu |
| 6,129,044 | A | 10/2000 | Zhao et al. |
| 6,129,546 | A | 10/2000 | Sada |
| 6,132,207 | A | 10/2000 | Stoutjesdijk |
| 6,134,807 | A | 10/2000 | Komino |
| 6,135,460 | A | 10/2000 | Wise et al. |
| 6,137,240 | A | 10/2000 | Bogdan |
| 6,139,239 | A | 10/2000 | Snijders |
| 6,139,983 | A | 10/2000 | Ohashi et al. |
| 6,140,252 | A | 10/2000 | Cho et al. |
| 6,143,079 | A | 11/2000 | Halpin |
| 6,143,082 | A | 11/2000 | McInerney et al. |
| 6,143,129 | A | 11/2000 | Savas et al. |
| 6,146,463 | A | 11/2000 | Yudovsky et al. |
| 6,148,761 | A | 11/2000 | Majewski et al. |
| 6,151,446 | A | 11/2000 | Hunter et al. |
| 6,152,070 | A | 11/2000 | Fairbairn et al. |
| 6,152,669 | A | 11/2000 | Morita et al. |
| 6,156,151 | A | 12/2000 | Komino et al. |
| 6,158,941 | A | 12/2000 | Muka et al. |
| 6,159,301 | A | 12/2000 | Sato et al. |
| 6,160,244 | A | 12/2000 | Ohashi |
| 6,161,500 | A | 12/2000 | Kopacz et al. |
| 6,162,323 | A | 12/2000 | Koshimizu |
| 6,164,894 | A | 12/2000 | Cheng |
| 6,174,809 | B1 | 1/2001 | Kang et al. |
| 6,176,929 | B1 | 1/2001 | Fukunaga et al. |
| 6,177,688 | B1 | 1/2001 | Linthicum et al. |
| 6,178,918 | B1 | 1/2001 | Van Os et al. |
| 6,179,955 | B1 | 1/2001 | Shin et al. |
| 6,180,979 | B1 | 1/2001 | Hofman et al. |
| 6,182,603 | B1 | 2/2001 | Shang et al. |
| 6,183,564 | B1 | 2/2001 | Reynolds et al. |
| 6,183,565 | B1 | 2/2001 | Granneman et al. |
| 6,187,672 | B1 | 2/2001 | Zhao et al. |
| 6,187,691 | B1 | 2/2001 | Fukuda |
| 6,189,482 | B1 | 2/2001 | Zhao et al. |
| 6,190,037 | B1 | 2/2001 | Das et al. |
| 6,190,113 | B1 | 2/2001 | Bui et al. |
| 6,190,634 | B1 | 2/2001 | Lieber et al. |
| 6,191,399 | B1 | 2/2001 | Van Bilsen |
| 6,194,037 | B1 | 2/2001 | Terasaki et al. |
| 6,200,897 | B1 | 3/2001 | Wang et al. |
| 6,201,999 | B1 | 3/2001 | Jevtic |
| 6,203,613 | B1 | 3/2001 | Gates et al. |
| 6,203,618 | B1 | 3/2001 | Hashizume et al. |
| 6,207,932 | B1 | 3/2001 | Yoo |
| 6,207,936 | B1 | 3/2001 | de Waard |
| 6,209,221 | B1 | 4/2001 | Beulens |
| 6,210,485 | B1 | 4/2001 | Zhao et al. |
| 6,212,789 | B1 | 4/2001 | Kato |
| 6,213,708 | B1 | 4/2001 | Allen |
| 6,214,122 | B1 | 4/2001 | Thompson |
| 6,214,717 | B1 | 4/2001 | Yan et al. |
| 6,217,658 | B1 | 4/2001 | Orczyk et al. |
| 6,217,662 | B1 | 4/2001 | Kong et al. |
| 6,218,288 | B1 | 4/2001 | Li et al. |
| 6,224,679 | B1 | 5/2001 | Sasaki et al. |
| 6,225,020 | B1 | 5/2001 | Jung et al. |
| 6,225,602 | B1 | 5/2001 | Buiijze et al. |
| 6,225,745 | B1 | 5/2001 | Srivastava |
| 6,230,650 | B1 | 5/2001 | Yamazaki |
| 6,231,290 | B1 | 5/2001 | Kikuchi et al. |
| 6,235,121 | B1 | 5/2001 | Honma et al. |
| 6,235,858 | B1 | 5/2001 | Swarup et al. |
| 6,238,734 | B1 | 5/2001 | Senzaki et al. |
| 6,239,402 | B1 | 5/2001 | Araki et al. |
| 6,239,715 | B1 | 5/2001 | Belton |
| 6,240,875 | B1 | 6/2001 | Wijck et al. |
| 6,241,822 | B1 | 6/2001 | Ide |
| 6,242,359 | B1 | 6/2001 | Misra |
| 6,243,654 | B1 | 6/2001 | Johnson et al. |
| 6,245,647 | B1 | 6/2001 | Akiyama et al. |
| 6,245,665 | B1 | 6/2001 | Yokoyama |
| 6,247,245 | B1 | 6/2001 | Ishii |
| 6,250,250 | B1 | 6/2001 | Maishev et al. |
| 6,255,221 | B1 | 7/2001 | Hudson et al. |
| 6,257,758 | B1 | 7/2001 | Culbertson |
| 6,261,648 | B1 | 7/2001 | Akiba et al. |
| 6,264,467 | B1 | 7/2001 | Lue et al. |
| 6,265,113 | B1 | 7/2001 | Rosasco et al. |
| 6,265,311 | B1 | 7/2001 | Hautala et al. |
| 6,270,572 | B1 | 8/2001 | Kim et al. |
| 6,271,148 | B1 | 8/2001 | Kao |
| 6,271,320 | B1 | 8/2001 | Keller et al. |
| 6,274,496 | B1 | 8/2001 | Leusink et al. |
| 6,274,878 | B1 | 8/2001 | Li et al. |
| 6,281,098 | B1 | 8/2001 | Wang |
| 6,281,141 | B1 | 8/2001 | Das et al. |
| 6,283,692 | B1 | 9/2001 | Perlov et al. |
| 6,284,050 | B1 | 9/2001 | Shi et al. |
| 6,284,149 | B1 | 9/2001 | Li et al. |
| 6,287,965 | B1 | 9/2001 | Kang et al. |
| 6,287,988 | B1 | 9/2001 | Nagamine et al. |
| 6,293,700 | B1 | 9/2001 | Lund et al. |
| D449,873 | S | 10/2001 | Bronson |
| 6,296,710 | B1 | 10/2001 | Allen et al. |
| 6,296,711 | B1 | 10/2001 | Loan et al. |
| 6,296,909 | B1 | 10/2001 | Spitsberg |
| 6,297,539 | B1 | 10/2001 | Ma et al. |
| 6,299,133 | B2 | 10/2001 | Waragai et al. |
| 6,302,964 | B1 | 10/2001 | Umotoy et al. |
| 6,303,523 | B2 | 10/2001 | Cheung |
| 6,305,898 | B1 | 10/2001 | Yamagishi et al. |
| 6,311,016 | B1 | 10/2001 | Yanagawa et al. |
| 6,312,525 | B1 | 11/2001 | Bright et al. |
| 6,315,512 | B1 | 11/2001 | Tabrizi et al. |
| 6,316,162 | B1 | 11/2001 | Jung et al. |
| 6,316,371 | B1 | 11/2001 | Oosterlaken et al. |
| 6,320,320 | B1 | 11/2001 | Bailey et al. |
| 6,321,680 | B2 | 11/2001 | Cook et al. |
| 6,321,780 | B1 | 11/2001 | Iwabuchi |
| D451,893 | S | 12/2001 | Robson |
| D452,220 | S | 12/2001 | Robson |
| 6,325,858 | B1 | 12/2001 | Wengert |
| 6,326,322 | B1 | 12/2001 | Kim et al. |
| 6,326,597 | B1 | 12/2001 | Lubomirsky et al. |
| 6,328,561 | B1 | 12/2001 | Hasper et al. |
| 6,328,864 | B1 | 12/2001 | Ishizawa et al. |
| 6,329,297 | B1 | 12/2001 | Balish |

(56) References Cited

U.S. PATENT DOCUMENTS

| | | | |
|---|---|---|---|
| 6,333,275 | B1 | 12/2001 | Mayer et al. |
| 6,335,049 | B1 | 1/2002 | Basceri |
| 6,335,240 | B1 | 1/2002 | Kim et al. |
| 6,335,293 | B1 | 1/2002 | Luo et al. |
| 6,342,427 | B1 | 1/2002 | Choi et al. |
| 6,343,239 | B1 | 1/2002 | Toda et al. |
| 6,344,084 | B1 | 2/2002 | Koinuma et al. |
| 6,344,232 | B1 | 2/2002 | Jones et al. |
| 6,346,419 | B1 | 2/2002 | Ryerson et al. |
| 6,347,636 | B1 | 2/2002 | Xia |
| 6,350,391 | B1 | 2/2002 | Livshits et al. |
| 6,352,049 | B1 | 3/2002 | Yin et al. |
| 6,352,945 | B1 | 3/2002 | Matsuki |
| 6,357,984 | B1 | 3/2002 | Zinger et al. |
| 6,363,294 | B1 | 3/2002 | Coronel et al. |
| D455,024 | S | 4/2002 | Mimick et al. |
| 6,367,410 | B1 | 4/2002 | Leahey et al. |
| 6,368,773 | B1 | 4/2002 | Jung et al. |
| 6,368,987 | B1 | 4/2002 | Kopacz et al. |
| 6,370,796 | B1 | 4/2002 | Zucker |
| 6,372,583 | B1 | 4/2002 | Tyagi |
| 6,374,831 | B1 | 4/2002 | Chandran |
| 6,375,312 | B1 | 4/2002 | Ikeda et al. |
| 6,375,749 | B1 | 4/2002 | Boydston et al. |
| 6,375,750 | B1 | 4/2002 | Van Os et al. |
| 6,379,466 | B1 | 4/2002 | Sahin et al. |
| D457,609 | S | 5/2002 | Piano |
| 6,383,300 | B1 | 5/2002 | Saito et al. |
| 6,383,566 | B1 | 5/2002 | Zagdoun |
| 6,383,955 | B1 | 5/2002 | Matsuki |
| 6,387,207 | B1 | 5/2002 | Janakiraman |
| 6,387,823 | B1 | 5/2002 | Sonderman et al. |
| 6,387,827 | B1 | 5/2002 | Mertens et al. |
| 6,390,753 | B1 | 5/2002 | de Ridder et al. |
| 6,390,754 | B2 | 5/2002 | Yamaga et al. |
| 6,391,803 | B1 | 5/2002 | Kim et al. |
| 6,395,650 | B1 | 5/2002 | Callegari et al. |
| 6,398,184 | B1 | 6/2002 | Sowada et al. |
| 6,399,022 | B1 | 6/2002 | Schuler et al. |
| 6,402,806 | B1 | 6/2002 | Schmitt et al. |
| 6,410,433 | B1 | 6/2002 | Hautala et al. |
| 6,410,459 | B2 | 6/2002 | Blalock et al. |
| 6,410,463 | B1 | 6/2002 | Matsuki |
| 6,413,321 | B1 | 7/2002 | Kim et al. |
| 6,413,583 | B1 | 7/2002 | Moghadam et al. |
| 6,420,279 | B1 | 7/2002 | Ono et al. |
| 6,423,949 | B1 | 7/2002 | Chen et al. |
| D461,233 | S | 8/2002 | Whalen |
| D461,882 | S | 8/2002 | Piano |
| 6,428,859 | B1 | 8/2002 | Chiang et al. |
| 6,429,465 | B1 | 8/2002 | Yagi et al. |
| 6,432,206 | B1 | 8/2002 | Tolt |
| 6,432,255 | B1 | 8/2002 | Sun et al. |
| 6,432,479 | B2 | 8/2002 | Chang et al. |
| 6,432,849 | B1 | 8/2002 | Endo et al. |
| 6,433,298 | B1 | 8/2002 | Ishii |
| 6,435,798 | B1 | 8/2002 | Satoh |
| 6,435,865 | B1 | 8/2002 | Tseng et al. |
| 6,436,819 | B1 | 8/2002 | Zhang |
| 6,437,444 | B2 | 8/2002 | Andideh |
| 6,438,502 | B1 | 8/2002 | Awtrey |
| 6,439,822 | B1 | 8/2002 | Kimura et al. |
| 6,440,261 | B1 | 8/2002 | Tepman et al. |
| 6,441,350 | B1 | 8/2002 | Stoddard et al. |
| 6,445,574 | B1 | 9/2002 | Saw et al. |
| 6,446,573 | B2 | 9/2002 | Hirayama et al. |
| 6,447,232 | B1 | 9/2002 | Davis et al. |
| 6,447,651 | B1 | 9/2002 | Ishikawa et al. |
| 6,447,937 | B1 | 9/2002 | Murakawa et al. |
| 6,448,192 | B1 | 9/2002 | Kaushik |
| 6,450,117 | B1 | 9/2002 | Murugesh et al. |
| 6,450,757 | B1 | 9/2002 | Saeki |
| 6,451,713 | B1 | 9/2002 | Tay et al. |
| 6,452,017 | B1 | 9/2002 | Uhlenbrock et al. |
| 6,454,860 | B2 | 9/2002 | Metzner et al. |
| 6,454,909 | B1 | 9/2002 | Matsuse et al. |
| 6,455,098 | B2 | 9/2002 | Tran et al. |
| 6,455,225 | B1 | 9/2002 | Kong et al. |
| 6,455,445 | B2 | 9/2002 | Matsuki |
| 6,460,482 | B1 | 10/2002 | Kuibira et al. |
| 6,461,435 | B1 | 10/2002 | Littau et al. |
| 6,461,436 | B1 | 10/2002 | Campbell et al. |
| 6,461,439 | B1 | 10/2002 | Granneman et al. |
| 6,462,310 | B1 | 10/2002 | Ratliff et al. |
| 6,464,825 | B1 | 10/2002 | Shinozaki |
| 6,468,924 | B2 | 10/2002 | Lee |
| 6,471,779 | B1 | 10/2002 | Nishio et al. |
| 6,472,266 | B1 | 10/2002 | Yu et al. |
| 6,474,987 | B1 | 11/2002 | Huang et al. |
| 6,475,276 | B1 | 11/2002 | Elers et al. |
| 6,475,902 | B1 | 11/2002 | Hausmann et al. |
| 6,475,930 | B1 | 11/2002 | Junker et al. |
| 6,478,872 | B1 | 11/2002 | Chae et al. |
| 6,481,945 | B1 | 11/2002 | Hasper et al. |
| 6,482,331 | B2 | 11/2002 | Lu et al. |
| 6,482,663 | B1 | 11/2002 | Buckland |
| 6,483,989 | B1 | 11/2002 | Okada et al. |
| 6,488,774 | B1 | 12/2002 | Horie et al. |
| 6,490,493 | B1 | 12/2002 | Dharnipragada |
| 6,492,625 | B1 | 12/2002 | Boguslayskiy et al. |
| 6,494,065 | B2 | 12/2002 | Babbitt |
| 6,494,998 | B1 | 12/2002 | Brcka |
| 6,496,819 | B1 | 12/2002 | Bello et al. |
| 6,497,734 | B1 | 12/2002 | Barber et al. |
| 6,497,767 | B1 | 12/2002 | Okase et al. |
| 6,498,091 | B1 | 12/2002 | Chen et al. |
| 6,499,533 | B2 | 12/2002 | Yamada |
| 6,500,487 | B1 | 12/2002 | Holst et al. |
| 6,502,530 | B1 | 1/2003 | Turlot et al. |
| 6,503,079 | B2 | 1/2003 | Kogano et al. |
| 6,503,330 | B1 | 1/2003 | Sneh et al. |
| 6,503,365 | B1 | 1/2003 | Kim et al. |
| 6,503,562 | B1 | 1/2003 | Saito et al. |
| 6,503,826 | B1 | 1/2003 | Oda |
| 6,506,009 | B1 | 1/2003 | Nulman et al. |
| 6,506,253 | B2 | 1/2003 | Sakuma |
| 6,507,410 | B1 | 1/2003 | Robertson et al. |
| 6,511,539 | B1 | 1/2003 | Raaijmakers |
| 6,514,313 | B1 | 2/2003 | Spiegelman |
| 6,514,666 | B1 | 2/2003 | Choi et al. |
| 6,521,295 | B1 | 2/2003 | Remington |
| 6,521,547 | B1 | 2/2003 | Chang et al. |
| 6,527,884 | B1 | 3/2003 | Takakuwa et al. |
| 6,528,171 | B1 | 3/2003 | Endler et al. |
| 6,528,430 | B2 | 3/2003 | Kwan |
| 6,528,752 | B1 | 3/2003 | Ishii et al. |
| 6,528,767 | B2 | 3/2003 | Bagley et al. |
| 6,530,994 | B1 | 3/2003 | Mahawili |
| 6,531,193 | B2 | 3/2003 | Fonash et al. |
| 6,531,412 | B2 | 3/2003 | Conti et al. |
| 6,534,133 | B1 | 3/2003 | Kaloyeros et al. |
| 6,534,395 | B2 | 3/2003 | Werkhoven et al. |
| 6,536,950 | B1 | 3/2003 | Green |
| 6,539,891 | B1 | 4/2003 | Kang et al. |
| 6,540,469 | B2 | 4/2003 | Matsunaga et al. |
| 6,540,838 | B2 | 4/2003 | Sneh et al. |
| 6,544,906 | B2 | 4/2003 | Rotondaro et al. |
| 6,552,209 | B1 | 4/2003 | Lei et al. |
| 6,558,517 | B2 | 5/2003 | Basceri |
| 6,558,755 | B2 | 5/2003 | Berry et al. |
| 6,559,026 | B1 | 5/2003 | Rossman et al. |
| 6,562,094 | B2 | 5/2003 | Denker et al. |
| 6,565,763 | B1 | 5/2003 | Asakawa et al. |
| 6,566,278 | B1 | 5/2003 | Harvey et al. |
| 6,569,239 | B2 | 5/2003 | Arai et al. |
| 6,569,971 | B2 | 5/2003 | Roh et al. |
| 6,573,030 | B1 | 6/2003 | Fairbairn et al. |
| 6,574,644 | B2 | 6/2003 | Hsu et al. |
| 6,576,062 | B2 | 6/2003 | Matsuse |
| 6,576,064 | B2 | 6/2003 | Griffiths et al. |
| 6,576,300 | B1 | 6/2003 | Berry et al. |
| 6,576,564 | B2 | 6/2003 | Agarwal |
| 6,578,589 | B1 | 6/2003 | Mayusumi |
| 6,579,833 | B1 | 6/2003 | McNallan et al. |

(56) References Cited

U.S. PATENT DOCUMENTS

| | | | |
|---|---|---|---|
| 6,580,050 | B1 | 6/2003 | Miller et al. |
| 6,582,174 | B1 | 6/2003 | Hayashi |
| 6,583,048 | B1 | 6/2003 | Vincent et al. |
| 6,583,572 | B2 | 6/2003 | Veltrop et al. |
| 6,587,108 | B1 | 7/2003 | Guerlain et al. |
| 6,589,352 | B1 | 7/2003 | Yudovsky et al. |
| 6,589,707 | B2 | 7/2003 | Lee et al. |
| 6,589,868 | B2 | 7/2003 | Rossman |
| 6,590,251 | B2 | 7/2003 | Kang et al. |
| 6,594,550 | B1 | 7/2003 | Okrah |
| 6,596,398 | B1 | 7/2003 | Russo et al. |
| 6,596,653 | B2 | 7/2003 | Tan |
| 6,598,559 | B1 | 7/2003 | Vellore et al. |
| 6,602,806 | B1 | 8/2003 | Xia et al. |
| 6,607,602 | B1 | 8/2003 | Granneman et al. |
| 6,607,868 | B2 | 8/2003 | Choi |
| 6,607,948 | B1 | 8/2003 | Sugiyama et al. |
| 6,608,745 | B2 | 8/2003 | Tsuruta et al. |
| 6,610,375 | B2 | 8/2003 | Akiba et al. |
| 6,613,685 | B1 | 9/2003 | Granneman et al. |
| 6,616,986 | B2 | 9/2003 | Sherman |
| 6,617,253 | B1 | 9/2003 | Chu et al. |
| 6,620,251 | B2 | 9/2003 | Kitano |
| 6,623,799 | B1 | 9/2003 | Lee et al. |
| 6,624,064 | B1 | 9/2003 | Sahin |
| 6,627,268 | B1 | 9/2003 | Fair et al. |
| 6,627,503 | B2 | 9/2003 | Ma et al. |
| 6,630,030 | B1 | 10/2003 | Suntola et al. |
| 6,632,478 | B2 | 10/2003 | Gaillard et al. |
| 6,633,364 | B2 | 10/2003 | Hayashi |
| 6,635,115 | B1 | 10/2003 | Fairbairn et al. |
| 6,635,117 | B1 | 10/2003 | Kinnard et al. |
| 6,635,578 | B1 | 10/2003 | Xu et al. |
| 6,638,839 | B2 | 10/2003 | Deng et al. |
| 6,640,145 | B2 | 10/2003 | Hoffberg et al. |
| 6,645,304 | B2 | 11/2003 | Yamaguchi |
| 6,648,974 | B1 | 11/2003 | Ogliari et al. |
| 6,649,921 | B1 | 11/2003 | Cekic et al. |
| 6,652,924 | B2 | 11/2003 | Sherman |
| 6,656,281 | B1 | 12/2003 | Ueda |
| 6,656,282 | B2 | 12/2003 | Kim et al. |
| 6,658,933 | B2 | 12/2003 | Allegre et al. |
| 6,659,111 | B1 | 12/2003 | Mouri et al. |
| 6,660,662 | B2 | 12/2003 | Ishikawa et al. |
| 6,662,817 | B2 | 12/2003 | Yamagishi |
| 6,663,332 | B1 | 12/2003 | Sluijk et al. |
| 6,673,196 | B1 | 1/2004 | Oyabu |
| 6,676,290 | B1 | 1/2004 | Lu |
| 6,676,759 | B1 | 1/2004 | Takagi |
| 6,679,194 | B2 | 1/2004 | Ham et al. |
| 6,682,971 | B2 | 1/2004 | Tsuneda et al. |
| 6,682,973 | B1 | 1/2004 | Paton et al. |
| 6,683,274 | B1 | 1/2004 | Kwon et al. |
| D486,891 | S | 2/2004 | Cronce |
| 6,684,659 | B1 | 2/2004 | Tanaka et al. |
| 6,684,719 | B2 | 2/2004 | Gehner et al. |
| 6,686,281 | B2 | 2/2004 | Yamazaki et al. |
| 6,688,784 | B1 | 2/2004 | Templeton |
| 6,689,220 | B1 | 2/2004 | Nguyen |
| 6,692,575 | B1 | 2/2004 | Omstead et al. |
| 6,692,576 | B2 | 2/2004 | Halpin et al. |
| 6,692,903 | B2 | 2/2004 | Chen et al. |
| 6,696,367 | B1 | 2/2004 | Aggarwal |
| 6,699,003 | B2 | 3/2004 | Saeki |
| 6,699,399 | B1 | 3/2004 | Qian et al. |
| 6,700,089 | B1 | 3/2004 | Hirooka |
| 6,709,989 | B2 | 3/2004 | Ramdani et al. |
| 6,710,364 | B2 | 3/2004 | Guldi et al. |
| 6,710,857 | B2 | 3/2004 | Kondo |
| 6,712,949 | B2 | 3/2004 | Gopal |
| 6,713,824 | B1 | 3/2004 | Mikata |
| 6,715,949 | B1 | 4/2004 | Fisher et al. |
| 6,716,477 | B1 | 4/2004 | Komiyama et al. |
| 6,716,571 | B2 | 4/2004 | Gabriel |
| 6,719,499 | B1 | 4/2004 | Kuznetsov et al. |
| 6,720,260 | B1 | 4/2004 | Fair et al. |
| 6,720,262 | B2 | 4/2004 | Koh et al. |
| 6,720,531 | B1 | 4/2004 | Jacobson et al. |
| 6,722,837 | B2 | 4/2004 | Inui |
| 6,723,642 | B1 | 4/2004 | Lim et al. |
| 6,730,614 | B1 | 5/2004 | Lim et al. |
| 6,732,006 | B2 | 5/2004 | Haanstra et al. |
| 6,734,090 | B2 | 5/2004 | Agarwala et al. |
| 6,734,631 | B2 | 5/2004 | Juestel et al. |
| 6,737,716 | B1 | 5/2004 | Matsuo et al. |
| 6,740,853 | B1 | 5/2004 | Johnson et al. |
| 6,743,475 | B2 | 6/2004 | Skarp et al. |
| 6,743,738 | B2 | 6/2004 | Todd et al. |
| 6,745,095 | B1 | 6/2004 | Ben-Dov |
| 6,746,240 | B2 | 6/2004 | de Ridder et al. |
| 6,746,308 | B1 | 6/2004 | Bode et al. |
| 6,749,671 | B2 | 6/2004 | Holst et al. |
| 6,753,507 | B2 | 6/2004 | Fure et al. |
| 6,755,221 | B2 | 6/2004 | Jeong et al. |
| 6,756,085 | B2 | 6/2004 | Waldfried |
| 6,756,293 | B2 | 6/2004 | Li et al. |
| 6,756,318 | B2 | 6/2004 | Nguyen et al. |
| 6,759,098 | B2 | 7/2004 | Han |
| 6,760,981 | B2 | 7/2004 | Leap |
| 6,766,545 | B2 | 7/2004 | Hodges |
| 6,767,447 | B2 | 7/2004 | Uno et al. |
| D494,552 | S | 8/2004 | Tezuka et al. |
| 6,776,849 | B2 | 8/2004 | Aggarwal et al. |
| 6,780,704 | B1 | 8/2004 | Raaijmakers et al. |
| 6,783,875 | B2 | 8/2004 | Yamada et al. |
| 6,784,033 | B1 | 8/2004 | Yamazaki |
| 6,784,108 | B1 | 8/2004 | Donohoe et al. |
| D496,008 | S | 9/2004 | Takahashi et al. |
| 6,786,997 | B1 | 9/2004 | Yamazaki |
| D497,536 | S | 10/2004 | Fujiwara |
| D497,977 | S | 11/2004 | Engelbrektsson |
| 6,811,960 | B2 | 11/2004 | Lee et al. |
| 6,812,157 | B1 | 11/2004 | Gadgil |
| 6,815,350 | B2 | 11/2004 | Kim et al. |
| 6,815,352 | B1 | 11/2004 | Tamura et al. |
| 6,818,566 | B2 | 11/2004 | Leeson et al. |
| 6,818,864 | B2 | 11/2004 | Ptak |
| 6,820,570 | B2 | 11/2004 | Kilpela et al. |
| 6,821,889 | B2 | 11/2004 | Elers et al. |
| 6,821,910 | B2 | 11/2004 | Adomaitis et al. |
| 6,824,665 | B2 | 11/2004 | Shelnut et al. |
| 6,825,106 | B1 | 11/2004 | Gao et al. |
| 6,825,134 | B2 | 11/2004 | Law et al. |
| D499,620 | S | 12/2004 | Horner-Richardson et al. |
| 6,827,789 | B2 | 12/2004 | Lee et al. |
| 6,828,235 | B2 | 12/2004 | Takano |
| 6,831,004 | B2 | 12/2004 | Byun |
| 6,833,024 | B2 | 12/2004 | Holst et al. |
| 6,835,039 | B2 | 12/2004 | Van Den Berg |
| 6,838,122 | B2 | 1/2005 | Basceri et al. |
| 6,841,201 | B2 | 1/2005 | Shanov et al. |
| 6,843,202 | B2 | 1/2005 | Kusuda |
| 6,843,858 | B2 | 1/2005 | Rossman |
| 6,846,146 | B2 | 1/2005 | Inui |
| 6,846,515 | B2 | 1/2005 | Vrtis |
| 6,846,742 | B2 | 1/2005 | Rossman |
| 6,847,014 | B1 | 1/2005 | Benjamin et al. |
| 6,849,241 | B2 | 2/2005 | Dauelsberg et al. |
| 6,849,857 | B2 | 2/2005 | Ichiki et al. |
| 6,854,580 | B2 | 2/2005 | Braford |
| 6,858,524 | B2 | 2/2005 | Haukka et al. |
| 6,858,547 | B2 | 2/2005 | Metzner |
| 6,861,642 | B2 | 3/2005 | Ichiki et al. |
| 6,863,019 | B2 | 3/2005 | Shamouilian |
| 6,863,281 | B2 | 3/2005 | Endou et al. |
| 6,864,041 | B2 | 3/2005 | Brown |
| 6,867,086 | B1 | 3/2005 | Chen et al. |
| 6,867,153 | B2 | 3/2005 | Tokunaga |
| 6,867,859 | B1 | 3/2005 | Powell |
| 6,872,258 | B2 | 3/2005 | Park et al. |
| 6,872,259 | B2 | 3/2005 | Strang |
| D504,142 | S | 4/2005 | Horner-Richardson et al. |
| 6,874,247 | B1 | 4/2005 | Hsu |
| 6,874,480 | B1 | 4/2005 | Ismailov |

(56) References Cited

U.S. PATENT DOCUMENTS

| | | | |
|---|---|---|---|
| 6,875,477 | B2 | 4/2005 | Trickett et al. |
| 6,875,677 | B1 | 4/2005 | Conley, Jr. et al. |
| 6,876,017 | B2 | 4/2005 | Goodner |
| 6,876,191 | B2 | 4/2005 | de Ridder |
| 6,878,206 | B2 | 4/2005 | Tzu et al. |
| 6,878,402 | B2 | 4/2005 | Chiang et al. |
| 6,883,733 | B1 | 4/2005 | Lind |
| 6,884,066 | B2 | 4/2005 | Nguyen et al. |
| 6,884,295 | B2 | 4/2005 | Ishii |
| 6,884,319 | B2 | 4/2005 | Kim |
| 6,884,475 | B2 | 4/2005 | Basceri |
| D505,590 | S | 5/2005 | Greiner |
| 6,889,211 | B1 | 5/2005 | Yoshiura et al. |
| 6,889,864 | B2 | 5/2005 | Linclfors et al. |
| 6,890,596 | B2 | 5/2005 | Sarigiannis et al. |
| 6,895,158 | B2 | 5/2005 | Alyward et al. |
| 6,899,507 | B2 | 5/2005 | Yamagishi et al. |
| 6,902,395 | B2 | 6/2005 | Oosterlaken et al. |
| 6,902,647 | B2 | 6/2005 | Hasper |
| 6,909,839 | B2 | 6/2005 | Wang et al. |
| 6,911,092 | B2 | 6/2005 | Sneh |
| 6,913,152 | B2 | 7/2005 | Zuk |
| 6,913,796 | B2 | 7/2005 | Albano et al. |
| 6,916,398 | B2 | 7/2005 | Chen et al. |
| 6,916,559 | B2 | 7/2005 | Murakawa et al. |
| 6,917,755 | B2 | 7/2005 | Nguyen et al. |
| 6,924,078 | B2 | 8/2005 | Lee et al. |
| 6,928,890 | B2 | 8/2005 | Gehner et al. |
| 6,929,699 | B2 | 8/2005 | Whitesell |
| 6,929,700 | B2 | 8/2005 | Tan et al. |
| 6,930,041 | B2 | 8/2005 | Agarwal |
| 6,930,059 | B2 | 8/2005 | Conley, Jr. et al. |
| 6,935,269 | B2 | 8/2005 | Lee et al. |
| 6,939,579 | B2 | 9/2005 | Bondestam et al. |
| 6,939,817 | B2 | 9/2005 | Sandhu et al. |
| 6,942,753 | B2 | 9/2005 | Choi et al. |
| 6,949,204 | B1 | 9/2005 | Lenz et al. |
| 6,951,587 | B1 | 10/2005 | Narushima |
| 6,952,656 | B1 | 10/2005 | Cordova et al. |
| 6,953,609 | B2 | 10/2005 | Carollo |
| 6,955,741 | B2 | 10/2005 | Yamagishi |
| 6,955,836 | B2 | 10/2005 | Kumagai et al. |
| 6,955,928 | B1 | 10/2005 | Brennan |
| 6,963,052 | B2 | 11/2005 | Kuibira et al. |
| 6,972,055 | B2 | 12/2005 | Sferlazzo |
| 6,972,478 | B1 | 12/2005 | Waite et al. |
| 6,974,781 | B2 | 12/2005 | Timmermans et al. |
| 6,975,921 | B2 | 12/2005 | Verhaar |
| 6,976,822 | B2 | 12/2005 | Woodruff |
| RE38,937 | E | 1/2006 | Nakamura |
| 6,981,832 | B2 | 1/2006 | Zinger et al. |
| 6,982,046 | B2 | 1/2006 | Srivastava et al. |
| 6,982,103 | B2 | 1/2006 | Basceri et al. |
| 6,984,591 | B1 | 1/2006 | Buchanan et al. |
| 6,984,595 | B1 | 1/2006 | Yamazaki |
| 6,985,788 | B2 | 1/2006 | Haanstra et al. |
| 6,986,914 | B2 | 1/2006 | Elers et al. |
| 6,987,155 | B2 | 1/2006 | Roh et al. |
| 6,990,430 | B2 | 1/2006 | Hosek |
| 7,005,227 | B2 | 2/2006 | Yueh et al. |
| 7,005,391 | B2 | 2/2006 | Min |
| 7,008,879 | B2 | 3/2006 | Lee et al. |
| 7,010,580 | B1 | 3/2006 | Fu et al. |
| 7,017,514 | B1 | 3/2006 | Shepherd et al. |
| 7,018,941 | B2 | 3/2006 | Cui et al. |
| 7,021,330 | B2 | 4/2006 | Maula et al. |
| 7,021,881 | B2 | 4/2006 | Yamagishi |
| 7,036,453 | B2 | 5/2006 | Ishikawa et al. |
| 7,041,609 | B2 | 5/2006 | Vaartstra |
| 7,045,430 | B2 | 5/2006 | Ahn et al. |
| 7,049,226 | B2 | 5/2006 | Chung et al. |
| 7,049,247 | B2 | 5/2006 | Gates et al. |
| 7,052,584 | B2 | 5/2006 | Basceri |
| 7,053,009 | B2 | 5/2006 | Conley, Jr. et al. |
| 7,055,263 | B2 | 6/2006 | Wu et al. |
| 7,055,875 | B2 | 6/2006 | Bonora |
| 7,062,161 | B2 | 6/2006 | Kusuda et al. |
| D524,600 | S | 7/2006 | Austin et al. |
| D525,127 | S | 7/2006 | Cogley et al. |
| 7,070,178 | B2 | 7/2006 | Van Der Toorn et al. |
| 7,071,051 | B1 | 7/2006 | Jeon et al. |
| 7,073,834 | B2 | 7/2006 | Matsumoto et al. |
| 7,074,690 | B1 | 7/2006 | Gauri et al. |
| 7,077,614 | B1 | 7/2006 | Hasper et al. |
| 7,080,545 | B2 | 7/2006 | Dimeo et al. |
| 7,084,060 | B1 | 8/2006 | Furukawa |
| 7,084,079 | B2 | 8/2006 | Conti et al. |
| 7,085,623 | B2 | 8/2006 | Siegers |
| 7,086,347 | B2 | 8/2006 | Howald et al. |
| 7,088,003 | B2 | 8/2006 | Gates et al. |
| 7,090,394 | B2 | 8/2006 | Hashikura et al. |
| 7,092,287 | B2 | 8/2006 | Beulens et al. |
| 7,098,149 | B2 | 8/2006 | Lukas |
| 7,098,150 | B2 | 8/2006 | Misra et al. |
| 7,100,459 | B2 | 9/2006 | Gehner et al. |
| 7,101,763 | B1 | 9/2006 | Anderson et al. |
| 7,108,753 | B2 | 9/2006 | Wood |
| 7,109,098 | B1 | 9/2006 | Ramaswamy et al. |
| 7,109,114 | B2 | 9/2006 | Chen et al. |
| 7,111,232 | B1 | 9/2006 | Bascom |
| 7,115,305 | B2 | 10/2006 | Bronikowski et al. |
| 7,115,838 | B2 | 10/2006 | Kurara et al. |
| 7,122,085 | B2 | 10/2006 | Shero et al. |
| 7,122,222 | B2 | 10/2006 | Xiao et al. |
| 7,122,844 | B2 | 10/2006 | Nakamura et al. |
| 7,129,165 | B2 | 10/2006 | Basol et al. |
| 7,132,360 | B2 | 11/2006 | Schaeffer et al. |
| 7,135,421 | B2 | 11/2006 | Ahn et al. |
| 7,140,558 | B2 | 11/2006 | McCracken et al. |
| 7,141,499 | B2 | 11/2006 | Raaijmakers |
| 7,143,897 | B1 | 12/2006 | Guzman et al. |
| 7,144,806 | B1 | 12/2006 | Fair et al. |
| 7,144,809 | B2 | 12/2006 | Elers et al. |
| 7,147,766 | B2 | 12/2006 | Uzoh et al. |
| 7,153,542 | B2 | 12/2006 | Nguyen et al. |
| D535,673 | S | 1/2007 | Conway et al. |
| 7,156,380 | B2 | 1/2007 | Soininen |
| 7,163,393 | B2 | 1/2007 | Adachi et al. |
| 7,163,721 | B2 | 1/2007 | Zhang et al. |
| 7,163,900 | B2 | 1/2007 | Weber |
| 7,168,852 | B2 | 1/2007 | Linnarsson |
| 7,172,497 | B2 | 2/2007 | Basol et al. |
| 7,173,216 | B2 | 2/2007 | Ptak |
| 7,183,229 | B2 | 2/2007 | Yamanaka |
| 7,186,648 | B1 | 3/2007 | Rozbicki |
| 7,192,824 | B2 | 3/2007 | Ahn et al. |
| 7,192,892 | B2 | 3/2007 | Ahn et al. |
| 7,195,479 | B2 | 3/2007 | Beatty et al. |
| 7,195,693 | B2 | 3/2007 | Cowans |
| D541,125 | S | 4/2007 | Gaudron |
| 7,198,447 | B2 | 4/2007 | Morimitsu et al. |
| 7,199,513 | B2 | 4/2007 | Huber et al. |
| 7,201,943 | B2 | 4/2007 | Park et al. |
| 7,202,148 | B2 | 4/2007 | Chen et al. |
| 7,202,512 | B2 | 4/2007 | Chen et al. |
| 7,204,886 | B2 | 4/2007 | Chen et al. |
| 7,204,887 | B2 | 4/2007 | Kawamura et al. |
| 7,205,246 | B2 | 4/2007 | MacNeil et al. |
| 7,205,247 | B2 | 4/2007 | Lee et al. |
| 7,207,763 | B2 | 4/2007 | Lee |
| 7,208,198 | B2 | 4/2007 | Basceri et al. |
| 7,208,389 | B1 | 4/2007 | Tipton et al. |
| 7,210,925 | B2 | 5/2007 | Adachi |
| 7,211,524 | B2 | 5/2007 | Ryu et al. |
| 7,211,525 | B1 | 5/2007 | Shanker |
| 7,214,630 | B1 | 5/2007 | Varadarajan et al. |
| 7,217,617 | B2 | 5/2007 | Basceri |
| 7,223,014 | B2 | 5/2007 | Lojen |
| 7,208,413 | B2 | 6/2007 | Byun et al. |
| 7,229,502 | B2 | 6/2007 | Wang et al. |
| 7,234,476 | B2 | 6/2007 | Arai |
| 7,235,137 | B2 | 6/2007 | Kitayama et al. |
| 7,235,482 | B2 | 6/2007 | Wu |
| 7,235,501 | B2 | 6/2007 | Ahn et al. |

(56) References Cited

U.S. PATENT DOCUMENTS

| | | | |
|---|---|---|---|
| 7,238,596 | B2 | 7/2007 | Kouvetakis et al. |
| 7,238,616 | B2 | 7/2007 | Agarwal |
| 7,238,653 | B2 | 7/2007 | Lee et al. |
| D549,815 | S | 8/2007 | Murphy |
| 7,256,375 | B2 | 8/2007 | Oosterlaken |
| 7,265,061 | B1 | 9/2007 | Cho et al. |
| 7,274,867 | B2 | 9/2007 | Peukert |
| D553,104 | S | 10/2007 | Oohashi et al. |
| 7,279,256 | B2 | 10/2007 | Son |
| 7,290,813 | B2 | 11/2007 | Bonora |
| 7,294,581 | B2 | 11/2007 | Haverkort et al. |
| 7,296,460 | B2 | 11/2007 | Dimeo et al. |
| 7,297,641 | B2 | 11/2007 | Todd et al. |
| 7,298,009 | B2 | 11/2007 | Yan et al. |
| 7,301,623 | B1 | 11/2007 | Madsen et al. |
| D556,704 | S | 12/2007 | Nakamura et al. |
| D557,226 | S | 12/2007 | Uchino et al. |
| D558,021 | S | 12/2007 | Lawrence |
| 7,307,028 | B2 | 12/2007 | Goto et al. |
| 7,307,178 | B2 | 12/2007 | Kiyomori et al. |
| 7,311,977 | B2 | 12/2007 | Yokota et al. |
| 7,312,148 | B2 | 12/2007 | Ramaswamy et al. |
| 7,312,162 | B2 | 12/2007 | Ramaswamy et al. |
| 7,312,494 | B2 | 12/2007 | Ahn et al. |
| D559,993 | S | 1/2008 | Nagakubo et al. |
| D559,994 | S | 1/2008 | Nagakubo et al. |
| 7,320,544 | B2 | 1/2008 | Hsieh |
| 7,323,401 | B2 | 1/2008 | Ramaswamy et al. |
| D562,357 | S | 2/2008 | Hardy |
| 7,326,656 | B2 | 2/2008 | Brask et al. |
| 7,326,657 | B2 | 2/2008 | Xia et al. |
| 7,327,948 | B1 | 2/2008 | Shrinivasan |
| 7,329,947 | B2 | 2/2008 | Adachi et al. |
| 7,335,611 | B2 | 2/2008 | Ramaswamy et al. |
| 7,351,057 | B2 | 4/2008 | Berenbak et al. |
| 7,354,482 | B2 | 4/2008 | Konishi et al. |
| 7,354,847 | B2 | 4/2008 | Chan et al. |
| 7,354,873 | B2 | 4/2008 | Fukazawa et al. |
| 7,356,762 | B2 | 4/2008 | van Driel |
| 7,357,138 | B2 | 4/2008 | Ji et al. |
| 7,361,447 | B2 | 4/2008 | Jung |
| 7,375,035 | B2 | 5/2008 | Heden et al. |
| 7,376,520 | B2 | 5/2008 | Wong |
| 7,378,618 | B1 | 5/2008 | Sorabji et al. |
| 7,379,785 | B2 | 5/2008 | Higashi et al. |
| D571,383 | S | 6/2008 | Ota et al. |
| D571,831 | S | 6/2008 | Ota et al. |
| 7,381,644 | B1 | 6/2008 | Soubramonium et al. |
| 7,387,685 | B2 | 6/2008 | Choi et al. |
| 7,393,207 | B2 | 7/2008 | Imai |
| 7,393,418 | B2 | 7/2008 | Yokogawa |
| 7,393,736 | B2 | 7/2008 | Ahn et al. |
| 7,393,765 | B2 | 7/2008 | Hanawa et al. |
| 7,396,491 | B2 | 7/2008 | Marking et al. |
| 7,399,388 | B2 | 7/2008 | Moghadam et al. |
| 7,399,570 | B2 | 7/2008 | Lee et al. |
| 7,402,534 | B2 | 7/2008 | Mahajani |
| 7,405,166 | B2 | 7/2008 | Liang et al. |
| 7,405,454 | B2 | 7/2008 | Ahn et al. |
| D575,713 | S | 8/2008 | Ratcliffe |
| 7,408,225 | B2 | 8/2008 | Shinriki et al. |
| 7,410,290 | B2 | 8/2008 | Tanaka |
| 7,410,666 | B2 | 8/2008 | Elers |
| 7,411,352 | B2 | 8/2008 | Madocks |
| 7,414,281 | B1 | 8/2008 | Fastow |
| D576,001 | S | 9/2008 | Brunderman |
| 7,422,635 | B2 | 9/2008 | Zheng et al. |
| 7,422,636 | B2 | 9/2008 | Ishizaka |
| 7,422,653 | B2 | 9/2008 | Blahnik et al. |
| 7,422,775 | B2 | 9/2008 | Ramaswamy et al. |
| 7,425,224 | B2 | 9/2008 | Nguyen |
| 7,427,571 | B2 | 9/2008 | Lindeboom et al. |
| 7,429,532 | B2 | 9/2008 | Ramaswamy et al. |
| 7,431,966 | B2 | 10/2008 | Derderian et al. |
| 7,432,476 | B2 | 10/2008 | Morita et al. |
| 7,437,060 | B2 | 10/2008 | Wang et al. |
| 7,442,275 | B2 | 10/2008 | Cowans |
| 7,456,429 | B2 | 11/2008 | Levy |
| D583,395 | S | 12/2008 | Ueda |
| 7,467,632 | B2 | 12/2008 | Lee et al. |
| 7,473,655 | B2 | 1/2009 | Wang et al. |
| 7,475,588 | B2 | 1/2009 | Dimeo et al. |
| 7,476,291 | B2 | 1/2009 | Wang et al. |
| 7,479,198 | B2 | 1/2009 | Guffrey |
| 7,482,247 | B1 | 1/2009 | Papasouliotis |
| 7,482,283 | B2 | 1/2009 | Yamasaki et al. |
| D585,968 | S | 2/2009 | Elkins et al. |
| 7,489,389 | B2 | 2/2009 | Shibazaki et al. |
| 7,494,882 | B2 | 2/2009 | Vitale |
| 7,497,614 | B2 | 3/2009 | Gaff |
| 7,498,242 | B2 | 3/2009 | Kumar et al. |
| 7,501,292 | B2 | 3/2009 | Matsushita et al. |
| 7,501,355 | B2 | 3/2009 | Bhatia et al. |
| 7,503,980 | B2 | 3/2009 | Kida et al. |
| 7,504,344 | B2 | 3/2009 | Matsuki et al. |
| D590,933 | S | 4/2009 | Vansell |
| 7,514,058 | B1 | 4/2009 | Hitzman et al. |
| 7,514,375 | B1 | 4/2009 | Shanker et al. |
| D593,585 | S | 6/2009 | Ota et al. |
| D593,969 | S | 6/2009 | Li |
| 7,541,297 | B2 | 6/2009 | Mallick et al. |
| 7,544,398 | B1 | 6/2009 | Chang et al. |
| 7,547,363 | B2 | 6/2009 | Tomiyasu et al. |
| 7,547,633 | B2 | 6/2009 | Ranish et al. |
| 7,550,396 | B2 | 6/2009 | Frohberg et al. |
| D596,476 | S | 7/2009 | Welch |
| 7,561,982 | B2 | 7/2009 | Rund et al. |
| 7,563,715 | B2 | 7/2009 | Haukka et al. |
| 7,566,891 | B2 | 7/2009 | Rocha-Alvarez et al. |
| 7,569,193 | B2 | 8/2009 | Ferron et al. |
| 7,575,968 | B2 | 8/2009 | Sadaka et al. |
| 7,579,285 | B2 | 8/2009 | Zimmerman et al. |
| 7,579,785 | B2 | 8/2009 | Shinmen et al. |
| D600,223 | S | 9/2009 | Aggarwal |
| 7,582,555 | B1 | 9/2009 | Lang |
| 7,582,575 | B2 | 9/2009 | Fukazawa et al. |
| 7,589,003 | B2 | 9/2009 | Kouvetakis et al. |
| 7,589,028 | B1 | 9/2009 | Cho et al. |
| 7,589,029 | B2 | 9/2009 | Derderian et al. |
| 7,591,601 | B2 | 9/2009 | Matsuoka et al. |
| 7,591,907 | B2 | 9/2009 | Chen et al. |
| D602,575 | S | 10/2009 | Breda |
| 7,598,513 | B2 | 10/2009 | Kouvetakis et al. |
| 7,601,223 | B2 | 10/2009 | Lindfors et al. |
| 7,601,225 | B2 | 10/2009 | Tuominen et al. |
| 7,601,652 | B2 | 10/2009 | Singh et al. |
| 7,611,640 | B1 | 11/2009 | Howald et al. |
| 7,611,751 | B2 | 11/2009 | Elers |
| 7,611,980 | B2 | 11/2009 | Wells et al. |
| 7,618,226 | B2 | 11/2009 | Takizawa |
| 7,621,672 | B2 | 11/2009 | Ripley |
| 7,622,369 | B1 | 11/2009 | Lee et al. |
| 7,622,378 | B2 | 11/2009 | Liu et al. |
| 7,623,940 | B2 | 11/2009 | Huskamp et al. |
| D606,952 | S | 12/2009 | Lee |
| 7,625,820 | B1 | 12/2009 | Papasouliotis |
| 7,629,277 | B2 | 12/2009 | Ghatnagar |
| 7,632,549 | B2 | 12/2009 | Goundar |
| 7,638,951 | B2 | 12/2009 | DeVincentis et al. |
| 7,640,142 | B2 | 12/2009 | Tachikawa et al. |
| 7,645,341 | B2 | 1/2010 | Kennedy et al. |
| 7,645,484 | B2 | 1/2010 | Ishizaka |
| 7,648,895 | B2 | 1/2010 | Kurokawa et al. |
| 7,648,927 | B2 | 1/2010 | Singh et al. |
| 7,651,269 | B2 | 1/2010 | Comendant |
| 7,651,583 | B2 | 1/2010 | Kent et al. |
| 7,651,955 | B2 | 1/2010 | Ranish et al. |
| 7,651,959 | B2 | 1/2010 | Fukazawa et al. |
| 7,651,961 | B2 | 1/2010 | Clark |
| D609,652 | S | 2/2010 | Nagasaka et al. |
| D609,655 | S | 2/2010 | Sugimoto |
| 7,661,299 | B2 | 2/2010 | Kusunoki |
| 7,662,689 | B2 | 2/2010 | Boyanov et al. |
| 7,670,432 | B2 | 3/2010 | Li |

(56) References Cited

U.S. PATENT DOCUMENTS

| | | | |
|---|---|---|---|
| 7,674,726 | B2 | 3/2010 | Hasper et al. |
| 7,678,197 | B2 | 3/2010 | Maki |
| 7,678,715 | B2 | 3/2010 | Mungekar et al. |
| 7,682,454 | B2 | 3/2010 | Sneh |
| 7,682,657 | B2 | 3/2010 | Sherman |
| D613,829 | S | 4/2010 | Griffin et al. |
| D614,153 | S | 4/2010 | Fondurulia et al. |
| D614,258 | S | 4/2010 | Kojima |
| D614,267 | S | 4/2010 | Breda |
| D614,268 | S | 4/2010 | Breda |
| D614,593 | S | 4/2010 | Lee |
| 7,690,881 | B2 | 4/2010 | Yamagishi |
| 7,691,205 | B2 | 4/2010 | Ikedo |
| 7,692,171 | B2 | 4/2010 | Kaszuba et al. |
| 7,695,808 | B2 | 4/2010 | Tuma |
| D616,390 | S | 5/2010 | Sato |
| D616,394 | S | 5/2010 | Sato |
| 7,712,435 | B2 | 5/2010 | Yoshizaki et al. |
| 7,713,874 | B2 | 5/2010 | Milligan |
| 7,716,993 | B2 | 5/2010 | Ozawa et al. |
| 7,718,930 | B2 | 5/2010 | Kawasaki et al. |
| 7,720,560 | B2 | 5/2010 | Menser et al. |
| 7,723,648 | B2 | 5/2010 | Tsukamoto et al. |
| 7,725,012 | B2 | 5/2010 | Aggarwal et al. |
| 7,727,864 | B2 | 6/2010 | Elers |
| 7,727,880 | B1 | 6/2010 | Chattopadhyay et al. |
| 7,732,343 | B2 | 6/2010 | Niroomand et al. |
| 7,736,437 | B2 | 6/2010 | Cadwell et al. |
| 7,736,528 | B2 | 6/2010 | Okita et al. |
| 7,736,600 | B2 | 6/2010 | Clark et al. |
| 7,737,035 | B1 | 6/2010 | Lind et al. |
| 7,740,437 | B2 | 6/2010 | de Ridder et al. |
| 7,740,705 | B2 | 6/2010 | Li |
| 7,745,346 | B2 | 6/2010 | Hausmann et al. |
| 7,748,760 | B2 | 7/2010 | Kushida |
| 7,749,563 | B2 | 7/2010 | Zheng et al. |
| 7,753,584 | B2 | 7/2010 | Gambino et al. |
| 7,754,621 | B2 | 7/2010 | Putjkonen |
| 7,758,698 | B2 | 7/2010 | Bang et al. |
| 7,763,869 | B2 | 7/2010 | Matsushita et al. |
| 7,767,262 | B2 | 8/2010 | Clark |
| 7,771,796 | B2 | 8/2010 | Kohno et al. |
| 7,780,440 | B2 | 8/2010 | Shibagaki et al. |
| 7,780,789 | B2 | 8/2010 | Wu et al. |
| 7,781,352 | B2 | 8/2010 | Fukazawa et al. |
| 7,789,559 | B2 | 9/2010 | Waser et al. |
| 7,789,965 | B2 | 9/2010 | Matsushita et al. |
| 7,790,633 | B1 | 9/2010 | Tarafdar et al. |
| 7,794,546 | B2 | 9/2010 | Li |
| 7,798,096 | B2 | 9/2010 | Mahajani et al. |
| 7,799,300 | B2 | 9/2010 | Lindfors et al. |
| 7,799,706 | B2 | 9/2010 | Yeom et al. |
| 7,803,722 | B2 | 9/2010 | Liang |
| D625,977 | S | 10/2010 | Watson et al. |
| 7,795,160 | B2 | 10/2010 | Wang et al. |
| 7,806,587 | B2 | 10/2010 | Kobayashi |
| 7,807,566 | B2 | 10/2010 | Tsuji et al. |
| 7,807,578 | B2 | 10/2010 | Bencher et al. |
| 7,816,278 | B2 | 10/2010 | Reed et al. |
| 7,824,492 | B2 | 11/2010 | Tois et al. |
| 7,825,040 | B1 | 11/2010 | Fukazawa et al. |
| 7,829,460 | B2 | 11/2010 | Streck et al. |
| 7,833,348 | B2 | 11/2010 | Wada et al. |
| 7,833,353 | B2 | 11/2010 | Furukawahara et al. |
| 7,838,084 | B2 | 11/2010 | Derderian et al. |
| 7,842,518 | B2 | 11/2010 | Miyajima |
| 7,842,622 | B1 | 11/2010 | Lee et al. |
| D629,874 | S | 12/2010 | Hermans |
| 7,850,449 | B2 | 12/2010 | Yang et al. |
| 7,851,019 | B2 | 12/2010 | Tuominen et al. |
| 7,851,232 | B2 | 12/2010 | van Schravendijk et al. |
| 7,858,519 | B2 | 12/2010 | Liu et al. |
| 7,858,533 | B2 | 12/2010 | Liu et al. |
| 7,858,898 | B2 | 12/2010 | Bailey et al. |
| 7,865,070 | B2 | 1/2011 | Nakamura |
| 7,871,198 | B2 | 1/2011 | Rempe et al. |
| 7,874,726 | B2 | 1/2011 | Jacobs et al. |
| 7,884,918 | B2 | 2/2011 | Hattori |
| 7,888,233 | B1 | 2/2011 | Gauri |
| 7,894,474 | B1 | 2/2011 | Bell |
| D633,452 | S | 3/2011 | Namiki et al. |
| D634,329 | S | 3/2011 | Wastrom |
| D634,719 | S | 3/2011 | Yasuda et al. |
| 7,897,215 | B1 | 3/2011 | Fair et al. |
| 7,897,217 | B2 | 3/2011 | Faguet |
| 7,902,009 | B2 | 3/2011 | Simonelli et al. |
| 7,902,582 | B2 | 3/2011 | Forbes et al. |
| 7,906,174 | B1 | 3/2011 | Wu et al. |
| 7,910,288 | B2 | 3/2011 | Abatchev et al. |
| 7,910,452 | B2 | 3/2011 | Roh et al. |
| 7,910,494 | B2 | 3/2011 | Dip et al. |
| 7,915,139 | B1 | 3/2011 | Lang |
| 7,915,667 | B2 | 3/2011 | Knoefler et al. |
| 7,919,142 | B2 | 4/2011 | Yeom et al. |
| 7,919,416 | B2 | 4/2011 | Lee et al. |
| 7,923,382 | B2 | 4/2011 | Huotari et al. |
| 7,925,378 | B2 | 4/2011 | Gilchrist et al. |
| 7,935,940 | B1 | 5/2011 | Smargiassi |
| 7,939,447 | B2 | 5/2011 | Bauer et al. |
| 7,942,969 | B2 | 5/2011 | Riker et al. |
| 7,946,762 | B2 | 5/2011 | Yednak |
| 7,951,262 | B2 | 5/2011 | Koshiishi et al. |
| 7,955,516 | B2 | 6/2011 | Chandrachood et al. |
| 7,955,646 | B2 | 6/2011 | Cruse et al. |
| 7,955,650 | B2 | 6/2011 | Tsuji |
| 7,957,708 | B2 | 6/2011 | Karschnia et al. |
| 7,963,736 | B2 | 6/2011 | Takizawa et al. |
| 7,967,913 | B2 | 6/2011 | Hua et al. |
| 7,972,980 | B2 | 7/2011 | Lee et al. |
| 7,977,256 | B2 | 7/2011 | Liu et al. |
| 7,981,751 | B2 | 7/2011 | Zhu et al. |
| D643,055 | S | 8/2011 | Takahashi |
| 7,989,365 | B2 | 8/2011 | Park et al. |
| 7,989,736 | B2 | 8/2011 | Park et al. |
| 7,992,318 | B2 | 8/2011 | Kawaji |
| 7,993,457 | B1 | 8/2011 | Krotov et al. |
| 7,994,070 | B1 | 8/2011 | Dip et al. |
| 7,994,721 | B2 | 8/2011 | Espiau et al. |
| 7,997,795 | B2 | 8/2011 | Schwagerman et al. |
| 7,998,875 | B2 | 8/2011 | DeYoung |
| 8,003,174 | B2 | 8/2011 | Fukazawa |
| 8,003,919 | B2 | 8/2011 | Goto et al. |
| 8,004,198 | B2 | 8/2011 | Bakre et al. |
| 8,020,315 | B2 | 9/2011 | Nishimura |
| 8,030,129 | B2 | 10/2011 | Jeong |
| 8,033,771 | B1 | 10/2011 | Gage et al. |
| 8,038,835 | B2 | 10/2011 | Hayashi et al. |
| 8,041,197 | B2 | 10/2011 | Kasai et al. |
| 8,041,450 | B2 | 10/2011 | Takizawa et al. |
| 8,043,972 | B1 | 10/2011 | Liu et al. |
| 8,046,193 | B2 | 10/2011 | Yetter et al. |
| 8,047,711 | B2 | 11/2011 | Ploechinger |
| 8,048,783 | B2 | 11/2011 | Chung et al. |
| 8,051,799 | B2 | 11/2011 | Itagaki et al. |
| 8,052,794 | B2 | 11/2011 | Sumakeris et al. |
| 8,055,378 | B2 | 11/2011 | Numakura |
| 8,060,252 | B2 | 11/2011 | Gage et al. |
| 8,083,853 | B2 | 11/2011 | Choi et al. |
| RE43,023 | E | 12/2011 | Nakashima et al. |
| D649,986 | S | 12/2011 | Fujikata et al. |
| D651,291 | S | 12/2011 | Liebson et al. |
| 8,071,451 | B2 | 12/2011 | Berry |
| 8,071,452 | B2 | 12/2011 | Raisanen |
| 8,072,578 | B2 | 12/2011 | Yasuda et al. |
| 8,076,230 | B2 | 12/2011 | Wei |
| 8,076,237 | B2 | 12/2011 | Uzoh |
| 8,076,250 | B1 | 12/2011 | Rajagopalan |
| 8,076,251 | B2 | 12/2011 | Akae et al. |
| 8,078,310 | B2 | 12/2011 | Nishimoto et al. |
| 8,082,946 | B2 | 12/2011 | Laverdiere et al. |
| 8,084,104 | B2 | 12/2011 | Shinriki et al. |
| 8,084,372 | B2 | 12/2011 | You et al. |
| D652,896 | S | 1/2012 | Gether |
| 8,092,604 | B2 | 1/2012 | Tomiyasu et al. |

(56) References Cited

U.S. PATENT DOCUMENTS 8,092,606 B2 1/2012 Park et al.
8,100,583 B2 1/2012 Aggarwal
D653,734 S 2/2012 Sisk
D654,882 S 2/2012 Honma et al.
D654,884 S 2/2012 Honma
D655,055 S 2/2012 Toll
8,110,099 B2 2/2012 Hersey et al.
8,114,734 B2 2/2012 Yang et al.
8,119,466 B2 2/2012 Avouris
8,119,527 B1 2/2012 Chadrashekar et al.
D655,260 S 3/2012 Honma et al.
D655,261 S 3/2012 Honma et al.
D655,599 S 3/2012 Durham
8,128,333 B2 3/2012 Aburatani
8,129,290 B2 3/2012 Balseanu et al.
8,137,462 B2 3/2012 Fondurulia et al.
8,137,465 B1 3/2012 Shrinivasan et al.
8,138,104 B2 3/2012 Balseanu et al.
8,138,676 B2 3/2012 Mills
8,142,862 B2 3/2012 Lee et al.
8,143,174 B2 3/2012 Xia et al.
8,147,242 B2 4/2012 Shibagaki et al.
8,152,922 B2 4/2012 Schmidt et al.
8,158,512 B2 4/2012 Ji et al.
8,172,947 B2 5/2012 Shibata et al.
8,173,554 B2 5/2012 Lee et al.
8,174,400 B2 5/2012 Park et al.
8,178,436 B2 5/2012 King et al.
8,187,679 B2 5/2012 Dickey et al.
8,187,951 B1 5/2012 Wang
8,192,901 B2 6/2012 Kageyama
8,196,234 B2 6/2012 Glunk
8,197,915 B2 6/2012 Oka et al.
8,198,168 B2 6/2012 Tanioku
8,202,575 B2 6/2012 Monsma et al.
8,206,506 B2 6/2012 Kadkhodayan et al.
8,216,380 B2 7/2012 White et al.
8,227,032 B2 7/2012 Dussarrat et al.
8,231,799 B2 7/2012 Bera et al.
D665,055 S 8/2012 Yanagisawa et al.
8,241,991 B2 8/2012 Hsieh et al.
8,241,992 B2 8/2012 Clevenger et al.
8,242,028 B1 8/2012 van Schravendijk
8,242,031 B2 8/2012 Mallick et al.
8,246,900 B2 8/2012 Kasai et al.
8,252,114 B2 8/2012 Vukovic
8,252,659 B2 8/2012 Huyghabaert et al.
8,252,691 B2 8/2012 Beynet et al.
8,253,204 B2 8/2012 Lee et al.
8,267,633 B2 9/2012 Obikane
8,272,516 B2 9/2012 Salvador
8,278,176 B2 10/2012 Bauer et al.
8,278,224 B1 10/2012 Mui et al.
8,282,769 B2 10/2012 Iizuka
8,282,847 B2 10/2012 Romano
8,282,992 B2 10/2012 Myo et al.
8,287,648 B2 10/2012 Reed et al.
8,291,857 B2 10/2012 Lam et al.
8,293,016 B2 10/2012 Bahng et al.
8,293,642 B2 10/2012 Kim
8,298,336 B2 10/2012 Wang et al.
8,298,951 B1 10/2012 Nakano
8,307,472 B1 11/2012 Saxon et al.
8,309,173 B2 11/2012 Tuominen et al.
8,318,327 B2 11/2012 O'Donnell
8,318,584 B2 11/2012 Li et al.
8,323,413 B2 12/2012 Son
8,324,699 B2 12/2012 Ichijo et al.
8,328,939 B2 12/2012 Choi et al.
8,329,599 B2 12/2012 Fukazawa et al.
8,333,839 B2 12/2012 Oh
8,334,219 B2 12/2012 Lee et al.
8,338,809 B2 12/2012 Yang et al.
8,349,083 B2 1/2013 Takasuka et al.
D676,943 S 2/2013 Kluss
8,367,528 B2 2/2013 Bauer et al.
8,372,204 B2 2/2013 Nakamura
8,378,464 B2 2/2013 Kato et al.
8,382,370 B2 2/2013 Aggarwal et al.
8,382,939 B2 2/2013 Kutney et al.
8,393,091 B2 3/2013 Kawamoto
8,394,466 B2 3/2013 Hong et al.
8,398,773 B2 3/2013 Jdira et al.
8,402,918 B2 3/2013 Kadkhodayan et al.
8,404,044 B2 3/2013 Arai
8,404,499 B2 3/2013 Moffatt
8,415,258 B2 4/2013 Akae
8,415,259 B2 4/2013 Lee et al.
8,415,587 B2 4/2013 Millman et al.
8,419,959 B2 4/2013 Bettencourt et al.
8,425,682 B2 4/2013 Wang et al.
8,430,620 B1 4/2013 Blank et al.
8,435,894 B2 5/2013 Chandrashekar et al.
8,440,259 B2 5/2013 Chiang et al.
8,443,484 B2 5/2013 Ozaki et al.
8,444,120 B2 5/2013 Gregg et al.
8,445,075 B2 5/2013 Xu et al.
8,450,191 B2 5/2013 Wang
8,454,749 B2 6/2013 Li
8,465,811 B2 6/2013 Ueda
8,465,903 B2 6/2013 Weidman et al.
8,466,411 B2 6/2013 Arai
8,470,187 B2 6/2013 Ha
8,470,718 B2 6/2013 Lee
8,484,846 B2 7/2013 Dhindsa
8,492,170 B2 7/2013 Xie et al.
8,496,377 B2 7/2013 Harr et al.
8,496,756 B2 7/2013 Cruse et al.
8,497,213 B2 7/2013 Yasui et al.
8,501,599 B2 8/2013 Ueno et al.
8,506,162 B2 8/2013 Schick et al.
8,506,713 B2 8/2013 Takagi
8,507,720 B2 8/2013 Shay
8,524,612 B2 9/2013 Li et al.
8,529,701 B2 9/2013 Morita
8,535,767 B1 9/2013 Kimura
8,536,068 B2 9/2013 Weidman et al.
D691,974 S 10/2013 Osada et al.
8,551,892 B2 10/2013 Nakano
8,557,712 B1 10/2013 Antonelli et al.
8,562,272 B2 10/2013 Lenz
8,563,443 B2 10/2013 Fukazawa
8,569,184 B2 10/2013 Oka
D693,200 S 11/2013 Saunders
D693,782 S 11/2013 Mori et al.
8,573,152 B2 11/2013 de la Llera et al.
8,573,154 B2 11/2013 Yorozuya
8,586,484 B2 11/2013 Matsuyama et al.
8,591,659 B1 11/2013 Fang et al.
8,592,005 B2 11/2013 Ueda
D694,790 S 12/2013 Matsumoto et al.
D695,240 S 12/2013 Iida et al.
8,608,885 B2 12/2013 Goto et al.
8,614,047 B2 12/2013 Ayothi et al.
8,616,765 B2 12/2013 Darabnia et al.
8,617,411 B2 12/2013 Singh
D697,038 S 1/2014 Matsumoto et al.
8,623,770 B1 1/2014 Gao et al.
8,633,115 B2 1/2014 Chang et al.
8,637,384 B2 1/2014 Ando et al.
D698,904 S 2/2014 Milligan et al.
8,642,488 B2 2/2014 Liu et al.
8,647,439 B2 2/2014 Sanchez et al.
8,647,722 B2 2/2014 Kobayashi et al.
8,647,993 B2 2/2014 Lavoie et al.
8,651,788 B1 2/2014 Budde
8,664,627 B1 3/2014 Ishikawa et al.
8,667,654 B2 3/2014 Gros-Jean
8,668,957 B2 3/2014 Dussarrat et al.
8,669,185 B2 3/2014 Onizawa
8,679,958 B2 3/2014 Takamure et al.
D702,188 S 4/2014 Jacobs
8,683,943 B2 4/2014 Onodera et al.
8,697,198 B2 4/2014 Lee

(56) References Cited

U.S. PATENT DOCUMENTS

| | | | |
|---|---|---|---|
| 8,703,002 | B2 | 4/2014 | Matsudo et al. |
| 8,709,162 | B2 | 4/2014 | Leung et al. |
| 8,710,580 | B2 | 4/2014 | Sakuma et al. |
| 8,711,338 | B2 | 4/2014 | Liu et al. |
| D705,745 | S | 5/2014 | Kurs et al. |
| D705,762 | S | 5/2014 | Yu |
| 8,664,127 | B2 | 5/2014 | Bhatia et al. |
| 8,720,965 | B2 | 5/2014 | Hino et al. |
| 8,721,791 | B2 | 5/2014 | Choi et al. |
| 8,722,510 | B2 | 5/2014 | Watanabe et al. |
| 8,722,546 | B2 | 5/2014 | Fukazawa et al. |
| 8,726,837 | B2 | 5/2014 | Patalay et al. |
| 8,728,832 | B2 | 5/2014 | Raisanen et al. |
| 8,728,956 | B2 | 5/2014 | Lavoie et al. |
| 8,741,062 | B2 | 6/2014 | Lindfors et al. |
| 8,741,065 | B2 | 6/2014 | Odagiri et al. |
| 8,742,668 | B2 | 6/2014 | Nakano et al. |
| 8,758,512 | B2 | 6/2014 | Lee |
| 8,759,223 | B2 | 6/2014 | Sapre et al. |
| D709,536 | S | 7/2014 | Yoshimura et al. |
| D709,537 | S | 7/2014 | Kuwabara et al. |
| 8,764,085 | B2 | 7/2014 | Urabe |
| 8,771,791 | B2 | 7/2014 | Lee et al. |
| 8,771,807 | B2 | 7/2014 | Xiao et al. |
| 8,779,502 | B2 | 7/2014 | Sakuma et al. |
| 8,784,676 | B2 | 7/2014 | Guha et al. |
| 8,784,950 | B2 | 7/2014 | Fukazawa et al. |
| 8,784,951 | B2 | 7/2014 | Fukazawa et al. |
| 8,785,215 | B2 | 7/2014 | Kobayashi et al. |
| 8,785,311 | B2 | 7/2014 | Miyoshi |
| 8,790,743 | B1 | 7/2014 | Omari |
| 8,790,749 | B2 | 7/2014 | Omori et al. |
| 8,802,201 | B2 | 8/2014 | Raisanen et al. |
| 8,809,170 | B2 | 8/2014 | Bauer |
| D712,358 | S | 9/2014 | Allen et al. |
| D712,359 | S | 9/2014 | Allen et al. |
| 8,820,809 | B2 | 9/2014 | Ando et al. |
| 8,821,640 | B2 | 9/2014 | Cleary et al. |
| 8,821,985 | B2 | 9/2014 | Shao et al. |
| 8,823,672 | B2 | 9/2014 | Kim |
| 8,828,886 | B2 | 9/2014 | Samukawa et al. |
| 8,841,182 | B1 | 9/2014 | Chen et al. |
| 8,845,806 | B2 | 9/2014 | Aida et al. |
| 8,846,502 | B2 | 9/2014 | Haukka et al. |
| D715,410 | S | 10/2014 | Lohmann |
| 8,859,368 | B2 | 10/2014 | Deniz |
| 8,860,955 | B2 | 10/2014 | Rodnick et al. |
| 8,864,202 | B1 | 10/2014 | Schrameyer |
| 8,864,375 | B2 | 10/2014 | Abe et al. |
| D716,742 | S | 11/2014 | Jang et al. |
| 8,876,974 | B2 | 11/2014 | Wan |
| 8,877,300 | B2 | 11/2014 | Lee |
| 8,877,655 | B2 | 11/2014 | Shero et al. |
| 8,882,923 | B2 | 11/2014 | Saido et al. |
| 8,883,270 | B2 | 11/2014 | Shero et al. |
| 8,895,108 | B2 | 11/2014 | Lee |
| 8,895,395 | B1 | 11/2014 | Kerber et al. |
| 8,900,935 | B2 | 12/2014 | Guo et al. |
| 8,900,999 | B1 | 12/2014 | Wu et al. |
| 8,901,016 | B2 | 12/2014 | Jeongseok et al. |
| 8,911,553 | B2 | 12/2014 | Baluja et al. |
| 8,911,826 | B2 | 12/2014 | Adachi et al. |
| 8,912,101 | B2 | 12/2014 | Tsuji et al. |
| D720,838 | S | 1/2015 | Yamagishi et al. |
| 8,927,906 | B2 | 1/2015 | Tadokoro et al. |
| 8,932,802 | B2 | 1/2015 | Wu et al. |
| 8,933,375 | B2 | 1/2015 | Dunn et al. |
| 8,937,800 | B2 | 1/2015 | Lubomirsky et al. |
| 8,940,646 | B1 | 1/2015 | Chandrasekharan |
| D723,153 | S | 2/2015 | Borkholder |
| 8,945,305 | B2 | 2/2015 | Marsh |
| 8,945,306 | B2 | 2/2015 | Tsuda |
| 8,945,339 | B2 | 2/2015 | Kakimoto |
| 8,946,830 | B2 | 2/2015 | Jung et al. |
| 8,956,971 | B2 | 2/2015 | Huakka |
| 8,956,983 | B2 | 2/2015 | Swaminathan |
| D723,330 | S | 3/2015 | York |
| D724,553 | S | 3/2015 | Choi |
| D724,701 | S | 3/2015 | Yamagishi et al. |
| D725,168 | S | 3/2015 | Yamagishi |
| 8,967,608 | B2 | 3/2015 | Mitsumori et al. |
| 8,968,989 | B2 | 3/2015 | Ouattara et al. |
| 8,969,934 | B1 | 3/2015 | Cheng et al. |
| 8,974,868 | B2 | 3/2015 | Ishikawa et al. |
| 8,980,006 | B2 | 3/2015 | Huh et al. |
| 8,986,456 | B2 | 3/2015 | Fondurulia et al. |
| 8,991,214 | B2 | 3/2015 | Hoshino et al. |
| 8,991,887 | B2 | 3/2015 | Shin et al. |
| 8,993,054 | B2 | 3/2015 | Jung et al. |
| 8,993,072 | B2 | 3/2015 | Xiao et al. |
| 8,993,457 | B1 | 3/2015 | Ramkumar et al. |
| D726,365 | S | 4/2015 | Weigensberg |
| D726,884 | S | 4/2015 | Yamagishi et al. |
| 8,999,102 | B2 | 4/2015 | Miyoshi et al. |
| 9,004,744 | B1 | 4/2015 | Kemp |
| 9,005,539 | B2 | 4/2015 | Halpin et al. |
| 9,017,481 | B1 | 4/2015 | Pettinger et al. |
| 9,017,933 | B2 | 4/2015 | Liu et al. |
| 9,018,093 | B2 | 4/2015 | Tsuji et al. |
| 9,018,111 | B2 | 4/2015 | Milligan et al. |
| 9,018,567 | B2 | 4/2015 | de Ridder et al. |
| 9,021,985 | B2 | 5/2015 | Alokozai et al. |
| 9,023,737 | B2 | 5/2015 | Beynet et al. |
| 9,023,738 | B2 | 5/2015 | Kato et al. |
| 9,029,244 | B2 | 5/2015 | Won et al. |
| 9,029,253 | B2 | 5/2015 | Milligan et al. |
| 9,029,272 | B1 | 5/2015 | Nakano |
| D732,145 | S | 6/2015 | Yamagishi |
| D732,644 | S | 6/2015 | Yamagishi et al. |
| D733,257 | S | 6/2015 | Schoenherr et al. |
| D733,261 | S | 6/2015 | Yamagishi et al. |
| D733,262 | S | 6/2015 | Kang |
| 9,057,388 | B2 | 6/2015 | Comeau et al. |
| 9,064,815 | B2 | 6/2015 | Zhang et al. |
| D733,843 | S | 7/2015 | Yamagishi |
| D734,377 | S | 7/2015 | Hirakida |
| 9,076,635 | B2 | 7/2015 | Gross et al. |
| 9,076,726 | B2 | 7/2015 | Kauerauf et al. |
| D735,836 | S | 8/2015 | Yamagishi et al. |
| D736,348 | S | 8/2015 | Tan |
| 9,095,869 | B2 | 8/2015 | Kilpi et al. |
| 9,096,931 | B2 | 8/2015 | Yednak et al. |
| 9,099,423 | B2 | 8/2015 | Weeks et al. |
| 9,099,505 | B2 | 8/2015 | Kusakabe et al. |
| 9,111,972 | B2 | 8/2015 | Takeshita et al. |
| 9,117,657 | B2 | 8/2015 | Nakano et al. |
| 9,117,866 | B2 | 8/2015 | Marquardt et al. |
| D739,222 | S | 9/2015 | Chadbourne |
| 9,123,510 | B2 | 9/2015 | Nakano et al. |
| 9,123,577 | B2 | 9/2015 | Fujimoto et al. |
| 9,127,358 | B2 | 9/2015 | Inoue et al. |
| 9,127,362 | B2 | 9/2015 | Scheible et al. |
| 9,129,897 | B2 | 9/2015 | Pore et al. |
| 9,136,108 | B2 | 9/2015 | Matsushita et al. |
| 9,136,180 | B2 | 9/2015 | Machkaoutsan |
| 9,142,393 | B2 | 9/2015 | Okabe et al. |
| 9,142,437 | B2 | 9/2015 | Fosnight et al. |
| 9,142,764 | B1 | 9/2015 | Wang |
| 9,153,441 | B2 | 10/2015 | Takamure et al. |
| 9,163,310 | B2 | 10/2015 | Lee |
| 9,166,012 | B2 | 10/2015 | Sim et al. |
| 9,169,975 | B2 | 10/2015 | Sarin et al. |
| 9,171,714 | B2 | 10/2015 | Mori |
| 9,171,715 | B2 | 10/2015 | Matero |
| 9,171,716 | B2 | 10/2015 | Fukuda |
| D742,202 | S | 11/2015 | Cyphers et al. |
| D743,357 | S | 11/2015 | Vyne |
| D743,513 | S | 11/2015 | Yamagishi |
| 9,174,178 | B2 | 11/2015 | Berger et al. |
| 9,175,394 | B2 | 11/2015 | Yudovsky et al. |
| 9,177,784 | B2 | 11/2015 | Raisanen et al. |
| 9,184,047 | B2 | 11/2015 | Liu et al. |
| 9,184,054 | B1 | 11/2015 | Huang et al. |
| 9,190,263 | B2 | 11/2015 | Ishikawa et al. |

(56) References Cited

U.S. PATENT DOCUMENTS

| | | | |
|---|---|---|---|
| 9,190,264 | B2 | 11/2015 | Yuasa et al. |
| 9,196,483 | B1 | 11/2015 | Lee et al. |
| D745,641 | S | 12/2015 | Blum |
| 9,202,727 | B2 | 12/2015 | Dunn et al. |
| 9,214,333 | B1 | 12/2015 | Sims et al. |
| 9,214,340 | B2 | 12/2015 | Kurita et al. |
| 9,219,006 | B2 | 12/2015 | Chatterjee |
| 9,223,203 | B2 | 12/2015 | Farm et al. |
| 9,228,259 | B2 | 1/2016 | Haukka et al. |
| 9,240,412 | B2 | 1/2016 | Xie et al. |
| 9,245,742 | B2 | 1/2016 | Haukka |
| 9,252,024 | B2 | 2/2016 | Lam et al. |
| 9,252,238 | B1 | 2/2016 | Trevino et al. |
| 9,257,274 | B2 | 2/2016 | Kang et al. |
| 9,263,298 | B2 | 2/2016 | Matsumoto et al. |
| 9,267,204 | B2 | 2/2016 | Honma |
| 9,267,850 | B2 | 2/2016 | Aggarwal |
| D751,176 | S | 3/2016 | Schoenherr et al. |
| 9,275,834 | B1 | 3/2016 | Park et al. |
| 9,281,223 | B2 | 3/2016 | Hara |
| 9,281,277 | B2 | 3/2016 | Baek et al. |
| 9,284,642 | B2 | 3/2016 | Nakano |
| 9,287,273 | B2 | 3/2016 | Ragnarsson et al. |
| 9,297,705 | B2 | 3/2016 | Aggarwal |
| 9,299,557 | B2 | 3/2016 | Tolle et al. |
| 9,299,595 | B2 | 3/2016 | Dunn et al. |
| D753,269 | S | 4/2016 | Yamagishi et al. |
| D753,629 | S | 4/2016 | Plattard |
| 9,305,836 | B1 | 4/2016 | Gates et al. |
| 9,309,598 | B2 | 4/2016 | Wang et al. |
| 9,309,978 | B2 | 4/2016 | Hatch et al. |
| 9,310,684 | B2 | 4/2016 | Meyers et al. |
| 9,312,155 | B2 | 4/2016 | Mori |
| 9,315,897 | B2 | 4/2016 | Byun |
| 9,324,811 | B2 | 4/2016 | Weeks |
| 9,324,846 | B1 | 4/2016 | Camillo |
| D756,929 | S | 5/2016 | Harck et al. |
| 9,331,200 | B1 | 5/2016 | Wang et al. |
| 9,337,031 | B2 | 5/2016 | Kim et al. |
| 9,337,054 | B2 | 5/2016 | Hunks et al. |
| 9,337,057 | B2 | 5/2016 | Park et al. |
| 9,341,296 | B2 | 5/2016 | Yednak |
| 9,343,297 | B1 | 5/2016 | Fukazawa et al. |
| 9,343,308 | B2 | 5/2016 | Isii |
| 9,343,343 | B2 | 5/2016 | Mori |
| 9,343,350 | B2 | 5/2016 | Arai |
| 9,349,620 | B2 | 5/2016 | Kamata et al. |
| 9,353,440 | B2 | 5/2016 | Ge et al. |
| 9,353,441 | B2 | 5/2016 | Chung |
| 9,355,876 | B2 | 5/2016 | Reuter et al. |
| 9,355,882 | B2 | 5/2016 | Wu et al. |
| D759,137 | S | 6/2016 | Hassan |
| D759,193 | S | 6/2016 | Gutierrez et al. |
| 9,362,107 | B2 | 6/2016 | Thadani et al. |
| 9,362,137 | B2 | 6/2016 | Kang et al. |
| 9,362,180 | B2 | 6/2016 | Lee et al. |
| 9,365,924 | B2 | 6/2016 | Nonaka |
| 9,368,352 | B2 | 6/2016 | Takamure et al. |
| 9,370,863 | B2 | 6/2016 | Tsuji et al. |
| 9,378,969 | B2 | 6/2016 | Hsu et al. |
| D761,325 | S | 7/2016 | Abed |
| 9,384,987 | B2 | 7/2016 | Jung et al. |
| 9,390,909 | B2 | 7/2016 | Pasquale et al. |
| 9,394,608 | B2 | 7/2016 | Shero et al. |
| 9,396,934 | B2 | 7/2016 | Tolle |
| 9,396,956 | B1 | 7/2016 | Fukazawa |
| 9,399,228 | B2 | 7/2016 | Breiling et al. |
| D764,196 | S | 8/2016 | Handler et al. |
| 9,404,587 | B2 | 8/2016 | Shugrue |
| 9,412,564 | B2 | 8/2016 | Milligan |
| 9,412,581 | B2 | 8/2016 | Thadani et al. |
| 9,412,582 | B2 | 8/2016 | Sasaki et al. |
| 9,418,885 | B2 | 8/2016 | Sung et al. |
| 9,425,078 | B2 | 8/2016 | Tang et al. |
| 9,428,833 | B1 | 8/2016 | Duvall et al. |
| 9,443,725 | B2 | 9/2016 | Liu et al. |
| 9,447,498 | B2 | 9/2016 | Shiba et al. |
| 9,449,793 | B2 | 9/2016 | Shaji et al. |
| 9,449,795 | B2 | 9/2016 | Sabri et al. |
| 9,449,843 | B1 | 9/2016 | Korolik et al. |
| 9,449,987 | B1 | 9/2016 | Miyata et al. |
| 9,455,138 | B1 | 9/2016 | Fukazawa |
| 9,455,177 | B1 | 9/2016 | Park et al. |
| 9,460,954 | B2 | 10/2016 | De Jong et al. |
| 9,464,352 | B2 | 10/2016 | Nakano et al. |
| 9,472,410 | B2 | 10/2016 | Sadjadi et al. |
| 9,472,432 | B1 | 10/2016 | Blank |
| 9,474,163 | B2 | 10/2016 | Tolle et al. |
| 9,478,414 | B2 | 10/2016 | Kobayashi et al. |
| 9,478,415 | B2 | 10/2016 | Kimura |
| D770,993 | S | 11/2016 | Yoshida et al. |
| 9,484,191 | B2 | 11/2016 | Winkler |
| 9,496,225 | B1 | 11/2016 | Adusumilli et al. |
| 9,514,927 | B2 | 12/2016 | Tolle et al. |
| 9,514,932 | B2 | 12/2016 | Mallick et al. |
| 9,520,289 | B2 | 12/2016 | Park et al. |
| 9,523,148 | B1 | 12/2016 | Pore et al. |
| D777,546 | S | 1/2017 | Ishii et al. |
| 9,543,180 | B2 | 1/2017 | Kamiya |
| 9,556,516 | B2 | 1/2017 | Takamure |
| 9,558,931 | B2 | 1/2017 | Tang |
| 9,564,312 | B2 | 2/2017 | Henri et al. |
| 9,564,314 | B2 | 2/2017 | Takamure et al. |
| 9,570,302 | B1 | 2/2017 | Chang et al. |
| 9,574,268 | B1 | 2/2017 | Dunn et al. |
| 9,576,952 | B2 | 2/2017 | Joshi et al. |
| 9,583,333 | B2 | 2/2017 | Chatterjee |
| 9,583,345 | B2 | 2/2017 | Chen et al. |
| D782,419 | S | 3/2017 | Willette |
| 9,589,770 | B2 | 3/2017 | Winkler |
| 9,605,342 | B2 | 3/2017 | Alokozai et al. |
| 9,605,343 | B2 | 3/2017 | Winkler |
| 9,605,736 | B1 | 3/2017 | Foshage et al. |
| 9,607,837 | B1 | 3/2017 | Namba |
| D783,351 | S | 4/2017 | Fujino et al. |
| D784,276 | S | 4/2017 | Tiner et al. |
| 9,613,801 | B2 | 4/2017 | Carcasi et al. |
| 9,618,846 | B2 | 4/2017 | Shamma et al. |
| 9,627,221 | B1 | 4/2017 | Zaitsu et al. |
| D785,766 | S | 5/2017 | Sato |
| D787,458 | S | 5/2017 | Kim et al. |
| 9,640,416 | B2 | 5/2017 | Arai |
| 9,640,448 | B2 | 5/2017 | Ikegawa et al. |
| 9,640,542 | B2 | 5/2017 | Lee et al. |
| 9,644,266 | B2 | 5/2017 | Nasu et al. |
| 9,647,114 | B2 | 5/2017 | Margetis |
| 9,653,267 | B2 | 5/2017 | Carducci et al. |
| 9,657,845 | B2 | 5/2017 | Shugrue |
| 9,659,799 | B2 | 5/2017 | Lawson |
| 9,663,857 | B2 | 5/2017 | Nakano et al. |
| 9,666,528 | B1 | 5/2017 | Bergendahl et al. |
| D789,888 | S | 6/2017 | Jang et al. |
| D790,041 | S | 6/2017 | Jang et al. |
| 9,680,268 | B1 | 6/2017 | Finona |
| 9,684,234 | B2 | 6/2017 | Darling et al. |
| 9,685,320 | B2 | 6/2017 | Kang et al. |
| 9,691,668 | B2 | 6/2017 | Chang et al. |
| 9,691,771 | B2 | 6/2017 | Lansalot-Matras |
| 9,698,031 | B2 | 7/2017 | Kobayashi et al. |
| 9,708,707 | B2 | 7/2017 | Ditizio et al. |
| 9,708,708 | B2 | 7/2017 | Isobe et al. |
| 9,711,345 | B2 | 7/2017 | Shiba et al. |
| D793,352 | S | 8/2017 | Hill |
| D793,526 | S | 8/2017 | Behdjat |
| D793,572 | S | 8/2017 | Kozuka et al. |
| D793,976 | S | 8/2017 | Fukushima et al. |
| D794,753 | S | 8/2017 | Miller |
| D795,208 | S | 8/2017 | Sasaki et al. |
| 9,735,024 | B2 | 8/2017 | Zaitsu |
| 9,741,546 | B2 | 8/2017 | Carducci et al. |
| 9,741,559 | B2 | 8/2017 | Shimura et al. |
| 9,745,658 | B2 | 8/2017 | Kang et al. |
| 9,748,104 | B2 | 8/2017 | Sasaki et al. |
| 9,748,145 | B1 | 8/2017 | Kannan et al. |

(56) References Cited

U.S. PATENT DOCUMENTS

D796,458 S 9/2017 Jang et al.
D796,670 S 9/2017 Dolk et al.
D797,067 S 9/2017 Zhang et al.
D798,248 S 9/2017 Hanson et al.
9,754,779 B1 9/2017 Ishikawa
9,754,818 B2 9/2017 Shiu et al.
9,759,489 B2 9/2017 Kaneko
9,765,432 B2 9/2017 Ge et al.
9,773,818 B2 9/2017 Kimura
D800,782 S 10/2017 Bever et al.
9,778,561 B2 10/2017 Marks et al.
9,780,225 B2 10/2017 Venkatasubramanian et al.
9,786,491 B2 10/2017 Suzuki et al.
9,786,570 B2 10/2017 Kang et al.
9,790,595 B2 10/2017 Jung et al.
9,793,115 B2 10/2017 Tolle
9,793,135 B1 10/2017 Zaitsu et al.
9,793,148 B2 10/2017 Yamagishi et al.
9,798,308 B2 10/2017 Mimura
9,799,736 B1 10/2017 Ebrish et al.
9,803,926 B2 10/2017 Kikuchi et al.
D801,942 S 11/2017 Riker et al.
D802,472 S 11/2017 Sasaki et al.
D802,546 S 11/2017 Jang et al.
D803,802 S 11/2017 Sasaki et al.
9,808,246 B2 11/2017 Shelton et al.
9,812,319 B1 11/2017 Fukazawa et al.
9,812,320 B1 11/2017 Pore et al.
9,812,372 B2 11/2017 Choi et al.
9,820,289 B1 11/2017 Pawar et al.
9,824,881 B2 11/2017 Niskanen et al.
9,824,884 B1 11/2017 Sims et al.
9,824,893 B1 11/2017 Smith et al.
9,837,355 B2 12/2017 Briggs et al.
9,842,835 B1 12/2017 Cheng et al.
9,847,221 B1 12/2017 McLaughlin et al.
9,847,247 B2 12/2017 Huang et al.
9,850,573 B1 12/2017 Sun
D807,494 S 1/2018 Kim et al.
D808,254 S 1/2018 Deleu
9,859,151 B1 1/2018 Zhu
9,865,455 B1 1/2018 Sims et al.
9,865,456 B1 1/2018 Pandey et al.
9,865,815 B2 1/2018 Hausmann
9,868,131 B2 1/2018 Kilpi et al.
9,870,964 B1 1/2018 Yoshino et al.
9,875,891 B2 1/2018 Henri et al.
9,875,893 B2 1/2018 Takamure et al.
9,881,788 B2 1/2018 Kim et al.
D810,705 S 2/2018 Krishnan et al.
9,887,082 B1 2/2018 Pore et al.
9,890,456 B2 2/2018 Tolle et al.
9,891,521 B2 2/2018 Kang et al.
9,892,908 B2 2/2018 Pettinger et al.
9,892,913 B2 2/2018 Margetis et al.
9,895,715 B2 2/2018 Haukka et al.
9,899,291 B2 2/2018 Kato
9,899,405 B2 2/2018 Kim
9,905,420 B2 2/2018 Margetis et al.
9,905,492 B2 2/2018 Tang et al.
9,909,214 B2 3/2018 Suemori
9,909,492 B2 3/2018 Jeswine
9,911,595 B1 3/2018 Smith et al.
9,911,676 B2 3/2018 Tang
9,916,980 B1 3/2018 Knaepen
9,920,451 B2 3/2018 Sivaramakrishnan et al.
9,922,824 B2 3/2018 Okada
9,929,005 B1 3/2018 Shimamoto et al.
9,929,011 B2 3/2018 Hawryluk et al.
9,929,055 B2 3/2018 Dube et al.
9,951,421 B2 4/2018 Lind
9,960,033 B1 5/2018 Nozawa
9,960,072 B2 5/2018 Coomer
9,966,299 B2 5/2018 Tang et al.
9,970,112 B2 5/2018 Koshi et al.
9,984,869 B1 5/2018 Blanquart
D819,580 S 6/2018 Krishnan et al.
9,987,747 B2 6/2018 Hwang et al.
9,991,138 B2 6/2018 Lin et al.
9,996,004 B2 6/2018 Smith et al.
9,997,357 B2 6/2018 Arghavani et al.
9,997,373 B2 6/2018 Hudson
10,032,628 B2 6/2018 Xie et al.
10,014,212 B2 7/2018 Chen et al.
10,017,856 B1 7/2018 Arnepalli et al.
10,018,920 B2 7/2018 Chang et al.
10,023,960 B2 7/2018 Alokozai
10,032,792 B2 7/2018 Kim et al.
D825,505 S 8/2018 Hanson et al.
D825,614 S 8/2018 Bever et al.
10,043,661 B2 8/2018 Kato et al.
10,047,435 B2 8/2018 Haukka et al.
10,053,774 B2 8/2018 Tolle et al.
10,060,473 B2 8/2018 Davey et al.
D827,592 S 9/2018 Ichino et al.
D829,306 S 9/2018 Ikedo et al.
10,083,836 B2 9/2018 Milligan
D830,981 S 10/2018 Jeong et al.
10,087,522 B2 10/2018 Raisanen et al.
10,087,525 B2 10/2018 Schmotzer et al.
10,090,316 B2 10/2018 Ootsuka
10,103,040 B1 10/2018 Oosterlaken et al.
10,106,892 B1 10/2018 Siddiqui et al.
RE47,145 E 11/2018 Hashimoto
D834,686 S 11/2018 Yamada et al.
10,121,671 B2 11/2018 Fu et al.
10,134,617 B2 11/2018 Gurary et al.
10,134,757 B2 11/2018 Chun et al.
RE47,170 E 12/2018 Beynet et al.
10,147,600 B2 12/2018 Takamure et al.
10,167,557 B2 1/2019 Hawkins et al.
10,177,024 B2 1/2019 Gomm et al.
10,177,025 B2 1/2019 Pore
10,179,947 B2 1/2019 Fukazawa
10,186,420 B2 1/2019 Fukazawa
10,190,213 B2 1/2019 Zhu et al.
10,190,214 B2 1/2019 Shon et al.
10,190,701 B2 1/2019 Raj et al.
10,192,734 B2 1/2019 Sanchez et al.
10,193,429 B2 1/2019 Smith et al.
D840,364 S 2/2019 Ichino et al.
10,204,788 B1 2/2019 Ye et al.
10,211,308 B2 2/2019 Zhu et al.
10,229,833 B2 3/2019 Raisanen et al.
10,229,851 B2 3/2019 Briggs et al.
10,229,985 B1 3/2019 Li et al.
10,236,177 B1 3/2019 Kohen et al.
D846,008 S 4/2019 Geldenhuys et al.
10,249,524 B2 4/2019 den Hartog Besselink et al.
10,249,577 B2 4/2019 Lee et al.
10,262,859 B2 4/2019 Margetis et al.
10,269,558 B2 4/2019 Blanquart et al.
10,276,355 B2 4/2019 White et al.
D849,055 S 5/2019 Kneip
D849,662 S 5/2019 Rike
10,283,353 B2 5/2019 Kobayashi et al.
10,287,684 B2 5/2019 Yanai et al.
10,290,508 B1 5/2019 Kubota et al.
10,297,440 B2 5/2019 Yamazaki et al.
RE47,440 E 6/2019 Yudovsky et al.
10,312,055 B2 6/2019 Suzuki
10,312,129 B2 6/2019 Coomer
10,319,588 B2 6/2019 Mattinen et al.
10,322,384 B2 6/2019 Stumpf et al.
10,332,747 B1 6/2019 Watanabe et al.
10,332,963 B1 6/2019 Xie
D855,089 S 7/2019 Hopkins
10,340,125 B2 7/2019 Winkler
10,340,135 B2 7/2019 Blanquart
10,343,920 B2 7/2019 Haukka
10,347,547 B2 7/2019 Varadarajan et al.
10,354,873 B2 7/2019 Ko et al.
10,361,201 B2 7/2019 Xie et al.
10,361,366 B2 7/2019 Hakamata et al.

(56) References Cited

U.S. PATENT DOCUMENTS 10,367,080 B2 7/2019 Tang et al.
10,388,513 B1 8/2019 Blanquart
10,395,917 B2 8/2019 Niskanen et al.
10,395,919 B2 8/2019 Masaru et al.
10,395,963 B2 8/2019 Cooke
D859,136 S 9/2019 Tenander et al.
10,400,335 B2 9/2019 Ge et al.
10,410,943 B2 9/2019 Jiang et al.
10,424,476 B2 9/2019 Suzuki et al.
10,424,477 B2 9/2019 Niskanen et al.
D864,134 S 10/2019 Watarai et al.
10,428,419 B2 10/2019 Huotari et al.
10,435,790 B2 10/2019 Fukazawa et al.
D867,867 S 11/2019 Tenander et al.
10,468,244 B2 11/2019 Li et al.
10,468,251 B2 11/2019 Ishikawa et al.
10,483,154 B1 11/2019 Smith et al.
10,510,529 B2 12/2019 Suzuki et al.
10,510,871 B1 12/2019 More et al.
10,529,554 B2 1/2020 Ishikawa et al.
D876,504 S 2/2020 Lee et al.
10,590,531 B1 3/2020 Shirako et al.
10,590,535 B2 3/2020 Huggare
10,600,637 B2 3/2020 Suzuki et al.
D880,437 S 4/2020 Lee et al.
D881,338 S 4/2020 Chen
10,622,196 B2 4/2020 Nagayama et al.
10,622,236 B2 4/2020 Kuo et al.
10,648,788 B2 5/2020 Boyd et al.
10,662,525 B2 5/2020 Jang et al.
10,704,143 B1 7/2020 Hisamitsu et al.
10,714,335 B2 7/2020 Kim et al.
10,731,249 B2 8/2020 Hatanpää et al.
10,734,497 B2 8/2020 Zhu et al.
10,741,386 B2 8/2020 Chen et al.
10,763,139 B2 9/2020 Shindo
10,770,336 B2 9/2020 Hill et al.
D900,036 S 10/2020 Wuester et al.
D903,477 S 12/2020 Goratela et al.
D913,980 S 3/2021 Lee et al.
D914,620 S 3/2021 Rokkam et al.
10,950,477 B2 3/2021 Lin et al.
11,018,003 B2 5/2021 Huang et al.
D922,229 S 6/2021 Jun et al.
11,053,584 B2 7/2021 Hsieh et al.
2001/0000141 A1 4/2001 Zhou et al.
2001/0001953 A1 5/2001 Griffiths et al.
2001/0002581 A1 6/2001 Nishikawa et al.
2001/0003015 A1 6/2001 Chang et al.
2001/0003191 A1 6/2001 Kovacs et al.
2001/0003271 A1 6/2001 Otsuki
2001/0004880 A1 6/2001 Cho et al.
2001/0006070 A1 7/2001 Shang
2001/0007244 A1 7/2001 Matsuse
2001/0007246 A1 7/2001 Ueda et al.
2001/0007645 A1 7/2001 Honma
2001/0014267 A1 8/2001 Yamaga et al.
2001/0014514 A1 8/2001 Geusic
2001/0015343 A1 8/2001 Sprey et al.
2001/0016273 A1 8/2001 Narasimhan et al.
2001/0017103 A1 8/2001 Takeshita et al.
2001/0018267 A1 8/2001 Shinriki et al.
2001/0019347 A1 9/2001 Hauck
2001/0019777 A1 9/2001 Tanaka et al.
2001/0019900 A1 9/2001 Hasegawa
2001/0020715 A1 9/2001 Yamasaki
2001/0021591 A1 9/2001 Srinivasan et al.
2001/0022215 A1 9/2001 Donohoe
2001/0024387 A1 9/2001 Raaijmakers et al.
2001/0027026 A1 10/2001 Dhindsa et al.
2001/0027585 A1 10/2001 Lee
2001/0028924 A1 10/2001 Sherman
2001/0031535 A1 10/2001 Agnello et al.
2001/0031541 A1 10/2001 Madan et al.
2001/0034097 A1 10/2001 Lim et al.
2001/0038783 A1 11/2001 Nakashima et al.
2001/0039922 A1 11/2001 Nakahara
2001/0039966 A1 11/2001 Walpole et al.
2001/0040511 A1 11/2001 Bushner et al.
2001/0041250 A1 11/2001 Werkhoven et al.
2001/0042511 A1 11/2001 Liu et al.
2001/0042514 A1 11/2001 Mizuno et al.
2001/0042594 A1 11/2001 Shamouilian et al.
2001/0046765 A1 11/2001 Cappellani et al.
2001/0047761 A1 12/2001 Wijck et al.
2001/0048981 A1 12/2001 Suzuki
2001/0049080 A1 12/2001 Asano
2001/0049202 A1 12/2001 Maeda et al.
2001/0052556 A1 12/2001 Ting et al.
2001/0054381 A1 12/2001 Umotoy et al.
2001/0054388 A1 12/2001 Qian
2002/0000195 A1 1/2002 Bang et al.
2002/0000202 A1 1/2002 Yuda et al.
2002/0001971 A1 1/2002 Cho
2002/0001974 A1 1/2002 Chan
2002/0001976 A1 1/2002 Danek
2002/0005400 A1 1/2002 Gat et al.
2002/0005943 A1 1/2002 Voinalovich
2002/0008270 A1 1/2002 Marsh
2002/0009119 A1 1/2002 Matthew et al.
2002/0009560 A1 1/2002 Ozono
2002/0009861 A1 1/2002 Narwankar et al.
2002/0011210 A1 1/2002 Satoh et al.
2002/0011211 A1 1/2002 Halpin
2002/0011310 A1 1/2002 Kamarehi et al.
2002/0013792 A1 1/2002 Imielinski et al.
2002/0014204 A1 2/2002 Pyo
2002/0014483 A1 2/2002 Suzuki et al.
2002/0015853 A1 2/2002 Wataya et al.
2002/0016829 A1 2/2002 Defosse
2002/0020429 A1 2/2002 Selbrede et al.
2002/0022347 A1 2/2002 Park et al.
2002/0023677 A1 2/2002 Zheng
2002/0025688 A1 2/2002 Kato
2002/0027945 A1 3/2002 Hirano et al.
2002/0030047 A1 3/2002 Shao et al.
2002/0031644 A1 3/2002 Malofsky et al.
2002/0033183 A1 3/2002 Sun et al.
2002/0036065 A1 3/2002 Yamagishi et al.
2002/0041931 A1 4/2002 Suntola et al.
2002/0043337 A1 4/2002 Goodman et al.
2002/0045336 A1 4/2002 Locati et al.
2002/0047705 A1 4/2002 Tada et al.
2002/0048634 A1 4/2002 Basceri
2002/0050648 A1 5/2002 Kishida et al.
2002/0052119 A1 5/2002 Cleemput
2002/0061716 A1 5/2002 Korovin et al.
2002/0062633 A1 5/2002 Denker et al.
2002/0064592 A1 5/2002 Datta et al.
2002/0064598 A1 5/2002 Wang et al.
2002/0066532 A1 6/2002 Shih et al.
2002/0068458 A1 6/2002 Chiang et al.
2002/0069222 A1 6/2002 McNeely
2002/0073922 A1 6/2002 Frankel et al.
2002/0073923 A1 6/2002 Saito et al.
2002/0076490 A1 6/2002 Chiang et al.
2002/0076507 A1 6/2002 Chiang et al.
2002/0076944 A1 6/2002 Wang et al.
2002/0078893 A1 6/2002 Van Os et al.
2002/0079056 A1 6/2002 Kudo et al.
2002/0079714 A1 6/2002 Soucy et al.
2002/0081826 A1 6/2002 Rotondaro et al.
2002/0086501 A1 7/2002 O'Donnell et al.
2002/0088542 A1 7/2002 Nishikawa et al.
2002/0090735 A1 7/2002 Kishkovich et al.
2002/0094378 A1 7/2002 O'Donnell et al.
2002/0094388 A1 7/2002 Fonash et al.
2002/0096211 A1 7/2002 Zheng
2002/0098627 A1 7/2002 Pomarede et al.
2002/0099470 A1 7/2002 Zinger et al.
2002/0100418 A1 8/2002 Sandhu et al.
2002/0104481 A1 8/2002 Chiang et al.
2002/0104751 A1 8/2002 Drewery et al.
2002/0106909 A1 8/2002 Kato et al.

(56) References Cited

U.S. PATENT DOCUMENTS

| | | | |
|---|---|---|---|
| 2002/0108570 | A1 | 8/2002 | Lindfors |
| 2002/0108670 | A1 | 8/2002 | Baker et al. |
| 2002/0108714 | A1 | 8/2002 | Doering et al. |
| 2002/0109115 | A1 | 8/2002 | Cederstav et al. |
| 2002/0110695 | A1 | 8/2002 | Yang et al. |
| 2002/0110991 | A1 | 8/2002 | Li |
| 2002/0112114 | A1 | 8/2002 | Blair et al. |
| 2002/0114886 | A1 | 8/2002 | Chou et al. |
| 2002/0115252 | A1 | 8/2002 | Haukka et al. |
| 2002/0117113 | A1 | 8/2002 | Tsuruno et al. |
| 2002/0117262 | A1 | 8/2002 | Pang et al. |
| 2002/0122885 | A1 | 9/2002 | Ahn |
| 2002/0123200 | A1 | 9/2002 | Yamamoto et al. |
| 2002/0123230 | A1 | 9/2002 | Hubacek |
| 2002/0123237 | A1 | 9/2002 | Nguyen et al. |
| 2002/0124883 | A1 | 9/2002 | Zheng |
| 2002/0124906 | A1 | 9/2002 | Suzuki et al. |
| 2002/0127350 | A1 | 9/2002 | Ishikawa |
| 2002/0127956 | A1 | 9/2002 | Ashjaee et al. |
| 2002/0129768 | A1 | 9/2002 | Carpenter et al. |
| 2002/0132408 | A1 | 9/2002 | Ma et al. |
| 2002/0134511 | A1 | 9/2002 | Ushioda et al. |
| 2002/0136214 | A1 | 9/2002 | Do et al. |
| 2002/0136909 | A1 | 9/2002 | Yang |
| 2002/0139775 | A1 | 10/2002 | Chang |
| 2002/0146512 | A1 | 10/2002 | Rossman |
| 2002/0151327 | A1 | 10/2002 | Levitt |
| 2002/0152244 | A1 | 10/2002 | Dean et al. |
| 2002/0155219 | A1 | 10/2002 | Wang et al. |
| 2002/0155708 | A1 | 10/2002 | Lo et al. |
| 2002/0157611 | A1 | 10/2002 | Bondestam et al. |
| 2002/0160112 | A1 | 10/2002 | Sakai et al. |
| 2002/0164420 | A1 | 11/2002 | Derderian et al. |
| 2002/0164423 | A1 | 11/2002 | Chiang et al. |
| 2002/0168870 | A1 | 11/2002 | Matsuki |
| 2002/0170676 | A1 | 11/2002 | Mitrovic et al. |
| 2002/0172768 | A1 | 11/2002 | Endo et al. |
| 2002/0174106 | A1 | 11/2002 | Martin |
| 2002/0179011 | A1 | 12/2002 | Jonnalagadda et al. |
| 2002/0181612 | A1 | 12/2002 | Warble et al. |
| 2002/0184111 | A1 | 12/2002 | Swanson |
| 2002/0187650 | A1 | 12/2002 | Blalock et al. |
| 2002/0187656 | A1 | 12/2002 | Tan et al. |
| 2002/0188376 | A1 | 12/2002 | Derderian et al. |
| 2002/0192370 | A1 | 12/2002 | Metzner et al. |
| 2002/0197402 | A1 | 12/2002 | Chiang et al. |
| 2002/0197849 | A1 | 12/2002 | Mandal |
| 2003/0000647 | A1 | 1/2003 | Yudovsky et al. |
| 2003/0002562 | A1 | 1/2003 | Yerlikaya et al. |
| 2003/0003607 | A1 | 1/2003 | Kagoshima |
| 2003/0003635 | A1 | 1/2003 | Paranjpe et al. |
| 2003/0003696 | A1 | 1/2003 | Gelatos et al. |
| 2003/0003719 | A1 | 1/2003 | Lim et al. |
| 2003/0008528 | A1 | 1/2003 | Xia et al. |
| 2003/0008602 | A1 | 1/2003 | Ashjaee et al. |
| 2003/0010355 | A1 | 1/2003 | Nowak et al. |
| 2003/0010451 | A1 | 1/2003 | Tzu |
| 2003/0010452 | A1 | 1/2003 | Park et al. |
| 2003/0012632 | A1 | 1/2003 | Saeki |
| 2003/0013314 | A1 | 1/2003 | Ying et al. |
| 2003/0015141 | A1 | 1/2003 | Takagi |
| 2003/0015294 | A1 | 1/2003 | Wang |
| 2003/0015596 | A1 | 1/2003 | Evans |
| 2003/0017265 | A1 | 1/2003 | Basceri et al. |
| 2003/0017266 | A1 | 1/2003 | Basceri et al. |
| 2003/0017268 | A1 | 1/2003 | Hu |
| 2003/0019428 | A1 | 1/2003 | Ku et al. |
| 2003/0019580 | A1 | 1/2003 | Strang |
| 2003/0022468 | A1 | 1/2003 | Shioya et al. |
| 2003/0022523 | A1 | 1/2003 | Irino et al. |
| 2003/0023338 | A1 | 1/2003 | Chin et al. |
| 2003/0024901 | A1 | 2/2003 | Ishikawa |
| 2003/0025146 | A1 | 2/2003 | Narwankar et al. |
| 2003/0026904 | A1 | 2/2003 | Yadav et al. |
| 2003/0027431 | A1 | 2/2003 | Sneh et al. |
| 2003/0029303 | A1 | 2/2003 | Hasegawa et al. |
| 2003/0029381 | A1 | 2/2003 | Nishibayashi |
| 2003/0029475 | A1 | 2/2003 | Hua et al. |
| 2003/0029563 | A1 | 2/2003 | Kaushal et al. |
| 2003/0032297 | A1 | 2/2003 | Lindstrom et al. |
| 2003/0035002 | A1 | 2/2003 | Moles |
| 2003/0035705 | A1 | 2/2003 | Johnson |
| 2003/0036272 | A1 | 2/2003 | Shamouilian et al. |
| 2003/0037800 | A1 | 2/2003 | Bailey et al. |
| 2003/0040120 | A1 | 2/2003 | Allen et al. |
| 2003/0040158 | A1 | 2/2003 | Saitoh |
| 2003/0040196 | A1 | 2/2003 | Lim et al. |
| 2003/0040841 | A1 | 2/2003 | Nasr et al. |
| 2003/0041971 | A1 | 3/2003 | Kido et al. |
| 2003/0042419 | A1 | 3/2003 | Katsumata et al. |
| 2003/0045961 | A1 | 3/2003 | Nakao |
| 2003/0049372 | A1 | 3/2003 | Cook et al. |
| 2003/0049375 | A1 | 3/2003 | Nguyen et al. |
| 2003/0049499 | A1 | 3/2003 | Murakawa et al. |
| 2003/0049571 | A1 | 3/2003 | Hallock et al. |
| 2003/0049580 | A1 | 3/2003 | Goodman |
| 2003/0049937 | A1 | 3/2003 | Suzuki |
| 2003/0054670 | A1 | 3/2003 | Wang et al. |
| 2003/0056726 | A1 | 3/2003 | Holst et al. |
| 2003/0057848 | A1 | 3/2003 | Yuasa et al. |
| 2003/0059535 | A1 | 3/2003 | Luo et al. |
| 2003/0059980 | A1 | 3/2003 | Chen et al. |
| 2003/0062359 | A1 | 4/2003 | Ho et al. |
| 2003/0065413 | A1 | 4/2003 | Liteplo et al. |
| 2003/0066482 | A1 | 4/2003 | Pokharna et al. |
| 2003/0066541 | A1 | 4/2003 | Sun et al. |
| 2003/0066826 | A1 | 4/2003 | Lee et al. |
| 2003/0070617 | A1 | 4/2003 | Kim et al. |
| 2003/0071015 | A1 | 4/2003 | Chinn et al. |
| 2003/0072882 | A1 | 4/2003 | Niinisto et al. |
| 2003/0075107 | A1 | 4/2003 | Miyano et al. |
| 2003/0075925 | A1 | 4/2003 | Lindfors et al. |
| 2003/0077857 | A1 | 4/2003 | Xia et al. |
| 2003/0077883 | A1 | 4/2003 | Ohtake |
| 2003/0082296 | A1 | 5/2003 | Elers et al. |
| 2003/0082307 | A1 | 5/2003 | Chung et al. |
| 2003/0085663 | A1 | 5/2003 | Horsky |
| 2003/0091938 | A1 | 5/2003 | Fairbairn et al. |
| 2003/0094133 | A1 | 5/2003 | Yoshidome et al. |
| 2003/0101938 | A1 | 6/2003 | Ronsse et al. |
| 2003/0109107 | A1 | 6/2003 | Hsieh et al. |
| 2003/0109951 | A1 | 6/2003 | Hsiung et al. |
| 2003/0111012 | A1 | 6/2003 | Takeshima |
| 2003/0111013 | A1 | 6/2003 | Oosterlaken et al. |
| 2003/0111963 | A1 | 6/2003 | Tolmachev et al. |
| 2003/0113995 | A1 | 6/2003 | Xia et al. |
| 2003/0116087 | A1 | 6/2003 | Nguyen |
| 2003/0121608 | A1 | 7/2003 | Chen |
| 2003/0124792 | A1 | 7/2003 | Jeon et al. |
| 2003/0124818 | A1 | 7/2003 | Luo et al. |
| 2003/0124820 | A1 | 7/2003 | Johnsgard et al. |
| 2003/0124842 | A1 | 7/2003 | Hytros et al. |
| 2003/0127049 | A1 | 7/2003 | Han et al. |
| 2003/0132319 | A1 | 7/2003 | Hytros et al. |
| 2003/0133854 | A1 | 7/2003 | Tabata et al. |
| 2003/0134038 | A1 | 7/2003 | Paranjpe |
| 2003/0140851 | A1 | 7/2003 | Janakiraman et al. |
| 2003/0141527 | A1 | 7/2003 | Joo et al. |
| 2003/0141820 | A1 | 7/2003 | White et al. |
| 2003/0143328 | A1 | 7/2003 | Chen |
| 2003/0143846 | A1 | 7/2003 | Sekiya et al. |
| 2003/0145789 | A1 | 8/2003 | Bauch et al. |
| 2003/0149506 | A1 | 8/2003 | Haanstra et al. |
| 2003/0150386 | A1 | 8/2003 | Shimada |
| 2003/0153177 | A1 | 8/2003 | Tepman et al. |
| 2003/0153186 | A1 | 8/2003 | Bar-Gadda |
| 2003/0157345 | A1 | 8/2003 | Beldi et al. |
| 2003/0157432 | A1 | 8/2003 | Rottsegge |
| 2003/0157436 | A1 | 8/2003 | Manger et al. |
| 2003/0159653 | A1 | 8/2003 | Dando et al. |
| 2003/0159656 | A1 | 8/2003 | Tan |
| 2003/0162412 | A1 | 8/2003 | Chung |
| 2003/0168001 | A1 | 9/2003 | Sneh |
| 2003/0168008 | A1 | 9/2003 | Ohmi et al. |

(56) References Cited

U.S. PATENT DOCUMENTS

2003/0168012 A1 9/2003 Tamura et al.
2003/0168174 A1 9/2003 Foree
2003/0168699 A1 9/2003 Honda
2003/0168750 A1 9/2003 Basceri et al.
2003/0168948 A1 9/2003 Yamagishi et al.
2003/0170153 A1 9/2003 Bar-Gadda
2003/0170583 A1 9/2003 Nakashima
2003/0170945 A1 9/2003 Igeta et al.
2003/0173030 A1 9/2003 Ishii
2003/0173490 A1 9/2003 Lappen
2003/0176074 A1 9/2003 Paterson et al.
2003/0178145 A1 9/2003 Anderson et al.
2003/0180458 A1 9/2003 Sneh
2003/0181065 A1 9/2003 O'Donnell
2003/0183156 A1 10/2003 Dando
2003/0183856 A1 10/2003 Wieczorek et al.
2003/0188682 A1 10/2003 Tois et al.
2003/0188685 A1 10/2003 Wang
2003/0190804 A1 10/2003 Glenn et al.
2003/0192875 A1 10/2003 Bieker et al.
2003/0198587 A1 10/2003 Kaloyeros
2003/0200926 A1 10/2003 Dando et al.
2003/0201541 A1 10/2003 Kim
2003/0205096 A1 11/2003 Gehner et al.
2003/0205202 A1 11/2003 Funaki et al.
2003/0205237 A1 11/2003 Sakuma
2003/0205327 A1 11/2003 Howald et al.
2003/0207032 A1 11/2003 Ahn et al.
2003/0209323 A1 11/2003 Yokogaki
2003/0209326 A1 11/2003 Lee et al.
2003/0209746 A1 11/2003 Horii
2003/0210901 A1 11/2003 Donald et al.
2003/0211735 A1 11/2003 Rossman
2003/0213435 A1 11/2003 Okuda et al.
2003/0213560 A1 11/2003 Wang et al.
2003/0213562 A1 11/2003 Gondhalekar et al.
2003/0215963 A1 11/2003 AmRhein et al.
2003/0217915 A1 11/2003 Ouellet
2003/0219972 A1 11/2003 Green
2003/0221780 A1 12/2003 Lei et al.
2003/0226840 A1 12/2003 Dalton
2003/0228772 A1 12/2003 Cowans
2003/0230986 A1 12/2003 Horsky et al.
2003/0231698 A1 12/2003 Yamaguchi
2003/0232138 A1 12/2003 Tuominen et al.
2003/0232491 A1 12/2003 Yamaguchi
2003/0232497 A1 12/2003 Xi et al.
2003/0232511 A1 12/2003 Metzner et al.
2003/0234371 A1 12/2003 Ziegler
2004/0002224 A1 1/2004 Chono et al.
2004/0005147 A1 1/2004 Wang et al.
2004/0005753 A1 1/2004 Kostamo et al.
2004/0009307 A1 1/2004 Koh et al.
2004/0009679 A1 1/2004 Yeo et al.
2004/0010772 A1 1/2004 McKenna et al.
2004/0011504 A1 1/2004 Ku et al.
2004/0013577 A1 1/2004 Ganguli et al.
2004/0013818 A1 1/2004 Moon et al.
2004/0015300 A1 1/2004 Ganguli et al.
2004/0016637 A1 1/2004 Yang
2004/0018304 A1 1/2004 Chung et al.
2004/0018307 A1 1/2004 Park et al.
2004/0018694 A1 1/2004 Lee et al.
2004/0018723 A1 1/2004 Byun et al.
2004/0018750 A1 1/2004 Sophie et al.
2004/0023125 A1 2/2004 Nozawa et al.
2004/0023516 A1 2/2004 Londergan et al.
2004/0025786 A1 2/2004 Kontani et al.
2004/0025787 A1 2/2004 Selbrede et al.
2004/0026372 A1 2/2004 Takenaka et al.
2004/0029052 A1 2/2004 Park et al.
2004/0031564 A1 2/2004 Gottscho et al.
2004/0035358 A1 2/2004 Basceri et al.
2004/0036129 A1 2/2004 Forbes et al.
2004/0037339 A1 2/2004 Watson et al.
2004/0037675 A1 2/2004 Zinger et al.
2004/0038525 A1 2/2004 Meng et al.
2004/0043149 A1 3/2004 Gordon et al.
2004/0043544 A1 3/2004 Asai et al.
2004/0048439 A1 3/2004 Soman
2004/0048452 A1 3/2004 Sugawara et al.
2004/0048492 A1 3/2004 Ishikawa et al.
2004/0050325 A1 3/2004 Samoilov
2004/0050496 A1 3/2004 Iwai
2004/0052972 A1 3/2004 Schmitt
2004/0056017 A1 3/2004 Renken
2004/0058517 A1 3/2004 Nallan et al.
2004/0062081 A1 4/2004 Drewes
2004/0063289 A1 4/2004 Ohta
2004/0065255 A1 4/2004 Yang et al.
2004/0069226 A1 4/2004 Yoshida et al.
2004/0071897 A1 4/2004 Verplancken et al.
2004/0077182 A1 4/2004 Lim et al.
2004/0079286 A1 4/2004 Lindfors
2004/0079960 A1 4/2004 Shakuda
2004/0080697 A1 4/2004 Song
2004/0082171 A1 4/2004 Shin et al.
2004/0083961 A1 5/2004 Basceri
2004/0083962 A1 5/2004 Bang et al.
2004/0083964 A1 5/2004 Ingle et al.
2004/0083975 A1 5/2004 Tong et al.
2004/0087141 A1 5/2004 Ramanathan et al.
2004/0087168 A1 5/2004 Granneman et al.
2004/0089078 A1 5/2004 Gehner et al.
2004/0089236 A1 5/2004 Yokogawa et al.
2004/0092073 A1 5/2004 Cabral et al.
2004/0092120 A1 5/2004 Wicker
2004/0093963 A1 5/2004 Gehner et al.
2004/0094206 A1 5/2004 Ishida
2004/0094402 A1 5/2004 Gopalraja
2004/0095074 A1 5/2004 Ishii et al.
2004/0099213 A1 5/2004 Adomaitis et al.
2004/0099635 A1 5/2004 Nishikawa
2004/0101622 A1 5/2004 Park et al.
2004/0103914 A1 6/2004 Cheng et al.
2004/0104439 A1 6/2004 Haukka et al.
2004/0105738 A1 6/2004 Ahn et al.
2004/0106249 A1 6/2004 Huotari
2004/0112288 A1 6/2004 Whitesell
2004/0115936 A1 6/2004 DePetrillo et al.
2004/0118342 A1 6/2004 Cheng et al.
2004/0121620 A1 6/2004 Pomarede et al.
2004/0124131 A1 7/2004 Aitchison
2004/0124549 A1 7/2004 Curran
2004/0126213 A1 7/2004 Pelzmann et al.
2004/0126929 A1 7/2004 Tang et al.
2004/0126990 A1 7/2004 Ohta
2004/0127069 A1 7/2004 Yamazaki et al.
2004/0129211 A1 7/2004 Blonigan et al.
2004/0129671 A1 7/2004 Ji et al.
2004/0134429 A1 7/2004 Yamanaka
2004/0137756 A1 7/2004 Li et al.
2004/0142577 A1 7/2004 Sugawara et al.
2004/0144311 A1 7/2004 Chen
2004/0144323 A1 7/2004 Kai
2004/0144980 A1 7/2004 Ahn et al.
2004/0146644 A1 7/2004 Xia et al.
2004/0151844 A1 8/2004 Zhang et al.
2004/0151845 A1 8/2004 Nguyen et al.
2004/0152287 A1 8/2004 Sherrill et al.
2004/0154746 A1 8/2004 Park
2004/0159343 A1 8/2004 Shimbara et al.
2004/0163590 A1 8/2004 Tran et al.
2004/0168627 A1 9/2004 Conley et al.
2004/0168742 A1 9/2004 Kim et al.
2004/0168769 A1 9/2004 Matsuoka et al.
2004/0169032 A1 9/2004 Murayama et al.
2004/0185177 A1 9/2004 Basceri et al.
2004/0187304 A1 9/2004 Chen et al.
2004/0187777 A1 9/2004 Okamoto et al.
2004/0187784 A1 9/2004 Sferlazzo
2004/0187790 A1 9/2004 Bader
2004/0187928 A1 9/2004 Ambrosina
2004/0198069 A1 10/2004 Metzner et al.

(56) References Cited

U.S. PATENT DOCUMENTS

| | | | |
|---|---|---|---|
| 2004/0200499 | A1 | 10/2004 | Harvey et al. |
| 2004/0202786 | A1 | 10/2004 | Wongsenakhum et al. |
| 2004/0203251 | A1 | 10/2004 | Kawaguchi et al. |
| 2004/0206305 | A1 | 10/2004 | Choi et al. |
| 2004/0208228 | A1 | 10/2004 | Hashikura et al. |
| 2004/0209477 | A1 | 10/2004 | Buxbaum et al. |
| 2004/0211357 | A1 | 10/2004 | Gadgil |
| 2004/0212947 | A1 | 10/2004 | Nguyen |
| 2004/0213921 | A1 | 10/2004 | Leu |
| 2004/0214399 | A1 | 10/2004 | Ahn et al. |
| 2004/0214445 | A1 | 10/2004 | Shimizu et al. |
| 2004/0217217 | A1 | 11/2004 | Han et al. |
| 2004/0219793 | A1 | 11/2004 | Hishiya et al. |
| 2004/0220699 | A1 | 11/2004 | Heden et al. |
| 2004/0221807 | A1 | 11/2004 | Verghese et al. |
| 2004/0221808 | A1 | 11/2004 | Kawano |
| 2004/0223893 | A1 | 11/2004 | Tabata et al. |
| 2004/0224478 | A1 | 11/2004 | Chudzik et al. |
| 2004/0226507 | A1 | 11/2004 | Carpenter et al. |
| 2004/0226515 | A1 | 11/2004 | Yendler et al. |
| 2004/0228968 | A1 | 11/2004 | Basceri |
| 2004/0231600 | A1 | 11/2004 | Lee |
| 2004/0231799 | A1 | 11/2004 | Lee et al. |
| 2004/0238523 | A1 | 12/2004 | Kuibira et al. |
| 2004/0241322 | A1 | 12/2004 | Basceri et al. |
| 2004/0241341 | A1 | 12/2004 | Lin |
| 2004/0241998 | A1 | 12/2004 | Hanson |
| 2004/0245091 | A1 | 12/2004 | Karim et al. |
| 2004/0247779 | A1 | 12/2004 | Selvamanickam et al. |
| 2004/0250600 | A1 | 12/2004 | Bevers et al. |
| 2004/0253790 | A1 | 12/2004 | Ootsuka |
| 2004/0253867 | A1 | 12/2004 | Matsumoto |
| 2004/0261492 | A1 | 12/2004 | Zarkar et al. |
| 2004/0261706 | A1 | 12/2004 | Lindfors et al. |
| 2004/0261712 | A1 | 12/2004 | Hayashi et al. |
| 2004/0261946 | A1 | 12/2004 | Endoh et al. |
| 2004/0266011 | A1 | 12/2004 | Lee et al. |
| 2005/0000428 | A1 | 1/2005 | Shero et al. |
| 2005/0001062 | A1 | 1/2005 | McCracken et al. |
| 2005/0003089 | A1 | 1/2005 | Won et al. |
| 2005/0003600 | A1 | 1/2005 | Kasai et al. |
| 2005/0003662 | A1 | 1/2005 | Jurisch et al. |
| 2005/0006682 | A1 | 1/2005 | Bae et al. |
| 2005/0008799 | A1 | 1/2005 | Tomiyasu et al. |
| 2005/0009325 | A1 | 1/2005 | Chung et al. |
| 2005/0016452 | A1 | 1/2005 | Ryu et al. |
| 2005/0016470 | A1 | 1/2005 | Kang et al. |
| 2005/0016956 | A1 | 1/2005 | Liu et al. |
| 2005/0017272 | A1 | 1/2005 | Yamashita et al. |
| 2005/0019026 | A1 | 1/2005 | Wang et al. |
| 2005/0019494 | A1 | 1/2005 | Moghadam et al. |
| 2005/0019960 | A1 | 1/2005 | Lee et al. |
| 2005/0020071 | A1 | 1/2005 | Sonobe et al. |
| 2005/0023231 | A1 | 2/2005 | Huang et al. |
| 2005/0023624 | A1 | 2/2005 | Ahn et al. |
| 2005/0026402 | A1 | 2/2005 | Jurgensen |
| 2005/0033075 | A1 | 2/2005 | Chi et al. |
| 2005/0034664 | A1 | 2/2005 | Koh et al. |
| 2005/0034674 | A1 | 2/2005 | Ono |
| 2005/0037154 | A1 | 2/2005 | Koh et al. |
| 2005/0037578 | A1 | 2/2005 | Chen et al. |
| 2005/0037610 | A1 | 2/2005 | Cha |
| 2005/0037619 | A1 | 2/2005 | Granneman et al. |
| 2005/0040144 | A1 | 2/2005 | Sellers |
| 2005/0042778 | A1 | 2/2005 | Peukert |
| 2005/0046825 | A1 | 3/2005 | Powell et al. |
| 2005/0048797 | A1 | 3/2005 | Fukazawa |
| 2005/0051093 | A1 | 3/2005 | Makino et al. |
| 2005/0051100 | A1 | 3/2005 | Chiang et al. |
| 2005/0051854 | A1 | 3/2005 | Cabral et al. |
| 2005/0054175 | A1 | 3/2005 | Bauer |
| 2005/0054198 | A1 | 3/2005 | Um |
| 2005/0054228 | A1 | 3/2005 | March |
| 2005/0056218 | A1 | 3/2005 | Sun et al. |
| 2005/0056780 | A1 | 3/2005 | Miller et al. |
| 2005/0059261 | A1 | 3/2005 | Basceri et al. |
| 2005/0059262 | A1 | 3/2005 | Yin et al. |
| 2005/0059264 | A1 | 3/2005 | Cheung |
| 2005/0061964 | A1 | 3/2005 | Nagano et al. |
| 2005/0062773 | A1 | 3/2005 | Fouet |
| 2005/0063451 | A1 | 3/2005 | Abe et al. |
| 2005/0064207 | A1 | 3/2005 | Senzaki et al. |
| 2005/0064719 | A1 | 3/2005 | Liu |
| 2005/0066893 | A1 | 3/2005 | Soininen |
| 2005/0069651 | A1 | 3/2005 | Miyoshi |
| 2005/0070123 | A1 | 3/2005 | Hirano |
| 2005/0070128 | A1 | 3/2005 | Xia et al. |
| 2005/0070729 | A1 | 3/2005 | Kiyomori et al. |
| 2005/0072357 | A1 | 4/2005 | Shero et al. |
| 2005/0074576 | A1 | 4/2005 | Chaiken et al. |
| 2005/0074983 | A1 | 4/2005 | Shinriki et al. |
| 2005/0079124 | A1 | 4/2005 | Sanderson |
| 2005/0079691 | A1 | 4/2005 | Kim et al. |
| 2005/0081786 | A1 | 4/2005 | Kubista et al. |
| 2005/0085090 | A1 | 4/2005 | Mui et al. |
| 2005/0090123 | A1 | 4/2005 | Nishimura et al. |
| 2005/0092247 | A1 | 5/2005 | Schmidt |
| 2005/0092249 | A1 | 5/2005 | Kilpela et al. |
| 2005/0092439 | A1 | 5/2005 | Keeton et al. |
| 2005/0092733 | A1 | 5/2005 | Ito et al. |
| 2005/0095770 | A1 | 5/2005 | Kumagai et al. |
| 2005/0095779 | A1 | 5/2005 | Park et al. |
| 2005/0095859 | A1 | 5/2005 | Chen et al. |
| 2005/0098107 | A1 | 5/2005 | Du Bois et al. |
| 2005/0100669 | A1 | 5/2005 | Kools et al. |
| 2005/0101154 | A1 | 5/2005 | Huang |
| 2005/0101843 | A1 | 5/2005 | Quinn et al. |
| 2005/0104112 | A1 | 5/2005 | Haukka et al. |
| 2005/0106762 | A1 | 5/2005 | Chakrapani et al. |
| 2005/0106893 | A1 | 5/2005 | Wilk |
| 2005/0107627 | A1 | 5/2005 | Dussarrat et al. |
| 2005/0109461 | A1 | 5/2005 | Sun |
| 2005/0110069 | A1 | 5/2005 | Kil et al. |
| 2005/0112282 | A1 | 5/2005 | Gordon et al. |
| 2005/0115946 | A1 | 6/2005 | Shim et al. |
| 2005/0118804 | A1 | 6/2005 | Byun et al. |
| 2005/0118837 | A1 | 6/2005 | Todd |
| 2005/0120805 | A1 | 6/2005 | Lane |
| 2005/0120962 | A1 | 6/2005 | Ushioda et al. |
| 2005/0121145 | A1 | 6/2005 | Du Bois et al. |
| 2005/0123690 | A1 | 6/2005 | Derderian et al. |
| 2005/0130427 | A1 | 6/2005 | Seok-Jun |
| 2005/0132957 | A1 | 6/2005 | E1-Raghy |
| 2005/0133160 | A1 | 6/2005 | Kennedy et al. |
| 2005/0133161 | A1 | 6/2005 | Carpenter et al. |
| 2005/0133166 | A1 | 6/2005 | Satitpunwaycha et al. |
| 2005/0136188 | A1 | 6/2005 | Chang |
| 2005/0136657 | A1 | 6/2005 | Yokoi et al. |
| 2005/0139160 | A1 | 6/2005 | Lei et al. |
| 2005/0141591 | A1 | 6/2005 | Sakano |
| 2005/0142361 | A1 | 6/2005 | Nakanishi |
| 2005/0145338 | A1 | 7/2005 | Park et al. |
| 2005/0148162 | A1 | 7/2005 | Chen et al. |
| 2005/0150601 | A1 | 7/2005 | Srivastava |
| 2005/0151184 | A1 | 7/2005 | Lee et al. |
| 2005/0153571 | A1 | 7/2005 | Senzaki |
| 2005/0153573 | A1 | 7/2005 | Okudaira et al. |
| 2005/0160987 | A1 | 7/2005 | Kasai et al. |
| 2005/0161434 | A1 | 7/2005 | Sugawara et al. |
| 2005/0164469 | A1 | 7/2005 | Haupt |
| 2005/0170306 | A1 | 8/2005 | Oosterlaken et al. |
| 2005/0172895 | A1 | 8/2005 | Kijima et al. |
| 2005/0173003 | A1 | 8/2005 | Laverdiere et al. |
| 2005/0175789 | A1 | 8/2005 | Helms |
| 2005/0178333 | A1 | 8/2005 | Loke et al. |
| 2005/0181535 | A1 | 8/2005 | Yun et al. |
| 2005/0181555 | A1 | 8/2005 | Haukka et al. |
| 2005/0183827 | A1 | 8/2005 | White et al. |
| 2005/0186688 | A1 | 8/2005 | Basceri |
| 2005/0187647 | A1 | 8/2005 | Wang et al. |
| 2005/0191828 | A1 | 9/2005 | Al-Bayati et al. |
| 2005/0193948 | A1 | 9/2005 | Oohirabaru et al. |
| 2005/0193952 | A1 | 9/2005 | Goodman et al. |
| 2005/0199013 | A1 | 9/2005 | Vandroux et al. |

(56) References Cited

U.S. PATENT DOCUMENTS

2005/0199342 A1 9/2005 Shajii et al.
2005/0201908 A1 9/2005 Nakamura et al.
2005/0208217 A1 9/2005 Shinriki et al.
2005/0208219 A1 9/2005 Basceri
2005/0208718 A1 9/2005 Lim et al.
2005/0211167 A1 9/2005 Gunji
2005/0211384 A1 9/2005 Hayashi
2005/0212119 A1 9/2005 Shero
2005/0214457 A1 9/2005 Schmitt et al.
2005/0214458 A1 9/2005 Meiere
2005/0208778 A1 10/2005 Li
2005/0218462 A1 10/2005 Ahn et al.
2005/0221021 A1 10/2005 Strang
2005/0221618 A1 10/2005 AmRhein et al.
2005/0223982 A1 10/2005 Park et al.
2005/0223994 A1 10/2005 Blomiley et al.
2005/0227502 A1 10/2005 Schmitt et al.
2005/0229848 A1 10/2005 Shinriki
2005/0229849 A1 10/2005 Silvetti et al.
2005/0229972 A1 10/2005 Hoshi et al.
2005/0233477 A1 10/2005 Yamazaki et al.
2005/0238807 A1 10/2005 Lin et al.
2005/0241176 A1 11/2005 Shero et al.
2005/0241763 A1 11/2005 Huang et al.
2005/0241765 A1 11/2005 Dhindsa et al.
2005/0245058 A1 11/2005 Lee et al.
2005/0249876 A1 11/2005 Kawahara et al.
2005/0250340 A1 11/2005 Chen et al.
2005/0251990 A1 11/2005 Choi
2005/0252447 A1 11/2005 Zhao et al.
2005/0252449 A1 11/2005 Nguyen et al.
2005/0252455 A1 11/2005 Moriya et al.
2005/0253061 A1 11/2005 Cameron et al.
2005/0255257 A1 11/2005 Choi et al.
2005/0255327 A1 11/2005 Chaney et al.
2005/0258280 A1 11/2005 Goto et al.
2005/0260347 A1 11/2005 Narwankar et al.
2005/0260837 A1 11/2005 Walther et al.
2005/0260850 A1 11/2005 Loke
2005/0263072 A1 12/2005 Balasubramanian et al.
2005/0263075 A1 12/2005 Wang et al.
2005/0263719 A1 12/2005 Ohdaira et al.
2005/0263932 A1 12/2005 Heugel
2005/0268856 A1 12/2005 Miller et al.
2005/0271812 A1 12/2005 Myo et al.
2005/0271813 A1 12/2005 Kher et al.
2005/0272247 A1 12/2005 Ikeda et al.
2005/0274323 A1 12/2005 Seidel et al.
2005/0276928 A1 12/2005 Okumura et al.
2005/0277271 A1 12/2005 Beintner
2005/0282101 A1 12/2005 Adachi
2005/0282350 A1 12/2005 Chou et al.
2005/0284573 A1 12/2005 Egley et al.
2005/0284991 A1 12/2005 Saez
2005/0285097 A1 12/2005 Shang et al.
2005/0285208 A1 12/2005 Ren et al.
2005/0287725 A1 12/2005 Kitagawa
2005/0287771 A1 12/2005 Seamons et al.
2006/0000411 A1 1/2006 Seo
2006/0006538 A1 1/2006 Allman et al.
2006/0008997 A1 1/2006 Jang et al.
2006/0009044 A1 1/2006 Igeta et al.
2006/0013674 A1 1/2006 Elliott et al.
2006/0013946 A1 1/2006 Park et al.
2006/0014384 A1 1/2006 Lee et al.
2006/0014397 A1 1/2006 Seamons et al.
2006/0016783 A1 1/2006 Wu et al.
2006/0019033 A1 1/2006 Muthukrishnan et al.
2006/0019495 A1 1/2006 Marcadal et al.
2006/0019502 A1 1/2006 Park et al.
2006/0021572 A1 2/2006 Wolden
2006/0021573 A1 2/2006 Monsma et al.
2006/0021703 A1 2/2006 Umotoy et al.
2006/0024439 A2 2/2006 Tuominen et al.
2006/0026314 A1 2/2006 Franchuk et al.
2006/0032443 A1 2/2006 Hasebe et al.
2006/0040054 A1 2/2006 Pearlstein et al.
2006/0040508 A1 2/2006 Ji
2006/0046518 A1 3/2006 Hill et al.
2006/0048710 A1 3/2006 Horiguchi et al.
2006/0051505 A1 3/2006 Kortshagen et al.
2006/0051520 A1 3/2006 Behle et al.
2006/0051925 A1 3/2006 Ahn et al.
2006/0057799 A1 3/2006 Horiguchi et al.
2006/0057828 A1 3/2006 Omura
2006/0057858 A1 3/2006 Chung et al.
2006/0060930 A1 3/2006 Metz et al.
2006/0062910 A1 3/2006 Meiere
2006/0063346 A1 3/2006 Lee et al.
2006/0068097 A1 3/2006 Yamasaki et al.
2006/0068104 A1 3/2006 Ishizaka
2006/0068121 A1 3/2006 Lee et al.
2006/0068125 A1 3/2006 Radhakrishnan
2006/0081558 A1 4/2006 Collins et al.
2006/0087638 A1 4/2006 Hirayanagi
2006/0090702 A1 5/2006 Koo et al.
2006/0093756 A1 5/2006 Rajagopalan et al.
2006/0094236 A1 5/2006 Elkins et al.
2006/0096540 A1 5/2006 Choi
2006/0097220 A1 5/2006 Kim et al.
2006/0097305 A1 5/2006 Lee
2006/0099782 A1 5/2006 Ritenour
2006/0102968 A1 5/2006 Bojarczuk et al.
2006/0105566 A1 5/2006 Waldfried et al.
2006/0107898 A1 5/2006 Blomberg
2006/0108221 A1 5/2006 Goodwin et al.
2006/0108331 A1 5/2006 Nozawa et al.
2006/0110930 A1 5/2006 Senzaki
2006/0110934 A1 5/2006 Fukuchi
2006/0113038 A1 6/2006 Gondhalekar et al.
2006/0113675 A1 6/2006 Chang et al.
2006/0113806 A1 6/2006 Tsuji et al.
2006/0115589 A1 6/2006 Vukovic
2006/0118240 A1 6/2006 Holber et al.
2006/0118241 A1 6/2006 Ohmi et al.
2006/0125099 A1 6/2006 Gordon et al.
2006/0127067 A1 6/2006 Wintenberger et al.
2006/0128142 A1 6/2006 Whelan et al.
2006/0128168 A1 6/2006 Ahn et al.
2006/0130751 A1 6/2006 Volfovski et al.
2006/0130767 A1 6/2006 Herchen
2006/0133955 A1 6/2006 Peters
2006/0137608 A1 6/2006 Choi et al.
2006/0137609 A1 6/2006 Puchacz et al.
2006/0141155 A1 6/2006 Gordon et al.
2006/0141758 A1 6/2006 Naumann et al.
2006/0144820 A1 7/2006 Sawin et al.
2006/0147626 A1 7/2006 Blomberg
2006/0148151 A1 7/2006 Murthy et al.
2006/0148180 A1 7/2006 Ahn et al.
2006/0151117 A1 7/2006 Kasanami et al.
2006/0154424 A1 7/2006 Yang et al.
2006/0156979 A1 7/2006 Thakur et al.
2006/0156981 A1 7/2006 Fondurulia
2006/0162658 A1 7/2006 Weidman
2006/0162661 A1 7/2006 Jung et al.
2006/0162863 A1 7/2006 Kim et al.
2006/0163612 A1 7/2006 Kouvetakis et al.
2006/0163683 A1 7/2006 Roth et al.
2006/0165892 A1 7/2006 Weidman
2006/0166428 A1 7/2006 Kamioka
2006/0172531 A1 8/2006 Lin et al.
2006/0175669 A1 8/2006 Kim et al.
2006/0176928 A1 8/2006 Nakamura et al.
2006/0177855 A1 8/2006 Utermohlen
2006/0182885 A1 8/2006 Lei et al.
2006/0185589 A1 8/2006 Zehavi et al.
2006/0188360 A1 8/2006 Bonora et al.
2006/0191555 A1 8/2006 Yoshida et al.
2006/0193979 A1 8/2006 Meiere et al.
2006/0193980 A1 8/2006 Hasegawa
2006/0196418 A1 9/2006 Lindfors et al.
2006/0196420 A1 9/2006 Ushakov et al.
2006/0196421 A1 9/2006 Ronsse et al.

(56) References Cited

U.S. PATENT DOCUMENTS

2006/0199357 A1 9/2006 Wan et al.
2006/0205194 A1 9/2006 Bauer
2006/0205223 A1 9/2006 Smayling
2006/0205231 A1 9/2006 Chou et al.
2006/0208215 A1 9/2006 Metzner et al.
2006/0211224 A1 9/2006 Matsuda
2006/0211243 A1 9/2006 Ishizaka et al.
2006/0211259 A1 9/2006 Maes
2006/0213437 A1 9/2006 Ishizaka et al.
2006/0213439 A1 9/2006 Ishizaka
2006/0213441 A1 9/2006 Kobrin et al.
2006/0216942 A1 9/2006 Kim et al.
2006/0219169 A1 10/2006 Chen et al.
2006/0219361 A1 10/2006 Wang et al.
2006/0219363 A1 10/2006 Matsumoto et al.
2006/0223301 A1 10/2006 Vanhaelemeersch et al.
2006/0223337 A1 10/2006 Ahn et al.
2006/0226117 A1 10/2006 Bertram et al.
2006/0228496 A1 10/2006 Choi
2006/0228863 A1 10/2006 Zhang et al.
2006/0228888 A1 10/2006 Lee et al.
2006/0228898 A1 10/2006 Wajda et al.
2006/0236934 A1 10/2006 Choi et al.
2006/0240187 A1 10/2006 Weidman
2006/0240574 A1 10/2006 Yoshie
2006/0240662 A1 10/2006 Conley et al.
2006/0247404 A1 11/2006 Todd
2006/0249175 A1 11/2006 Nowak et al.
2006/0249253 A1 11/2006 Dando
2006/0251827 A1 11/2006 Nowak
2006/0252228 A1 11/2006 Jeng
2006/0252244 A1 11/2006 Vaartstra et al.
2006/0252351 A1 11/2006 Kundracik
2006/0254514 A1 11/2006 Kang et al.
2006/0257563 A1 11/2006 Doh et al.
2006/0257584 A1 11/2006 Derderian et al.
2006/0258078 A1 11/2006 Lee et al.
2006/0258173 A1 11/2006 Xiao et al.
2006/0260545 A1 11/2006 Ramaswamy et al.
2006/0263522 A1 11/2006 Byun
2006/0263540 A1 11/2006 Ramaswamy et al.
2006/0264060 A1 11/2006 Ramaswamy et al.
2006/0264066 A1 11/2006 Bartholomew
2006/0266289 A1 11/2006 Verghese et al.
2006/0269690 A1 11/2006 Watanabe et al.
2006/0269692 A1 11/2006 Balseanu
2006/0275710 A1 12/2006 Yamazaki et al.
2006/0275933 A1 12/2006 Du Bois et al.
2006/0278524 A1 12/2006 Stowell
2006/0283629 A1 12/2006 Kikuchi et al.
2006/0286774 A1 12/2006 Singh et al.
2006/0286775 A1 12/2006 Singh et al.
2006/0286817 A1 12/2006 Kato et al.
2006/0286818 A1 12/2006 Wang et al.
2006/0286819 A1 12/2006 Seutter
2006/0291982 A1 12/2006 Tanaka
2006/0292310 A1 12/2006 Le et al.
2006/0292845 A1 12/2006 Chiang et al.
2007/0004204 A1 1/2007 Fukazawa et al.
2007/0006806 A1 1/2007 Imai
2007/0010072 A1 1/2007 Bailey et al.
2007/0012402 A1 1/2007 Sneh
2007/0014919 A1 1/2007 Hamalainen et al.
2007/0020160 A1 1/2007 Berkman et al.
2007/0020167 A1 1/2007 Han et al.
2007/0020830 A1 1/2007 Speranza
2007/0020953 A1 1/2007 Tsai et al.
2007/0022954 A1 2/2007 Iizuka et al.
2007/0026148 A1 2/2007 Arai et al.
2007/0026162 A1 2/2007 Wei et al.
2007/0026540 A1 2/2007 Nooten et al.
2007/0026654 A1 2/2007 Huotari et al.
2007/0028842 A1 2/2007 Inagawa et al.
2007/0031598 A1 2/2007 Okuyama et al.
2007/0031599 A1 2/2007 Gschwandtner et al.
2007/0032004 A1 2/2007 Ramaswamy et al.
2007/0032045 A1 2/2007 Kasahara et al.
2007/0032054 A1 2/2007 Ramaswamy et al.
2007/0032082 A1 2/2007 Ramaswamy et al.
2007/0032095 A1 2/2007 Ramaswamy et al.
2007/0034477 A1 2/2007 Inui
2007/0037343 A1 2/2007 Colombo et al.
2007/0037412 A1 2/2007 Dip et al.
2007/0042117 A1 2/2007 Kupurao et al.
2007/0042581 A1 2/2007 Sano et al.
2007/0044716 A1 3/2007 Tetsuka et al.
2007/0045244 A1 3/2007 Lee et al.
2007/0047384 A1 3/2007 McLaughlin et al.
2007/0048953 A1 3/2007 Gealy et al.
2007/0049053 A1 3/2007 Mahajani
2007/0051299 A1 3/2007 Ong et al.
2007/0051312 A1 3/2007 Sneh
2007/0051471 A1 3/2007 Kawaguchi et al.
2007/0054049 A1 3/2007 Lindfors et al.
2007/0054499 A1 3/2007 Jang
2007/0056843 A1 3/2007 Ye et al.
2007/0056850 A1 3/2007 Ye et al.
2007/0059948 A1 3/2007 Metzner et al.
2007/0062439 A1 3/2007 Wada et al.
2007/0062453 A1 3/2007 Ishikawa
2007/0062646 A1 3/2007 Ogawa et al.
2007/0065578 A1 3/2007 McDougall
2007/0065597 A1 3/2007 Kaido et al.
2007/0066010 A1 3/2007 Ando
2007/0066038 A1 3/2007 Sadjadi et al.
2007/0066079 A1 3/2007 Kolster et al.
2007/0066084 A1 3/2007 Wajda et al.
2007/0074665 A1 4/2007 Chacin et al.
2007/0077355 A1 4/2007 Chacin et al.
2007/0082132 A1 4/2007 Shinriki
2007/0082500 A1 4/2007 Norman et al.
2007/0082508 A1 4/2007 Chiang et al.
2007/0084405 A1 4/2007 Kim
2007/0087296 A1 4/2007 Kim et al.
2007/0087515 A1 4/2007 Yieh et al.
2007/0087579 A1 4/2007 Kitayama et al.
2007/0089670 A1 4/2007 Ikedo
2007/0092696 A1 4/2007 Tsukatani et al.
2007/0095283 A1 5/2007 Galewski
2007/0095286 A1 5/2007 Baek et al.
2007/0096194 A1 5/2007 Streck et al.
2007/0098527 A1 5/2007 Hall et al.
2007/0107845 A1 5/2007 Ishizawa et al.
2007/0111030 A1 5/2007 Nakano et al.
2007/0111470 A1 5/2007 Smythe
2007/0111545 A1 5/2007 Lee et al.
2007/0113788 A1 5/2007 Nozawa et al.
2007/0116872 A1 5/2007 Li et al.
2007/0116873 A1 5/2007 Li et al.
2007/0116887 A1 5/2007 Faguet
2007/0116888 A1 5/2007 Faguet
2007/0119370 A1 5/2007 Ma et al.
2007/0120275 A1 5/2007 Liu
2007/0123037 A1 5/2007 Lee et al.
2007/0123060 A1 5/2007 Rahtu
2007/0123189 A1 5/2007 Saito et al.
2007/0125762 A1 6/2007 Cui et al.
2007/0128538 A1 6/2007 Fairbairn et al.
2007/0128570 A1 6/2007 Goto et al.
2007/0128858 A1 6/2007 Haukka et al.
2007/0128876 A1 6/2007 Fukiage
2007/0128888 A1 6/2007 Goto et al.
2007/0129621 A1 6/2007 Kellogg et al.
2007/0131168 A1 6/2007 Gomi et al.
2007/0134821 A1 6/2007 Thakur et al.
2007/0134919 A1 6/2007 Gunji et al.
2007/0134942 A1 6/2007 Ahn et al.
2007/0137794 A1 6/2007 Qiu et al.
2007/0144442 A1 6/2007 Migita
2007/0146621 A1 6/2007 Yeom
2007/0148347 A1 6/2007 Hatanpaa et al.
2007/0148350 A1 6/2007 Rahtu
2007/0148990 A1 6/2007 Deboer et al.
2007/0153625 A1 6/2007 Lundgren et al.

(56) References Cited

U.S. PATENT DOCUMENTS

2007/0155138 A1 7/2007 Tomasini et al.
2007/0157466 A1 7/2007 Kida et al.
2007/0157683 A1 7/2007 Li
2007/0158026 A1 7/2007 Amikura
2007/0163440 A1 7/2007 Kim et al.
2007/0163490 A1 7/2007 Habel et al.
2007/0163625 A1 7/2007 Lee
2007/0163996 A1 7/2007 Horiguchi
2007/0166457 A1 7/2007 Yamoto et al.
2007/0166459 A1 7/2007 Chang et al.
2007/0166966 A1 7/2007 Todd et al.
2007/0166999 A1 7/2007 Vaarstra
2007/0170372 A1 7/2007 Horsky
2007/0173071 A1 7/2007 Afzali-Ardakani et al.
2007/0175393 A1 8/2007 Nishimura et al.
2007/0175397 A1 8/2007 Tomiyasu et al.
2007/0178235 A1 8/2007 Yamada et al.
2007/0181066 A1 8/2007 Cadwell et al.
2007/0184179 A1 8/2007 Waghray et al.
2007/0186849 A1 8/2007 Furuya
2007/0186952 A1 8/2007 Honda et al.
2007/0187362 A1 8/2007 Nakagawa et al.
2007/0187363 A1 8/2007 Oka et al.
2007/0190266 A1 8/2007 Fu et al.
2007/0190362 A1 8/2007 Weidman
2007/0190744 A1 8/2007 Hiraiwa et al.
2007/0190782 A1 8/2007 Park
2007/0199510 A1 8/2007 Weiner et al.
2007/0202678 A1 8/2007 Plombon et al.
2007/0205788 A1 9/2007 Natsuhara et al.
2007/0207275 A1 9/2007 Nowak et al.
2007/0209588 A1 9/2007 Li et al.
2007/0209590 A1 9/2007 Li
2007/0210890 A1 9/2007 Hsu et al.
2007/0212484 A1 9/2007 Li
2007/0212811 A1 9/2007 Hanawa et al.
2007/0212827 A1 9/2007 Girotra et al.
2007/0215048 A1 9/2007 Suzuki et al.
2007/0215278 A1 9/2007 Furuse et al.
2007/0215580 A1 9/2007 Koshiishi et al.
2007/0218200 A1 9/2007 Suzuki et al.
2007/0218705 A1 9/2007 Matsuki et al.
2007/0222131 A1 9/2007 Fukumoto et al.
2007/0224777 A1 9/2007 Hamelin
2007/0224833 A1 9/2007 Morisada et al.
2007/0227665 A1 10/2007 Matsumoto et al.
2007/0231488 A1 10/2007 Von Kaenel
2007/0232031 A1 10/2007 Singh et al.
2007/0232071 A1 10/2007 Balseanu et al.
2007/0232501 A1 10/2007 Tonomura
2007/0234955 A1 10/2007 Suzuki et al.
2007/0237697 A1 10/2007 Clark
2007/0237698 A1 10/2007 Clark
2007/0237699 A1 10/2007 Clark
2007/0238305 A1 10/2007 Delgadino et al.
2007/0241688 A1 10/2007 DeVancentis et al.
2007/0243317 A1 10/2007 Du Bois et al.
2007/0247075 A1 10/2007 Kim et al.
2007/0248767 A1 10/2007 Okura
2007/0248832 A1 10/2007 Maeda et al.
2007/0249131 A1 10/2007 Allen et al.
2007/0251444 A1 11/2007 Gros-Jean et al.
2007/0251456 A1 11/2007 Herchen et al.
2007/0252233 A1 11/2007 Yamazaki et al.
2007/0252244 A1 11/2007 Srividya et al.
2007/0252532 A1 11/2007 DeVancentis et al.
2007/0254414 A1 11/2007 Miyanami
2007/0258506 A1 11/2007 Schwagerman et al.
2007/0258855 A1 11/2007 Turcot et al.
2007/0259778 A1 11/2007 Spencer et al.
2007/0261868 A1 11/2007 Gross
2007/0264427 A1 11/2007 Shinriki et al.
2007/0264793 A1 11/2007 Oh et al.
2007/0264807 A1 11/2007 Leone et al.
2007/0266932 A1 11/2007 Hiramatsu
2007/0266945 A1 11/2007 Shuto et al.
2007/0269983 A1 11/2007 Sneh
2007/0275166 A1 11/2007 Thridandam et al.
2007/0277735 A1 12/2007 Mokhesi et al.
2007/0281082 A1 12/2007 Mokhesi et al.
2007/0281105 A1 12/2007 Mokhesi et al.
2007/0281106 A1 12/2007 Lubomirsky et al.
2007/0281496 A1 12/2007 Ingle et al.
2007/0286957 A1 12/2007 Suzuki et al.
2007/0289534 A1 12/2007 Lubomirsky et al.
2007/0292974 A1 12/2007 Mizuno et al.
2007/0295602 A1 12/2007 Tiller et al.
2007/0298362 A1 12/2007 Rocha-Alvarez et al.
2007/0298565 A1 12/2007 Nieh et al.
2008/0003425 A1 1/2008 Spencer et al.
2008/0003824 A1 1/2008 Padhi et al.
2008/0003838 A1 1/2008 Haukka et al.
2008/0006208 A1 1/2008 Ueno et al.
2008/0018004 A1 1/2008 Steidl
2008/0020591 A1 1/2008 Balseanu et al.
2008/0020593 A1 1/2008 Wang et al.
2008/0023436 A1 1/2008 Gros-Jean et al.
2008/0026162 A1 1/2008 Dickey et al.
2008/0026574 A1 1/2008 Brcka
2008/0026597 A1 1/2008 Munro et al.
2008/0029790 A1 2/2008 Ahn et al.
2008/0031708 A1 2/2008 Bonora et al.
2008/0032514 A1 2/2008 Sano et al.
2008/0035055 A1 2/2008 Dip et al.
2008/0035306 A1 2/2008 White et al.
2008/0035607 A1 2/2008 O'Hara et al.
2008/0036354 A1 2/2008 Letz et al.
2008/0038485 A1 2/2008 Fukazawa et al.
2008/0038934 A1 2/2008 Vrtis et al.
2008/0042165 A1 2/2008 Sugizaki
2008/0042192 A1 2/2008 Park et al.
2008/0043803 A1 2/2008 Bandoh
2008/0044932 A1 2/2008 Samoilov et al.
2008/0044938 A1 2/2008 England et al.
2008/0050536 A1 2/2008 Aing et al.
2008/0050538 A1 2/2008 Hirata
2008/0054332 A1 3/2008 Kim et al.
2008/0054813 A1 3/2008 Espiau et al.
2008/0056860 A1 3/2008 Natume
2008/0057659 A1 3/2008 Forbes et al.
2008/0061667 A1 3/2008 Gaertner et al.
2008/0063798 A1 3/2008 Kher et al.
2008/0066778 A1 3/2008 Matsushita et al.
2008/0067146 A1 3/2008 Onishi et al.
2008/0069951 A1 3/2008 Chacin et al.
2008/0069955 A1 3/2008 Hong et al.
2008/0072821 A1 3/2008 Dalton et al.
2008/0075562 A1 3/2008 Maria et al.
2008/0075838 A1 3/2008 Inoue et al.
2008/0075881 A1 3/2008 Won et al.
2008/0076070 A1 3/2008 Koh et al.
2008/0076266 A1 3/2008 Fukazawa et al.
2008/0076281 A1 3/2008 Ciancanelli et al.
2008/0081104 A1 4/2008 Hasebe et al.
2008/0081113 A1 4/2008 Clark
2008/0081121 A1 4/2008 Morita et al.
2008/0083710 A1 4/2008 Chen et al.
2008/0083948 A1 4/2008 Lin et al.
2008/0085226 A1 4/2008 Fondurulia et al.
2008/0085610 A1 4/2008 Wang et al.
2008/0087218 A1 4/2008 Shimada et al.
2008/0087642 A1 4/2008 Sawin et al.
2008/0087890 A1 4/2008 Ahn et al.
2008/0092815 A1 4/2008 Chen et al.
2008/0092821 A1 4/2008 Otsuka et al.
2008/0099147 A1 5/2008 Myo et al.
2008/0102203 A1 5/2008 Wu
2008/0102205 A1 5/2008 Barry et al.
2008/0102208 A1 5/2008 Wu et al.
2008/0102603 A1 5/2008 Kobayashi et al.
2008/0102630 A1 5/2008 Saito
2008/0105276 A1 5/2008 Yeh et al.
2008/0110401 A1 5/2008 Fujikawa et al.
2008/0110568 A1 5/2008 Son et al.

(56) References Cited

U.S. PATENT DOCUMENTS

| | | | |
|---|---|---|---|
| 2008/0113094 | A1 | 5/2008 | Casper |
| 2008/0113096 | A1 | 5/2008 | Mahajani |
| 2008/0113097 | A1 | 5/2008 | Mahajani et al. |
| 2008/0118334 | A1 | 5/2008 | Bonora |
| 2008/0121177 | A1 | 5/2008 | Bang et al. |
| 2008/0121626 | A1 | 5/2008 | Thomas et al. |
| 2008/0121962 | A1 | 5/2008 | Forbes et al. |
| 2008/0124197 | A1 | 5/2008 | van der Meulen et al. |
| 2008/0124908 | A1 | 5/2008 | Forbes et al. |
| 2008/0124945 | A1 | 5/2008 | Miya et al. |
| 2008/0124946 | A1 | 5/2008 | Xiao et al. |
| 2008/0128726 | A1 | 6/2008 | Sakata et al. |
| 2008/0129209 | A1 | 6/2008 | Deakins et al. |
| 2008/0132046 | A1 | 6/2008 | Walther |
| 2008/0133154 | A1 | 6/2008 | Krauss et al. |
| 2008/0134887 | A1 | 6/2008 | Sherer |
| 2008/0135516 | A1 | 6/2008 | Yokogawa et al. |
| 2008/0135936 | A1 | 6/2008 | Nakajima |
| 2008/0142046 | A1 | 6/2008 | Johnson et al. |
| 2008/0142483 | A1 | 6/2008 | Hua |
| 2008/0146033 | A1 | 6/2008 | Park |
| 2008/0149031 | A1 | 6/2008 | Chu et al. |
| 2008/0149593 | A1 | 6/2008 | Bai et al. |
| 2008/0152463 | A1 | 6/2008 | Chidambaram et al. |
| 2008/0153308 | A1 | 6/2008 | Ogawa et al. |
| 2008/0153311 | A1 | 6/2008 | Padhi et al. |
| 2008/0156769 | A1 | 7/2008 | Weiner et al. |
| 2008/0157157 | A1 | 7/2008 | Tonomura |
| 2008/0157212 | A1 | 7/2008 | Lavoie et al. |
| 2008/0157365 | A1 | 7/2008 | Ott et al. |
| 2008/0173237 | A1 | 7/2008 | Collins |
| 2008/0173238 | A1 | 7/2008 | Nakashima et al. |
| 2008/0173240 | A1 | 7/2008 | Furukawahara |
| 2008/0173326 | A1 | 7/2008 | Gu et al. |
| 2008/0176335 | A1 | 7/2008 | Alberti et al. |
| 2008/0176375 | A1 | 7/2008 | Erben et al. |
| 2008/0176412 | A1 | 7/2008 | Komeda |
| 2008/0178608 | A1 | 7/2008 | Tandou et al. |
| 2008/0178805 | A1 | 7/2008 | Paterson et al. |
| 2008/0179104 | A1 | 7/2008 | Zhang |
| 2008/0179291 | A1 | 7/2008 | Collins et al. |
| 2008/0179715 | A1 | 7/2008 | Coppa |
| 2008/0182075 | A1 | 7/2008 | Chopra |
| 2008/0182390 | A1 | 7/2008 | Lemmi et al. |
| 2008/0182411 | A1 | 7/2008 | Elers |
| 2008/0191193 | A1 | 8/2008 | Li et al. |
| 2008/0193643 | A1 | 8/2008 | Dip |
| 2008/0194088 | A1 | 8/2008 | Srinivasan et al. |
| 2008/0194105 | A1 | 8/2008 | Dominguez et al. |
| 2008/0194113 | A1 | 8/2008 | Kim et al. |
| 2008/0194169 | A1 | 8/2008 | Sterling et al. |
| 2008/0199977 | A1 | 8/2008 | Weigel et al. |
| 2008/0202416 | A1 | 8/2008 | Provencher |
| 2008/0202689 | A1 | 8/2008 | Kim |
| 2008/0203487 | A1 | 8/2008 | Hohage et al. |
| 2008/0205483 | A1 | 8/2008 | Rempe et al. |
| 2008/0210162 | A1 | 9/2008 | Yonebayashi |
| 2008/0210278 | A1 | 9/2008 | Orii et al. |
| 2008/0211423 | A1 | 9/2008 | Shinmen et al. |
| 2008/0211526 | A1 | 9/2008 | Shinma |
| 2008/0213696 | A1 | 9/2008 | Meeus et al. |
| 2008/0214003 | A1 | 9/2008 | Xia et al. |
| 2008/0216077 | A1 | 9/2008 | Emani et al. |
| 2008/0216742 | A1 | 9/2008 | Takebayashi |
| 2008/0216958 | A1 | 9/2008 | Goto et al. |
| 2008/0220619 | A1 | 9/2008 | Matsushita et al. |
| 2008/0223130 | A1 | 9/2008 | Snell et al. |
| 2008/0223725 | A1 | 9/2008 | Han et al. |
| 2008/0224240 | A1 | 9/2008 | Ahn et al. |
| 2008/0228306 | A1 | 9/2008 | Yetter et al. |
| 2008/0229811 | A1 | 9/2008 | Zhao et al. |
| 2008/0230352 | A1 | 9/2008 | Hirata |
| 2008/0230371 | A1 | 9/2008 | McHugh |
| 2008/0233288 | A1 | 9/2008 | Clark |
| 2008/0237572 | A1 | 10/2008 | Chui et al. |
| 2008/0237604 | A1 | 10/2008 | Alshareef et al. |
| 2008/0241052 | A1 | 10/2008 | Hooper et al. |
| 2008/0241384 | A1 | 10/2008 | Jeong |
| 2008/0241387 | A1 | 10/2008 | Keto |
| 2008/0242116 | A1 | 10/2008 | Clark |
| 2008/0246101 | A1 | 10/2008 | Li et al. |
| 2008/0248310 | A1 | 10/2008 | Kim et al. |
| 2008/0248597 | A1 | 10/2008 | Qin et al. |
| 2008/0257102 | A1 | 10/2008 | Packer |
| 2008/0257494 | A1 | 10/2008 | Hayashi et al. |
| 2008/0260345 | A1 | 10/2008 | Mertesdorf et al. |
| 2008/0260963 | A1 | 10/2008 | Yoon et al. |
| 2008/0261405 | A1 | 10/2008 | Yang et al. |
| 2008/0261413 | A1 | 10/2008 | Mahajani |
| 2008/0264337 | A1 | 10/2008 | Sano et al. |
| 2008/0264443 | A1 | 10/2008 | Shrinivasan et al. |
| 2008/0267598 | A1 | 10/2008 | Nakamura |
| 2008/0268171 | A1 | 10/2008 | Ma et al. |
| 2008/0268635 | A1 | 10/2008 | Yu et al. |
| 2008/0272424 | A1 | 11/2008 | Kim et al. |
| 2008/0274369 | A1 | 11/2008 | Lee et al. |
| 2008/0276864 | A1 | 11/2008 | Koelmel et al. |
| 2008/0277647 | A1 | 11/2008 | Kouvetakis et al. |
| 2008/0277656 | A1 | 11/2008 | Park et al. |
| 2008/0277715 | A1 | 11/2008 | Ohmi et al. |
| 2008/0282970 | A1 | 11/2008 | Heys et al. |
| 2008/0283962 | A1 | 11/2008 | Dyer |
| 2008/0286463 | A1 | 11/2008 | Tiner et al. |
| 2008/0289574 | A1 | 11/2008 | Jacobs et al. |
| 2008/0289650 | A1 | 11/2008 | Arena |
| 2008/0289767 | A1 | 11/2008 | Tandou et al. |
| 2008/0291964 | A1 | 11/2008 | Shrimpling |
| 2008/0293198 | A1 | 11/2008 | Kojima et al. |
| 2008/0295872 | A1 | 12/2008 | Riker et al. |
| 2008/0298945 | A1 | 12/2008 | Cox |
| 2008/0299326 | A1 | 12/2008 | Fukazawa |
| 2008/0299758 | A1 | 12/2008 | Harada et al. |
| 2008/0302303 | A1 | 12/2008 | Choi et al. |
| 2008/0303744 | A1 | 12/2008 | Hirayama et al. |
| 2008/0305014 | A1 | 12/2008 | Honda |
| 2008/0305246 | A1 | 12/2008 | Choi et al. |
| 2008/0305443 | A1 | 12/2008 | Nakamura |
| 2008/0314319 | A1 | 12/2008 | Hamano et al. |
| 2008/0314892 | A1 | 12/2008 | Graham |
| 2008/0315292 | A1 | 12/2008 | Ji et al. |
| 2008/0317972 | A1 | 12/2008 | Hendriks |
| 2009/0000550 | A1 | 1/2009 | Tran et al. |
| 2009/0000551 | A1 | 1/2009 | Choi et al. |
| 2009/0000769 | A1 | 1/2009 | Lin et al. |
| 2009/0004875 | A1 | 1/2009 | Shen et al. |
| 2009/0011145 | A1 | 1/2009 | Yun |
| 2009/0011150 | A1 | 1/2009 | Jeon et al. |
| 2009/0011608 | A1 | 1/2009 | Nabatame |
| 2009/0014879 | A1 | 1/2009 | Park et al. |
| 2009/0017227 | A1 | 1/2009 | Fu et al. |
| 2009/0017631 | A1 | 1/2009 | Bencher |
| 2009/0017733 | A1 | 1/2009 | Takahashi et al. |
| 2009/0020072 | A1 | 1/2009 | Mizunaga et al. |
| 2009/0023229 | A1 | 1/2009 | Matsushita |
| 2009/0029503 | A1 | 1/2009 | Arai |
| 2009/0029528 | A1 | 1/2009 | Sanchez et al. |
| 2009/0029564 | A1 | 1/2009 | Yamashita et al. |
| 2009/0031954 | A1 | 2/2009 | Nishikido et al. |
| 2009/0033907 | A1 | 2/2009 | Watson |
| 2009/0035463 | A1 | 2/2009 | Dip |
| 2009/0035584 | A1 | 2/2009 | Tran et al. |
| 2009/0035927 | A1 | 2/2009 | Olsen et al. |
| 2009/0035946 | A1 | 2/2009 | Pierreux et al. |
| 2009/0035947 | A1 | 2/2009 | Horii |
| 2009/0036292 | A1 | 2/2009 | Sun et al. |
| 2009/0039475 | A1 | 2/2009 | Shioya |
| 2009/0041952 | A1 | 2/2009 | Yoon et al. |
| 2009/0041984 | A1 | 2/2009 | Mayers et al. |
| 2009/0042344 | A1 | 2/2009 | Ye et al. |
| 2009/0042408 | A1 | 2/2009 | Maeda |
| 2009/0045749 | A1 | 2/2009 | Ganachev et al. |
| 2009/0045829 | A1 | 2/2009 | Awazu |
| 2009/0047426 | A1 | 2/2009 | Park et al. |
| 2009/0047433 | A1 | 2/2009 | Kim et al. |

(56) References Cited

U.S. PATENT DOCUMENTS

| | | | |
|---|---|---|---|
| 2009/0047447 | A1 | 2/2009 | Sawin et al. |
| 2009/0050621 | A1 | 2/2009 | Awazu |
| 2009/0052498 | A1 | 2/2009 | Halpin et al. |
| 2009/0053023 | A1 | 2/2009 | Wakabayashi |
| 2009/0053900 | A1 | 2/2009 | Nozawa et al. |
| 2009/0053906 | A1 | 2/2009 | Miya et al. |
| 2009/0056112 | A1 | 3/2009 | Kobayashi |
| 2009/0056629 | A1 | 3/2009 | Katz et al. |
| 2009/0057269 | A1 | 3/2009 | Katz et al. |
| 2009/0060480 | A1 | 3/2009 | Herchen |
| 2009/0061083 | A1 | 3/2009 | Chiang et al. |
| 2009/0061644 | A1 | 3/2009 | Chiang et al. |
| 2009/0061647 | A1 | 3/2009 | Mallick et al. |
| 2009/0075490 | A1 | 3/2009 | Dussarrat |
| 2009/0075491 | A1 | 3/2009 | Liu et al. |
| 2009/0080136 | A1 | 3/2009 | Nagayama et al. |
| 2009/0081879 | A1 | 3/2009 | Sukekawa et al. |
| 2009/0084317 | A1 | 4/2009 | Wu |
| 2009/0085156 | A1 | 4/2009 | Dewey et al. |
| 2009/0087585 | A1 | 4/2009 | Lee et al. |
| 2009/0087964 | A1 | 4/2009 | Maeda et al. |
| 2009/0087967 | A1 | 4/2009 | Todd |
| 2009/0090382 | A1 | 4/2009 | Morisada |
| 2009/0093080 | A1 | 4/2009 | Choi et al. |
| 2009/0093094 | A1 | 4/2009 | Ye et al. |
| 2009/0093100 | A1 | 4/2009 | Xia et al. |
| 2009/0095221 | A1 | 4/2009 | Tam et al. |
| 2009/0104351 | A1 | 4/2009 | Kakegawa |
| 2009/0104594 | A1 | 4/2009 | Webb |
| 2009/0104789 | A1 | 4/2009 | Mallick et al. |
| 2009/0107404 | A1 | 4/2009 | Ogliari et al. |
| 2009/0108308 | A1 | 4/2009 | Yang et al. |
| 2009/0112458 | A1 | 4/2009 | Nakai |
| 2009/0115064 | A1 | 5/2009 | Sandhu et al. |
| 2009/0116936 | A1 | 5/2009 | Marubayashi et al. |
| 2009/0117717 | A1 | 5/2009 | Tomasini et al. |
| 2009/0117723 | A1 | 5/2009 | Kim et al. |
| 2009/0117746 | A1 | 5/2009 | Masuda |
| 2009/0120580 | A1 | 5/2009 | Kagoshima et al. |
| 2009/0122293 | A1 | 5/2009 | Shibazaki |
| 2009/0122458 | A1 | 5/2009 | Lischer et al. |
| 2009/0124131 | A1 | 5/2009 | Breunsbach et al. |
| 2009/0130331 | A1 | 5/2009 | Asai |
| 2009/0130859 | A1 | 5/2009 | Itatani et al. |
| 2009/0136665 | A1 | 5/2009 | Choi et al. |
| 2009/0136668 | A1 | 5/2009 | Gregg et al. |
| 2009/0136683 | A1 | 5/2009 | Fukasawa et al. |
| 2009/0137055 | A1 | 5/2009 | Bognar |
| 2009/0139657 | A1 | 6/2009 | Lee et al. |
| 2009/0142905 | A1 | 6/2009 | Yamazaki |
| 2009/0142933 | A1 | 6/2009 | Yajima et al. |
| 2009/0142935 | A1 | 6/2009 | Fukazawa et al. |
| 2009/0146322 | A1 | 6/2009 | Weling et al. |
| 2009/0147819 | A1 | 6/2009 | Goodman et al. |
| 2009/0155488 | A1 | 6/2009 | Nakano et al. |
| 2009/0156015 | A1 | 6/2009 | Park et al. |
| 2009/0156017 | A1 | 6/2009 | Fukazawa et al. |
| 2009/0159000 | A1 | 6/2009 | Aggarwal et al. |
| 2009/0159002 | A1 | 6/2009 | Bera et al. |
| 2009/0159424 | A1 | 6/2009 | Liu et al. |
| 2009/0162647 | A1 | 6/2009 | Sun et al. |
| 2009/0162996 | A1 | 6/2009 | Ramaswarmy et al. |
| 2009/0163038 | A1 | 6/2009 | Miyoshi |
| 2009/0165715 | A1 | 7/2009 | Oh |
| 2009/0165721 | A1 | 7/2009 | Pitney et al. |
| 2009/0165722 | A1 | 7/2009 | Ha |
| 2009/0166616 | A1 | 7/2009 | Uchiyama |
| 2009/0176018 | A1 | 7/2009 | Zou et al. |
| 2009/0179365 | A1 | 7/2009 | Lerner et al. |
| 2009/0183520 | A1 | 7/2009 | Yukimoto |
| 2009/0186479 | A1 | 7/2009 | Okabe et al. |
| 2009/0186571 | A1 | 7/2009 | Haro |
| 2009/0194233 | A1 | 8/2009 | Tamura et al. |
| 2009/0197015 | A1 | 8/2009 | Kudela et al. |
| 2009/0197411 | A1 | 8/2009 | Dussarrat et al. |
| 2009/0200494 | A1 | 8/2009 | Hatem |
| 2009/0200547 | A1 | 8/2009 | Griffin et al. |
| 2009/0204403 | A1 | 8/2009 | Hollander et al. |
| 2009/0206056 | A1 | 8/2009 | Xu |
| 2009/0209081 | A1 | 8/2009 | Matero |
| 2009/0211523 | A1 | 8/2009 | Kuppurao et al. |
| 2009/0211525 | A1 | 8/2009 | Sarigiannis et al. |
| 2009/0214825 | A1 | 8/2009 | Sun et al. |
| 2009/0217871 | A1 | 9/2009 | Kim et al. |
| 2009/0221149 | A1 | 9/2009 | Hammond et al. |
| 2009/0221151 | A1 | 9/2009 | Honda et al. |
| 2009/0223441 | A1 | 9/2009 | Arena et al. |
| 2009/0227094 | A1 | 9/2009 | Bateman |
| 2009/0230211 | A1 | 9/2009 | Kobayashi et al. |
| 2009/0232985 | A1 | 9/2009 | Dussarrat et al. |
| 2009/0236014 | A1 | 9/2009 | Wilson |
| 2009/0236276 | A1 | 9/2009 | Kurth et al. |
| 2009/0236315 | A1 | 9/2009 | Willwerth et al. |
| 2009/0239386 | A1 | 9/2009 | Suzaki et al. |
| 2009/0242130 | A1 | 10/2009 | Tian et al. |
| 2009/0242957 | A1 | 10/2009 | Ma et al. |
| 2009/0246374 | A1 | 10/2009 | Vukovic |
| 2009/0246399 | A1 | 10/2009 | Goundar |
| 2009/0246971 | A1 | 10/2009 | Reid et al. |
| 2009/0250004 | A1 | 10/2009 | Yamada et al. |
| 2009/0250955 | A1 | 10/2009 | Aoki |
| 2009/0255901 | A1 | 10/2009 | Okita |
| 2009/0256127 | A1 | 10/2009 | Feist et al. |
| 2009/0261331 | A1 | 10/2009 | Yang et al. |
| 2009/0266296 | A1 | 10/2009 | Tachibana et al. |
| 2009/0267135 | A1 | 10/2009 | Tanaka et al. |
| 2009/0267225 | A1 | 10/2009 | Eguchi |
| 2009/0269506 | A1 | 10/2009 | Okum et al. |
| 2009/0269507 | A1 | 10/2009 | Yu et al. |
| 2009/0269941 | A1 | 10/2009 | Raisanen |
| 2009/0275205 | A1 | 11/2009 | Kiehlbauch et al. |
| 2009/0275210 | A1 | 11/2009 | Shanker et al. |
| 2009/0277510 | A1 | 11/2009 | Shikata |
| 2009/0277874 | A1 | 11/2009 | Rui et al. |
| 2009/0280248 | A1 | 11/2009 | Goodman et al. |
| 2009/0283041 | A1 | 11/2009 | Tomiyasu et al. |
| 2009/0283217 | A1 | 11/2009 | Lubomirsky et al. |
| 2009/0284156 | A1 | 11/2009 | Banna et al. |
| 2009/0286400 | A1 | 11/2009 | Heo et al. |
| 2009/0286402 | A1 | 11/2009 | Xia et al. |
| 2009/0286405 | A1 | 11/2009 | Okesaku et al. |
| 2009/0289300 | A1 | 11/2009 | Sasaki et al. |
| 2009/0291208 | A1 | 11/2009 | Gordon et al. |
| 2009/0291566 | A1 | 11/2009 | Ueno et al. |
| 2009/0297696 | A1 | 12/2009 | Pore et al. |
| 2009/0297710 | A1 | 12/2009 | Lindfors |
| 2009/0297731 | A1 | 12/2009 | Goundar |
| 2009/0298257 | A1 | 12/2009 | Lee et al. |
| 2009/0302002 | A1 | 12/2009 | Collins et al. |
| 2009/0302434 | A1 | 12/2009 | Pallem et al. |
| 2009/0304558 | A1 | 12/2009 | Patton |
| 2009/0308315 | A1 | 12/2009 | de Ridder |
| 2009/0308425 | A1 | 12/2009 | Yednak |
| 2009/0311857 | A1 | 12/2009 | Todd et al. |
| 2009/0314208 | A1 | 12/2009 | Zhou et al. |
| 2009/0314309 | A1 | 12/2009 | Sankarakrishnan et al. |
| 2009/0315093 | A1 | 12/2009 | Li et al. |
| 2009/0317214 | A1 | 12/2009 | Hsiao et al. |
| 2009/0320754 | A1 | 12/2009 | Oya |
| 2009/0320881 | A1 | 12/2009 | Aitchison |
| 2009/0324971 | A1 | 12/2009 | De Vries et al. |
| 2009/0324989 | A1 | 12/2009 | Witz et al. |
| 2009/0325391 | A1 | 12/2009 | De Vusser et al. |
| 2009/0325469 | A1 | 12/2009 | Koo et al. |
| 2010/0000608 | A1 | 1/2010 | Goto et al. |
| 2010/0001409 | A1 | 1/2010 | Humbert et al. |
| 2010/0003406 | A1 | 1/2010 | Lam et al. |
| 2010/0006031 | A1 | 1/2010 | Choi et al. |
| 2010/0006923 | A1 | 1/2010 | Fujitsuka |
| 2010/0008656 | A1 | 1/2010 | Sorabji et al. |
| 2010/0012036 | A1 | 1/2010 | Silva et al. |
| 2010/0012153 | A1 | 1/2010 | Shigemoto et al. |
| 2010/0014479 | A1 | 1/2010 | Kim |
| 2010/0015813 | A1 | 1/2010 | McGinnis et al. |

(56) References Cited

U.S. PATENT DOCUMENTS

| | | | |
|---|---|---|---|
| 2010/0018460 | A1 | 1/2010 | Singh et al. |
| 2010/0018913 | A1 | 1/2010 | Blum |
| 2010/0022097 | A1 | 1/2010 | Yamoto et al. |
| 2010/0024727 | A1 | 2/2010 | Kim et al. |
| 2010/0024872 | A1 | 2/2010 | Kishimoto |
| 2010/0025766 | A1 | 2/2010 | Nuttinck et al. |
| 2010/0025796 | A1 | 2/2010 | Dabiran |
| 2010/0031884 | A1 | 2/2010 | Aggarwal et al. |
| 2010/0032587 | A1 | 2/2010 | Hosch et al. |
| 2010/0032842 | A1 | 2/2010 | Herdt et al. |
| 2010/0034719 | A1 | 2/2010 | Dussarrat et al. |
| 2010/0038687 | A1 | 2/2010 | Klaus et al. |
| 2010/0040441 | A1 | 2/2010 | Obikane |
| 2010/0041179 | A1 | 2/2010 | Lee |
| 2010/0041243 | A1 | 2/2010 | Cheng et al. |
| 2010/0046321 | A1 | 2/2010 | McLaughlin et al. |
| 2010/0050943 | A1 | 3/2010 | Kato et al. |
| 2010/0051584 | A1 | 3/2010 | Okita et al. |
| 2010/0051597 | A1 | 3/2010 | Morita et al. |
| 2010/0055312 | A1 | 3/2010 | Kato et al. |
| 2010/0055316 | A1 | 3/2010 | Honma |
| 2010/0055318 | A1 | 3/2010 | Volf et al. |
| 2010/0055442 | A1 | 3/2010 | Kellock |
| 2010/0055898 | A1 | 3/2010 | Chang et al. |
| 2010/0058984 | A1 | 3/2010 | Marubayashi |
| 2010/0065758 | A1 | 3/2010 | Liu et al. |
| 2010/0068009 | A1 | 3/2010 | Kimura |
| 2010/0068383 | A1 | 3/2010 | Kato et al. |
| 2010/0068414 | A1 | 3/2010 | Takahashi et al. |
| 2010/0068891 | A1 | 3/2010 | Hatanaka et al. |
| 2010/0075037 | A1 | 3/2010 | Marsh et al. |
| 2010/0075488 | A1 | 3/2010 | Collins et al. |
| 2010/0075507 | A1 | 3/2010 | Chang et al. |
| 2010/0078601 | A1 | 4/2010 | Pallem et al. |
| 2010/0078746 | A1 | 4/2010 | Jung |
| 2010/0081094 | A1 | 4/2010 | Hasebe et al. |
| 2010/0081293 | A1 | 4/2010 | Mallick et al. |
| 2010/0086703 | A1 | 4/2010 | Mangum et al. |
| 2010/0087069 | A1 | 4/2010 | Miya et al. |
| 2010/0089320 | A1 | 4/2010 | Kim |
| 2010/0089870 | A1 | 4/2010 | Hiroshima et al. |
| 2010/0090149 | A1 | 4/2010 | Thompson et al. |
| 2010/0092679 | A1 | 4/2010 | Lee et al. |
| 2010/0092696 | A1 | 4/2010 | Shinriki |
| 2010/0093187 | A1 | 4/2010 | Lee et al. |
| 2010/0094430 | A1 | 4/2010 | Krumdieck |
| 2010/0098862 | A1 | 4/2010 | Xu et al. |
| 2010/0101728 | A1 | 4/2010 | Iwasaki |
| 2010/0102417 | A1 | 4/2010 | Ganguli et al. |
| 2010/0105936 | A1 | 4/2010 | Tada et al. |
| 2010/0111648 | A1 | 5/2010 | Tamura et al. |
| 2010/0112496 | A1 | 5/2010 | Nakajima et al. |
| 2010/0116207 | A1 | 5/2010 | Givens |
| 2010/0116208 | A1 | 5/2010 | Sangam |
| 2010/0116209 | A1 | 5/2010 | Kato |
| 2010/0119439 | A1 | 5/2010 | Shindou |
| 2010/0119727 | A1 | 5/2010 | Takagi |
| 2010/0119844 | A1 | 5/2010 | Sun et al. |
| 2010/0120261 | A1 | 5/2010 | Kim et al. |
| 2010/0121100 | A1 | 5/2010 | Shay |
| 2010/0124610 | A1 | 5/2010 | Aikawa et al. |
| 2010/0124618 | A1 | 5/2010 | Kobayashi et al. |
| 2010/0124621 | A1 | 5/2010 | Kobayashi et al. |
| 2010/0126415 | A1 | 5/2010 | Ishino et al. |
| 2010/0126539 | A1 | 5/2010 | Lee et al. |
| 2010/0126605 | A1 | 5/2010 | Stones |
| 2010/0126666 | A1 | 5/2010 | Tandou et al. |
| 2010/0129548 | A1 | 5/2010 | Sneh |
| 2010/0129670 | A1 | 5/2010 | Sun et al. |
| 2010/0129990 | A1 | 5/2010 | Nishizawa et al. |
| 2010/0130015 | A1 | 5/2010 | Nakajima et al. |
| 2010/0130017 | A1 | 5/2010 | Luo et al. |
| 2010/0130105 | A1 | 5/2010 | Lee |
| 2010/0133255 | A1 | 6/2010 | Bahng et al. |
| 2010/0134023 | A1 | 6/2010 | Mills |
| 2010/0136216 | A1 | 6/2010 | Tsuei et al. |
| 2010/0140221 | A1 | 6/2010 | Kikuchi et al. |
| 2010/0140684 | A1 | 6/2010 | Ozawa |
| 2010/0143609 | A1 | 6/2010 | Fukazawa et al. |
| 2010/0144150 | A1 | 6/2010 | Sills et al. |
| 2010/0144162 | A1 | 6/2010 | Lee et al. |
| 2010/0144968 | A1 | 6/2010 | Lee et al. |
| 2010/0145547 | A1 | 6/2010 | Darabnia et al. |
| 2010/0147396 | A1 | 6/2010 | Yamagishi et al. |
| 2010/0151206 | A1 | 6/2010 | Wu et al. |
| 2010/0159638 | A1 | 6/2010 | Jeong |
| 2010/0159707 | A1 | 6/2010 | Huang et al. |
| 2010/0162752 | A1 | 7/2010 | Tabata et al. |
| 2010/0162956 | A1 | 7/2010 | Murakami et al. |
| 2010/0163187 | A1 | 7/2010 | Yokogawa et al. |
| 2010/0163524 | A1 | 7/2010 | Arai |
| 2010/0163937 | A1 | 7/2010 | Clendenning |
| 2010/0166630 | A1 | 7/2010 | Gu et al. |
| 2010/0168404 | A1 | 7/2010 | Girolami et al. |
| 2010/0170441 | A1 | 7/2010 | Won et al. |
| 2010/0170868 | A1 | 7/2010 | Lin et al. |
| 2010/0173432 | A1 | 7/2010 | White et al. |
| 2010/0178137 | A1 | 7/2010 | Chintalapati et al. |
| 2010/0178423 | A1 | 7/2010 | Shimizu et al. |
| 2010/0180819 | A1 | 7/2010 | Hatanaka et al. |
| 2010/0183825 | A1 | 7/2010 | Becker et al. |
| 2010/0184302 | A1 | 7/2010 | Lee et al. |
| 2010/0186669 | A1 | 7/2010 | Shin et al. |
| 2010/0189923 | A1 | 7/2010 | Goundar et al. |
| 2010/0193501 | A1 | 8/2010 | Zucker et al. |
| 2010/0193955 | A1 | 8/2010 | Milligan et al. |
| 2010/0195392 | A1 | 8/2010 | Freeman |
| 2010/0195690 | A1 | 8/2010 | Moench et al. |
| 2010/0197107 | A1 | 8/2010 | Matsuzaki |
| 2010/0202860 | A1 | 8/2010 | Reed |
| 2010/0203242 | A1 | 8/2010 | Borden |
| 2010/0206767 | A1 | 8/2010 | Odashima et al. |
| 2010/0209598 | A1 | 8/2010 | Xu et al. |
| 2010/0210108 | A1 | 8/2010 | Ishizaka et al. |
| 2010/0219757 | A1 | 9/2010 | Benzerrouk et al. |
| 2010/0221452 | A1 | 9/2010 | Kang |
| 2010/0224130 | A1 | 9/2010 | Smith et al. |
| 2010/0227458 | A1 | 9/2010 | Chung et al. |
| 2010/0229795 | A1 | 9/2010 | Tanabe |
| 2010/0229965 | A1 | 9/2010 | Kashima et al. |
| 2010/0230051 | A1 | 9/2010 | Iizuka |
| 2010/0230863 | A1 | 9/2010 | Moench et al. |
| 2010/0233885 | A1 | 9/2010 | Kushibiki et al. |
| 2010/0233886 | A1 | 9/2010 | Yang et al. |
| 2010/0236691 | A1 | 9/2010 | Yamazaki |
| 2010/0243166 | A1 | 9/2010 | Hayashi et al. |
| 2010/0244688 | A1 | 9/2010 | Braun et al. |
| 2010/0248465 | A1 | 9/2010 | Yi et al. |
| 2010/0252434 | A1 | 10/2010 | Roy |
| 2010/0255196 | A1 | 10/2010 | Geisler et al. |
| 2010/0255198 | A1 | 10/2010 | Cleary et al. |
| 2010/0255218 | A1 | 10/2010 | Oka et al. |
| 2010/0255625 | A1 | 10/2010 | De Vries |
| 2010/0255658 | A1 | 10/2010 | Aggarwal |
| 2010/0258809 | A1 | 10/2010 | Muller |
| 2010/0259152 | A1 | 10/2010 | Yasuda et al. |
| 2010/0266765 | A1 | 10/2010 | White et al. |
| 2010/0267224 | A1 | 10/2010 | Choi et al. |
| 2010/0267248 | A1 | 10/2010 | Ma |
| 2010/0270675 | A1 | 10/2010 | Harada |
| 2010/0246630 | A1 | 11/2010 | Kaszynski et al. |
| 2010/0275846 | A1 | 11/2010 | Kitagawa |
| 2010/0279008 | A1 | 11/2010 | Takagi |
| 2010/0279512 | A1 | 11/2010 | Udea et al. |
| 2010/0282163 | A1 | 11/2010 | Aggarwal et al. |
| 2010/0282170 | A1 | 11/2010 | Nishizawa |
| 2010/0282645 | A1 | 11/2010 | Wang |
| 2010/0285237 | A1 | 11/2010 | Ditizio et al. |
| 2010/0285319 | A1 | 11/2010 | Kwak et al. |
| 2010/0294199 | A1 | 11/2010 | Tran et al. |
| 2010/0297391 | A1 | 11/2010 | Kley |
| 2010/0301752 | A1 | 12/2010 | Bakre et al. |
| 2010/0304047 | A1 | 12/2010 | Yang et al. |
| 2010/0307415 | A1 | 12/2010 | Shero et al. |

(56) References Cited

U.S. PATENT DOCUMENTS

2010/0317177 A1 12/2010 Huang et al.
2010/0317198 A1 12/2010 Antonelli
2010/0322604 A1 12/2010 Fondurulia et al.
2010/0322822 A1 12/2010 Fritchie et al.
2010/0326358 A1 12/2010 Choi
2011/0000619 A1 1/2011 Suh
2011/0003087 A1 1/2011 Soininen et al.
2011/0003450 A1 1/2011 Lee et al.
2011/0005684 A1 1/2011 Hayami et al.
2011/0006402 A1 1/2011 Zhou
2011/0006406 A1 1/2011 Urbanowicz et al.
2011/0008950 A1 1/2011 Xu
2011/0014359 A1 1/2011 Hashim
2011/0014795 A1 1/2011 Lee
2011/0017139 A1 1/2011 Chiang et al.
2011/0021033 A1 1/2011 Ikeuchi et al.
2011/0027725 A1 2/2011 Tsutsumi et al.
2011/0027999 A1 2/2011 Sparks et al.
2011/0031562 A1 2/2011 Lin et al.
2011/0034039 A1 2/2011 Liang et al.
2011/0039419 A1 2/2011 Date et al.
2011/0041764 A1 2/2011 Webb et al.
2011/0042200 A1 2/2011 Wilby
2011/0045610 A1 2/2011 Van schravendijk
2011/0045676 A1 2/2011 Park et al.
2011/0046314 A1 2/2011 Klipp et al.
2011/0048642 A1 3/2011 Mihara et al.
2011/0048769 A1 3/2011 Fujiwara
2011/0049100 A1 3/2011 Han et al.
2011/0052833 A1 3/2011 Hanawa et al.
2011/0053383 A1 3/2011 Shero et al.
2011/0056513 A1 3/2011 Hombach et al.
2011/0056626 A1 3/2011 Brown et al.
2011/0057248 A1 3/2011 Ma et al.
2011/0061810 A1 3/2011 Ganguly et al.
2011/0065289 A1 3/2011 Asai
2011/0067522 A1 3/2011 Lai
2011/0070380 A1 3/2011 Shero et al.
2011/0070740 A1 3/2011 Bettencourt et al.
2011/0076401 A1 3/2011 Chao et al.
2011/0081519 A1 4/2011 Dillingh
2011/0083496 A1 4/2011 Lin et al.
2011/0086516 A1 4/2011 Lee et al.
2011/0089166 A1 4/2011 Hunter et al.
2011/0089419 A1 4/2011 Yamazaki et al.
2011/0089469 A1 4/2011 Merckling
2011/0091650 A1 4/2011 Noguchi et al.
2011/0092077 A1 4/2011 Xu et al.
2011/0097901 A1 4/2011 Banna et al.
2011/0098841 A1 4/2011 Tsuda
2011/0100489 A1 5/2011 Orito et al.
2011/0104395 A1 5/2011 Kumagai et al.
2011/0107512 A1 5/2011 Gilbert
2011/0108194 A1 5/2011 Yoshioka et al.
2011/0108424 A1 5/2011 Puget et al.
2011/0108741 A1 5/2011 Ingram
2011/0108929 A1 5/2011 Meng
2011/0114261 A1 5/2011 Matsumoto et al.
2011/0114601 A1 5/2011 Lubomirsky et al.
2011/0115378 A1 5/2011 Lubomirsky et al.
2011/0117490 A1 5/2011 Bae et al.
2011/0117492 A1 5/2011 Yamada et al.
2011/0117728 A1 5/2011 Su et al.
2011/0117732 A1 5/2011 Bauer et al.
2011/0117737 A1 5/2011 Agarwala et al.
2011/0117749 A1 5/2011 Sheu
2011/0121503 A1 5/2011 Burrows et al.
2011/0121736 A1 5/2011 Hirayama et al.
2011/0124196 A1 5/2011 Lee
2011/0127702 A1 6/2011 Gautam et al.
2011/0132542 A1 6/2011 Ilzuka
2011/0135842 A1 6/2011 Faguet et al.
2011/0139272 A1 6/2011 Matsumoto et al.
2011/0139748 A1 6/2011 Donnelly et al.
2011/0140172 A1 6/2011 Chu
2011/0140173 A1 6/2011 Ramdani
2011/0143032 A1 6/2011 Vrtis et al.
2011/0143461 A1 6/2011 Fish et al.
2011/0155264 A1 6/2011 Minami et al.
2011/0155322 A1 6/2011 Himori et al.
2011/0159200 A1 6/2011 Kogure
2011/0159202 A1 6/2011 Matsushita
2011/0159673 A1 6/2011 Hanawa et al.
2011/0159680 A1 6/2011 Yoo
2011/0168330 A1 7/2011 Sakaue et al.
2011/0171380 A1 7/2011 Higashi et al.
2011/0171775 A1 7/2011 Yamamoto et al.
2011/0175011 A1 7/2011 Ehrne et al.
2011/0177648 A1 7/2011 Tanner et al.
2011/0180233 A1 7/2011 Bera et al.
2011/0183079 A1 7/2011 Jackson et al.
2011/0183269 A1 7/2011 Zhu
2011/0183527 A1 7/2011 Cho
2011/0185969 A1 8/2011 Yang
2011/0186984 A1 8/2011 Saito et al.
2011/0192820 A1 8/2011 Yeom et al.
2011/0195574 A1 8/2011 Blasco et al.
2011/0198034 A1 8/2011 Sun et al.
2011/0198417 A1 8/2011 Detmar et al.
2011/0198736 A1 8/2011 Shero et al.
2011/0204025 A1 8/2011 Tahara
2011/0207332 A1 8/2011 Liu et al.
2011/0210468 A1 9/2011 Shannon et al.
2011/0212625 A1 9/2011 Toyoda et al.
2011/0217838 A1 9/2011 Hsieh et al.
2011/0220874 A1 9/2011 Hanrath
2011/0223334 A1 9/2011 Yudovsky et al.
2011/0226421 A1 9/2011 Hayashi
2011/0232678 A1 9/2011 Shih et al.
2011/0236201 A1 9/2011 Shende
2011/0236594 A1 9/2011 Haverkamp et al.
2011/0236600 A1 9/2011 Fox et al.
2011/0237040 A1 9/2011 Ng et al.
2011/0237082 A1 9/2011 Nakajima et al.
2011/0239936 A1 10/2011 Suzaki et al.
2011/0239940 A1 10/2011 Benvenuti et al.
2011/0244673 A1 10/2011 Cho et al.
2011/0253044 A1 10/2011 Tam et al.
2011/0254052 A1 10/2011 Kouvetakis
2011/0256675 A1 10/2011 Avouris
2011/0256692 A1 10/2011 Tam et al.
2011/0256724 A1 10/2011 Chandrasekharan et al.
2011/0256726 A1 10/2011 Lavoie et al.
2011/0256727 A1 10/2011 Beynet et al.
2011/0256734 A1 10/2011 Hausmann et al.
2011/0259519 A1 10/2011 Kenworthy et al.
2011/0262642 A1 10/2011 Xiao et al.
2011/0263107 A1 10/2011 Chung et al.
2011/0263115 A1 10/2011 Ganguli et al.
2011/0264250 A1 10/2011 Nishimura et al.
2011/0265549 A1 11/2011 Cruse et al.
2011/0265715 A1 11/2011 Keller
2011/0265725 A1 11/2011 Tsuji
2011/0265951 A1 11/2011 Xu et al.
2011/0266611 A1 11/2011 Kim et al.
2011/0269314 A1 11/2011 Lee et al.
2011/0275018 A1 11/2011 Matteo et al.
2011/0275166 A1 11/2011 Shero et al.
2011/0277690 A1 11/2011 Rozenzon et al.
2011/0281417 A1 11/2011 Gordon et al.
2011/0283933 A1 11/2011 Makarov et al.
2011/0286819 A1 11/2011 Shibata et al.
2011/0291243 A1 12/2011 Seamons
2011/0294075 A1 12/2011 Chen et al.
2011/0294288 A1 12/2011 Lee et al.
2011/0297088 A1 12/2011 Song et al.
2011/0298062 A1 12/2011 Ganguli et al.
2011/0300720 A1 12/2011 Fu
2011/0305102 A1 12/2011 Berger et al.
2011/0305856 A1 12/2011 Bonn
2011/0308453 A1 12/2011 Su et al.
2011/0308460 A1 12/2011 Hong et al.
2011/0312191 A1 12/2011 Ohkura et al.
2011/0318142 A1 12/2011 Gage et al.

(56) References Cited

U.S. PATENT DOCUMENTS

2011/0318888 A1 12/2011 Komatsu et al.
2011/0318935 A1 12/2011 Oyabu et al.
2012/0001172 A1 1/2012 Shang et al.
2012/0003500 A1 1/2012 Yoshida et al.
2012/0003599 A1 1/2012 Patalay et al.
2012/0003726 A1 1/2012 Jones et al.
2012/0003831 A1 1/2012 Kang et al.
2012/0006489 A1 1/2012 Okita
2012/0009802 A1 1/2012 Lavoie
2012/0012556 A1 1/2012 Matsumoto et al.
2012/0021252 A1 1/2012 Lee
2012/0024223 A1 2/2012 Torres et al.
2012/0024227 A1 2/2012 Takasuka et al.
2012/0024231 A1 2/2012 Horino
2012/0024478 A1 2/2012 Huang et al.
2012/0024479 A1 2/2012 Palagashvili et al.
2012/0027547 A1 2/2012 Jager et al.
2012/0028454 A1 2/2012 Swaminathan et al.
2012/0028469 A1 2/2012 Onizawa et al.
2012/0031333 A1 2/2012 Kurita et al.
2012/0031500 A1 2/2012 Hirose et al.
2012/0032311 A1 2/2012 Gates
2012/0033695 A1 2/2012 Hayashi et al.
2012/0034793 A1 2/2012 Narushima et al.
2012/0036732 A1 2/2012 Varadarajan
2012/0040097 A1 2/2012 Volf et al.
2012/0040528 A1 2/2012 Kim et al.
2012/0043556 A1 2/2012 Dube et al.
2012/0043617 A1 2/2012 Nakagawa et al.
2012/0046421 A1 2/2012 Darling et al.
2012/0052681 A1 3/2012 Marsh
2012/0055401 A1 3/2012 Tozawa
2012/0058270 A1 3/2012 Winter et al.
2012/0058630 A1 3/2012 Quinn
2012/0064690 A1 3/2012 Hirota et al.
2012/0064726 A1 3/2012 Nozawa et al.
2012/0064764 A1 3/2012 Islam
2012/0068242 A1 3/2012 Shin et al.
2012/0070136 A1 3/2012 Koelmel et al.
2012/0070997 A1 3/2012 Larson
2012/0073400 A1 3/2012 Wang
2012/0074533 A1 3/2012 Aoyama
2012/0077349 A1 3/2012 Li et al.
2012/0077350 A1 3/2012 Miya et al.
2012/0080756 A1 4/2012 Suzuki
2012/0083134 A1 4/2012 Wu et al.
2012/0088031 A1 4/2012 Neel
2012/0088369 A1 4/2012 Weidman et al.
2012/0090704 A1 4/2012 Laverdiere et al.
2012/0091522 A1 4/2012 Ozaki et al.
2012/0094010 A1 4/2012 Sugiura et al.
2012/0094468 A1 4/2012 Bhatia et al.
2012/0098107 A1 4/2012 Raisanen et al.
2012/0100464 A1 4/2012 Kageyama
2012/0103264 A1 5/2012 Choi et al.
2012/0103522 A1 5/2012 Hohenwarter
2012/0103939 A1 5/2012 Wu et al.
2012/0104514 A1 5/2012 Park et al.
2012/0107607 A1 5/2012 Takaki et al.
2012/0108039 A1 5/2012 Zojaji et al.
2012/0108048 A1 5/2012 Lim et al.
2012/0111271 A1 5/2012 Begarney et al.
2012/0114877 A1 5/2012 Lee
2012/0115250 A1 5/2012 Ariga et al.
2012/0115257 A1 5/2012 Matsuyam et al.
2012/0119337 A1 5/2012 Sasaki et al.
2012/0121823 A1 5/2012 Chhabra
2012/0122275 A1 5/2012 Koo et al.
2012/0122302 A1 5/2012 Weisman et al.
2012/0122319 A1 5/2012 Shimizu
2012/0125258 A1 5/2012 Lee
2012/0126300 A1 5/2012 Park et al.
2012/0128897 A1 5/2012 Xiao et al.
2012/0135145 A1 5/2012 Je et al.
2012/0139009 A1 6/2012 Ning et al.
2012/0145078 A1 6/2012 Huang et al.
2012/0146113 A1 6/2012 Suzuki et al.
2012/0149207 A1 6/2012 Graff
2012/0149213 A1 6/2012 Nittala
2012/0156108 A1 6/2012 Fondurulia et al.
2012/0156890 A1 6/2012 Yim et al.
2012/0160172 A1 6/2012 Wamura et al.
2012/0160809 A1 6/2012 Ishibashi et al.
2012/0161126 A1 6/2012 Yamazaki
2012/0161405 A1 6/2012 Mohn
2012/0164327 A1 6/2012 Sato
2012/0164837 A1 6/2012 Tan et al.
2012/0164842 A1 6/2012 Watanabe
2012/0164846 A1 6/2012 Ha et al.
2012/0170170 A1 7/2012 Gros-Jean
2012/0171391 A1 7/2012 Won
2012/0171874 A1 7/2012 Thridandam et al.
2012/0175518 A1 7/2012 Godet et al.
2012/0175751 A1 7/2012 Gatineau et al.
2012/0177845 A1 7/2012 Odedra et al.
2012/0180719 A1 7/2012 Inoue
2012/0180954 A1 7/2012 Yang et al.
2012/0183689 A1 7/2012 Suzuki et al.
2012/0186521 A1 7/2012 Iwasaki et al.
2012/0186573 A1 7/2012 Jdira et al.
2012/0187083 A1 7/2012 Hashizume
2012/0187305 A1 7/2012 Elam et al.
2012/0187375 A1 7/2012 Guo et al.
2012/0190178 A1 7/2012 Wang et al.
2012/0190185 A1 7/2012 Rogers
2012/0190208 A1 7/2012 Ozu et al.
2012/0196048 A1 8/2012 Ueda
2012/0196242 A1 8/2012 Volfovski et al.
2012/0196450 A1 8/2012 Balseanu et al.
2012/0202358 A1 8/2012 Gealy et al.
2012/0206033 A1 8/2012 Matsuyama
2012/0207456 A1 8/2012 Kim et al.
2012/0212121 A1 8/2012 Lin
2012/0213947 A1 8/2012 Lee
2012/0214318 A1 8/2012 Fukazawa et al.
2012/0216743 A1 8/2012 Itoh et al.
2012/0219735 A1 8/2012 Bakker et al.
2012/0219824 A1 8/2012 Prolier
2012/0220139 A1 8/2012 Lee et al.
2012/0222813 A1 9/2012 Pal et al.
2012/0222815 A1 9/2012 Sabri et al.
2012/0225192 A1 9/2012 Yudovsky et al.
2012/0225561 A1 9/2012 Watanabe
2012/0231611 A1 9/2012 Gatineau et al.
2012/0231771 A1 9/2012 Marcus
2012/0232340 A1 9/2012 Levy et al.
2012/0238074 A1 9/2012 Santhanam et al.
2012/0240858 A1 9/2012 Taniyama et al.
2012/0241089 A1 9/2012 Dielmann et al.
2012/0241411 A1 9/2012 Darling et al.
2012/0244703 A1 9/2012 Nakayama et al.
2012/0247386 A1 10/2012 Sanchez et al.
2012/0252229 A1 10/2012 Timans et al.
2012/0258257 A1 10/2012 Nguyen et al.
2012/0263875 A1 10/2012 Brenninger et al.
2012/0263876 A1 10/2012 Haukka et al.
2012/0263887 A1 10/2012 Papasouliotis et al.
2012/0264051 A1 10/2012 Angelov et al.
2012/0264305 A1 10/2012 Nakano
2012/0267048 A1 10/2012 Moyama et al.
2012/0269962 A1 10/2012 Blomberg et al.
2012/0269967 A1 10/2012 Yudovsky et al.
2012/0270339 A1 10/2012 Xie et al.
2012/0270384 A1 10/2012 Sanchez et al.
2012/0270393 A1 10/2012 Pore et al.
2012/0270407 A1 10/2012 Werner et al.
2012/0273052 A1 11/2012 Ye et al.
2012/0273162 A1 11/2012 Mahadeswaraswamy
2012/0276306 A1 11/2012 Ueda
2012/0288625 A1 11/2012 Furuya et al.
2012/0289053 A1 11/2012 Holland et al.
2012/0289056 A1 11/2012 Bergman et al.
2012/0289057 A1 11/2012 DeDontney
2012/0295427 A1 11/2012 Bauer

(56) References Cited

U.S. PATENT DOCUMENTS

| | | | |
|---|---|---|---|
| 2012/0295449 | A1 | 11/2012 | Fukazawa |
| 2012/0302055 | A1 | 11/2012 | Pore |
| 2012/0303313 | A1 | 11/2012 | Moroi et al. |
| 2012/0304935 | A1 | 12/2012 | Oosterlaken et al. |
| 2012/0305026 | A1 | 12/2012 | Nomura et al. |
| 2012/0305196 | A1 | 12/2012 | Mori et al. |
| 2012/0305987 | A1 | 12/2012 | Hirler et al. |
| 2012/0307588 | A1 | 12/2012 | Hanada et al. |
| 2012/0309181 | A1 | 12/2012 | Machkaoutsan et al. |
| 2012/0310440 | A1 | 12/2012 | Darabnia et al. |
| 2012/0315113 | A1 | 12/2012 | Hiroki |
| 2012/0315404 | A1 | 12/2012 | Li et al. |
| 2012/0318334 | A1 | 12/2012 | Bedell et al. |
| 2012/0318457 | A1 | 12/2012 | Nguyen et al. |
| 2012/0318773 | A1 | 12/2012 | Wu et al. |
| 2012/0319279 | A1 | 12/2012 | Isobayashi |
| 2012/0320491 | A1 | 12/2012 | Doh et al. |
| 2012/0321786 | A1 | 12/2012 | Satitpunwaycha et al. |
| 2012/0322252 | A1 | 12/2012 | Son et al. |
| 2012/0325148 | A1 | 12/2012 | Yamagishi et al. |
| 2012/0328780 | A1 | 12/2012 | Yamagishi et al. |
| 2012/0329208 | A1 | 12/2012 | Pore et al. |
| 2013/0002121 | A1 | 1/2013 | Ma |
| 2013/0005122 | A1 | 1/2013 | Schwarzenbach et al. |
| 2013/0005147 | A1 | 1/2013 | Angyal et al. |
| 2013/0008607 | A1 | 1/2013 | Matsumoto et al. |
| 2013/0011630 | A1 | 1/2013 | Sullivan et al. |
| 2013/0011983 | A1 | 1/2013 | Tsai |
| 2013/0011984 | A1 | 1/2013 | Wang et al. |
| 2013/0012003 | A1 | 1/2013 | Haukka et al. |
| 2013/0012034 | A1 | 1/2013 | Ahn et al. |
| 2013/0014697 | A1 | 1/2013 | Kanayama |
| 2013/0014896 | A1 | 1/2013 | Shoji et al. |
| 2013/0017503 | A1 | 1/2013 | de Ridder et al. |
| 2013/0019944 | A1 | 1/2013 | Hekmatshoar-Tabai et al. |
| 2013/0019945 | A1 | 1/2013 | Hekmatshoar-Tabai et al. |
| 2013/0019960 | A1 | 1/2013 | Choi et al. |
| 2013/0020246 | A1 | 1/2013 | Hoots et al. |
| 2013/0023120 | A1 | 1/2013 | Yaehashi et al. |
| 2013/0023124 | A1 | 1/2013 | Nemani et al. |
| 2013/0023129 | A1 | 1/2013 | Reed |
| 2013/0025538 | A1 | 1/2013 | Collins et al. |
| 2013/0025786 | A1 | 1/2013 | Davidkovich et al. |
| 2013/0026451 | A1 | 1/2013 | Bangsaruntip et al. |
| 2013/0032085 | A1 | 2/2013 | Hanawa et al. |
| 2013/0037532 | A1 | 2/2013 | Volfovski et al. |
| 2013/0037858 | A1 | 2/2013 | Hong et al. |
| 2013/0037886 | A1 | 2/2013 | Tsai et al. |
| 2013/0040447 | A1 | 2/2013 | Swaminathan et al. |
| 2013/0040481 | A1 | 2/2013 | Vallely et al. |
| 2013/0042811 | A1 | 2/2013 | Shanker et al. |
| 2013/0048606 | A1 | 2/2013 | Mao et al. |
| 2013/0052585 | A1 | 2/2013 | Ayothi et al. |
| 2013/0052836 | A1 | 2/2013 | Hirose et al. |
| 2013/0059078 | A1 | 3/2013 | Gatineau et al. |
| 2013/0059415 | A1 | 3/2013 | Kato et al. |
| 2013/0061755 | A1 | 3/2013 | Frederick |
| 2013/0062753 | A1 | 3/2013 | Nguyen et al. |
| 2013/0062839 | A1 | 3/2013 | Tschinderle et al. |
| 2013/0064973 | A1 | 3/2013 | Chen et al. |
| 2013/0065189 | A1 | 3/2013 | Yoshii et al. |
| 2013/0068391 | A1 | 3/2013 | Mazzocco et al. |
| 2013/0068727 | A1 | 3/2013 | Okita |
| 2013/0068970 | A1 | 3/2013 | Matsushita |
| 2013/0069052 | A1 | 3/2013 | Sandhu |
| 2013/0070456 | A1 | 3/2013 | Jang et al. |
| 2013/0075746 | A1 | 3/2013 | Mallikarjunaswamy et al. |
| 2013/0075788 | A1 | 3/2013 | Tomabechi |
| 2013/0078376 | A1 | 3/2013 | Higashino et al. |
| 2013/0078392 | A1 | 3/2013 | Xiao et al. |
| 2013/0081702 | A1 | 4/2013 | Mohammed et al. |
| 2013/0082274 | A1 | 4/2013 | Yang |
| 2013/0084156 | A1 | 4/2013 | Shimamoto |
| 2013/0084408 | A1 | 4/2013 | Nakao et al. |
| 2013/0084711 | A1 | 4/2013 | Liang et al. |
| 2013/0084714 | A1 | 4/2013 | Oka et al. |
| 2013/0085618 | A1 | 4/2013 | Ding |
| 2013/0089667 | A1 | 4/2013 | Lai et al. |
| 2013/0089716 | A1 | 4/2013 | Krishnamurthy et al. |
| 2013/0089988 | A1 | 4/2013 | Wang et al. |
| 2013/0092085 | A1 | 4/2013 | Lee |
| 2013/0093048 | A1 | 4/2013 | Chang et al. |
| 2013/0093321 | A1 | 4/2013 | Yoshikawa et al. |
| 2013/0095664 | A1 | 4/2013 | Matero et al. |
| 2013/0095973 | A1 | 4/2013 | Kroneberger et al. |
| 2013/0099318 | A1 | 4/2013 | Adam et al. |
| 2013/0104988 | A1 | 5/2013 | Yednak et al. |
| 2013/0104992 | A1 | 5/2013 | Yednak et al. |
| 2013/0107415 | A1 | 5/2013 | Banna et al. |
| 2013/0109172 | A1 | 5/2013 | Collins et al. |
| 2013/0109192 | A1 | 5/2013 | Hawkins et al. |
| 2013/0112251 | A1 | 5/2013 | Hang et al. |
| 2013/0113085 | A1 | 5/2013 | Michaelson et al. |
| 2013/0115383 | A1 | 5/2013 | Lu et al. |
| 2013/0115763 | A1 | 5/2013 | Takamure et al. |
| 2013/0115768 | A1 | 5/2013 | Pore et al. |
| 2013/0118405 | A1 | 5/2013 | Ho et al. |
| 2013/0118895 | A1 | 5/2013 | Roozeboom et al. |
| 2013/0119018 | A1 | 5/2013 | Kanarik et al. |
| 2013/0122712 | A1 | 5/2013 | Kim et al. |
| 2013/0122722 | A1 | 5/2013 | Cissell et al. |
| 2013/0126515 | A1 | 5/2013 | Shero et al. |
| 2013/0129577 | A1 | 5/2013 | Halpin et al. |
| 2013/0130490 | A1 | 5/2013 | Lee et al. |
| 2013/0134148 | A1 | 5/2013 | Tachikawa |
| 2013/0137279 | A1 | 5/2013 | Yamamoto et al. |
| 2013/0143401 | A1 | 6/2013 | Yu et al. |
| 2013/0143415 | A1 | 6/2013 | Yudovsky et al. |
| 2013/0145587 | A1 | 6/2013 | Adhiprakasha |
| 2013/0145984 | A1 | 6/2013 | Zhang et al. |
| 2013/0147050 | A1 | 6/2013 | Bonner, III et al. |
| 2013/0149874 | A1 | 6/2013 | Hirose et al. |
| 2013/0152933 | A1 | 6/2013 | Lischer et al. |
| 2013/0157409 | A1 | 6/2013 | Vaidya |
| 2013/0157521 | A1 | 6/2013 | Aldrich et al. |
| 2013/0160709 | A1 | 6/2013 | White et al. |
| 2013/0161629 | A1 | 6/2013 | Han et al. |
| 2013/0162142 | A1 | 6/2013 | Nishino et al. |
| 2013/0164458 | A1 | 6/2013 | Soininen et al. |
| 2013/0168353 | A1 | 7/2013 | Okita et al. |
| 2013/0168354 | A1 | 7/2013 | Kanarik |
| 2013/0171818 | A1 | 7/2013 | Kim et al. |
| 2013/0175596 | A1 | 7/2013 | Cheng et al. |
| 2013/0177706 | A1 | 7/2013 | Baluja et al. |
| 2013/0180448 | A1 | 7/2013 | Sakaue et al. |
| 2013/0183814 | A1 | 7/2013 | Huang et al. |
| 2013/0186340 | A1 | 7/2013 | Omori et al. |
| 2013/0189635 | A1 | 7/2013 | Lim et al. |
| 2013/0189854 | A1 | 7/2013 | Hausmann et al. |
| 2013/0196502 | A1 | 8/2013 | Haukka et al. |
| 2013/0196507 | A1 | 8/2013 | Ma et al. |
| 2013/0200518 | A1 | 8/2013 | Ahmed et al. |
| 2013/0202387 | A1 | 8/2013 | Hiroki |
| 2013/0203258 | A1 | 8/2013 | Chen et al. |
| 2013/0203266 | A1 | 8/2013 | Hintze |
| 2013/0203267 | A1 | 8/2013 | Pomarede et al. |
| 2013/0206066 | A1 | 8/2013 | Han et al. |
| 2013/0209940 | A1 | 8/2013 | Sakamoto et al. |
| 2013/0210241 | A1 | 8/2013 | Lavoie et al. |
| 2013/0213300 | A1 | 8/2013 | Sung et al. |
| 2013/0214232 | A1 | 8/2013 | Tendulkar et al. |
| 2013/0216710 | A1 | 8/2013 | Masuda et al. |
| 2013/0217239 | A1 | 8/2013 | Mallick et al. |
| 2013/0217240 | A1 | 8/2013 | Mallick et al. |
| 2013/0217241 | A1 | 8/2013 | Underwood et al. |
| 2013/0217243 | A1 | 8/2013 | Underwood et al. |
| 2013/0219853 | A1 | 8/2013 | Little et al. |
| 2013/0220550 | A1 | 8/2013 | Koo et al. |
| 2013/0224964 | A1 | 8/2013 | Fukazawa |
| 2013/0228225 | A1 | 9/2013 | Leeser |
| 2013/0228902 | A1 | 9/2013 | Tomizawa et al. |
| 2013/0230814 | A1 | 9/2013 | Dunn et al. |
| 2013/0230987 | A1 | 9/2013 | Draeger et al. |
| 2013/0234203 | A1 | 9/2013 | Tsai et al. |

(56) References Cited

U.S. PATENT DOCUMENTS

2013/0242287 A1 9/2013 Schlezinger
2013/0247937 A1 9/2013 Nunomura et al.
2013/0256265 A1 10/2013 Darling et al.
2013/0256838 A1 10/2013 Sanchez et al.
2013/0256962 A1 10/2013 Ranish
2013/0260371 A1 10/2013 Holt
2013/0264659 A1 10/2013 Jung
2013/0267045 A1 10/2013 Lee et al.
2013/0269609 A1 10/2013 Leeser
2013/0269612 A1 10/2013 Cheng et al.
2013/0270600 A1 10/2013 Helander et al.
2013/0270676 A1 10/2013 Lindert et al.
2013/0273330 A1 10/2013 Wang et al.
2013/0276978 A1 10/2013 Bluck et al.
2013/0280891 A1 10/2013 Kim et al.
2013/0285155 A1 10/2013 Glass
2013/0287526 A1 10/2013 Bluck et al.
2013/0288427 A1 10/2013 Hung et al.
2013/0288471 A1 10/2013 Chi
2013/0288480 A1 10/2013 Sanchez et al.
2013/0288485 A1 10/2013 Liang et al.
2013/0292047 A1 11/2013 Tian et al.
2013/0292676 A1 11/2013 Milligan et al.
2013/0292807 A1 11/2013 Raisanen et al.
2013/0295779 A1 11/2013 Chandra et al.
2013/0299944 A1 11/2013 Lai et al.
2013/0302520 A1 11/2013 Wang et al.
2013/0302999 A1 11/2013 Won et al.
2013/0303803 A1 11/2013 Doerr et al.
2013/0309876 A1 11/2013 Ogawa
2013/0312663 A1 11/2013 Khosla et al.
2013/0313656 A1 11/2013 Tong
2013/0319290 A1 12/2013 Xiao et al.
2013/0320429 A1 12/2013 Thomas
2013/0323435 A1 12/2013 Xiao et al.
2013/0323859 A1 12/2013 Chen et al.
2013/0323935 A1 12/2013 Suzuki et al.
2013/0330165 A1 12/2013 Wimplinger
2013/0330911 A1 12/2013 Huang et al.
2013/0330933 A1 12/2013 Fukazawa et al.
2013/0333619 A1 12/2013 Omari
2013/0337172 A1 12/2013 Lee
2013/0337583 A1 12/2013 Kobayashi et al.
2013/0337639 A1 12/2013 Ivanstov et al.
2013/0337653 A1 12/2013 Kovalgin et al.
2013/0340619 A1 12/2013 Tammera
2013/0340678 A1 12/2013 Wamura et al.
2013/0344248 A1 12/2013 Clark
2014/0000843 A1 1/2014 Dunn et al.
2014/0001520 A1 1/2014 Glass
2014/0004274 A1 1/2014 Thompson
2014/0007808 A1 1/2014 Okabe et al.
2014/0014642 A1 1/2014 Elliot et al.
2014/0014644 A1 1/2014 Akiba et al.
2014/0015108 A1 1/2014 Kim et al.
2014/0015186 A1 1/2014 Wessel et al.
2014/0017408 A1 1/2014 Gandikota et al.
2014/0017414 A1 1/2014 Fukazawa et al.
2014/0017908 A1 1/2014 Beynet et al.
2014/0020619 A1 1/2014 Vincent et al.
2014/0020764 A1 1/2014 Woelk et al.
2014/0020839 A1 1/2014 Kenney et al.
2014/0023794 A1 1/2014 Mahajani et al.
2014/0024223 A1 1/2014 Kilpi et al.
2014/0027884 A1 1/2014 Tang et al.
2014/0030447 A1 1/2014 Lee
2014/0033978 A1 2/2014 Adachi et al.
2014/0034240 A1 2/2014 Kim et al.
2014/0034632 A1 2/2014 Pan et al.
2014/0036274 A1 2/2014 Marquardt et al.
2014/0045324 A1 2/2014 Brabant et al.
2014/0045342 A1 2/2014 Mallick et al.
2014/0047705 A1 2/2014 Singh
2014/0048765 A1 2/2014 Ma et al.
2014/0053866 A1 2/2014 Baluja et al.
2014/0056679 A1 2/2014 Yamabe et al.
2014/0056770 A1 2/2014 Bedard et al.
2014/0057187 A1 2/2014 Suzuki et al.
2014/0057454 A1 2/2014 Subramonium
2014/0058179 A1 2/2014 Stevens et al.
2014/0060147 A1 3/2014 Sarin et al.
2014/0060572 A1 3/2014 Yasumuro et al.
2014/0061770 A1 3/2014 Lee
2014/0062304 A1 3/2014 Nakano et al.
2014/0065841 A1 3/2014 Matero
2014/0067110 A1 3/2014 Lawson et al.
2014/0072710 A1 3/2014 Valle
2014/0072726 A1 3/2014 Kim
2014/0072925 A1 3/2014 Kaneko
2014/0073082 A1 3/2014 Song
2014/0073143 A1 3/2014 Alokozai et al.
2014/0076861 A1 3/2014 Cornelius et al.
2014/0077240 A1 3/2014 Roucka et al.
2014/0080314 A1 3/2014 Sasajima et al.
2014/0084341 A1 3/2014 Weeks
2014/0087490 A1 3/2014 Kahlon
2014/0087544 A1 3/2014 Tolle
2014/0087564 A1 3/2014 Shimizu et al.
2014/0094027 A1 4/2014 Azumo et al.
2014/0096716 A1 4/2014 Chung et al.
2014/0097468 A1 4/2014 Okita
2014/0099794 A1 4/2014 Ingle et al.
2014/0099798 A1 4/2014 Tsuji
2014/0103145 A1 4/2014 White et al.
2014/0106574 A1 4/2014 Kang et al.
2014/0110798 A1 4/2014 Cai
2014/0113457 A1 4/2014 Sims
2014/0116335 A1 5/2014 Tsuji et al.
2014/0117380 A1 5/2014 Loboda et al.
2014/0120312 A1 5/2014 He et al.
2014/0120487 A1 5/2014 Kaneko
2014/0120678 A1 5/2014 Shinriki et al.
2014/0120723 A1 5/2014 Fu et al.
2014/0120738 A1 5/2014 Jung
2014/0120750 A1 5/2014 Johnson
2014/0127422 A1 5/2014 Shao et al.
2014/0127907 A1 5/2014 Yang
2014/0130687 A1 5/2014 Shibusawa et al.
2014/0138779 A1 5/2014 Xie et al.
2014/0141165 A1 5/2014 Sato et al.
2014/0141625 A1 5/2014 Fukazawa et al.
2014/0141674 A1 5/2014 Galbreath et al.
2014/0144375 A1 5/2014 Kim et al.
2014/0144500 A1 5/2014 Cao et al.
2014/0145332 A1 5/2014 Ryan et al.
2014/0147587 A1 5/2014 Endo et al.
2014/0148924 A1 5/2014 Brak et al.
2014/0158154 A1 6/2014 Kondo et al.
2014/0158786 A1 6/2014 Santo
2014/0159170 A1 6/2014 Raisanen et al.
2014/0162401 A1 6/2014 Kawano et al.
2014/0167187 A1 6/2014 Kuo et al.
2014/0170320 A1 6/2014 Yamamoto et al.
2014/0170335 A1 6/2014 Shao et al.
2014/0174354 A1 6/2014 Arai
2014/0174357 A1 6/2014 Kim et al.
2014/0174927 A1 6/2014 Bashir et al.
2014/0175054 A1 6/2014 Carlson et al.
2014/0179091 A1 6/2014 Clark
2014/0179092 A1 6/2014 Kim
2014/0182053 A1 7/2014 Huang
2014/0182689 A1 7/2014 Shareef et al.
2014/0187022 A1 7/2014 Falster et al.
2014/0187045 A1 7/2014 Hua et al.
2014/0190581 A1 7/2014 Nagase et al.
2014/0191389 A1 7/2014 Lee et al.
2014/0193983 A1 7/2014 Lavoie
2014/0202382 A1 7/2014 Kim et al.
2014/0202386 A1 7/2014 Taga
2014/0202388 A1 7/2014 Um et al.
2014/0209976 A1 7/2014 Yang et al.
2014/0213061 A1 7/2014 Huang et al.
2014/0217065 A1 8/2014 Winkler et al.
2014/0220247 A1 8/2014 Haukka et al.

(56) References Cited

U.S. PATENT DOCUMENTS

2014/0225065 A1 8/2014 Rachmady et al.
2014/0227072 A1 8/2014 Lee et al.
2014/0227444 A1 8/2014 Winter et al.
2014/0227861 A1 8/2014 Wu et al.
2014/0227881 A1 8/2014 Lubomirsky et al.
2014/0231922 A1 8/2014 Kim et al.
2014/0234466 A1 8/2014 Gao et al.
2014/0234550 A1 8/2014 Winter et al.
2014/0234992 A1 8/2014 Kubota et al.
2014/0238607 A1 8/2014 Nozawa et al.
2014/0238608 A1 8/2014 Sabri et al.
2014/0242298 A1 8/2014 Lansalot-Matras et al.
2014/0242806 A1 8/2014 Knapp et al.
2014/0242808 A1 8/2014 Akiyama et al.
2014/0245948 A1 9/2014 Nguyen et al.
2014/0251788 A1 9/2014 Ge et al.
2014/0251953 A1 9/2014 Winkler et al.
2014/0251954 A1 9/2014 Winkler et al.
2014/0252134 A1 9/2014 Chen
2014/0252479 A1 9/2014 Utomo et al.
2014/0252710 A1 9/2014 Cuvalci et al.
2014/0256160 A1 9/2014 Wada et al.
2014/0260684 A1 9/2014 Christmann
2014/0262028 A1 9/2014 Kelekar
2014/0262034 A1 9/2014 Ishibashi et al.
2014/0262193 A1 9/2014 Im et al.
2014/0263172 A1 9/2014 Xie et al.
2014/0263272 A1 9/2014 Duan et al.
2014/0264297 A1 9/2014 Kumar et al.
2014/0264444 A1 9/2014 Guo et al.
2014/0264902 A1 9/2014 Ting et al.
2014/0265090 A1 9/2014 Hou
2014/0265832 A1 9/2014 Kenney et al.
2014/0271081 A1 9/2014 Lavitsky et al.
2014/0272194 A1 9/2014 Xiao et al.
2014/0272341 A1 9/2014 Duan et al.
2014/0273428 A1 9/2014 Shero
2014/0273477 A1 9/2014 Niskanen
2014/0273497 A1 9/2014 Payne et al.
2014/0273510 A1 9/2014 Chen et al.
2014/0273528 A1 9/2014 Niskanen
2014/0273530 A1 9/2014 Nguyen
2014/0273531 A1 9/2014 Niskanen
2014/0283747 A1 9/2014 Kasai et al.
2014/0287164 A1 9/2014 Xiao et al.
2014/0287595 A1 9/2014 Shimamoto et al.
2014/0290573 A1 10/2014 Okabe et al.
2014/0290578 A1 10/2014 Wamura et al.
2014/0306250 A1 10/2014 Gardner et al.
2014/0308108 A1 10/2014 Fosnight et al.
2014/0312767 A1 10/2014 Tian et al.
2014/0322862 A1 10/2014 Xie et al.
2014/0322885 A1 10/2014 Xie et al.
2014/0327117 A1 11/2014 Bencher et al.
2014/0339981 A1 11/2014 Komatsu et al.
2014/0346142 A1 11/2014 Chapuis et al.
2014/0346600 A1 11/2014 Cheng et al.
2014/0346650 A1 11/2014 Raisanen et al.
2014/0349033 A1 11/2014 Nonaka et al.
2014/0349068 A1 11/2014 Inglis et al.
2014/0357090 A1 12/2014 Knaepen et al.
2014/0360430 A1 12/2014 Armour et al.
2014/0363980 A1 12/2014 Kawamata et al.
2014/0363983 A1 12/2014 Nakano et al.
2014/0363985 A1 12/2014 Jang et al.
2014/0366804 A1 12/2014 Pak et al.
2014/0367043 A1 12/2014 Bishara et al.
2014/0367642 A1 12/2014 Guo
2014/0377960 A1 12/2014 Koiwa
2015/0004316 A1 1/2015 Thompson et al.
2015/0004317 A1 1/2015 Dussarrat et al.
2015/0004318 A1 1/2015 Alasaarela et al.
2015/0004798 A1 1/2015 Chandrasekharan et al.
2015/0004806 A1 1/2015 Ndiege et al.
2015/0007770 A1 1/2015 Chandrasekharan et al.
2015/0010381 A1 1/2015 Cai
2015/0011095 A1 1/2015 Chandrasekharan et al.
2015/0014632 A1 1/2015 Kim et al.
2015/0014823 A1 1/2015 Mallikarjunan et al.
2015/0017794 A1 1/2015 Takamure
2015/0021599 A1 1/2015 Ridgeway
2015/0024567 A1 1/2015 Tsai et al.
2015/0024609 A1 1/2015 Milligan et al.
2015/0030766 A1 1/2015 Lind et al.
2015/0030782 A1 1/2015 Ivanov et al.
2015/0031218 A1 1/2015 Karakawa
2015/0041431 A1 2/2015 Zafiropoulo et al.
2015/0048485 A1 2/2015 Tolle
2015/0056815 A1 2/2015 Fernandez
2015/0056821 A1 2/2015 Ishikawa
2015/0061078 A1 3/2015 Abel et al.
2015/0064923 A1 3/2015 Matsumoto et al.
2015/0069354 A1 3/2015 Helander et al.
2015/0072509 A1 3/2015 Chi et al.
2015/0078874 A1 3/2015 Sansoni
2015/0079311 A1 3/2015 Nakano
2015/0086316 A1 3/2015 Greenberg
2015/0086716 A1 3/2015 Park et al.
2015/0087139 A1 3/2015 O'Neill et al.
2015/0087154 A1 3/2015 Guha et al.
2015/0091057 A1 4/2015 Xie et al.
2015/0091134 A1 4/2015 Amaratunga et al.
2015/0094470 A1 4/2015 Sanchez et al.
2015/0096973 A1 4/2015 Dunn et al.
2015/0099065 A1 4/2015 Canizares et al.
2015/0099072 A1 4/2015 Takamure et al.
2015/0099123 A1 4/2015 Barbee et al.
2015/0099342 A1 4/2015 Tsai
2015/0099374 A1 4/2015 Kakimoto et al.
2015/0099375 A1 4/2015 Haripin et al.
2015/0102466 A1 4/2015 Colinge
2015/0104574 A1 4/2015 Lee et al.
2015/0104575 A1 4/2015 Takoudis et al.
2015/0110147 A1 4/2015 Mizuno
2015/0110968 A1 4/2015 Lavoie et al.
2015/0111374 A1 4/2015 Bao
2015/0111395 A1 4/2015 Hashimoto et al.
2015/0114295 A1 4/2015 Kim et al.
2015/0118009 A1 4/2015 Hsieh et al.
2015/0118846 A1 4/2015 Isii et al.
2015/0118863 A1 4/2015 Rathod et al.
2015/0122180 A1 5/2015 Chang et al.
2015/0125628 A1 5/2015 Kim et al.
2015/0126036 A1 5/2015 Zhao
2015/0132212 A1 5/2015 Winkler et al.
2015/0132953 A1 5/2015 Nowling et al.
2015/0137315 A1 5/2015 Chen et al.
2015/0140210 A1 5/2015 Jung et al.
2015/0144060 A1 5/2015 Park
2015/0147482 A1 5/2015 Kang et al.
2015/0147483 A1 5/2015 Fukazawa
2015/0147488 A1 5/2015 Choi et al.
2015/0147875 A1 5/2015 Takamure et al.
2015/0147877 A1 5/2015 Jung
2015/0152547 A1 6/2015 Nakamura et al.
2015/0152553 A1 6/2015 Popp et al.
2015/0155140 A1 6/2015 Lee et al.
2015/0155177 A1 6/2015 Zhang et al.
2015/0155370 A1 6/2015 Tsai et al.
2015/0162168 A1 6/2015 Oehrlien
2015/0162185 A1 6/2015 Pore
2015/0162214 A1 6/2015 Thompson
2015/0167159 A1 6/2015 Halpin et al.
2015/0167161 A1 6/2015 Canizares et al.
2015/0167162 A1 6/2015 Barik et al.
2015/0167165 A1 6/2015 Lindfors
2015/0167705 A1 6/2015 Lee et al.
2015/0170907 A1 6/2015 Haukka et al.
2015/0170914 A1 6/2015 Haukka et al.
2015/0170945 A1 6/2015 Segawa et al.
2015/0170947 A1 6/2015 Bluck
2015/0170954 A1 6/2015 Agarwal
2015/0170975 A1 6/2015 Blatchford et al.
2015/0171177 A1 6/2015 Cheng et al.

(56) References Cited

U.S. PATENT DOCUMENTS

2015/0174768 A1 6/2015 Rodnick
2015/0175467 A1 6/2015 Denifl et al.
2015/0176124 A1 6/2015 Greer et al.
2015/0176126 A1 6/2015 Ge et al.
2015/0179415 A1 6/2015 Sasaki et al.
2015/0179501 A1 6/2015 Jhaveri et al.
2015/0179564 A1 6/2015 Lee et al.
2015/0179640 A1 6/2015 Kim et al.
2015/0184287 A1 7/2015 Tsung et al.
2015/0184291 A1 7/2015 Alokozai et al.
2015/0187559 A1 7/2015 Sano
2015/0187568 A1 7/2015 Pettinger et al.
2015/0187611 A1 7/2015 Sato
2015/0187908 A1 7/2015 Zhang et al.
2015/0203961 A1 7/2015 Ha et al.
2015/0203967 A1 7/2015 Dhas et al.
2015/0211124 A1 7/2015 Nozawa et al.
2015/0211125 A1 7/2015 Yoshikawa et al.
2015/0217330 A1 8/2015 Haukka
2015/0217456 A1 8/2015 Tsuji et al.
2015/0218695 A1 8/2015 Odedra
2015/0218698 A1 8/2015 Yoon et al.
2015/0218700 A1 8/2015 Nguyen et al.
2015/0221479 A1 8/2015 Chen et al.
2015/0221480 A1 8/2015 Duan et al.
2015/0221519 A1 8/2015 Marks et al.
2015/0225850 A1 8/2015 Arora et al.
2015/0228513 A1 8/2015 Parkhe et al.
2015/0228572 A1 8/2015 Yang et al.
2015/0228645 A1 8/2015 Chuang et al.
2015/0228749 A1 8/2015 Ando et al.
2015/0240357 A1 8/2015 Tachibana et al.
2015/0240359 A1 8/2015 Jdira et al.
2015/0240360 A1 8/2015 Leeser
2015/0241787 A1 8/2015 Yaegashi
2015/0243522 A1 8/2015 Kitagaito et al.
2015/0243542 A1 8/2015 Yoshihara et al.
2015/0243545 A1 8/2015 Tang
2015/0243563 A1 8/2015 Lee et al.
2015/0243658 A1 8/2015 Joshi et al.
2015/0247259 A1 9/2015 Hekmatshoar-Tabari et al.
2015/0249013 A1 9/2015 Arghavani et al.
2015/0255319 A1 9/2015 Kikuchi et al.
2015/0255324 A1 9/2015 Li et al.
2015/0255385 A1 9/2015 Lee et al.
2015/0259790 A1 9/2015 Newman
2015/0259801 A1 9/2015 Matsumoto et al.
2015/0262828 A1 9/2015 Brand et al.
2015/0263033 A1 9/2015 Aoyama
2015/0267294 A1 9/2015 Itatani
2015/0267295 A1 9/2015 Hill et al.
2015/0267297 A1 9/2015 Shiba
2015/0267298 A1 9/2015 Saitou et al.
2015/0267299 A1 9/2015 Hawkins
2015/0267301 A1 9/2015 Hill et al.
2015/0270140 A1 9/2015 Gupta et al.
2015/0270146 A1 9/2015 Yoshihara et al.
2015/0275355 A1 10/2015 Mallikarjunan et al.
2015/0275357 A1 10/2015 Kamakura et al.
2015/0279665 A1 10/2015 Zafiropoulo
2015/0279681 A1 10/2015 Knoops
2015/0279682 A1 10/2015 Nakatani et al.
2015/0279708 A1 10/2015 Kobayashi et al.
2015/0279956 A1 10/2015 Ozaki et al.
2015/0280051 A1 10/2015 Xu
2015/0284848 A1 10/2015 Nakano et al.
2015/0287591 A1 10/2015 Pore et al.
2015/0287612 A1 10/2015 Luere et al.
2015/0287626 A1 10/2015 Arai
2015/0287710 A1 10/2015 Yun et al.
2015/0291830 A1 10/2015 Galbreath et al.
2015/0292088 A1 10/2015 Canizares
2015/0299848 A1 10/2015 Haukka et al.
2015/0307982 A1 10/2015 Firouzdor et al.
2015/0307989 A1 10/2015 Lindfors
2015/0308586 A1 10/2015 Shugrue et al.
2015/0311043 A1 10/2015 Sun et al.
2015/0311151 A1 10/2015 Chi et al.
2015/0303056 A1 11/2015 Varadarajan et al.
2015/0315704 A1 11/2015 Nakano et al.
2015/0322569 A1 11/2015 Kilpi et al.
2015/0325432 A1 11/2015 Ishizaka
2015/0332921 A1 11/2015 Lee et al.
2015/0340247 A1 11/2015 Balakrishnan et al.
2015/0340266 A1 11/2015 Ngo et al.
2015/0340500 A1 11/2015 Brunco
2015/0340609 A1 11/2015 Banno et al.
2015/0343559 A1 12/2015 Morikazu et al.
2015/0343741 A1 12/2015 Shibata et al.
2015/0345018 A1 12/2015 Detavernier et al.
2015/0345022 A1 12/2015 Yudovsky et al.
2015/0348755 A1 12/2015 Han et al.
2015/0349073 A1 12/2015 Kang
2015/0353478 A1 12/2015 Hoshino et al.
2015/0354060 A1 12/2015 Yabe et al.
2015/0361550 A1 12/2015 Yabe et al.
2015/0361553 A1 12/2015 Murakawa
2015/0364347 A1 12/2015 Nguyen et al.
2015/0364371 A1 12/2015 Yen
2015/0364747 A1 12/2015 Elam et al.
2015/0367253 A1 12/2015 Kanyal et al.
2015/0368798 A1 12/2015 Kwong
2015/0371864 A1 12/2015 Hsu et al.
2015/0372056 A1 12/2015 Seong et al.
2015/0376211 A1 12/2015 Girard
2015/0376785 A1 12/2015 Knaapen et al.
2015/0380296 A1 12/2015 Antonelli et al.
2016/0002776 A1 1/2016 Nal et al.
2016/0002786 A1 1/2016 Gatineau et al.
2016/0005571 A1 1/2016 Della Rosa et al.
2016/0005595 A1 1/2016 Liu et al.
2016/0005596 A1 1/2016 Behera et al.
2016/0005839 A1 1/2016 Yieh et al.
2016/0010208 A1 1/2016 Huang et al.
2016/0013022 A1 1/2016 Ayoub
2016/0013024 A1 1/2016 Milligan et al.
2016/0013086 A1 1/2016 Yang et al.
2016/0017493 A1 1/2016 Dhas
2016/0020071 A1 1/2016 Khaja et al.
2016/0020092 A1 1/2016 Kang et al.
2016/0024655 A1 1/2016 Yudovsky et al.
2016/0024656 A1 1/2016 White et al.
2016/0032453 A1 2/2016 Qian et al.
2016/0035542 A1 2/2016 Hausmann
2016/0035566 A1 2/2016 LaVoie
2016/0035596 A1 2/2016 Kamiya
2016/0042954 A1 2/2016 Sung et al.
2016/0051964 A1 2/2016 Tolle et al.
2016/0056074 A1 2/2016 Na
2016/0056156 A1 2/2016 Ghani et al.
2016/0060752 A1 3/2016 Jacques et al.
2016/0064208 A1 3/2016 Zafiropoulo et al.
2016/0064231 A1 3/2016 Agarwal et al.
2016/0069613 A1 3/2016 Colgan et al.
2016/0071750 A1 3/2016 de Ridder et al.
2016/0076949 A1 3/2016 Sabah et al.
2016/0079054 A1 3/2016 Chen et al.
2016/0085003 A1 3/2016 Jaiswal
2016/0086811 A1 3/2016 Mackedanz et al.
2016/0087028 A1 3/2016 Hirota et al.
2016/0097123 A1 4/2016 Shugrue et al.
2016/0099150 A1 4/2016 Tsai
2016/0099166 A1 4/2016 Yudovsky
2016/0099250 A1 4/2016 Rabkin et al.
2016/0102214 A1 4/2016 Dietz et al.
2016/0111272 A1 4/2016 Girard
2016/0111304 A1 4/2016 Takahashi et al.
2016/0111438 A1 4/2016 Tsutsumi et al.
2016/0115590 A1 4/2016 Haukka et al.
2016/0118224 A1 4/2016 Kohno et al.
2016/0133307 A1 5/2016 Lee et al.
2016/0133504 A1 5/2016 Chu et al.
2016/0133628 A1 5/2016 Xie
2016/0141172 A1 5/2016 Kang

(56) References Cited

U.S. PATENT DOCUMENTS

2016/0145738 A1 5/2016 Liu et al.
2016/0148800 A1 5/2016 Henri et al.
2016/0148801 A1 5/2016 Yabe et al.
2016/0148806 A1 5/2016 Henri et al.
2016/0148811 A1 5/2016 Nakatani et al.
2016/0148821 A1 5/2016 Singh
2016/0152649 A1 6/2016 Gordon
2016/0153088 A1 6/2016 Tsuji et al.
2016/0155629 A1 6/2016 Hawryluk et al.
2016/0163556 A1 6/2016 Briggs et al.
2016/0163558 A1 6/2016 Hudson et al.
2016/0163561 A1 6/2016 Hudson et al.
2016/0163711 A1 6/2016 Arndt et al.
2016/0163972 A1 6/2016 Swaminathan et al.
2016/0168699 A1 6/2016 Fukazawa et al.
2016/0168704 A1 6/2016 Choi et al.
2016/0169766 A1 6/2016 Ishibashi et al.
2016/0172189 A1 6/2016 Tapily
2016/0172296 A1 6/2016 Lim et al.
2016/0175805 A1 6/2016 Catchpole et al.
2016/0177448 A1 6/2016 Ikeda
2016/0181117 A1 6/2016 Arghavani et al.
2016/0181128 A1 6/2016 Mori
2016/0181368 A1 6/2016 Weeks
2016/0190137 A1 6/2016 Tsai et al.
2016/0195331 A1 7/2016 Hyon et al.
2016/0196969 A1 7/2016 Berry et al.
2016/0196970 A1 7/2016 Takamure et al.
2016/0203995 A1 7/2016 Kanarik et al.
2016/0204005 A1 7/2016 Oki et al.
2016/0204436 A1 7/2016 Barker et al.
2016/0211135 A1 7/2016 Noda et al.
2016/0211147 A1 7/2016 Fukazawa
2016/0211166 A1 7/2016 Yan et al.
2016/0215387 A1 7/2016 Liu et al.
2016/0217857 A1 7/2016 Paudel
2016/0218028 A1 7/2016 Schaller et al.
2016/0222504 A1 8/2016 Haukka et al.
2016/0222509 A1 8/2016 Honma
2016/0222516 A1 8/2016 Ikeda
2016/0225588 A1 8/2016 Shaikh et al.
2016/0225607 A1 8/2016 Yamamoto et al.
2016/0225632 A1 8/2016 Shaikh et al.
2016/0237559 A1 8/2016 Tsuji
2016/0245704 A1 8/2016 Osaka et al.
2016/0256187 A1 9/2016 Shelton et al.
2016/0268102 A1 9/2016 White
2016/0268107 A1 9/2016 White
2016/0273095 A1 9/2016 Lin et al.
2016/0273101 A1 9/2016 Komori et al.
2016/0273106 A1 9/2016 Kanjolia et al.
2016/0273128 A1 9/2016 Kang
2016/0276148 A1 9/2016 Qian et al.
2016/0276212 A1 9/2016 Horikoshi
2016/0279629 A1 9/2016 Michishita et al.
2016/0281223 A1 9/2016 Sowa et al.
2016/0281230 A1 9/2016 Varadarajan et al.
2016/0284517 A1 9/2016 Saido
2016/0284542 A1 9/2016 Noda et al.
2016/0289828 A1 10/2016 Shero et al.
2016/0293398 A1 10/2016 Danek et al.
2016/0293609 A1 10/2016 Jha et al.
2016/0305015 A1 10/2016 Nakamura et al.
2016/0307739 A1 10/2016 Lee et al.
2016/0307740 A1 10/2016 Kim et al.
2016/0307766 A1 10/2016 Jongbloed et al.
2016/0312360 A1 10/2016 Rasheed et al.
2016/0314960 A1 10/2016 Cheng et al.
2016/0314962 A1 10/2016 Higashino et al.
2016/0314964 A1 10/2016 Tang et al.
2016/0314967 A1 10/2016 Tolle
2016/0315168 A1 10/2016 Dussarrat et al.
2016/0334709 A1 11/2016 Huli et al.
2016/0336178 A1 11/2016 Swaminathan et al.
2016/0336392 A1 11/2016 Tominaga et al.
2016/0343612 A1 11/2016 Wang et al.
2016/0345384 A1 11/2016 Zhang et al.
2016/0351413 A1 12/2016 Schmidt et al.
2016/0351747 A1 12/2016 Forrest et al.
2016/0358772 A1 12/2016 Xie
2016/0362783 A1 12/2016 Tolle et al.
2016/0362813 A1 12/2016 Bao et al.
2016/0365280 A1 12/2016 Brink et al.
2016/0365414 A1 12/2016 Peng et al.
2016/0372321 A1 12/2016 Krishnan et al.
2016/0372365 A1 12/2016 Tang et al.
2016/0372744 A1 12/2016 Essaki et al.
2016/0376700 A1 12/2016 Haukka
2016/0376701 A1 12/2016 Takewaki et al.
2016/0376704 A1 12/2016 Raisanen
2016/0379826 A9 12/2016 Arghavani et al.
2016/0379851 A1 12/2016 Swaminathan et al.
2016/0381732 A1 12/2016 Moench et al.
2017/0009347 A1 1/2017 Jang et al.
2017/0009367 A1 1/2017 Harris et al.
2017/0011889 A1 1/2017 Winkler et al.
2017/0011926 A1 1/2017 Harada et al.
2017/0011950 A1 1/2017 Schmotzer
2017/0018477 A1 1/2017 Kato
2017/0018570 A1 1/2017 Lue et al.
2017/0022612 A1 1/2017 Lei et al.
2017/0025280 A1 1/2017 Milligan
2017/0025291 A1 1/2017 Lin
2017/0029945 A1 2/2017 Kamakura
2017/0032942 A1 2/2017 Walfried
2017/0032943 A1 2/2017 Spaulding et al.
2017/0032992 A1 2/2017 Hoechbauer
2017/0033004 A1 2/2017 Siew et al.
2017/0037513 A1 2/2017 Haukka
2017/0040146 A1 2/2017 Huang et al.
2017/0040164 A1 2/2017 Wang et al.
2017/0040198 A1 2/2017 Lin et al.
2017/0040206 A1 2/2017 Schmotzer et al.
2017/0044664 A1 2/2017 Dussarrat et al.
2017/0044665 A1 2/2017 Shon et al.
2017/0044666 A1 2/2017 Jang et al.
2017/0047446 A1 2/2017 Margetis et al.
2017/0051402 A1 2/2017 Mori
2017/0051405 A1 2/2017 Fukazawa et al.
2017/0051406 A1 2/2017 Mori et al.
2017/0051408 A1 2/2017 Kosuke et al.
2017/0053811 A1 2/2017 Fung et al.
2017/0058402 A1 3/2017 Wenxu et al.
2017/0062204 A1 3/2017 Suzuki et al.
2017/0062209 A1 3/2017 Shiba
2017/0062210 A1 3/2017 Visser et al.
2017/0062218 A1 3/2017 Duan et al.
2017/0062224 A1 3/2017 Fu et al.
2017/0062258 A1 3/2017 Bluck
2017/0069725 A1 3/2017 Bhimarasetti et al.
2017/0091320 A1 3/2017 Psota et al.
2017/0092469 A1 3/2017 Kurita et al.
2017/0092531 A1 3/2017 Coomer
2017/0092535 A1 3/2017 Kimihiko et al.
2017/0092847 A1 3/2017 Kim et al.
2017/0100742 A1 4/2017 Pore et al.
2017/0102612 A1 4/2017 Meyers et al.
2017/0103907 A1 4/2017 Chu et al.
2017/0104061 A1 4/2017 Peng et al.
2017/0107621 A1 4/2017 Suemori
2017/0110313 A1 4/2017 Tang et al.
2017/0110601 A1 4/2017 Blomberg et al.
2017/0114460 A1 4/2017 Kim et al.
2017/0114464 A1 4/2017 Iriuda et al.
2017/0114465 A1 4/2017 Kalutarage et al.
2017/0117141 A1 4/2017 Zhu et al.
2017/0117202 A1 4/2017 Tang et al.
2017/0117203 A1 4/2017 Tang et al.
2017/0117222 A1 4/2017 Kim et al.
2017/0121845 A1 5/2017 Grutzmacher et al.
2017/0130332 A1 5/2017 Stumpf
2017/0136578 A1 5/2017 Yoshimura
2017/0140924 A1 5/2017 Suzuki et al.
2017/0140925 A1 5/2017 Suzuki et al.

(56) References Cited

U.S. PATENT DOCUMENTS

| | | | |
|---|---|---|---|
| 2017/0145564 | A1 | 5/2017 | Bertuch et al. |
| 2017/0146909 | A1 | 5/2017 | Smith et al. |
| 2017/0148918 | A1 | 5/2017 | Ye et al. |
| 2017/0152968 | A1 | 6/2017 | Raj et al. |
| 2017/0154757 | A1 | 6/2017 | Winkler et al. |
| 2017/0154770 | A1 | 6/2017 | Margetis et al. |
| 2017/0154895 | A1 | 6/2017 | Huo |
| 2017/0159177 | A1 | 6/2017 | Monsma et al. |
| 2017/0165624 | A1 | 6/2017 | Ravoin et al. |
| 2017/0167023 | A1 | 6/2017 | Praia et al. |
| 2017/0170033 | A1 | 6/2017 | Okabe et al. |
| 2017/0173696 | A1 | 6/2017 | Sheinman |
| 2017/0175290 | A1 | 6/2017 | Chen et al. |
| 2017/0178899 | A1 | 6/2017 | Kabansky et al. |
| 2017/0178939 | A1 | 6/2017 | Omori |
| 2017/0178942 | A1 | 6/2017 | Sakata et al. |
| 2017/0179036 | A1 | 6/2017 | Chen et al. |
| 2017/0186621 | A1 | 6/2017 | Zaitsu |
| 2017/0186754 | A1 | 6/2017 | Blomberg et al. |
| 2017/0191159 | A1 | 7/2017 | Polyak et al. |
| 2017/0191164 | A1 | 7/2017 | Alokozai et al. |
| 2017/0191685 | A1 | 7/2017 | Ronne et al. |
| 2017/0191861 | A1 | 7/2017 | Rondano et al. |
| 2017/0196562 | A1 | 7/2017 | Shelton |
| 2017/0200622 | A1 | 7/2017 | Shiokawa et al. |
| 2017/0204516 | A1 | 7/2017 | Nguyen et al. |
| 2017/0213960 | A1 | 7/2017 | de Araujo et al. |
| 2017/0216762 | A1 | 8/2017 | Shugrue et al. |
| 2017/0218515 | A1 | 8/2017 | Shin et al. |
| 2017/0222008 | A1 | 8/2017 | Hsu et al. |
| 2017/0226636 | A1 | 8/2017 | Xiao |
| 2017/0232457 | A1 | 8/2017 | Toshiki et al. |
| 2017/0233868 | A1 | 8/2017 | Donoso et al. |
| 2017/0243734 | A1 | 8/2017 | Ishikawa et al. |
| 2017/0250068 | A1 | 8/2017 | Ishikawa et al. |
| 2017/0250075 | A1 | 8/2017 | Caymax et al. |
| 2017/0253968 | A1 | 9/2017 | Yahata |
| 2017/0256393 | A1 | 9/2017 | Kim et al. |
| 2017/0256417 | A1 | 9/2017 | Chou |
| 2017/0256429 | A1 | 9/2017 | Lawson et al. |
| 2017/0260649 | A1 | 9/2017 | Coomer |
| 2017/0263437 | A1 | 9/2017 | Li et al. |
| 2017/0263438 | A1 | 9/2017 | Li et al. |
| 2017/0267527 | A1 | 9/2017 | Kim et al. |
| 2017/0267531 | A1 | 9/2017 | Huakka |
| 2017/0271143 | A1 | 9/2017 | Fukiage et al. |
| 2017/0271191 | A1 | 9/2017 | Yoo et al. |
| 2017/0271256 | A1 | 9/2017 | Inatsuka |
| 2017/0271501 | A1 | 9/2017 | Avci et al. |
| 2017/0278705 | A1 | 9/2017 | Murakami et al. |
| 2017/0278707 | A1 | 9/2017 | Margetis et al. |
| 2017/0283312 | A1 | 10/2017 | Lee et al. |
| 2017/0283313 | A1 | 10/2017 | Lee et al. |
| 2017/0287681 | A1 | 10/2017 | Nitadori et al. |
| 2017/0287744 | A1 | 10/2017 | Kobayashi et al. |
| 2017/0294318 | A1 | 10/2017 | Yoshida et al. |
| 2017/0294339 | A1 | 10/2017 | Tapily |
| 2017/0294499 | A1 | 10/2017 | Lu et al. |
| 2017/0301519 | A1 | 10/2017 | Naim et al. |
| 2017/0301542 | A1 | 10/2017 | Maes et al. |
| 2017/0303382 | A1 | 10/2017 | Smith et al. |
| 2017/0306478 | A1 | 10/2017 | Raisanen et al. |
| 2017/0306479 | A1 | 10/2017 | Raisanen et al. |
| 2017/0306480 | A1 | 10/2017 | Zhu et al. |
| 2017/0306494 | A1 | 10/2017 | Lin et al. |
| 2017/0309490 | A1 | 10/2017 | Ogawa |
| 2017/0309528 | A1 | 10/2017 | Bansal et al. |
| 2017/0314125 | A1 | 11/2017 | Fenwick et al. |
| 2017/0316933 | A1 | 11/2017 | Xie et al. |
| 2017/0316940 | A1 | 11/2017 | Ishikawa et al. |
| 2017/0317194 | A1 | 11/2017 | Tang et al. |
| 2017/0323783 | A1 | 11/2017 | Sanchez et al. |
| 2017/0323784 | A1 | 11/2017 | Faguet et al. |
| 2017/0338111 | A1 | 11/2017 | Takamure et al. |
| 2017/0338133 | A1 | 11/2017 | Tan et al. |
| 2017/0338134 | A1 | 11/2017 | Tan et al. |
| 2017/0338192 | A1 | 11/2017 | Lee et al. |
| 2017/0342559 | A1 | 11/2017 | Fukazawa et al. |
| 2017/0343896 | A1 | 11/2017 | Darling et al. |
| 2017/0345674 | A1 | 11/2017 | Ranjan et al. |
| 2017/0350688 | A1 | 12/2017 | Boyd et al. |
| 2017/0358445 | A1 | 12/2017 | O'Shaughnessy et al. |
| 2017/0358482 | A1 | 12/2017 | Chen et al. |
| 2017/0358670 | A1 | 12/2017 | Kub et al. |
| 2017/0362710 | A1 | 12/2017 | Ge et al. |
| 2017/0365467 | A1 | 12/2017 | Shimamoto et al. |
| 2017/0369993 | A1 | 12/2017 | Sun |
| 2017/0372884 | A1 | 12/2017 | Margetis et al. |
| 2017/0372919 | A1 | 12/2017 | Manna et al. |
| 2017/0373188 | A1 | 12/2017 | Mochizuki et al. |
| 2018/0005814 | A1 | 1/2018 | Kumar et al. |
| 2018/0010243 | A1 | 1/2018 | Lee et al. |
| 2018/0010247 | A1 | 1/2018 | Niskanen |
| 2018/0011052 | A1 | 1/2018 | Andersson et al. |
| 2018/0012792 | A1 | 1/2018 | Zhu |
| 2018/0019165 | A1 | 1/2018 | Baum et al. |
| 2018/0025890 | A1 | 1/2018 | Choi et al. |
| 2018/0025907 | A1 | 1/2018 | Kalutarage et al. |
| 2018/0025939 | A1 | 1/2018 | Kovalgin et al. |
| 2018/0033614 | A1 | 2/2018 | Chandra et al. |
| 2018/0033616 | A1 | 2/2018 | Masaru |
| 2018/0033625 | A1 | 2/2018 | Yoo |
| 2018/0033645 | A1 | 2/2018 | Saido et al. |
| 2018/0033674 | A1 | 2/2018 | Jeong |
| 2018/0033679 | A1 | 2/2018 | Pore |
| 2018/0040746 | A1 | 2/2018 | Johnson et al. |
| 2018/0044800 | A1 | 2/2018 | Hendrix et al. |
| 2018/0047591 | A1 | 2/2018 | Ogo |
| 2018/0047621 | A1 | 2/2018 | Armini |
| 2018/0047749 | A1 | 2/2018 | Kim |
| 2018/0053660 | A1 | 2/2018 | Jandl et al. |
| 2018/0053769 | A1 | 2/2018 | Kim et al. |
| 2018/0057931 | A1 | 3/2018 | Cha et al. |
| 2018/0057934 | A1 | 3/2018 | Cooper et al. |
| 2018/0057937 | A1 | 3/2018 | Lee et al. |
| 2018/0061628 | A1 | 3/2018 | Ou et al. |
| 2018/0061851 | A1 | 3/2018 | Ootsuka |
| 2018/0068844 | A1 | 3/2018 | Chen et al. |
| 2018/0068862 | A1 | 3/2018 | Terakura et al. |
| 2018/0068950 | A1 | 3/2018 | Bruley et al. |
| 2018/0069019 | A1 | 3/2018 | Kim et al. |
| 2018/0076021 | A1 | 3/2018 | Fukushima et al. |
| 2018/0083435 | A1 | 3/2018 | Redler |
| 2018/0087152 | A1 | 3/2018 | Yoshida |
| 2018/0087154 | A1 | 3/2018 | Pore et al. |
| 2018/0087156 | A1 | 3/2018 | Kohei et al. |
| 2018/0090583 | A1 | 3/2018 | Choi et al. |
| 2018/0094350 | A1 | 4/2018 | Verghese et al. |
| 2018/0094351 | A1 | 4/2018 | Verghese et al. |
| 2018/0096821 | A1 | 4/2018 | Lubomirsky |
| 2018/0096844 | A1 | 4/2018 | Dutartre et al. |
| 2018/0097076 | A1 | 4/2018 | Cheng et al. |
| 2018/0102276 | A1 | 4/2018 | Zhu et al. |
| 2018/0105701 | A1 | 4/2018 | Larsson et al. |
| 2018/0105930 | A1 | 4/2018 | Kang et al. |
| 2018/0108587 | A1 | 4/2018 | Jiang |
| 2018/0114680 | A1 | 4/2018 | Kim et al. |
| 2018/0119283 | A1 | 5/2018 | Fukazawa |
| 2018/0122642 | A1 | 5/2018 | Raisanen |
| 2018/0122709 | A1 | 5/2018 | Xie |
| 2018/0122959 | A1 | 5/2018 | Calka et al. |
| 2018/0126379 | A1 | 5/2018 | Ramsey et al. |
| 2018/0127876 | A1 | 5/2018 | Tolle et al. |
| 2018/0130652 | A1 | 5/2018 | Pettinger et al. |
| 2018/0130701 | A1 | 5/2018 | Chun |
| 2018/0135172 | A1 | 5/2018 | Nogami et al. |
| 2018/0135173 | A1 | 5/2018 | Kim et al. |
| 2018/0135179 | A1 | 5/2018 | Toshiyuki et al. |
| 2018/0138036 | A1 | 5/2018 | Baldesseroni et al. |
| 2018/0142353 | A1 | 5/2018 | Tetsuya et al. |
| 2018/0142357 | A1 | 5/2018 | Yoshikazu |
| 2018/0148832 | A1 | 5/2018 | Chatterjee et al. |
| 2018/0151346 | A1 | 5/2018 | Blanquart |
| 2018/0151358 | A1 | 5/2018 | Margetis et al. |

(56) References Cited

U.S. PATENT DOCUMENTS

2018/0151588 A1 5/2018 Tsutsumi et al.
2018/0155832 A1 6/2018 Hamalainen et al.
2018/0155836 A1 6/2018 Arai et al.
2018/0158688 A1 6/2018 Chen
2018/0158716 A1 6/2018 Konkola et al.
2018/0163305 A1 6/2018 Batzer et al.
2018/0166258 A1 6/2018 Kim et al.
2018/0166315 A1 6/2018 Coomer
2018/0171472 A1 6/2018 Yamada et al.
2018/0171475 A1 6/2018 Maes et al.
2018/0171477 A1 6/2018 Kim et al.
2018/0172172 A1 6/2018 Oehler et al.
2018/0173109 A1 6/2018 Gronheid et al.
2018/0174801 A1 6/2018 Chen et al.
2018/0174826 A1 6/2018 Raaijmakers et al.
2018/0179625 A1 6/2018 Takagi et al.
2018/0180509 A1 6/2018 Sawachi et al.
2018/0182613 A1 6/2018 Blanquart et al.
2018/0182618 A1 6/2018 Blanquart et al.
2018/0187303 A1 7/2018 Gatineau et al.
2018/0189923 A1 7/2018 Zhong et al.
2018/0190496 A1 7/2018 Ashihara et al.
2018/0195174 A1 7/2018 Kim et al.
2018/0204733 A1 7/2018 Sherpa et al.
2018/0209042 A1 7/2018 Wu et al.
2018/0211834 A1 7/2018 Takamure et al.
2018/0223047 A1 8/2018 Xiao et al.
2018/0223429 A1 8/2018 Fukazawa et al.
2018/0230595 A1 8/2018 Suda et al.
2018/0233372 A1 8/2018 Vayrynen et al.
2018/0245215 A1 8/2018 Lei et al.
2018/0246101 A1 8/2018 Sasisekharan et al.
2018/0254211 A1 9/2018 Kosakai et al.
2018/0258532 A1 9/2018 Kato et al.
2018/0265294 A1 9/2018 Hayashi
2018/0265972 A1 9/2018 Firouzdor et al.
2018/0265973 A1 9/2018 Firouzdor et al.
2018/0269057 A1 9/2018 Lei et al.
2018/0274098 A1 9/2018 Takagi et al.
2018/0277338 A1 9/2018 Fukada et al.
2018/0277423 A1 9/2018 Lottes
2018/0286638 A1 10/2018 Susa
2018/0286663 A1 10/2018 Kobayashi et al.
2018/0286668 A1 10/2018 Baum et al.
2018/0286672 A1 10/2018 Van Aerde et al.
2018/0286675 A1 10/2018 Blomberg et al.
2018/0286711 A1 10/2018 Oosterlaken et al.
2018/0294187 A1 10/2018 Thombare et al.
2018/0305247 A1 10/2018 Feng et al.
2018/0308686 A1 10/2018 Xie et al.
2018/0308701 A1 10/2018 Na et al.
2018/0312966 A1 11/2018 Chan et al.
2018/0315597 A1 11/2018 Varadarajan et al.
2018/0315838 A1 11/2018 Morrow et al.
2018/0323055 A1 11/2018 Woodruff et al.
2018/0323056 A1 11/2018 Woodruff et al.
2018/0323059 A1 11/2018 Bhargava et al.
2018/0325414 A1 11/2018 Marashdeh et al.
2018/0327892 A1 11/2018 Wu et al.
2018/0327898 A1 11/2018 Wu et al.
2018/0327899 A1 11/2018 Wu et al.
2018/0331117 A1 11/2018 Titus et al.
2018/0337087 A1 11/2018 Sandhu et al.
2018/0350587 A1 12/2018 Jia et al.
2018/0350588 A1 12/2018 Raisanen et al.
2018/0350620 A1 12/2018 Zaitsu et al.
2018/0350653 A1 12/2018 Jeong et al.
2018/0355480 A1 12/2018 Kondo
2018/0355484 A1 12/2018 Lansalot-Matras et al.
2018/0358222 A1 12/2018 Venkatasubramanian et al.
2018/0363131 A1 12/2018 Lee et al.
2018/0363139 A1 12/2018 Rajavelu et al.
2018/0366314 A1 12/2018 Niskanen et al.
2018/0371610 A1 12/2018 Banerjee et al.
2019/0003050 A1 1/2019 Dezelah et al.
2019/0003052 A1 1/2019 Shero et al.
2019/0006797 A1 1/2019 Paynter et al.
2019/0013199 A1 1/2019 Bhargava et al.
2019/0019670 A1 1/2019 Lin et al.
2019/0019714 A1 1/2019 Kosakai et al.
2019/0027573 A1 1/2019 Zhu et al.
2019/0027583 A1 1/2019 Margetis et al.
2019/0027584 A1 1/2019 Margetis et al.
2019/0027605 A1 1/2019 Tolle et al.
2019/0032209 A1 1/2019 Huggare
2019/0032998 A1 1/2019 Jdira et al.
2019/0035605 A1 1/2019 Suzuki
2019/0035647 A1 1/2019 Lee et al.
2019/0035698 A1 1/2019 Tanaka
2019/0035810 A1 1/2019 Chun et al.
2019/0040529 A1 2/2019 Verbaas et al.
2019/0046947 A1 2/2019 Strohm et al.
2019/0051544 A1 2/2019 Verbaas
2019/0051548 A1 2/2019 den Hartog Besselink et al.
2019/0051555 A1 2/2019 Hill et al.
2019/0057857 A1 2/2019 Ishikawa
2019/0057858 A1 2/2019 Hausmann et al.
2019/0058043 A1 2/2019 Dewey et al.
2019/0062907 A1 2/2019 Kim et al.
2019/0062917 A1 2/2019 Sung et al.
2019/0066978 A1 2/2019 Um et al.
2019/0066997 A1 2/2019 Klaver et al.
2019/0067003 A1 2/2019 Zope et al.
2019/0067004 A1 2/2019 Kohen et al.
2019/0067014 A1 2/2019 Shrestha et al.
2019/0067016 A1 2/2019 Zhu et al.
2019/0067085 A1 2/2019 Kweskin
2019/0067094 A1 2/2019 Zope et al.
2019/0067095 A1 2/2019 Zhu et al.
2019/0078206 A1 3/2019 Wu et al.
2019/0080903 A1 3/2019 Abel et al.
2019/0081072 A1 3/2019 Chun et al.
2019/0085451 A1 3/2019 Lei et al.
2019/0086807 A1 3/2019 Kachel et al.
2019/0088555 A1 3/2019 Xie et al.
2019/0089143 A1 3/2019 Malone et al.
2019/0093221 A1 3/2019 Jdira et al.
2019/0096708 A1 3/2019 Sharma
2019/0106788 A1 4/2019 Hawkins et al.
2019/0109002 A1 4/2019 Mattinen et al.
2019/0109009 A1 4/2019 Longrie et al.
2019/0109043 A1 4/2019 Wang et al.
2019/0112711 A1 4/2019 Lyons et al.
2019/0115206 A1 4/2019 Kim et al.
2019/0115237 A1 4/2019 den Hartog Besselink et al.
2019/0115451 A1 4/2019 Lee et al.
2019/0131124 A1 5/2019 Kohen et al.
2019/0140067 A1 5/2019 Zhu et al.
2019/0148177 A1 5/2019 Yin et al.
2019/0148224 A1 5/2019 Kuroda et al.
2019/0148398 A1 5/2019 Kim et al.
2019/0148556 A1 5/2019 Wang et al.
2019/0153593 A1 5/2019 Zhu et al.
2019/0157054 A1 5/2019 White et al.
2019/0157067 A1 5/2019 Bhuyan et al.
2019/0163056 A1 5/2019 Maes et al.
2019/0164763 A1 5/2019 Raisanen et al.
2019/0172701 A1 6/2019 Jia et al.
2019/0172714 A1 6/2019 Bobek et al.
2019/0176435 A1 6/2019 Bellman et al.
2019/0181002 A1 6/2019 Iijima et al.
2019/0185999 A1 6/2019 Shanbhag et al.
2019/0189447 A1 6/2019 Kamp et al.
2019/0198297 A1 6/2019 Aramaki et al.
2019/0198359 A1 6/2019 Kamimura et al.
2019/0198571 A1 6/2019 Xu et al.
2019/0204029 A1 7/2019 Tanabe
2019/0211450 A1 7/2019 Adachi et al.
2019/0217277 A1 7/2019 Jeon et al.
2019/0221433 A1 7/2019 Raisanen et al.
2019/0229008 A1 7/2019 Rokkam et al.
2019/0233446 A1 8/2019 MacDonald et al.
2019/0233940 A1 8/2019 Guo et al.
2019/0237325 A1 8/2019 Wang et al.

(56) References Cited

U.S. PATENT DOCUMENTS

| | | | |
|---|---|---|---|
| 2019/0237327 | A1 | 8/2019 | Kohen et al. |
| 2019/0244803 | A1 | 8/2019 | Suzuki |
| 2019/0249300 | A1 | 8/2019 | Hatanpaa et al. |
| 2019/0249303 | A1 | 8/2019 | Kuroda et al. |
| 2019/0252195 | A1 | 8/2019 | Haukka |
| 2019/0252196 | A1 | 8/2019 | Vayrynen et al. |
| 2019/0259611 | A1 | 8/2019 | Nakano et al. |
| 2019/0259612 | A1 | 8/2019 | Nozawa et al. |
| 2019/0264324 | A1 | 8/2019 | Shugrue et al. |
| 2019/0271078 | A1 | 9/2019 | Raisanen et al. |
| 2019/0272981 | A1 | 9/2019 | Xu et al. |
| 2019/0272993 | A1 | 9/2019 | Mattinen et al. |
| 2019/0273133 | A1 | 9/2019 | Agrawal et al. |
| 2019/0276934 | A1 | 9/2019 | Verghese et al. |
| 2019/0287769 | A1 | 9/2019 | Blomberg et al. |
| 2019/0295837 | A1 | 9/2019 | Pore et al. |
| 2019/0301014 | A1 | 10/2019 | Pierreux et al. |
| 2019/0304776 | A1 | 10/2019 | Choi |
| 2019/0304780 | A1 | 10/2019 | Kohen et al. |
| 2019/0304790 | A1 | 10/2019 | Mousa et al. |
| 2019/0304821 | A1 | 10/2019 | Pierreux et al. |
| 2019/0311894 | A1 | 10/2019 | Girard et al. |
| 2019/0311897 | A1 | 10/2019 | Kang et al. |
| 2019/0311940 | A1 | 10/2019 | Choi et al. |
| 2019/0318910 | A1 | 10/2019 | Mori |
| 2019/0318923 | A1 | 10/2019 | Blanquart et al. |
| 2019/0319100 | A1 | 10/2019 | Chen et al. |
| 2019/0322812 | A1 | 10/2019 | Wojtecki et al. |
| 2019/0330740 | A1 | 10/2019 | Klaver |
| 2019/0333753 | A1 | 10/2019 | Ueda et al. |
| 2019/0333761 | A1 | 10/2019 | Tois et al. |
| 2019/0338418 | A1 | 11/2019 | Goradia et al. |
| 2019/0346300 | A1 | 11/2019 | Kim et al. |
| 2019/0348261 | A1 | 11/2019 | Lin et al. |
| 2019/0348273 | A1 | 11/2019 | Tang et al. |
| 2019/0348515 | A1 | 11/2019 | Li et al. |
| 2019/0362970 | A1 | 11/2019 | Wang et al. |
| 2019/0362989 | A1 | 11/2019 | Reuter et al. |
| 2019/0363006 | A1 | 11/2019 | Min |
| 2019/0363015 | A1 | 11/2019 | Cheng et al. |
| 2019/0368040 | A1 | 12/2019 | Kachel et al. |
| 2019/0368041 | A1 | 12/2019 | Sreeram et al. |
| 2019/0371594 | A1 | 12/2019 | Niskanen et al. |
| 2019/0371640 | A1 | 12/2019 | Raisanen et al. |
| 2019/0375638 | A1 | 12/2019 | Haukka |
| 2019/0376180 | A1 | 12/2019 | Niskanen |
| 2019/0378711 | A1 | 12/2019 | Suzuki et al. |
| 2019/0378916 | A1 | 12/2019 | Tang et al. |
| 2019/0385907 | A1 | 12/2019 | Gottheim et al. |
| 2019/0390338 | A1 | 12/2019 | Raisanen et al. |
| 2019/0390343 | A1 | 12/2019 | Min et al. |
| 2019/0393304 | A1 | 12/2019 | Guillorn et al. |
| 2019/0393308 | A1 | 12/2019 | Lo et al. |
| 2020/0002811 | A1 | 1/2020 | Sreeram et al. |
| 2020/0002812 | A1 | 1/2020 | Lee et al. |
| 2020/0012081 | A1 | 1/2020 | Komai |
| 2020/0013612 | A1 | 1/2020 | Blanquart et al. |
| 2020/0013613 | A1 | 1/2020 | Blanquart |
| 2020/0013626 | A1 | 1/2020 | Longrie et al. |
| 2020/0013629 | A1 | 1/2020 | de Roest et al. |
| 2020/0018421 | A1 | 1/2020 | Shugrue |
| 2020/0035489 | A1 | 1/2020 | Huang et al. |
| 2020/0040458 | A1 | 2/2020 | Ma et al. |
| 2020/0048768 | A1 | 2/2020 | Wiegers et al. |
| 2020/0052056 | A1 | 2/2020 | Park et al. |
| 2020/0052089 | A1 | 2/2020 | Yu et al. |
| 2020/0056282 | A1 | 2/2020 | Raisanen et al. |
| 2020/0056286 | A1 | 2/2020 | Shero et al. |
| 2020/0058469 | A1 | 2/2020 | Ranjan et al. |
| 2020/0063262 | A1 | 2/2020 | Katou et al. |
| 2020/0064737 | A1 | 2/2020 | de Roest |
| 2020/0066512 | A1 | 2/2020 | Tois et al. |
| 2020/0066552 | A1 | 2/2020 | Susa |
| 2020/0080200 | A1 | 3/2020 | Um et al. |
| 2020/0083054 | A1 | 3/2020 | Väyrynen et al. |
| 2020/0083375 | A1 | 3/2020 | Tolle et al. |
| 2020/0083469 | A1 | 3/2020 | Lhullier |
| 2020/0102649 | A1 | 4/2020 | Reed |
| 2020/0102653 | A1 | 4/2020 | Muralidhar et al. |
| 2020/0105579 | A1 | 4/2020 | Zhu |
| 2020/0105594 | A1 | 4/2020 | Cheng et al. |
| 2020/0105895 | A1 | 4/2020 | Tang et al. |
| 2020/0109472 | A1 | 4/2020 | Um et al. |
| 2020/0111669 | A1 | 4/2020 | Zaitsu et al. |
| 2020/0111690 | A1 | 4/2020 | Oosterlaken |
| 2020/0118811 | A1 | 4/2020 | Utsuno et al. |
| 2020/0118815 | A1 | 4/2020 | Fukazawa et al. |
| 2020/0118817 | A1 | 4/2020 | Blomberg et al. |
| 2020/0119038 | A1 | 4/2020 | Hopkins et al. |
| 2020/0126771 | A1 | 4/2020 | Roh et al. |
| 2020/0126840 | A1 | 4/2020 | Roh et al. |
| 2020/0131634 | A1 | 4/2020 | Gao et al. |
| 2020/0135512 | A1 | 4/2020 | Oosterlaken et al. |
| 2020/0135915 | A1 | 4/2020 | Savant et al. |
| 2020/0140995 | A1 | 5/2020 | Blanquart |
| 2020/0141003 | A1 | 5/2020 | Lee et al. |
| 2020/0144058 | A1 | 5/2020 | Kohen |
| 2020/0152473 | A1 | 5/2020 | Tapily et al. |
| 2020/0152750 | A1 | 5/2020 | Morrow et al. |
| 2020/0161129 | A1 | 5/2020 | Mattinen et al. |
| 2020/0161438 | A1 | 5/2020 | Tang et al. |
| 2020/0168485 | A1 | 5/2020 | Fluit |
| 2020/0279758 | A1 | 5/2020 | Sharma |
| 2020/0173020 | A1 | 6/2020 | Huggare |
| 2020/0176244 | A1 | 6/2020 | Lee et al. |
| 2020/0176246 | A1 | 6/2020 | Huotari et al. |
| 2020/0181770 | A1 | 6/2020 | Longrie et al. |
| 2020/0185249 | A1 | 6/2020 | Rice et al. |
| 2020/0185257 | A1 | 6/2020 | Nishiwaki |
| 2020/0194253 | A1 | 6/2020 | Banerjee et al. |
| 2020/0194268 | A1 | 6/2020 | Sharma |
| 2020/0203157 | A1 | 6/2020 | Su |
| 2020/0224309 | A1 | 7/2020 | Sreeram et al. |
| 2020/0224311 | A1 | 7/2020 | Niskanen et al. |
| 2020/0227243 | A1 | 7/2020 | Kim et al. |
| 2020/0227250 | A1 | 7/2020 | Pore et al. |
| 2020/0227325 | A1 | 7/2020 | Xie et al. |
| 2020/0232096 | A1 | 7/2020 | Hatanpää et al. |
| 2020/0234989 | A1 | 7/2020 | Jeong |
| 2020/0251328 | A1 | 8/2020 | Zaitsu et al. |
| 2020/0258766 | A1 | 8/2020 | Garssen et al. |
| 2020/0266057 | A1 | 8/2020 | Lee et al. |
| 2020/0266097 | A1 | 8/2020 | Liu et al. |
| 2020/0266098 | A1 | 8/2020 | Pore et al. |
| 2020/0266208 | A1 | 8/2020 | Kim et al. |
| 2020/0270749 | A1 | 8/2020 | Li et al. |
| 2020/0270752 | A1 | 8/2020 | Pierreux et al. |
| 2020/0273728 | A1 | 8/2020 | Benjaminson et al. |
| 2020/0273729 | A1 | 8/2020 | Verbaas et al. |
| 2020/0279721 | A1 | 9/2020 | White et al. |
| 2020/0283893 | A1 | 9/2020 | Byun et al. |
| 2020/0283894 | A1 | 9/2020 | Lehn et al. |
| 2020/0284467 | A1 | 9/2020 | Lindeboom et al. |
| 2020/0286725 | A1 | 9/2020 | Sharma et al. |
| 2020/0286726 | A1 | 9/2020 | Shero et al. |
| 2020/0294789 | A1 | 9/2020 | Woodruff et al. |
| 2020/0303180 | A1 | 9/2020 | Kim et al. |
| 2020/0303196 | A1 | 9/2020 | Chen et al. |
| 2020/0309455 | A1 | 10/2020 | Fluit |
| 2020/0312652 | A1 | 10/2020 | Kang et al. |
| 2020/0312681 | A1 | 10/2020 | Tanaka et al. |
| 2020/0318237 | A1 | 10/2020 | Fukazawa |
| 2020/0321209 | A1 | 10/2020 | Ishikawa et al. |
| 2020/0332416 | A1 | 10/2020 | Fluit |
| 2020/0340113 | A1 | 10/2020 | Hatanpää et al. |
| 2020/0340138 | A1 | 10/2020 | Tolle et al. |
| 2020/0343134 | A1 | 10/2020 | Kovalgin et al. |
| 2020/0343358 | A1 | 10/2020 | Zhu et al. |
| 2020/0350193 | A1 | 11/2020 | Garssen |
| 2020/0354836 | A1 | 11/2020 | Yednak et al. |
| 2020/0355296 | A1 | 11/2020 | Shugrue et al. |
| 2020/0357631 | A1 | 11/2020 | Ueda |
| 2020/0365391 | A1 | 11/2020 | Blanquart et al. |
| 2020/0365433 | A1 | 11/2020 | de Ridder et al. |

(56) References Cited

U.S. PATENT DOCUMENTS

| | | | |
|---|---|---|---|
| 2020/0365434 | A1 | 11/2020 | De Ridder |
| 2020/0365444 | A1 | 11/2020 | Hill et al. |
| 2020/0373152 | A1 | 11/2020 | Blanquart |
| 2020/0385861 | A1 | 12/2020 | Deye et al. |
| 2020/0385867 | A1 | 12/2020 | Kim et al. |
| 2020/0385868 | A1 | 12/2020 | Kim et al. |
| 2020/0395199 | A1 | 12/2020 | Miyama |
| 2020/0395209 | A1 | 12/2020 | Yoshimoto et al. |
| 2020/0395444 | A1 | 12/2020 | Lo et al. |
| 2020/0402846 | A1 | 12/2020 | Collins et al. |
| 2021/0002762 | A1 | 1/2021 | Jun et al. |
| 2021/0005449 | A1 | 1/2021 | Blanquart et al. |
| 2021/0005450 | A1 | 1/2021 | Mattinen et al. |
| 2021/0005723 | A1 | 1/2021 | Tang et al. |
| 2021/0013010 | A1 | 1/2021 | Yoshikawa et al. |
| 2021/0013034 | A1 | 1/2021 | Wu et al. |
| 2021/0013037 | A1 | 1/2021 | Sun et al. |
| 2021/0013042 | A1 | 1/2021 | Väyrynen et al. |
| 2021/0013085 | A1 | 1/2021 | Roh et al. |
| 2021/0020429 | A1 | 1/2021 | Khazaka et al. |
| 2021/0020431 | A1 | 1/2021 | Blanquart et al. |
| 2021/0020432 | A1 | 1/2021 | Blanquart |
| 2021/0020467 | A1 | 1/2021 | Sekiguchi |
| 2021/0020470 | A1 | 1/2021 | Lee |
| 2021/0028021 | A1 | 1/2021 | Mousa et al. |
| 2021/0017648 | A1 | 2/2021 | Kubota et al. |
| 2021/0032754 | A1 | 2/2021 | White et al. |
| 2021/0033977 | A1 | 2/2021 | Raaijmakers et al. |
| 2021/0035785 | A1 | 2/2021 | Jeong et al. |
| 2021/0035786 | A1 | 2/2021 | Jeong et al. |
| 2021/0035802 | A1 | 2/2021 | Tolle et al. |
| 2021/0035824 | A1 | 2/2021 | de Ridder |
| 2021/0035839 | A1 | 2/2021 | de Ridder |
| 2021/0035840 | A1 | 2/2021 | de Ridder et al. |
| 2021/0035841 | A1 | 2/2021 | Fluit |
| 2021/0035842 | A1 | 2/2021 | de Ridder |
| 2021/0035854 | A1 | 2/2021 | Yoo et al. |
| 2021/0040613 | A1 | 2/2021 | White et al. |
| 2021/0040615 | A1 | 2/2021 | White et al. |
| 2021/0043444 | A1 | 2/2021 | Blanquart |
| 2021/0050231 | A1 | 2/2021 | Oosterlaken |
| 2021/0054500 | A1 | 2/2021 | Zope et al. |
| 2021/0054504 | A1 | 2/2021 | Wang et al. |
| 2021/0057214 | A1 | 2/2021 | Kengoyama et al. |
| 2021/0057223 | A1 | 2/2021 | Stevens et al. |
| 2021/0057275 | A1 | 2/2021 | Pierreux et al. |
| 2021/0057570 | A1 | 2/2021 | Lin et al. |
| 2021/0066075 | A1 | 3/2021 | Zhang et al. |
| 2021/0066079 | A1 | 3/2021 | Lima et al. |
| 2021/0066080 | A1 | 3/2021 | Mattinen et al. |
| 2021/0066083 | A1 | 3/2021 | Haukka |
| 2021/0066084 | A1 | 3/2021 | Raisanen et al. |
| 2021/0070783 | A1 | 3/2021 | Odedra et al. |
| 2021/0071296 | A1 | 3/2021 | Watarai et al. |
| 2021/0071298 | A1 | 3/2021 | Maes et al. |
| 2021/0074527 | A1 | 3/2021 | Lee et al. |
| 2021/0082692 | A1 | 3/2021 | Kikuchi |
| 2021/0090878 | A1 | 3/2021 | Kang et al. |
| 2021/0095372 | A1 | 4/2021 | Minjauw et al. |
| 2021/0102289 | A1 | 4/2021 | Tsuji et al. |
| 2021/0102290 | A1 | 4/2021 | Acosta et al. |
| 2021/0102292 | A1 | 4/2021 | Lin et al. |
| 2021/0104384 | A1 | 4/2021 | Parkhe |
| 2021/0104399 | A1 | 4/2021 | Kuroda et al. |
| 2021/0108328 | A1 | 4/2021 | Yanagisawa |
| 2021/0111025 | A1 | 4/2021 | Zyulkov et al. |
| 2021/0111053 | A1 | 4/2021 | De Ridder |
| 2021/0118667 | A1 | 4/2021 | Fukazawa et al. |
| 2021/0118679 | A1 | 4/2021 | Lima et al. |
| 2021/0118687 | A1 | 4/2021 | Wang et al. |
| 2021/0125827 | A1 | 4/2021 | Khazaka et al. |
| 2021/0125832 | A1 | 4/2021 | Bhatnagar |
| 2021/0134588 | A1 | 5/2021 | Kohen et al. |
| 2021/0134959 | A1 | 5/2021 | Lima et al. |
| 2021/0140043 | A1 | 5/2021 | Thombare et al. |
| 2021/0143003 | A1 | 5/2021 | Fukuda et al. |
| 2021/0151315 | A1 | 5/2021 | Pierreux et al. |
| 2021/0151348 | A1 | 5/2021 | Utsuno et al. |
| 2021/0151352 | A1 | 5/2021 | Zope et al. |
| 2021/0156024 | A1 | 5/2021 | Roh et al. |
| 2021/0156030 | A1 | 5/2021 | Shugrue |
| 2021/0159077 | A1 | 5/2021 | Longrie et al. |
| 2021/0166910 | A1 | 6/2021 | Kim et al. |
| 2021/0166924 | A1 | 6/2021 | Moon et al. |
| 2021/0166925 | A1 | 6/2021 | Moon et al. |
| 2021/0166940 | A1 | 6/2021 | Nozawa |
| 2021/0172064 | A1 | 6/2021 | Moon |
| 2021/0175052 | A1 | 6/2021 | Takahashi et al. |
| 2021/0180184 | A1 | 6/2021 | Verni et al. |
| 2021/0180188 | A1 | 6/2021 | Kim et al. |
| 2021/0180189 | A1 | 6/2021 | Shugrue et al. |
| 2021/0193458 | A1 | 6/2021 | Salmi et al. |
| 2021/0205758 | A1 | 7/2021 | Kimtee et al. |
| 2021/0207269 | A1 | 7/2021 | Huang et al. |
| 2021/0207270 | A1 | 7/2021 | de Ridder et al. |
| 2021/0210373 | A1 | 7/2021 | Singu et al. |
| 2021/0214842 | A1 | 7/2021 | Yoon et al. |
| 2021/0225615 | A1 | 7/2021 | Yoshida |
| 2021/0225622 | A1 | 7/2021 | Shoji |
| 2021/0225642 | A1 | 7/2021 | Utsuno et al. |
| 2021/0225643 | A1 | 7/2021 | Kuroda et al. |
| 2021/0230744 | A1 | 7/2021 | Kimtee et al. |
| 2021/0230746 | A1 | 7/2021 | Shiba |
| 2021/0233772 | A1 | 7/2021 | Zhu et al. |
| 2021/0238736 | A1 | 8/2021 | Butail et al. |
| 2021/0238742 | A1 | 8/2021 | Susa et al. |
| 2021/0239614 | A1 | 8/2021 | Muralidhar et al. |
| 2021/0242011 | A1 | 8/2021 | Shero et al. |
| 2021/0246556 | A1 | 8/2021 | Mori |
| 2021/0247693 | A1 | 8/2021 | Maes et al. |
| 2021/0249303 | A1 | 8/2021 | Blanquart |
| 2021/0254216 | A1 | 8/2021 | Mori et al. |
| 2021/0254238 | A1 | 8/2021 | Khazaka et al. |
| 2021/0257213 | A1 | 8/2021 | Kikuchi et al. |
| 2021/0257509 | A1 | 8/2021 | Nishiwaki |
| 2021/0265134 | A1 | 8/2021 | Singh et al. |
| 2021/0265158 | A1 | 8/2021 | Kaneko |
| 2021/0268554 | A1 | 9/2021 | Mori |
| 2021/0269914 | A1 | 9/2021 | Väyrynen et al. |
| 2021/0272821 | A1 | 9/2021 | Oosterlaken |
| 2021/0273109 | A1 | 9/2021 | Yamazaki et al. |
| 2021/0280448 | A1 | 9/2021 | Ganguli et al. |
| 2021/0285102 | A1 | 9/2021 | Yoon et al. |
| 2021/0287878 | A1 | 9/2021 | Um et al. |
| 2021/0287912 | A1 | 9/2021 | Shiba et al. |
| 2021/0287928 | A1 | 9/2021 | Kim et al. |
| 2021/0288476 | A1 | 9/2021 | Wei |
| 2021/0292902 | A1 | 9/2021 | Kajbafvala et al. |
| 2021/0296130 | A1 | 9/2021 | Longrie et al. |
| 2021/0296144 | A1 | 9/2021 | Lin et al. |
| 2021/0310125 | A1 | 10/2021 | Ma et al. |
| 2021/0313150 | A1 | 10/2021 | Kang et al. |
| 2021/0313167 | A1 | 10/2021 | Pore et al. |
| 2021/0313170 | A1 | 10/2021 | Suzuki |
| 2021/0313178 | A1 | 10/2021 | Nakano |
| 2021/0313182 | A1 | 10/2021 | Zhu et al. |
| 2021/0317576 | A1 | 10/2021 | Väyrynen et al. |
| 2021/0319982 | A1 | 10/2021 | Kim et al. |
| 2021/0320003 | A1 | 10/2021 | Sugiura et al. |
| 2021/0320010 | A1 | 10/2021 | Wang et al. |
| 2021/0320020 | A1 | 10/2021 | Oosterlaken et al. |
| 2021/0324510 | A1 | 10/2021 | Kuwano et al. |
| 2021/0324518 | A1 | 10/2021 | de Ridder |
| 2021/0327704 | A1 | 10/2021 | Kajbafvala et al. |
| 2021/0327714 | A1 | 10/2021 | Lee et al. |
| 2021/0327715 | A1 | 10/2021 | Xie et al. |
| 2021/0328036 | A1 | 10/2021 | Li et al. |
| 2021/0041284 | A1 | 11/2021 | Yednak |

FOREIGN PATENT DOCUMENTS

| | | |
|---|---|---|
| CN | 2588350 | 11/2003 |
| CN | 1563483 | 1/2005 |
| CN | 1655362 | 8/2005 |

(56) References Cited

FOREIGN PATENT DOCUMENTS

| | | |
|---|---|---|
| CN | 1664987 | 9/2005 |
| CN | 1825535 | 8/2006 |
| CN | 101047143 | 10/2007 |
| CN | 101142012 | 3/2008 |
| CN | 101609858 | 12/2009 |
| CN | 101681873 | 3/2010 |
| CN | 101308794 | 9/2010 |
| CN | 102094183 | 6/2011 |
| CN | 102383106 | 3/2012 |
| CN | 103014846 | 4/2013 |
| CN | 102539019 | 9/2013 |
| CN | 103515222 | 1/2014 |
| CN | 102373440 | 7/2014 |
| CN | 203721699 | 7/2014 |
| CN | 104244620 | 12/2014 |
| CN | 104307264 | 1/2015 |
| CN | 104498895 | 4/2015 |
| CN | 104517892 | 4/2015 |
| CN | 204629865 | 9/2015 |
| CN | 105253917 | 1/2016 |
| CN | 205448240 | 8/2016 |
| CN | 104342637 | 2/2017 |
| CN | 206145834 | 5/2017 |
| CN | 104233226 | 6/2017 |
| CN | 106895521 | 6/2017 |
| CN | 104201108 | 11/2017 |
| CN | 104630735 | 12/2017 |
| CN | 107675144 | 2/2018 |
| CN | 108389798 | 8/2018 |
| CN | 106011785 | 10/2018 |
| CN | 108910843 | 11/2018 |
| CN | 109000352 | 12/2018 |
| DE | 8902307 | 8/1989 |
| DE | 3836696 | 12/1989 |
| DE | 3626724 | 6/1994 |
| DE | 10133013 | 1/2003 |
| DE | 102008052750 | 6/2009 |
| EP | 0058571 | 8/1982 |
| EP | 0499004 | 8/1992 |
| EP | 0634785 | 1/1995 |
| EP | 0550058 | 11/1998 |
| EP | 0887632 | 12/1998 |
| EP | 678909 | 7/1999 |
| EP | 1061567 | 12/2000 |
| EP | 1889817 | 2/2008 |
| EP | 2036600 | 3/2009 |
| EP | 2426233 | 7/2012 |
| FR | 686869 | 7/1930 |
| FR | 1408266 | 8/1965 |
| FR | 2233614 | 1/1975 |
| FR | 2517790 | 6/1983 |
| FR | 2610007 | 8/1990 |
| FR | 2708624 | 2/1995 |
| GB | 400010 | 10/1933 |
| GB | 752-277 | 7/1956 |
| GB | 1186889 | 6/1966 |
| GB | 1514921 | 6/1978 |
| GB | 2051875 | 1/1981 |
| JP | 58-19462 | 4/1983 |
| JP | S5979545 | 5/1984 |
| JP | S59127847 | 7/1984 |
| JP | 59-211779 | 11/1984 |
| JP | S60110133 | 6/1985 |
| JP | 61038863 | 2/1986 |
| JP | S62237236 | 10/1987 |
| JP | S63136532 | 6/1988 |
| JP | H0165766 | 6/1989 |
| JP | H01185176 | 7/1989 |
| JP | H01-296613 | 11/1989 |
| JP | H01-307229 | 12/1989 |
| JP | H01313954 | 12/1989 |
| JP | H02-93071 | 4/1990 |
| JP | H02-185038 | 7/1990 |
| JP | H02-217469 | 8/1990 |
| JP | H03-044472 | 2/1991 |
| JP | H03-155625 | 7/1991 |
| JP | H03211753 | 9/1991 |
| JP | H03-248427 | 11/1991 |
| JP | H04-29313 | 1/1992 |
| JP | H04-115531 | 4/1992 |
| JP | H05-6880 | 1/1993 |
| JP | H05-23079 | 3/1993 |
| JP | 405118928 | 5/1993 |
| JP | H05-118928 | 5/1993 |
| JP | H05-171446 | 7/1993 |
| JP | H05-291142 | 11/1993 |
| JP | H06-053210 | 2/1994 |
| JP | H06-84888 | 3/1994 |
| JP | H06-140399 | 5/1994 |
| JP | H0616433 | 6/1994 |
| JP | 6204231 | 7/1994 |
| JP | H06-319177 | 11/1994 |
| JP | H06-338497 | 12/1994 |
| JP | H07-297271 | 1/1995 |
| JP | H0729836 | 1/1995 |
| JP | 07066267 | 3/1995 |
| JP | H07-74162 | 3/1995 |
| JP | H07-109576 | 4/1995 |
| JP | 07034936 | 8/1995 |
| JP | H07-034936 | 8/1995 |
| JP | H07-225214 | 8/1995 |
| JP | 7-272694 | 10/1995 |
| JP | H07-283149 | 10/1995 |
| JP | H07-209093 | 11/1995 |
| JP | H08-181135 | 7/1996 |
| JP | H08-335558 | 12/1996 |
| JP | H09-064149 | 3/1997 |
| JP | 9-89676 | 4/1997 |
| JP | H09-148322 | 6/1997 |
| JP | H10-41096 | 2/1998 |
| JP | H10-50635 | 2/1998 |
| JP | H10-50800 | 2/1998 |
| JP | H10-064696 | 3/1998 |
| JP | H10-153494 | 6/1998 |
| JP | H10-227703 | 8/1998 |
| JP | H10-0261620 | 9/1998 |
| JP | Hll-097163 | 4/1999 |
| JP | Hll-118615 | 4/1999 |
| JP | H11-183264 | 7/1999 |
| JP | H11-183265 | 7/1999 |
| JP | H11-195688 | 7/1999 |
| JP | H11-287715 | 10/1999 |
| JP | 2000068355 | 3/2000 |
| JP | 2000182949 | 6/2000 |
| JP | 2000269163 | 9/2000 |
| JP | 2001015698 | 1/2001 |
| JP | 2001023872 | 1/2001 |
| JP | 2001207265 | 7/2001 |
| JP | 2001207268 | 7/2001 |
| JP | 2001210602 | 8/2001 |
| JP | 2001220677 | 8/2001 |
| JP | 2001257199 | 9/2001 |
| JP | 2001287180 | 10/2001 |
| JP | 2002118066 | 4/2002 |
| JP | 2002164342 | 6/2002 |
| JP | 2002170781 | 6/2002 |
| JP | 2002237375 | 8/2002 |
| JP | 2003035574 | 2/2003 |
| JP | 2003053688 | 2/2003 |
| JP | 2003133300 | 5/2003 |
| JP | 2003153706 | 5/2003 |
| JP | 2003303814 | 10/2003 |
| JP | 2004014952 | 1/2004 |
| JP | 2004023043 | 1/2004 |
| JP | 2004088077 | 3/2004 |
| JP | 2004091848 | 3/2004 |
| JP | 2004113270 | 4/2004 |
| JP | 2004128019 | 4/2004 |
| JP | 2004134553 | 4/2004 |
| JP | 2004163293 | 6/2004 |
| JP | 2004244298 | 9/2004 |
| JP | 2004244661 | 9/2004 |
| JP | 2005033221 | 9/2004 |
| JP | 2004294638 | 10/2004 |

(56) References Cited

FOREIGN PATENT DOCUMENTS

| | | |
|---|---|---|
| JP | 3589954 | 11/2004 |
| JP | 2004310019 | 11/2004 |
| JP | 2005033221 | 2/2005 |
| JP | 2005079254 | 3/2005 |
| JP | 2005507030 | 3/2005 |
| JP | 2005172489 | 6/2005 |
| JP | 3725100 | 12/2005 |
| JP | 2006028572 | 2/2006 |
| JP | 2006049352 | 2/2006 |
| JP | 2006059931 | 3/2006 |
| JP | 2006090762 | 4/2006 |
| JP | 2006124831 | 5/2006 |
| JP | 2006124832 | 5/2006 |
| JP | 2006153706 | 6/2006 |
| JP | 2006186271 | 7/2006 |
| JP | 2006188729 | 7/2006 |
| JP | 2006278058 | 10/2006 |
| JP | 2006319261 | 11/2006 |
| JP | 2007027777 | 2/2007 |
| JP | 2007287902 | 11/2007 |
| JP | 3140111 | 3/2008 |
| JP | 2008060304 | 3/2008 |
| JP | 2008066159 | 3/2008 |
| JP | 2008085129 | 4/2008 |
| JP | 2008089320 | 4/2008 |
| JP | 2008172083 | 7/2008 |
| JP | 2008198629 | 8/2008 |
| JP | 2008202107 | 9/2008 |
| JP | 2009016815 | 1/2009 |
| JP | 2009088421 | 4/2009 |
| JP | 2009099938 | 5/2009 |
| JP | 2009194248 | 8/2009 |
| JP | 2009239082 | 10/2009 |
| JP | 2009251216 | 10/2009 |
| JP | 2009252851 | 10/2009 |
| JP | 2010067940 | 3/2010 |
| JP | 2010097834 | 4/2010 |
| JP | 2010205967 | 9/2010 |
| JP | 2010251444 | 10/2010 |
| JP | 2010255218 | 11/2010 |
| JP | 2011049592 | 3/2011 |
| JP | 2011162830 | 8/2011 |
| JP | 2011181681 | 9/2011 |
| JP | 2009010412 | 2/2012 |
| JP | 2012146939 | 8/2012 |
| JP | 2012164736 | 8/2012 |
| JP | 2012195513 | 10/2012 |
| JP | 2013026479 | 2/2013 |
| JP | 2013196822 | 9/2013 |
| JP | 2013235912 | 11/2013 |
| JP | D1422467 | 8/2014 |
| JP | 2014222693 | 11/2014 |
| JP | 2015021175 | 2/2015 |
| JP | 2015115461 | 6/2015 |
| JP | 2016098406 | 5/2016 |
| JP | 2010123843 | 6/2016 |
| JP | 2016174158 | 9/2016 |
| JP | 2017183242 | 10/2017 |
| JP | 2017220011 | 12/2017 |
| JP | 6519897 | 5/2019 |
| KR | 1998-0026850 | 7/1998 |
| KR | 20000000946 | 1/2000 |
| KR | 10-0253664 | 4/2000 |
| KR | 10-2000-0031098 | 6/2000 |
| KR | 10-2000-0045257 | 7/2000 |
| KR | 100273261 | 12/2000 |
| KR | 10-0295043 | 4/2001 |
| KR | 10-2002-0027695 | 4/2002 |
| KR | 10-2002-0064028 | 8/2002 |
| KR | 2002-0086763 | 11/2002 |
| KR | 10-0377095 | 3/2003 |
| KR | 2003-0092305 | 12/2003 |
| KR | 10-2005-0054122 | 6/2005 |
| KR | 10-0547248 | 1/2006 |
| KR | 10-0593960 | 6/2006 |
| KR | 10-2006-0129566 | 12/2006 |
| KR | 10-0688484 | 2/2007 |
| KR | 20070041701 | 4/2007 |
| KR | 10-2007-0079797 | 8/2007 |
| KR | 10-2007-0084683 | 8/2007 |
| KR | 10-2007-0117817 | 12/2007 |
| KR | 2008-0058620 | 6/2008 |
| KR | 10-2009-0039936 | 4/2009 |
| KR | 10-2009-0055443 | 6/2009 |
| KR | 10-2009-0056475 | 6/2009 |
| KR | 10-2009-0086790 | 8/2009 |
| KR | 10-2009-0105977 | 10/2009 |
| KR | 10-0936694 | 1/2010 |
| KR | 10-2010-0015073 | 2/2010 |
| KR | 10-2010-0020834 | 2/2010 |
| KR | 10-2010-0032812 | 3/2010 |
| KR | 10-2010-0077442 | 7/2010 |
| KR | 10-2010-0079920 | 7/2010 |
| KR | 10-2010-0122701 | 11/2010 |
| KR | 10-2010-0132779 | 12/2010 |
| KR | 10-2011-0058534 | 6/2011 |
| KR | 10-1114219 | 3/2012 |
| KR | 10-2012-0111060 | 10/2012 |
| KR | 10-2013-0007806 | 1/2013 |
| KR | 10-2013-0067600 | 6/2013 |
| KR | 10-2013-0129149 | 11/2013 |
| KR | 10-1347962 | 1/2014 |
| KR | 10-1491726 | 2/2015 |
| KR | 10-1535573 | 7/2015 |
| KR | 101758892 | 7/2017 |
| KR | 10-2019-0032077 | 3/2019 |
| NL | 8600255 | 9/1987 |
| NL | 8701549 | 2/1989 |
| RU | 1786406 | 1/1993 |
| SU | 494614 | 2/1976 |
| SU | 1408319 | 7/1988 |
| TW | 538327 | 6/2003 |
| TW | 540093 | 7/2003 |
| TW | M292692 | 6/2006 |
| TW | 200731357 | 8/2007 |
| TW | 200903625 | 1/2009 |
| TW | 201213596 | 4/2012 |
| TW | 201234453 | 8/2012 |
| TW | 201247690 | 12/2012 |
| TW | M446412 | 2/2013 |
| TW | 201330086 | 7/2013 |
| TW | D162593 | 8/2014 |
| TW | D164568 | 12/2014 |
| TW | 201531587 | 8/2015 |
| TW | M512254 | 11/2015 |
| TW | I514509 | 12/2015 |
| TW | 201613231 | 4/2016 |
| TW | M553518 | 12/2017 |
| TW | D196097 | 2/2019 |
| WO | 1987001508 | 3/1987 |
| WO | 1990004045 | 4/1990 |
| WO | 1991004522 | 4/1991 |
| WO | 1991006975 | 5/1991 |
| WO | 1992000477 | 1/1992 |
| WO | 1994027315 | 11/1994 |
| WO | 1996017107 | 6/1996 |
| WO | 1997003223 | 1/1997 |
| WO | 1998032893 | 7/1998 |
| WO | 1999023690 | 5/1999 |
| WO | DM/048579 | 7/1999 |
| WO | 2004008491 | 7/2002 |
| WO | 2004007800 | 1/2004 |
| WO | 2004008827 | 1/2004 |
| WO | 2004010467 | 1/2004 |
| WO | 2004106584 | 12/2004 |
| WO | 2005112082 | 11/2005 |
| WO | 2006035281 | 4/2006 |
| WO | 2006054854 | 5/2006 |
| WO | 2006056091 | 6/2006 |
| WO | 2006078666 | 7/2006 |
| WO | 2006080782 | 8/2006 |
| WO | 2006097525 | 9/2006 |
| WO | 2006101857 | 9/2006 |
| WO | 2006114781 | 11/2006 |

(56) References Cited

FOREIGN PATENT DOCUMENTS

| | | |
|---|---|---|
| WO | 2007024720 | 3/2007 |
| WO | 2007027165 | 3/2007 |
| WO | 2007076195 | 7/2007 |
| WO | 2007088940 | 8/2007 |
| WO | 2007117718 | 10/2007 |
| WO | 2007131051 | 11/2007 |
| WO | 2007140376 | 12/2007 |
| WO | 2008045972 | 4/2008 |
| WO | 2008091900 | 7/2008 |
| WO | 2008121463 | 10/2008 |
| WO | 2008147731 | 12/2008 |
| WO | 2009028619 | 3/2009 |
| WO | 2009029532 | 3/2009 |
| WO | 2009039251 | 3/2009 |
| WO | 2009099776 | 8/2009 |
| WO | 2009154889 | 12/2009 |
| WO | 2009154896 | 12/2009 |
| WO | 2010039363 | 4/2010 |
| WO | 2010077533 | 7/2010 |
| WO | 2010100702 | 9/2010 |
| WO | 2010110558 | 9/2010 |
| WO | 2010118051 | 10/2010 |
| WO | 2010129428 | 11/2010 |
| WO | 2010129430 | 11/2010 |
| WO | 2010129431 | 11/2010 |
| WO | 2011019950 | 2/2011 |
| WO | 2011149640 | 12/2011 |
| WO | 2012056592 | 5/2012 |
| WO | 2012077590 | 6/2012 |
| WO | 2013043330 | 3/2013 |
| WO | 2013078065 | 5/2013 |
| WO | 2013078066 | 5/2013 |
| WO | 2013177269 | 11/2013 |
| WO | 2014107290 | 7/2014 |
| WO | 2015026230 | 2/2015 |
| WO | 2015107009 | 7/2015 |
| WO | 2015112728 | 7/2015 |
| WO | 2015127614 | 9/2015 |
| WO | 2016019795 | 2/2016 |
| WO | 2018109553 | 6/2016 |
| WO | 2018109554 | 6/2016 |
| WO | 2017108713 | 6/2017 |
| WO | 2017108714 | 6/2017 |
| WO | 2017125401 | 7/2017 |
| WO | 2017212546 | 12/2017 |
| WO | 2018003072 | 1/2018 |
| WO | 2018008088 | 1/2018 |
| WO | 2018013778 | 1/2018 |
| WO | 2018020316 | 2/2018 |
| WO | 2018020318 | 2/2018 |
| WO | 2018020320 | 2/2018 |
| WO | 2018020327 | 2/2018 |
| WO | 2018105349 | 6/2018 |
| WO | 2018109551 | 6/2018 |
| WO | 2018109552 | 6/2018 |
| WO | 2018178771 | 10/2018 |
| WO | 2019030565 | 2/2019 |
| WO | 2019103610 | 5/2019 |
| WO | 2019103613 | 5/2019 |
| WO | 2019142055 | 7/2019 |
| WO | 2019158960 | 8/2019 |
| WO | 2019214578 | 11/2019 |
| WO | 2019217749 | 11/2019 |
| WO | 2019229537 | 12/2019 |
| WO | 2020002995 | 1/2020 |
| WO | 2020003000 | 1/2020 |
| WO | 2020118100 | 6/2020 |
| WO | 2021072042 | 4/2021 |

OTHER PUBLICATIONS

CNIPA; Office Action dated Aug. 1, 2013 in Application No. 201080015699.9.

CNIPA; Office Action dated Jan. 21, 2014 in Application No. 201080015699.9.

CNIPA; Office Action dated Jul. 25, 2014 in Application No. 201080015699.9.

CNIPA; Office Action dated Jan. 12, 2015 in Application No. 201080015699.9.

CNIPA; Notice of Allowance dated May 8, 2015 in Application No. 201080015699.9.

CNIPA; Office Action dated Dec. 10, 2013 in Application No. 201080020267.7.

CNIPA; Notice of Allowance dated Aug. 22, 2014 in Application No. 201080020267.7.

CNIPA; Office Action dated Jan. 21, 2013 in Application No. 201080020268.1.

CNIPA; Office Action dated Sep. 26, 2013 in Application No. 201080020268.1.

CNIPA; Office Action dated Apr. 3, 2014 in Application No. 201080020268.1.

CNIPA; Office Action dated Sep. 23, 2014 in Application No. 201080020268.1.

CNIPA; Office Action dated Apr. 7, 2015 in Application No. 201080020268.1.

CNIPA; Notice of Allowance dated Oct. 16, 2015 in Application No. 201080020268.1.

CNIPA; Office Action dated May 24, 2013 in Application No. 201080036764.6.

CNIPA; Office Action dated Jan. 2, 2014 in Application No. 201080036764.6.

CNIPA; Office Action dated Jul. 1, 2014 in Application No. 201080036764.6.

CNIPA; Notice of Allowance dated Oct. 24, 2014 in Application No. 201080036764.6.

CNIPA; Office Action dated Feb. 8, 2014 in Application No. 201110155056.0.

CNIPA; Office Action dated Sep. 16, 2014 in Application No. 201110155056.0.

CNIPA; Office Action dated Feb. 9, 2015 in Application No. 201110155056.0.

CNIPA; Notice of Allowance dated Aug. 26, 2015 in Application No. 201110155056.0.

CNIPA; Office Action dated Dec. 4, 2015 in Application No. 201210201995.9.

CNIPA; Office Action dated Jul. 14, 2016 in Application No. 201210201995.9.

CNIPA; Office Action dated Jan. 20, 2017 in Application No. 201210201995.9.

CNIPA; Notice of Allowance dated Apr. 13, 2017 in Application No. 201210201995.9.

CNIPA; Office Action dated Dec. 24, 2015 in Application No. 201280057466.4.

CNIPA; Notice of Allowance dated Jun. 16, 2016 in Application No. 201280057466.4.

CNIPA; Office Action dated Dec. 4, 2015 in Application No. 201280057542.1.

CNIPA; Office Action dated May 16, 2016 in Application No. 201280057542.1.

CNIPA; Office Action dated Sep. 9, 2016 in Application No. 201280057542.1.

CNIPA; Notice of Allowance dated Jan. 3, 2017 in Application No. 201280057542.1.

CNIPA; Office Action dated Dec. 5, 2016 in Application No. 201310412808.6.

CNIPA; Notice of Allowance dated Jul. 20, 2017 in Application No. 201310412808.6.

CNIPA; Office Action dated Feb. 05, 2018 in Application No. 201410331047.6.

CNIPA; Office Action dated Dec. 14, 2018 in Application No. 201410331047.6.

CNIPA; Notice of Allowance dated Jun. 14, 2019 in Application No. 201410331047.6.

CNIPA; Office Action dated Oct. 19, 2018 in Application No. 201510765170.3.

(56) References Cited

OTHER PUBLICATIONS

CNIPA; Office Action dated Jun. 28, 2019 in Application No. 201510765170.3.
CNIPA; Notice of Allowance dated Sep. 30, 2019 in Application No. 201510765170.3.
CNIPA; Office Action dated Oct. 31, 2018 in Application No. 201510765406.3.
CNIPA; Office Action dated Jun. 28, 2019 in Application No. 201510765406.3.
CNIPA; Notice of Allowance dated Dec. 27, 2019 in Application No. 201510765406.3.
CNIPA; Office Action dated Jan. 21, 2020 in Application No. 201610028064.1.
CNIPA; Notice of Allowance dated May 22, 2020 in Application No. 201610028064.1.
CNIPA; Office Action dated Mar. 26, 2020 in Application No. 201610131743.1.
CNIPA; Office Action dated Mar. 14, 2019 in Application No. 201610141027.1.
CNIPA; Notice of Allowance dated Sep. 3, 2019 in Application No. 201610141027.1.
CNIPA; Office Action dated Jul. 23, 2019 in Application No. 201610897958.4.
CNIPA; Office Action dated Feb. 28, 2020 in Application No. 201610897958.4.
CNIPA; Office Action dated Nov. 4, 2019 in Application No. 201610898822.5.
CNIPA; Office Action dated May 18, 2020 in Application No. 201610982040.X.
CNIPA; Office Action dated May 29, 2020 in Application No. 201710131319.1.
CNIPA; Office Action dated Jun. 1, 2020 in Application No. 201710173292.2.
CNIPA; Office Action dated Dec. 20, 2018 in Application No. 201710738549.4.
CNIPA; Office Action dated Jun. 20, 2019 in Application No. 201711120632.1.
CNIPA; Notice of Allowance dated May 25, 2017 in Application No. 201730010308.9.
CNIPA; Office Action dated Nov. 11, 2019 in Application No. 201810379112.0.
CNIPA; Notice of Allowance dated Oct. 24, 2018 in Application No. 201830060972.9.
CNIPA; Notice of Allowance dated Nov. 1, 2018 in Application No. 201830397219.9.
CNIPA; Notice of Allowance dated May 14, 2020 in Application No. 201930615780.4.
CNIPA; Notice of Allowance dated Apr. 27, 2020 in Application No. 201930660355.7.
CNIPA; Notice of Allowance dated Jun. 2, 2020 in Application No. 202030048819.1.
CNIPA; Notice of Allowance dated May 15, 2020 in Application No. 202030048854.3.
CNIPA; Notice of Allowance dated May 15, 2020 in Application No. 202030053560.X.
CNIPA; Notice of Allowance dated May 20, 2020 in Application No. 202030053634.X.
EPO; Supplementary European Search Report and Opinion dated Nov. 9, 2012 in Application No. 08798519.8.
EPO; Office Action dated Jul. 18, 2016 in Application No. 08798519.8.
EPO; Extended European Search Report dated Dec. 9, 2016 in Application No. 09767208.3.
EPO; Office Action dated Aug. 10, 2018 in Application No. 09767208.3.
EPO; Notice of Allowance dated Aug. 1, 2019 in Application No. 09767208.3.
EPO; Supplementary European Search Report and Opinion dated Jan. 5, 2017 in Application No. 09836647.9.
EPO; Office Action dated Feb. 28, 2018 in Application No. 09836647.9.
EPO; Office Action dated Jan. 11, 2019 in Application No. 09836647.9.
EPO; Notice of Allowance dated Oct. 16, 2019 in Application No. 09836647.9.
EPO; Extended European Search Report dated Apr. 28, 2014 in Application No. 11162225.4.
EPO; Notice of Allowance dated Feb. 3, 2015 in Application No. 11162225.4.
EPO; Extended European Search Report dated Nov. 29, 2019 in Application No. 19188826.2.
EPO; Extended European Search Report dated Mar. 3, 2020 in Application No. 19205558.0.
IPOS; Notice of Allowance dated Aug. 14, 2017 in Application No. 10201401237.
JPO; Office Action dated Aug. 10, 2009 in Application No. 2003029767.
JPO; Office Action dated Apr. 13, 2010 in Application No. 2003029767.
JPO; Notice of Allowance dated Jun. 24, 2010 in Application No. 2003029767.
JPO; Office Action dated Oct. 30, 2008 in Application No. 2004558313.
JPO; Office Action dated Feb. 19, 2009 in Application No. 2004558313.
JPO; Notice of Allowance dated Jun. 30, 2009 in Application No. 2004558313.
JPO; Office Action dated Mar. 16, 2012 in Application No. 2009-532567.
JPO; Notice of Allowance dated Jul. 23, 2012 in Application No. 2009-532567.
JPO; Notice of Allowance dated Mar. 29, 2013 in Application No. 2010-509478.
JPO; Office Action dated Dec. 20, 2011 in Application No. 2010-522075.
JPO; Office Action dated Apr. 11, 2012 in Application No. 2010-522075.
JPO; Office Action dated May 15, 2013 in Application No. 2010058415.
JPO; Office Action dated Oct. 30, 2013 in Application No. 2010058415.
JPO; Office Action dated Aug. 7, 2014 in Application No. 2010058415.
JPO; Notice of Allowance dated Dec. 18, 2014 in Application No. 2010058415.
JPO; Office Action dated Aug. 22, 2013 in Application No. 2010-153754.
JPO; Office Action dated Oct. 30, 2013 in Application No. 2010-193285.
JPO; Office Action dated Aug. 26, 2015 in Application No. 2011-284831.
JPO; Notice of Allowance dated Mar. 3, 2016 in Application No. 2011-284831.
JPO; Office Action dated May 31, 2012 in Application No. 2011-514650.
JPO; Office Action dated Sep. 11, 2012 in Application No. 2011-514650.
JPO; Notice of Allowance dated Dec. 10, 2012 in Application No. 2011-514650.
JPO; Office Action dated Dec. 10, 2014 in Application No. 2011090067.
JPO; Notice of Allowance dated Apr. 28, 2015 in Application No. 2011090067.
JPO; Office Action dated Jul. 14, 2016 in Application No. 2012-153698.
JPO; Notice of Allowance dated Oct. 21, 2016 in Application No. 2012-153698.
JPO; Office Action dated Dec. 20, 2013 in Application No. 2012-504786.
JPO; Office Action dated Jan. 25, 2014 in Application No. 2012-504786.
JPO; Office Action dated Dec. 1, 2014 in Application No. 2012-504786.
JPO; Notice of Allowance dated Jun. 12, 2015 in Application No. 2012504786.
JPO; Office Action dated Mar. 11, 2013 in Application No. 2012-509857.
JPO; Notice of Allowance dated Jun. 29, 2013 in Application No. 2012-509857.

(56) References Cited

OTHER PUBLICATIONS

JPO; Office Action dated May 19, 2017 in Application No. 2013-160173.
JPO; Notice of Allowance dated Aug. 23, 2017 in Application No. 2013-160173.
JPO; Office Action dated Aug. 14, 2017 in Application No. 2013-178344.
JPO; Office Action dated Jan. 23, 2018 in Application No. 2013-178344.
JPO; Notice of Allowance dated Jul. 24, 2018 in Application No. 2013-178344.
JPO; Office Action dated Apr. 3, 2018 in Application No. 2014-120675.
JPO; Notice of Allowance dated Jun. 6, 2018 in Application No. 2014-120675.
JPO; Office Action dated Mar. 28, 2018 in Application No. 2014-188835.
JPO; Notice of Allowance dated Jun. 6, 2018 in Application No. 2014-188835.
JPO; Office Action dated Apr. 12, 2018 in Application No. 2014-205548.
JPO; Notice of Allowance dated Dec. 19, 2019 in Application No. 2014205548.
JPO; Notice of Allowance dated May 14, 2018 in Application No. 2014-216540.
JPO; Office Action dated Jul. 20, 2018 in Application No. 2015-034774.
JPO; Office Action dated Jun. 27, 2019 in Application No. 2015034774.
JPO; Notice of Allowance dated Nov. 20, 2019 in Application No. 2015034774.
JPO; Office Action dated Jan. 30, 2019 in Application No. 2015052198.
JPO; Notice of Allowance dated Apr. 5, 2019 in Application No. 2015052198.
JPO; Office Action dated Aug. 29, 2019 in Application No. 2016001928.
JPO; Notice of Allowance dated Dec. 17, 2019 in Application No. 2016001928.
KIPO; Office Action dated Dec. 10, 2015 in Application No. 10-2010-0028336.
KIPO; Office Action dated Jun. 29, 2016 in Application No. 10-2010-0028336.
KIPO; Notice of Allowance dated Sep. 29, 2016 in Application No. 10-2010-0028336.
KIPO; Office Action dated Mar. 3, 2016 in Application No. 10-2010-0067768.
KIPO; Office Action dated Aug. 1, 2016 in Application No. 10-2010-0067768.
KIPO; Notice of Allowance dated Dec. 1, 2016 in Application No. 10-2010-0067768.
KIPO; Office Action dated May 2, 2016 in Application No. 10-2010-0082446.
KIPO; Office Action dated Sep. 19, 2016 in Application No. 10-2010-0082446.
KIPO; Notice of Allowance dated Mar. 7, 2017 in Application No. 10-2010-0082446.
KIPO; Office Action dated Mar. 13, 2017 in Application No. 20110034612.
KIPO; Office Action dated Jul. 20, 2017 in Application No. 20110034612.
KIPO; Notice of Allowance dated Sep. 1, 2017 in Application No. 20110034612.
KIPO; Office Action dated Nov. 24, 2017 in Application No. 10-2011-0036449.
KIPO; Office Action dated May 23, 2017 in Application No. 10-2011-0036449.
KIPO; Office Action dated Apr. 2, 2018 in Application No. 10-2011-0036449.
KIPO; Notice of Allowance dated Oct. 24, 2018 in Application No. 10-2011-0036449.
KIPO; Office Action dated Sep. 4, 2017 in Application No. 10-2011-0087600.
KIPO; Notice of Allowance dated Jan. 11, 2018 in Application No. 10-2011-0087600.
KIPO; Office Action dated Oct. 23, 2017 in Application No. 10-2011-0142924.
KIPO; Notice of Allowance dated Mar. 14, 2018 in Application No. 10-2011-0142924.
KIPO; Office Action dated Dec. 11, 2015 in Application No. 10-2011-7023416.
KIPO; Office Action dated Mar. 13, 2016 in Application No. 10-2011-7023416.
KIPO; Notice of Allowance dated Jun. 2, 0216 in Application No. 10-2011-7023416.
KIPO; Office Action dated Oct. 30, 2017 in Application No. 10-2012-0041878.
KIPO; Notice of Allowance dated Feb. 28, 2018 in Application No. 10-2012-0041878.
KIPO; Office Action dated Mar. 21, 2018 in Application No. 10-2012-0042518.
KIPO; Notice of Allowance dated May 30, 2018 in Application No. 10-2012-0042518.
KIPO; Office Action dated Mar. 21, 2018 in Application No. 10-2012-0064526.
KIPO; Office Action dated Sep. 18, 2018 in Application No. 10-2012-0064526.
KIPO; Office Action dated Dec. 13, 2018 in Application No. 10-2012-0064526.
KIPO; Office Action dated Jan. 12, 2019 in Application No. 10-2012-0064526.
KIPO; Notice of Allowance dated Jul. 5, 2019 in Application No. 10-2012-0064526.
KIPO; Office Action dated Mar. 30, 2018 in Application No. 10-2012-0076564.
KIPO; Office Action dated Sep. 27, 2018 in Application No. 10-2012-0076564.
KIPO; Office Action dated Mar. 27, 2019 in Application No. 10-2012-0076564.
KIPO; Office Action dated Apr. 30, 2018 in Application No. 10-2012-0103114.
KIPO; Notice of Allowance dated Nov. 22, 2018 in Application No. 10-2012-0103114.
KIPO; Office Action dated Oct. 24, 2016 in Application No. 10-2012-7004062.
KIPO; Office Action dated Jul. 24, 2017 in Application No. 10-2012-7004062.
KIPO; Decision of Intellectual Property Trial and Appeal Board dated May 13, 2019 in Application No. 10-2012-7004062.
KIPO; Office Action dated May 30, 2019 in Application No. 10-2012-7004062.
KIPO; Notice of Allowance dated Sep. 27, 2019 in Application No. 10-2012-7004062.
KIPO; Office Action dated Apr. 24, 2019 in Application No. 10-2013-0036823.
KIPO; Notice of Allowance dated Aug. 29, 2019 in Application No. 10-2013-0036823.
KIPO; Office Action dated Aug. 27, 2019 in Application No. 10-2013-0049598.
KIPO; Office Action dated Feb. 28, 2020 in Application No. 10-2013-0049598.
KIPO; Office Action dated May 31, 2019 in Application No. 10-2013-0050740.
KIPO; Office Action dated Nov. 27, 2019 in Application No. 10-2013-0050740.
KIPO; Notice of Allowance dated Apr. 23, 2020 in Application No. 10-2013-0050740.
KIPO; Office Action dated Mar. 27, 2019 in Application No. 10-2013-0084459.
KIPO; Notice of Allowance dated Oct. 30, 2019 in Application No. 10-2013-0084459.
KIPO; Office Action dated Apr. 30, 2019 in Application No. 10-2013-0088450.
KIPO; Office Action dated Nov. 29, 2019 in Application No. 10-2013-0088450.

(56) References Cited

OTHER PUBLICATIONS

KIPO; Notice of Allowance dated Jan. 13, 2020 in Application No. 10-2013-0088450.
KIPO; Office Action dated Aug. 27, 2019 in Application No. 10-2013-0089998.
KIPO; Notice of Allowance dated Feb. 27, 2020 in Application No. 10-2013-0089998.
KIPO; Office Action dated Dec. 4, 2019 in Application No. 10-2013-0098575.
KIPO; Office Action dated Jun. 19, 2020 in Application No. 10-2013-0098575.
KIPO; Office Action dated Apr. 19, 2019 in Application No. 10-2013-0101944.
KIPO; Notice of Allowance dated Oct. 8, 2019 in Application No. 10-2013-0101944.
KIPO; Office Action dated Nov. 12, 2019 in Application No. 10-2013-0102026.
KIPO; Notice of Allowance dated May 14, 2020 in Application No. 10-2013-0102026.
KIPO; Office Action dated Aug. 15, 2019 in Application No. 10-2013-0109390.
KIPO; Notice of Allowance dated Oct. 21, 2019 in Application No. 10-2013-0109390.
KIPO; Office Action dated Oct. 7, 2019 in Application No. 10-2013-0114079.
KIPO; Notice of Allowance dated Mar. 4, 2020 in Application No. 10-2013-0114079.
KIPO; Office Action dated May 21, 2019 in Application No. 10-2013-0121554.
KIPO; Notice of Allowance dated Oct. 28, 2019 in Application No. 10-2013-0121554.
KIPO; Office Action dated Mar. 30, 2020 in Application No. 10-2014-0011764.
KIPO; Office Action dated Feb. 3, 2020 in Application No. 10-2014-0021615.
KIPO; Office Action dated Feb. 15, 2020 in Application No. 10-2014-0027305.
KIPO; Office Action dated May 21, 2020 in Application No. 10-2014-0086902.
KIPO; Office Action dated May 21, 2020 in Application No. 10-2014-0091092.
KIPO; Office Action dated Mar. 11, 2020 in Application No. 10-2014-0103853.
KIPO; Office Action dated Jan. 22, 2019 in Application No. 10-2014-7017110.
KIPO; Notice of Allowance dated Aug. 26, 2019 in Application No. 10-2014-7017110.
KIPO; Office Action dated Sep. 28, 2017 in Application No. 10-2014-7017112.
KIPO; Notice of Allowance dated Feb. 23, 2018 in Application No. 10-2014-7017112.
KIPO; Office Action dated Nov. 9, 2016 in Application No. 10-2016-7023913.
KIPO; Notice of Allowance dated May 30, 2017 in Application No. 10-2016-7023913.
KIPO; Notice of Allowance dated Feb. 27, 2018 in Application No. 10-2017-0175442.
KIPO; Office Action dated Sep. 28, 2017 in Application No. 10-2017-7023740.
KIPO; Final Office Action dated Jun. 17, 2019 in Application No. 10-2017-7023740.
KIPO; Notice of Allowance dated Jul. 19, 2018 in Application No. 20187013945.
KIPO; Notice of Allowance dated Nov. 29, 2019 in Application No. 10-2019-0127773.
KIPO; Offie Action dated Apr. 22, 2020 in Application No. 10-2020-0009462.
KIPO; Office Action dated Feb. 12, 2020 in Application No. 10-2020-7000992.
KIPO; Office Action dated Sep. 15, 2017 in Application No. 30-2017-0001320.
KIPO; Notice of Allowance dated Jan. 19, 2018 in Application No. 30-2017-0001320.
KIPO; Notice of Allowance dated Jul. 10, 2018 in Application No. 30-2017-0052872.
KIPO; Office Action dated Jul. 11, 2018 in Application No. 30-2018-0006016.
KIPO; Notice of Allowance dated Oct. 16, 2018 in Application No. 30-2018-0006016.
KIPO; Office Action dated Jan. 30, 2019 in Application No. 30-2018-0033442.
KIPO; Notice of Allowance dated Apr. 1, 2019 in Application No. 30-2018-0033442.
TIPO; Office Action dated Aug. 30, 2013 in Application No. 97132391.
TIPO; Office Action dated Dec. 20, 2013 in Application No. 98117513.
TIPO; Notice of Allowance dated Jun. 12, 2014 in Application No. 98117513.
TIPO; Office Action dated Jul. 4, 2014 in Application No. 99110511.
TIPO; Notice of Allowance dated Feb. 24, 2016 in Application No. 99110511.
TIPO; Office Action dated Aug. 27, 2014 in Application No. 99114329.
TIPO; Notice of Allowance dated Jan. 28, 2015 in Application No. 99114329.
TIPO; Office Action dated Dec. 26, 2014 in Application No. 99114330.
TIPO; Notice of Allowance dated Apr. 28, 2015 in Application No. 99114330.
TIPO; Office Action dated Aug. 14, 2014 in Application No. 99114331.
TIPO; Notice of Allowance dated Oct. 16, 2015 in Application No. 99114331.
TIPO; Office Action dated Dec. 19, 2014 in Application No. 99127063.
TIPO; Notice of Allowance dated Mar. 14, 2016 in Application No. 99127063.
TIPO; Notice of Allowance dated Oct. 2, 2015 in Application No. 100130472.
TIPO; Office Action dated Feb. 19, 2016 in Application No. 100113130.
TIPO; Notice of Allowance dated Jun. 29, 2016 in Applicaton No. 100113130.
TIPO; Notice of Allowance dated Nov. 2, 2016 in Application No. 101142581.
TIPO; Office Action dated Apr. 28, 2016 in Application No. 101142582.
TIPO; Notice of Allowance dated Aug. 19, 2016 in Application No. 101142582.
TIPO; Office Action dated Aug. 1, 2016 in Application No. 101124745.
TIPO; Notice of Allowance dated Oct. 19, 2016 in Application No. 101124745.
TIPO; Office Action dated Sep. 19, 2016 in Application No. 102113028.
TIPO; Notice of Allowance dated Feb. 13, 2017 in Application No. 102113028.
TIPO; Office Action dated Aug. 2016 in Application No. 102115605.
TIPO; Office Action dated Feb. 24, 2017 in Application No. 102115605.
TIPO; Notice of Allowance dated Dec. 26, 2017 in Application No. 102115605.
TIPO; Office Action dated Nov. 15, 2016 in Application No. 102125191.
TIPO; Office Action dated Jun. 20, 2017 in Application No. 102125191.
TIPO; Notice of Allowance dated Feb. 20, 2020 in Application No. 102125191.
TIPO; Office Action dated Dec. 6, 2016 in Application No. 102126071.
TIPO; Office Action dated May 17, 2018 in Application No. 102126071.
TIPO; Notice of Allowance dated Aug. 24, 2018 in Application No. 102126071.

(56) References Cited

OTHER PUBLICATIONS

TIPO; Office Action dated Feb. 10, 2017 in Application No. 102127065.
TIPO; Notice of Allowance dated Jul. 18, 2017 in Application No. 102127065.
TIPO; Office Action dated Nov. 3, 2016 in Application No. 102129262.
TIPO; Notice of Allowance dated Mar. 3, 2017 in Application No. 102129262.
TIPO; Office Action dated Dec. 29, 2016 in Application No. 102129397.
TIPO; Notice of Allowance dated Aug. 29, 2017 in Application No. 102129397.
TIPO; Office Action dated Nov. 3, 2016 in Application No. 102131839.
TIPO; Notice of Allowance dated Jan. 26, 2017 in Application No. 102131839.
TIPO; Office Action dated Dec. 2, 2016 in Application No. 102136496.
TIPO; Office Action dated Jan. 10, 2018 in Application No. 102136496.
TIPO; Office Action dated Aug. 16, 2019 in Application No. 102136496.
TIPO; Notice of Allowance dated Jan. 7, 2020 in Application No. 102136496.
TIPO; Office Action dated Nov. 11, 2016 in Application No. 102132952.
TIPO; Notice of Allowance dated Apr. 19, 2017 in Application No. 102132952.
TIPO; Office Action dated Jul. 17, 2017 in Application No. 103101400.
TIPO; Notice of Allowance dated Jan. 24, 2018 in Application No. 103101400.
TIPO; Office Action dated Feb. 23, 2017 in Application No. 103102563.
TIPO; Notice of Allowance dated Nov. 30, 2017 in Application No. 103102563.
TIPO; Office Action dated Mar. 3, 2017 in Application No. 103105251.
TIPO; Notice of Allowance dated Oct. 20, 2017 in Application No. 103105251.
TIPO; Office Action dated Nov. 1, 2017 in Application No. 103106021.
TIPO; Notice of Allowance dated Apr. 10, 2018 in Application No. 103106021.
TIPO; Office Action dated Oct. 31, 2017 in Application No. 103106022.
TIPO; Notice of Allowance dated Apr. 10, 2018 in Application No. 103106022.
TIPO; Office Action dated Jul. 5, 2017 in Application No. 103117477.
TIPO; Notice of Allowance dated Jan. 22, 2018 in Application No. 103117477.
TIPO; Office Action dated Nov. 22, 2017 in Application No. 103117478.
TIPO; Notice of Allowance dated Mar. 13, 2018 in Application No. 103117478.
TIPO; Office Action dated May 19, 2017 in Application No. 103120478.
TIPO; Notice of Allowance dated Sep. 25, 2017 in Application No. 103120478.
TIPO; Office Action dated Sep. 20, 2018 in Application No. 103123439.
TIPO; Notice of Allowance dated Jul. 10, 2019 in Application No. 103123439.
TIPO; Office Action dated Nov. 8, 2017 in Application No. 103124509.
TIPO; Notice of Allowance dated Apr. 25, 2018 in Application No. 103124509.
Tipo; Office Action dated Nov. 20, 2017 in Application No. 103127588.
TIPO; Notice of Allowance dated Jun. 19, 2018 in Application No. 103127588.
TIPO; Office Action dated Sep. 19, 2017 in Application No. 103127734.
TIPO; Notice of Allowance dated Dec. 11, 2017 in Application No. 103127734.
TIPO; Office Action dated Sep. 26, 2018 in Application No. 103132230.
TIPO; Notice of Allowance dated Jan. 29, 2019 in Application No. 103132230.
TIPO; Office Action dated Nov. 22, 2017 in Application No. 103134537.
TIPO; Notice of Allowance dated Apr. 19, 2018 in Application No. 103134537.
TIPO; Office Action dated Aug. 24, 2017 in Application No. 103136251.
TIPO; Notice of Allowance dated Oct. 17, 2017 in Application No. 103136251.
TIPO; Office Action dated Feb. 26, 2018 in Application No. 103138510.
TIPO; Notice of Allowance dated Jun. 13, 2018 in Application No. 103138510.
TIPO; Office Action dated May 21, 2018 in Application No. 103139014.
TIPO; Notice of Allowance dated Sep. 11, 2018 in Application No. 103139014.
TIPO; Office Action dated Jun. 22, 2018 in Application No. 104105533.
TIPO; Office Action dated Feb. 22, 2019 in Application No. 104105533.
TIPO; Notice of Allowance dated Sep. 27, 2019 in Application No. 104105533.
TIPO; Office Action dated Nov. 19, 2018 in Application No. 104105965.
TIPO; Notice of Allowance dated Sep. 23, 2019 in Application No. 104105965.
TIPO; Office Action dated Jul. 9, 2018 in Application No. 104107876.
TIPO; Notice of Allowance dated May 9, 2019 in Application No. 104107876.
TIPO; Office Action dated Aug. 7, 2018 Application No. 104107888.
TIPO; Notice of Allowance dated Apr. 26, 2019 in Application No. 104107888.
TIPO; Office Action dated May 6, 2019 in Application No. 104108277.
TIPO; Office Action dated Jan. 17, 2020 in Application No. 104108277.
TIPO; Office Action dated Jul. 9, 2018 in Application No. 104110326.
TIPO; Notice of Allowance dated May 8, 2019 in Application No. 104110326.
TIPO; Office Action dated Jun. 13, 2018 in Application No. 104111910.
TIPO; Notice of Allowance dated Sep. 18, 2018 in Application No. 104111910.
TIPO; Office Action dated Apr. 29, 2019 in Application No. 104122889.
TIPO; Notice of Allowance dated Oct. 4, 2019 in Application No. 104122889.
TIPO; Office Action dated Jan. 30, 2019 in Application No. 104122890.
TIPO; Notice of Allowance dated Jul. 19, 2019 in Application No. 104122890.
TIPO; Office Action dated Jul. 11, 2018 in Application No. 104124377.
TIPO; Notice of Allowance dated Jun. 19, 2019 in Application No. 104124377.
TIPO; Office Action dated Jan. 7, 2019 in Application No. 104132991.
TIPO; Notice of Allowance dated Apr. 12, 2019 in Application No. 104132991.
TIPO; Office Action dated Apr. 25, 2019 in Application No. 104141679.
TIPO; Notice of Allowance dated Nov. 27, 2019 in Application No. 104141679.
TIPO; Office Action dated Apr. 25, 2019 in Application No. 105101536.
TIPO; Office Action dated Dec. 13, 2019 in Application No. 105101536.
TIPO; Notice of Allowance dated May 4, 2020 in Application No. 105101536.
TIPO; Office Action dated Nov. 6, 2019 in Application No. 105101537.
TIPO; Notice of Allowance dated May 7, 2019 in Application No. 105104453.
TIPO; Office Action dated Dec. 13, 2019 in Application No. 105111990.
TIPO; Office Action dated Jul. 5, 2019 in Application No. 105112363.
TIPO; Notice of Allowance dated Dec. 10, 2019 in Application No. 105112363.
TIPO; Office Action dated Oct. 1, 2019 in Application No. 105114105.

(56) References Cited

OTHER PUBLICATIONS

TIPO; Notice of Allowance dated Jan. 15, 2020 in Application No. 105114105.
TIPO; Office Action dated Sep. 9, 2019 in Application No. 105115513.
TIPO; Notice of Allowance dated Feb. 10, 2020 in Application No. 105115513.
TIPO; Office Action dated Oct. 3, 2019 in Application No. 105119533.
TIPO; Notice of Allowance dated Mar. 13, 2020 in Application No. 105119533.
TIPO; Office Action dated Jan. 20, 2020 in Application No. 105122394.
TIPO; Office Action dated Jan. 17, 2020 in Application No. 105122586.
TIPO; Office Action dated Oct. 28, 2019 in Application No. 105122715.
TIPO; Notice of Allowance dated Feb. 13, 2020 in Application No. 105122715.
TIPO; Office Action dated Apr. 14, 2020 in Application No. 105129977.
TIPO; Office Action dated Mar. 17, 2020 in Application No. 105130130.
TIPO; Notice of Allowance dated Dec. 5, 2017 in Application No. 105308015.
TIPO; Notice of Allowance dated Apr. 11, 2018 in Application No. 105308015D01.
TIPO; Office Action dated Nov. 6, 2017 in Application No. 106117181.
TIPO; Notice of Allowance dated Jun. 5, 2018 in Application No. 106117181.
TIPO; Office Action dated Sep. 28, 2018 in Application No. 106119537.
TIPO; Office Action dated Dec. 26, 2018 in Application No. 106127690.
TIPO; Office Action dated Aug. 31, 2018 in Application No. 106138119.
TIPO; Office Action dated Jun. 25, 2018 in Application No. 106138800.
TIPO; Office Action dated Jan. 7, 2019 in Application No. 106138800.
TIPO; Notice of Allowance dated Sep. 20, 2019 in Application No. 106138800.
TIPO; Office Action dated Oct. 3, 2018 in Application No. 106142731.
TIPO; Office Action dated Sep. 28, 2018 in Application No. 107112951.
TIPO; Office Action dated Aug. 27, 2019 in Application No. 107116804.
TIPO; Notice of Allowance dated Jan. 16, 2020 in Application No. 107116804.
TIPO; Office Action dated Nov. 20, 2018 in Application No. 107118271.
TIPO; Office Action dated Jun. 4, 2019 in Application No. 107123992.
TIPO; Office Action dated May 28, 2019 in Application No. 107125586.
TIPO; Office Action dated Jan. 17, 2020 in Application No. 107127688.
TIPO; Notice of Allowance dated Aug. 29, 2018 in Application No. 107300633.
TIPO; Notice of Allowance dated Feb. 21, 2019 in Application No. 107303723.
TIPO; Office Action dated May 31, 2019 in Application No. 108102146.
TIPO; Office Action dated Jun. 28, 2019 in Application No. 108102948.
TIPO; Office Action dated Dec. 24, 2019 in Application No. 108105002.
TIPO; Office Action dated Feb. 3, 2020 in Application No. 108114221.
TIPO; Office Action dated Nov. 13, 2019 in Application No. 108115406.
TIPO; Office Action dated Feb. 21, 2020 in Application No. 108120947.
TIPO; Notice of Allowance dated Mar. 12, 2020 in Application No. 108129100.
USPTO; Notice of Allowance dated Jul. 26, 2005 in U.S. Appl. No. 10/033,058.
USPTO; Non-Final Office Action dated Aug. 25, 2005 in U.S. Appl. No. 10/191,635.
USPTO; Final Office Action dated Apr. 25, 2006 in U.S. Appl. No. 10/191,635.
USPTO; Non-Final Office Action dated Nov. 20, 2006 in U.S. Appl. No. 10/191,635.
USPTO; Notice of Allowance dated May 21, 2007 in U.S. Appl. No. 10/191,635.
USPTO; Notice of Allowance dated Feb. 20, 2008 in U.S. Appl. No. 10/191,635.
USPTO; Non-Final Office Action dated May 13, 2003 in U.S. Appl. No. 10/222,229.
USPTO; Non-Final Office Action dated Oct. 22, 2003 in U.S. Appl. No. 10/222,229.
USPTO; Final Office Action dated Mar. 22, 2004 in U.S. Appl. No. 10/222,229.
USPTO; Advisory Action dated Oct. 7, 2004 in U.S. Appl. No. 10/222,229.
USPTO; Non-Final Office Action dated Dec. 22, 2004 in U.S. Appl. No. 10/222,229.
USPTO; Final Office Action dated Jun. 20, 2005 in U.S. Appl. No. 10/222,229.
USPTO; Advisory Action dated Nov. 16, 2005 in U.S. Appl. No. 10/222,229.
USPTO; Notice of Allowance dated Mar. 8, 2006 in U.S. Appl. No. 10/222,229.
USPTO; Non-Final Office Action dated Jan. 26, 2005 in U.S. Appl. No. 10/838,510.
USPTO; Notice of Allowance dated Jul. 12, 2005 in U.S. Appl. No. 10/838,510.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Non-Final Office Action dated Apr. 28, 2010 in U.S. Appl. No. 12/121,085.
USPTO; Notice of Allowance dated Jul. 26, 2010 in U.S. Appl. No. 12/121,085.
USPTO; Notice of Allowance dated Oct. 4, 2010 in U.S. Appl. No. 12/121,085.
USPTO; Non-Final Office Action dated Sep. 13, 2010 in U.S. Appl. No. 12/140,809.
USPTO; Final Office Action dated Dec. 28, 2010 in U.S. Appl. No. 12/140,809.
USPTO; Notice of Allowance dated Mar. 17, 2011 in U.S. Appl. No. 12/140,809.
USPTO; Non-Final Office Action dated Mar. 15, 2011 in U.S. Appl. No. 12/193,924.
USPTO; Foma; Office Action dated Sep. 30, 2011 in U.S. Appl. No. 12/193,924.
USPTO; Non-Final Office Action dated Oct. 24, 2012 in U.S. Appl. No. 12/193,924.
USPTO; Final Office Action dated Apr. 17, 2013 in U.S. Appl. No. 12/193,924.
USPTO; Advisory Action dated Jul. 9, 2013 in U.S. Appl. No. 12/193,924.
USPTO; Non-Final Office Action dated Jul. 28, 2011 in U.S. Appl. No. 12/330,096.
USPTO; Final Office Action dated Jan. 13, 2012 in U.S. Appl. No. 12/330,096.
USPTO; Notice of Allowance dated Mar. 6, 2012 in U.S. Appl. No. 12/330,096.
USPTO; Non-Final Office Action dated Mar. 20, 2012 in U.S. Appl. No. 12/330,096.
USPTO; Notice of Allowance dated Jun. 7, 2012 in U.S. Appl. No. 12/330,096.
USPTO; Non-Final Office Action dated Apr. 1, 2010 in U.S. Appl. No. 12/357,174.
USPTO; Final Office Action dated Sep. 1, 2010 in U.S. Appl. No. 12/357,174.
USPTO; Notice of Allowance dated Dec. 13, 2010 in U.S. Appl. No. 12/357,174.
USPTO; Non-Final Office Action dated Dec. 29, 2010 in U.S. Appl. No. 12/362,023.

(56) References Cited

OTHER PUBLICATIONS

USPTO; Non-Final Office Action dated Jul. 26, 2011 in U.S. Appl. No. 12/416,809.
USPTO; Final Office Action dated Dec. 6, 2011 in U.S. Appl. No. 12/416,809.
USPTO; Notice of Allowance dated Apr. 2, 2012 in U.S. Appl. No. 12/416,809.
USPTO; Advisory Action dated Feb. 3, 2012 in U.S. Appl. No. 12/416,809.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Non-Final Office Action dated Aug. 3, 2011 in U.S. Appl. No. 12/436,300.
USPTO; Final Office Action dated Jan. 23, 2012 in U.S. Appl. No. 12/436,300.
USPTO; Advisory Action dated Mar. 6, 2012 in U.S. Appl. No. 12/436,300.
USPTO; Non-Final Office Action dated May 22, 2012 in U.S. Appl. No. 12/436,300.
USPTO; Notice of Allowance dated Nov. 28, 2012 in U.S. Appl. No. 12/436,300.
USPTO; Non-Final Office Action dated Apr. 11, 2012 in U.S. Appl. No. 12/436,306.
USPTO; Final Office Action dated Sep. 26, 2012 in U.S. Appl. No. 12/436,306.
USPTO; Non-Final Office Action dated May 31, 2013 in U.S. Appl. No. 12/436,306.
USPTO; Final Office Action dated Oct. 17, 2013 in U.S. Appl. No. 12/436,306.
USPTO; Non-Final Office Action dated Feb. 4, 2014 in U.S. Appl. No. 12/436,306.
USPTO; Final Office Action dated Jun. 23, 2014 in U.S. Appl. No. 12/436,306.
USPTO; Advisory Action dated Oct. 1, 2014 in U.S. Appl. No. 12/436,306.
USPTO; Non-Final Office Action dated Feb. 3, 2015 in U.S. Appl. No. 12/436,306.
USPTO; Final Office Action dated May 13, 2015 in U.S. Appl. No. 12/436,306.
USPTO; Non-Final Office Action dated Oct. 14, 2015 in U.S. Appl. No. 12/436,306.
USPTO; Final Office Action dated Dec. 31, 2015 in U.S. Appl. No. 12/436,306.
USPTO; Notice of Allowance dated Feb. 3, 2016 in U.S. Appl. No. 12/436,306.
USPTO; Non-Final Office Action dated Aug. 3, 2011 in U.S. Appl. No. 12/436,315.
USPTO; Notice of Allowance dated Nov. 17, 2011 in U.S. Appl. No. 12/436,315.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Advisory Action dated Jul. 13, 2011 in U.S. Appl. no. 12/553,759.
USPTO; Non-Final Office Action dated Sep. 6, 2011 in U.S. Appl. No. 12/553,759.
USPTO; Notice of Allowance dated Jan. 27, 2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Advisory Action dated Jul. 23, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Advisory Action dated Mar. 4, 2016 in U.S. Appl. No. 12/618,355.
USPTO; Non-Final Office Action dated Jun. 30, 2016 in U.S. Appl. No. 12/618,355.
USPTO; Final Office Action dated Feb. 10, 2017 in U.S. Appl. No. 12/618,355.
USPTO; Advisory Action dated May 16, 2017 in U.S. Appl. No. 12/618,355.
USPTO; Non-Final Office Action dated Nov. 29, 2017 in U.S. Appl. No. 12/618,355.
USPTO; Final Office Action dated Aug. 10, 2018 in U.S. Appl. No. 12/618,355.
USPTO; Notice of Allowance dated Apr. 4, 2019 in U.S. Appl. No. 12/618,355.
USPTO; Non-Final Office Action dated Feb. 16, 2012 in U.S. Appl. No. 12/618,419.
USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Advisory Action dated Aug. 9, 2012 in U.S. Appl. No. 12/618,419.
USPTO; Notice of Allowance dated Apr. 12, 2013 in U.S. Appl. No. 12/618,419.
USPTO; Non-Final Office Action dated Jun. 12, 2013 in U.S. Appl. No. 12/618,419.
USPTO; Notice of Allowance dated Oct. 9, 2013 in U.S. Appl. No. 12/618,419.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Final Office Action dated Jul. 14, 2014 in U.S. Appl. No. 12/754,223.
USPTO; Non-Final Office Action dated Mar. 25, 2015 in U.S. Appl. No. 12/754,223.
USPTO; Final Office Action dated Aug. 12, 2015 in U.S. Appl. No. 12/754,223.
USPTO; Notice of Allowance dated May 23, 2016 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Office Action dated Oct. 8, 2014 in U.S. Appl. No. 12/763,037.
USPTO; Notice of Allowance dated Jan. 27, 2015 in U.S. Appl. No. 12/763,037.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.

(56) References Cited

OTHER PUBLICATIONS

USPTO; Advisory Action dated Jul. 1, 2013 in U.S. Appl. No. 12/847,848.
USPTO; Notice of Allowance dated Jan. 16, 2014 in U.S. Appl. No. 12/847,848.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Advisory Action dated Jul. 9, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Advisory Action dated Jul. 8, 2013 in U.S. Appl. No. 12/953,870.
USPTO; Non-Final Office Action dated Aug. 28, 2013 in U.S. Appl. No. 12/953,870.
USPTO; Final Office Action dated Apr. 17, 2014 in U.S. Appl. No. 12/953,870.
USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Non-Final Office Action dated Feb. 15, 2012 in U.S. Appl. No. 13/085,531.
USPTO; Notice of Allowance dated Jul. 12, 2012 in U.S. Appl. No. 13/085,531.
USPTO; Notice of Allowance dated Sep. 13, 2012 in U.S. Appl. No. 13/085,698.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Advisory Action dated Jun. 12, 2014 in U.S. Appl. No. 13/102,980.
USPTO; Notice of Allowance dated Jul. 3, 2014 in U.S. Appl. No. 13/102,980.
USPTO; Notice of Allowance dated Sep. 17, 2014 in U.S. Appl. No. 13/102,980.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Final Office Action dated Nov. 23, 2015 in U.S. Appl. No. 13/154,271.
USPTO; Notice of Allowance dated Feb. 10, 2016 in U.S. Appl. No. 13/154,271.
USPTO; Non-Final Office Action dated Jun. 27, 2016 in U.S. Appl. No. 13/166,367.
USPTO; Final Office Action dated Dec. 30, 2016 in U.S. Appl. No. 13/166,367.
USPTO; Advisory Action dated Apr. 21, 2017 in U.S. Appl. No. 13/166,367.
USPTO; Notice of Allowance dated Jun. 28, 2017 in U.S. Appl. No. 13/166,367.
USPTO; Non-Final Office Action dated Oct. 27, 2014 in U.S. Appl. No. 13/169,951.
USPTO; Final Office Action dated May 26, 2015 in U.S. Appl. No. 13/169,951.
USPTO; Non-Final Office Action dated Sep. 1, 2015 in U.S. Appl. No. 13/169,951.
USPTO; Final Office Action dated Mar. 3, 2016 in U.S. Appl. No. 13/169,951.
USPTO; Non-Final Office Action dated Jun. 9, 2016 in U.S. Appl. No. 13/169,951.
USPTO; Final Office Action dated Dec. 9, 2016 in U.S. Appl. No. 13/169,951.
USPTO; Advisory Action dated May 13, 2016 in U.S. Appl. No. 13/169,951.
USPTO; Advisory Action dated Feb. 15, 2017 in U.S. Appl. No. 13/169,951.
USPTO; Non-Final Office Action dated Apr. 26, 2017 in U.S. Appl. No. 13/169,951.
USPTO; Final Office Action dated Nov. 2, 2017 in U.S. Appl. No. 13/169,951.
USPTO; Advisory Action dated Feb. 8, 2018 in U.S. Appl. No. 13/169,951.
USPTO; Non-Final Office Action dated Apr. 6, 2018 in U.S. Appl. No. 13/169,951.
USPTO; Final Office Action dated Nov. 2, 2018 in U.S. Appl. No. 13/169,951.
USPTO; Advisory Action dated Feb. 4, 2019 in U.S. Appl. No. 13/169,951.
USPTO; Notice of Allowance dated Apr. 4, 2019 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Advisory Action dated Dec. 17, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.

(56) References Cited

OTHER PUBLICATIONS

USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Advisory Action dated Nov. 7, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Advisory Action dated May 18, 2015 in U.S. Appl. No. 13/184,351.
USPTO; Non-Final Office Action dated Aug. 10, 2015 in U.S. Appl. No. 13/184,351.
USPTO; Final Office Action dated Feb. 12, 2016 in U.S. Appl. No. 13/184,351.
USPTO; Non-Final Office Action dated Dec. 15, 2016 in U.S. Appl. No. 13/184,351.
USPTO; Final Office Action dated Jun. 15, 2017 in U.S. Appl. No. 13/184,351.
USPTO; Advisory Action dated Oct. 4, 2017 in U.S. Appl. No. 13/184,351.
USPTO; Non-Final Office Action dated Jul. 26, 2018 in U.S. Appl. No. 13/184,351.
USPTO; Final Office Action dated Dec. 28, 2018 in U.S. Appl. No. 13/184,351.
USPTO; Non-Final Office Action dated Aug. 19, 2019 in U.S. Appl. No. 13/184,351.
USPTO; Non-Final Office Action dated Sep. 17, 2014 in U.S. Appl. No. 13/187,300.
USPTO; Final Office Action dated Apr. 15, 2015 in U.S. Appl. No. 13/187,300.
USPTO; Non-Final Office Action dated Apr. 7, 2016 in U.S. Appl. No. 13/187,300.
USPTO; Final Office Acton dated Sep. 23, 2016 in U.S. Appl. No. 13/187,300.
USPTO; Non-Final Office Action dated Jan. 30, 2017 in U.S. Appl. No. 13/187,300.
USPTO; Final Office Action dated Aug. 9, 2017 in U.S. Appl. No. 13/187,300.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Office Action dated Apr. 26, 2013 in U.S. Appl. No. 13/250,721.
USPTO; Notice of Allowance dated Sep. 11, 2013 in U.S. Appl. No. 13/250,721.
USPTO; Office Action dated Jul. 2, 2014 in U.S. Appl. No. 13/283,408.
USPTO; Final Office Action dated Jan. 29, 2015 in U.S. Appl. No. 13/283,408.
USPTO; Non-Final Office Action dated Jun. 17, 2015 in U.S. Appl. No. 13/283,408.
USPTO; Final Office Action dated Dec. 18, 2015 in U.S. Appl. No. 13/283,408.
USPTO; Advisory Action dated Mar. 28, 2016 in U.S. Appl. No. 13/283,408.
USPTO; Notice of Allowance dated Mar. 28, 2016 in U.S. Appl. No. 13/283,408.
USPTO; Non-Final Office Action dated Jul. 30, 2014 in U.S. Appl. No. 13/284,642.
USPTO; Notice of Allowance dated Feb. 11, 2015 in U.S. Appl. No. 13/284,642.
USPTO; Non-Final Office Action dated Jan. 28, 2014 in U.S. Appl. No. 13/312,591.
USPTO; Final Office Action dated May 14, 2014 in U.S. Appl. No. 13/312,591.
USPTO; Advisory Action dated Aug. 26, 2014 in U.S. Appl. No. 13/312,591.
USPTO; Non-Final Office Action dated Nov. 26, 2014 in U.S. Appl. No. 13/312,591.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Notice of Allowance dated Jun. 11, 2015 in U.S. Appl. No. 13/312,591.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Advisory Action dated Mar. 27, 2013 in Application No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Advisory Action dated Oct. 29, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Non-Final Office Action dated Feb. 13, 2014 in U.S. Appl. No. 13/411,271.
USPTO; Non-Final Office Action dated Jul. 31, 2014 in U.S. Appl. No. 13/411,271.
USPTO; Advisory Action dated Apr. 22, 2015 in U.S. Appl. No. 13/411,271.
USPTO; Final Office Action dated Jan. 16, 2015 in U.S. Appl. No. 13/411,271.
USPTO; Notice of Allowance dated Oct. 6, 2015 in U.S. Appl. No. 13/411,271.
USPTO; Office Action dated Feb. 4, 2014 in U.S. Appl. No. 13/439,528.
USPTO; Final Office Action dated Jul. 8, 2014 in U.S. Appl. No. 13/439,528.
UPPTO; Notice of Allowance dated Oct. 21, 2014 in U.S. Appl. No. 13/439,528.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Non-Final Office Action dated May 23, 2013 in U.S. Appl. No. 13/465,340.

(56) References Cited

OTHER PUBLICATIONS

USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Non-Final Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Advisory Action dated Mar. 31, 2014 in U.S. Appl. No. 13/550,419.
USPTO; Notice of Allowance dated May 29, 2014 in U.S. Appl. No. 13/550,419.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Advisory Action dated Apr. 16, 2015 in U.S. Appl. No. 13/563,066.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Non-Final Office Action dated May 28, 2013 in U.S. Appl. No. 13/563,274.
USPTO; Notice of Allowance dated Sep. 27, 2013 in U.S. Appl. No. 13/563,274.
USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Advisory Action dated May 5, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Notice of Allowance dated Sep. 13, 2013 in U.S. Appl. No. 13/566,069.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; Non-Final Office Action dated Oct. 15, 2014 in U.S. Appl. No. 13/597,043.
USPTO; Final Office Action dated Mar. 13, 2015 in U.S. Appl. No. 13/597,043.
USPTO; Notice of Allowance dated Aug. 28, 2015 in U.S. Appl. No. 13/597,043.
USPTO; Non-Final Office Action dated Feb. 12, 2015 in U.S. Appl. No. 13/597,108.
USPTO; Final Office Action dated Jun. 1, 2015 in U.S. Appl. No. 13/597,108.
USPTO; Advisory Action dated Sep. 2, 2015 in U.S. Appl. No. 13/597,108.
USPTO; Non-Final Office Action dated Dec. 8, 2015 in U.S. Appl. No. 13/597,108.
USPTO; Final Office Action dated Jun. 2, 2016 in Application No. 13/597,108.
USPTO; Non-Final Office Action dated Sep. 15, 2016 in U.S. Appl. No. 13/597,108.
USPTO; Notice of Allowance dated Mar. 7, 2017 in U.S. Appl. No. 13/597,108.
USPTO; Notice of Allowance dated Mar. 27, 2014 in U.S. Appl. No. 13/604,498.
USPTO; Non-Final Office Action dated Nov. 15, 2013 in U.S. Appl. No. 13/612,538.
USPTO; Non-Final Office Action dated Jul. 10, 2014 in U.S. Appl. No. 13/612,538.
USPTO; Notice of Allowance dated Feb. 25, 2015 in U.S. Appl. No. 13/612,538.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Notice of Allowance dated Feb. 2, 2016 in U.S. Appl. No. 13/646,403.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Advisory Action dated Nov. 14, 2014 in U.S. Appl. No. 13/646,471.
USPTO; Non-Final Office Action dated Dec. 16, 2014 in U.S. Appl. No. 13/646,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Jan. 22, 2016 in U.S. Appl. No. 13/646,471.
USPTO; Advisory Action dated Apr. 15, 2016 in U.S. Appl. No. 13/646,471.
USPTO; Non-Final Office Action dated Jun. 2, 2016 in U.S. Appl. No. 13/646,471.
USPTO; Final Office Action dated Oct. 20, 2016 in U.S. Appl. No. 13/646,471.
USPTO; Non-Final Office Action dated May 28, 2015 in U.S. Appl. No. 13/651,144.
USPTO; Final Office Action dated Dec. 14, 2017 in U.S. Appl. No. 13/651,144.
USPTO; Final Office Action dated Nov. 19, 2015 in U.S. Appl. No. 13/651,144.
USPTO; Advisory Action dated Feb. 12, 2016 in U.S. Appl. No. 13/651,144.
USPTO; Non-Final Office Action dated May 10, 2016 in U.S. Appl. No. 13/651,144.
USPTO; Final Office Action dated Sep. 20, 2016 in U.S. Appl. No. 13/651,144.
USPTO; Advisory Action dated Dec. 29, 2016 in U.S. Appl. No. 13/651,144.
USPTO; Non-Final Office Action dated May 17, 2017 in U.S. Appl. No. 13/651,144.
USPTO; Non-Final Office Action dated Dec. 14, 2017 in U.S. Appl. No. 13/651,144.
USPTO; Advisory Action dated Apr. 19, 2018 in U.S. Appl. No. 13/651,144.
USPTO; Non-Final Office Action dated Sep. 20, 2018 in U.S. Appl. No. 13/651,144.
USPTO; Final Office Action dated Mar. 15, 2019 in U.S. Appl. No. 13/651,144.
USPTO; Non-Final Office Action dated Sep. 18, 2019 in U.S. Appl. No. 13/651,144.
USPTO; Notice of Allowance dated Feb. 10, 2020 in U.S. Appl. No. 13/651,144.
USPTO; Advisory Action dated Jun. 26, 2015 in U.S. Appl. No. 13/791,246.
USPTO; Non-Final Office Action dated Jun. 18, 2015 in U.S. Appl. No. 13/665,366.
USPTO; Final Office Action dated Mar. 1, 2016 in U.S. Appl. No. 13/665,366.

(56) References Cited

OTHER PUBLICATIONS

USPTO; Advisory Action dated May 13, 2016 in U.S. Appl. No. 13/665,366.
USPTO; Non-Final Office Action dated Jun. 17, 2016 in U.S. Appl. No. 13/665,366.
USPTO; Final Office Action dated May 3, 2017 in U.S. Appl. No. 13/665,366.
USPTO; Non-Final Office Action dated Apr. 3, 2015 in U.S. Appl. No. 13/677,133.
USPTO; Notice of Allowance dated Aug. 4, 2015 in U.S. Appl. No. 13/677,133.
USPTO; Notice of Allowance dated Aug. 24, 2015 in U.S. Appl. No. 13/677,133.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Notice of Allowance dated Mar. 17, 2015 in U.S. Appl. No. 13/677,151.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Final Office Action dated Jan. 22, 2016 in U.S. Appl. No. 13/727,324.
USPTO; Advisory Action dated Apr. 6, 2016 in U.S. Appl. No. 13/727,324.
USPTO; Non-Final Office Action dated May 25, 2016 in U.S. Appl. No. 13/727,324.
USPTO; Final Office Action dated Dec. 1, 2016 in U.S. Appl. No. 13/727,324.
USPTO; Notice of Allowance dated Mar. 1, 2017 in U.S. Appl. No. 13/727,324.
USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance Mar. 13, 2015 dated in U.S. Appl. No. 13/749,878.
USPTO; Non-Final Office Action dated Sep. 16, 2013 in U.S. Appl. No. 13/760,160.
USPTO; Final Office Action dated Dec. 27, 2013 in U.S. Appl. No. 13/760,160.
USPTO; Non-Final Office Action dated Jun. 4, 2014 in U.S. Appl. No. 13/760,160.
USPTO; Final Office Action dated Sep. 25, 2014 in U.S. Appl. No. 13/760,160.
USPTO; Final Office Action dated Jan. 28, 2015 in U.S. Appl. No. 13/760,160.
USPTO; Final Office Action dated May 12, 2015 in U.S. Appl. No. 13/760,160.
USPTO; Notice of Allowance dated Oct. 21, 2015 in U.S. Appl. No. 13/760,160.
USPTO; Notice of Allowance dated Jan. 20, 2016 in U.S. Appl. No. 13/760,160.
USPTO; Office Action dated Apr. 23, 2014 in U.S. Appl. No. 13/784,362.
USPTO; Notice of Allowance dated Aug. 13, 2014 in U.S. Appl. No. 13/784,362.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Non-Final Office Action dated Sep. 19, 2014 in U.S. Appl. No. 13/791,246.
USPTO; Final Office Action dated Mar. 25, 2015 in U.S. Appl. No. 13/791,246.
USPTO; Non-Final Office Action dated Oct. 26, 2015 in U.S. Appl. No. 13/791,246.
USPTO; Final Office Action dated Apr. 20, 2016 in U.S. Appl. No. 13/791,246.
USPTO; Advisory Action dated Jul. 13, 2016 in U.S. Appl. No. 13/791,246.
USPTO; Non-Final Office Action dated Aug. 11, 2016 in U.S. Appl. No. 13/791,246.
USPTO; Notice of Allowance dated Oct. 19, 2016 in U.S. Appl. No. 13/791,246.
USPTO; Notice of Allowance dated Nov. 25, 2016 in U.S. Appl. No. 13/791,246.
USPTO; Non-Final Office Action dated Nov. 6, 2015 in U.S. Appl. No. 13/791,339.
USPTO; Final Office Action dated Apr. 12, 2016 in U.S. Appl. No. 13/791,339.
USPTO; Advisory Action dated Jul. 14, 2016 in U.S. Appl. No. 13/791,339.
USPTO; Notice of Allowance dated Aug. 24, 2016 in U.S. Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Non-Final Office Action dated Oct. 9, 2014 in U.S. Appl. No. 13/874,708.
USPTO; Notice of Allowance dated Mar. 10, 2015 in U.S. Appl. No. 13/874,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Notice of Allowance dated Aug. 5, 2015 in U.S. Appl. No. 13/901,372.
USPTO; Advisory Action dated Jun. 29, 2015 in U.S. Appl. No. 13/901,372.
USPTO; Non-Final Office Action dated Jul. 8, 2015 in U.S. Appl. No. 13/901,400.
USPTO; Final Office Action dated Jan. 14, 2016 in U.S. Appl. No. 13/901,400.
USPTO; Notice of Allowance dated Apr. 12, 2016 in U.S. Appl. No. 13/901,400.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Advisory Action dated Dec. 11, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Non-Final Office Action dated Dec. 16, 2014 in U.S. Appl. No. 13/915,732.
USPTO; Final Office Action dated Apr. 10, 2015 in U.S. Appl. No. 13/915,732.
USPTO; Notice of Allowance dated Jun. 19, 2015 in U.S. Appl. No. 13/915,732.
USPTO; Notice of Allowance dated Mar. 17, 2015 in U.S. Appl. No. 13/923,197.
USPTO; Non-Final Office Action dated Sep. 12, 2014 in U.S. Appl. No. 13/941,134.

(56) References Cited

OTHER PUBLICATIONS

USPTO; Notice of Allowance dated Jan. 20, 2015 in U.S. Appl. No. 13/941,134.
USPTO; Non-Final Office Action dated Jul. 30, 2015 in U.S. Appl. No. 13/941,216.
USPTO; Final Office Action dated Mar. 1, 2016 in U.S. Appl. No. 13/941,216.
USPTO; Non-Final Office Action dated Jun. 15, 2016 in U.S. Appl. No. 13/941,216.
USPTO; Notice of Allowance dated Sep. 13, 2016 in U.S. Appl. No. 13/941,216.
USPTO; Notice of Allowance dated Nov. 14, 2016 in U.S. Appl. No. 13/941,216.
USPTO; Non-Final Office Action dated Jan. 14, 2014 in U.S. Appl. No. 13/941,226.
USPTO; Non-Final Office Action dated Jul. 8, 2014 in U.S. Appl. No. 13/941,226.
USPTO; Non-Final Office Action dated Feb. 3, 2015 in U.S. Appl. No. 13/941,226.
USPTO; Final Office Action dated Feb. 12, 2016 in U.S. Appl. No. 13/941,226.
USPTO; Advisory Action dated Jul. 29, 2016 in U.S. Appl. No. 13/941,226.
USPTO; Non-Final Office Action dated Aug. 8, 2017 in U.S. Appl. No. 13/941,226.
USPTO; Notice of Allowance dated Aug. 13, 2018 in U.S. Appl. No. 13/941,226.
USPTO; Notice of Allowance dated Oct. 3, 2018 in U.S. Appl. No. 13/941,226.
USPTO; Non-Final Office Action dated Oct. 30, 2014 in U.S. Appl. No. 13/948,055.
USPTO; Notice of Allowance dated Feb. 27, 2015 in U.S. Appl. No. 13/948,055.
USPTO; Notice of Allowance dated Mar. 31, 2015 in U.S. Appl. No. 13/948,055.
USPTO; Non-Final Office Action dated Jun. 29, 2015 in U.S. Appl. No. 13/966,782.
USPTO; Final Office Action dated Jan. 4, 2016 in U.S. Appl. No. 13/966,782.
USPTO; Notice of Allowance dated Mar. 21, 2016 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; Non-Final Office Action dated Apr. 7, 2015 in U.S. Appl. No. 14/018,345.
USPTO; Final Office Action dated Sep. 14, 2015 in U.S. Appl. No. 14/018,345.
USPTO; Notice of Allowance dated Jan. 14, 2016 in U.S. Appl. No. 14/018,345.
USPTO; Notice of Allowance dated Mar. 17, 2016 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Non-Final Office Action dated Jan. 2, 2015 in U.S. Appl. No. 14/040,196.
USPTO; Non-Final Office Action dated Apr. 28, 2015 in U.S. Appl. No. 14/040,196.
USPTO; Notice of Allowance dated Sep. 11, 2015 in U.S. Appl. No. 14/040,196.
USPTO; Non-Final Action dated Dec. 3, 2015 in U.S. Appl. No. 14/050,150.
USPTO; Final Office Action dated Jun. 15, 2016 in U.S. Appl. No. 14/050,150.
USPTO; Final Office Action dated Jul. 8, 2016 in U.S. Appl. No. 14/050,150.
USPTO; Notice of Allowance dated Oct. 20, 2016 in U.S. Appl. No. 14/050,150.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Advisory Action dated Aug. 24, 2015 in U.S. Appl. No. 14/065,114.
USPTO; Non-Final Office Action dated Oct. 7, 2015 in U.S. Appl. No. 14/065,114.
USPTO; Notice of Allowance dated Feb. 22, 2016 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Mar. 19, 2015 in U.S. Appl. No. 14/079,302.
USPTO; Final Office Action dated Sep. 1, 2015 in U.S. Appl. No. 14/079,302.
USPTO; Non-Final Office Action dated Dec. 23, 2015 in U.S. Appl. No. 14/079,302.
USPTO; Non-Final Office Action dated Apr. 27, 2016 in U.S. Appl. No. 14/079,302.
USPTO; Final Office Action dated Aug. 22, 2016 in U.S. Appl. No. 14/079,302.
USPTO; Notice of Allowance dated Dec. 14, 2016 in U.S. Appl. No. 14/079,302.
USPTO; Non-Final Office Action dated Sep. 9, 2015 in U.S. Appl. No. 14/090,750.
USPTO; Final Office Action dated Feb. 11, 2016 in U.S. Appl. No. 14/090,750.
USPTO; Advisory Action dated May 5, 2016 in U.S. Appl. No. 14/090,750.
USPTO; Non-Final Office Action dated Jun. 14, 2016 in U.S. Appl. No. 14/090,750.
USPTO; Advisory Action dated Dec. 21, 2016 in U.S. Appl. No. 14/090,750.
USPTO; Advisory Action dated Jan. 30, 2018 in U.S. Appl. No. 14/090,750.
USPTO; Final Office Action dated Sep. 28, 2016 in U.S. Appl. No. 14/090,750.
USPTO; Non-Final Office Action dated Jun. 23, 2017 in U.S. Appl. No. 14/090,750.
USPTO; Final Office Action dated Nov. 17, 2017 in U.S. Appl. No. 14/090,750.
USPTO; Non-Final Office Action dated Mar. 12, 2018 in U.S. Appl. No. 14/090,750.
USPTO; Notice of Allowance dated Aug. 29, 2018 in U.S. Appl. No. 14/090,750.
USPTO; Non-Final Office Action dated Mar. 19, 2015 in U.S. Appl. No. 14/166,462.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Notice of Allowance dated Apr. 22, 2016 in U.S. Appl. No. 14/172,220.
USPTO; Office Action dated May 29, 2014 in U.S. Appl. No. 14/183,187.
USPTO; Final Office Action dated Nov. 7, 2014 in U.S. Appl. No. 14/183,187.
USPTO; Advisory Action dated Feb. 20, 2015 in U.S. Appl. No. 14/183,187.
USPTO; Non-Final Office Action dated Mar. 16, 2015 in U.S. Appl. No. 14/183,187.
USPTO; Final Office Action dated Jul. 10, 2015 in U.S. Appl. No. 14/183,187.

(56) References Cited

OTHER PUBLICATIONS

USPTO; Notice of Allowance dated Aug. 31, 2015 in U.S. Appl. No. 14/183,187.
USPTO; Non-Final Office Action dated Jan. 11, 2016 in U.S. Appl. No. 14/188,760.
USPTO; Final Office Action dated Aug. 25, 2016 in U.S. Appl. No. 14/188,760.
USPTO; Advisory Action dated Jan. 12, 2017 in U.S. Appl. No. 14/188,760.
USPTO; Non-Final Office Action dated Mar. 23, 2017 in U.S. Appl. No. 14/188,760.
USPTO; Final Office Action dated Oct. 5, 2017 in U.S. Appl. No. 14/188,760.
USPTO; Advisory Action dated Jan. 3, 2018 in U.S. Appl. No. 14/188,760.
USPTO; Non-Final Office Action dated Apr. 18, 2018 in U.S. Appl. No. 14/188,760.
USPTO; Final Office Action dated Jan. 25, 2019 in U.S. Appl. No. 14/188,760.
USPTO; Non-Final Office Action dated Aug. 8, 2019 in U.S. Appl. No. 14/188,760.
USPTO; Notice of Allowance dated Feb. 10, 2020 in U.S. Appl. No. 14/188,760.
USPTO; Non-Final Office Action dated Oct. 8, 2015 in U.S. Appl. No. 14/218,374.
USPTO; Final Office Action dated Feb. 23, 2016 in U.S. Appl. No. 14/218,374.
USPTO; Advisory Action dated Apr. 29, 2016 in U.S. Appl. No. 14/218,374.
USPTO; Notice of Allowance dated Aug. 5, 2016 in U.S. Appl. No. 14/218,374.
USPTO; Non-Final Office Action dated Jul. 15, 2016 in U.S. Appl. No. 14/218,690.
USPTO; Final Office Action dated Nov. 14, 2016 in U.S. Appl. No. 14/218,690.
USPTO; Non-Final Office Action dated Apr. 6, 2017 in U.S. Appl. No. 14/218,690.
USPTO; Final Office Action dated Jul. 20, 2017 in U.S. Appl. No. 14/218,690.
USPTO; Non-Final Office Action dated Jan. 11, 2018 in U.S. Appl. No. 14/218,690.
USPTO; Final Office Action dated May 24, 2018 in U.S. Appl. No. 14/218,690.
USPTO; Notice of Allowance dated Sep. 24, 2018 in U.S. Appl. No. 14/218,690.
USPTO; Non-Final Office Action dated Sep. 22, 2015 in U.S. Appl. No. 14/219,839.
USPTO; Final Office Action dated Mar. 25, 2016 in U.S. Appl. No. 14/219,839.
USPTO; Non-Final Office Action dated Dec. 22, 2016 in U.S. Appl. No. 14/219,839.
USPTO; Advisory Action dated Jun. 30, 2016 in U.S. Appl. No. 14/219,839.
USPTO; Final Office Action dated Jul. 6, 2017 in U.S. Appl. No. 14/219,839.
USPTO; Non-Final Office Action dated Mar. 27, 2018 in U.S. Appl. No. 14/219,839.
USPTO; Final Office Action dated Nov. 1, 2018 in U.S. Appl. No. 14/219,839.
USPTO; Advisory Action dated Jan. 22, 2019 in U.S. Appl. No. 14/219,839.
USPTO; Non-Final Office Action dated Jul. 15, 2019 in U.S. Appl. No. 14/219,839.
USPTO; Final Office Action dated Jan. 27, 2020 in U.S. Appl. No. 14/219,839.
USPTO; Advisory Action dated Apr. 24, 2020 in U.S. Appl. No. 14/219,839.
USPTO; Advisory Action dated Apr. 24, 2020 in U.S. Appl. No. 14/219,879.
USPTO; Non-Final Office Action dated Nov. 25, 2015 in U.S. Appl. No. 14/219,879.
USPTO; Final Office action dated May 19, 2016 in U.S. Appl. no. 14/219,879.
USPTO; Advisory Action dated Aug. 22, 2016 in U.S. Appl. No. 14/219,879.
USPTO; Non-Final Office Action dated Dec. 23, 2016 in U.S. Appl. No. 14/219,879.
USPTO; Final Office action dated Jul. 6, 2017 in U.S. Appl. No. 14/219,879.
USPTO; Advisory Action dated Oct. 5, 2017 in U.S. Appl. No. 14/219,879.
USPTO; Non-Final Office Action dated Apr. 6, 2018 in U.S. Appl. No. 14/219,879.
USPTO; Final Office Action dated Nov. 2, 2018 in U.S. Appl. No. 14/219,879.
USPTO; Advisory Action dated Jan. 22, 2019 in U.S. Appl. No. 14/219,879.
USPTO; Non-Final Office Action dated Jun. 24, 2019 in U.S. Appl. No. 14/219,879.
USPTO; Final Office Action dated Jan. 13, 2020 in U.S. Appl. No. 14/219,879.
USPTO; Non-Final Office Action dated Sep. 18, 2015 in U.S. Appl. No. 14/244,689.
USPTO; Notice of Allowance dated Feb. 11, 2016 in U.S. Appl. No. 14/244,689.
USPTO; Non-Final Office Action dated Oct. 7, 2015 in U.S. Appl. No. 14/246,969.
USPTO; Final Office Action dated May 4, 2016 in U.S. Appl. No. 14/246,969.
USPTO; Advisory Action dated Aug. 2, 2016 in U.S. Appl. No. 14/246,969.
USPTO; Non-Final Office Action dated Aug. 12, 2016 in U.S. Appl. No. 14/246,969.
USPTO; Notice of Allowance dated Feb. 27, 2017 in U.S. Appl. No. 14/246,969.
USPTO; Non-Final Office Action dated Nov. 20, 2015 in U.S. Appl. No. 14/260,701.
USPTO; Notice of Allowance dated Jun. 2, 2016 in U.S. Appl. No. 14/260,701.
USPTO; Notice of Allowance dated Feb. 23, 2016 in U.S. Appl. No. 14/327,134.
USPTO; Non-Final Office Action dated Aug. 19, 2015 in U.S. Appl. No. 14/268,348.
USPTO; Non-Final Office Action dated Jan. 6, 2016 in U.S. Appl. No. 14/268,348.
USPTO; Final Office Action dated Apr. 29, 2016 in U.S. Appl. No. 14/268,348.
USPTO; Notice of Allowance dated Aug. 19, 2016 in U.S. Appl. No. 14/268,348.
USPTO; Notice of Allowance dated Aug. 30, 2016 in U.S. Appl. No. 14/268,348.
USPTO; Non-Final Office Action dated Oct. 20, 2015 in U.S. Appl. No. 14/281,477.
USPTO; Notice of Allowance dated Mar. 28, 2016 in U.S. Appl. No. 14/281,477.
USPTO; Non-Final Office Action dated Jan. 13, 2017 in U.S. Appl. No. 14/444,744.
USPTO; Final Office Action dated Jul. 10, 2017 in U.S. Appl. No. 14/444,744.
USPTO; Non-Final Office Action dated Nov. 29, 2017 in U.S. Appl. No. 14/444,744.
USPTO; Final Office Action dated Mar. 28, 2018 in U.S. Appl. No. 14/444,744.
USPTO; Non-Final Office Action Dated Jul. 27, 2018 in U.S. Appl. No. 14/444,744.
USPTO; Final Office Action dated Feb. 7, 2019 in U.S. Appl. No. 14/444,744.
USPTO; Non-Final Office Action dated Aug. 8, 2019 in U.S. Appl. No. 14/444,744.
USPTO; Final Office Action dated Feb. 20, 2020 in U.S. Appl. No. 14/444,744.

(56) References Cited

OTHER PUBLICATIONS

USPTO; Non-Final Office Action dated Apr. 28, 2020 in U.S. Appl. No. 14/444,744.
USPTO; Non-Final Office Action dated May 18, 2016 in U.S. Appl. No. 14/449,838.
USPTO; Notice of Allowance dated Nov. 28, 2016 in U.S. Appl. No. 14/449,838.
USPTO; Non-Final Office Action dated Feb. 12, 2015 in U.S. Appl. No. 14/457,058.
USPTO; Final Office Action dated Jul. 14, 2015 in U.S. Appl. No. 14/457,058.
USPTO; Non-Final Office Action dated Nov. 6, 2015 in U.S. Appl. No. 14/457,058.
USPTO; Advisory Action dated Nov. 6, 2015 in U.S. Appl. No. 14/457,058.
USPTO; Final Office Acton dated Jun. 17, 2016 in U.S. Appl. No. 14/457,058.
USPTO; Advisory Action dated Sep. 21, 2016 in U.S. Appl. No. 14/457,058.
USPTO; Non-Final Office Action dated Oct. 6, 2016 in U.S. Appl. No. 14/457,058.
USPTO; Final Office Acton dated May 4, 2017 in U.S. Appl. No. 14/457,058.
USPTO; Non-Final Office Action dated Oct. 19, 2017 in U.S. Appl. No. 14/457,058.
USPTO; Final Office Action dated Jun. 14, 2018 in U.S. Appl. No. 14/457,058.
USPTO; Non-Final Office Action dated Jan. 11, 2019 in U.S. Appl. No. 14/457,058.
USPTO; Final Office Action dated Jun. 25, 2019 in U.S. Appl. No. 14/457,058.
USPTO; Non-Final Office Action dated Oct. 31, 2019 in U.S. Appl. No. 14/457,058.
USPTO; Final Office Action dated May 15, 2020 in U.S. Appl. No. 14/457,058.
USPTO; Non-Final Office Action dated Sep. 16, 2016 in U.S. Appl. No. 14/465,252.
USPTO; Final Office Action dated Nov. 1, 2016 in U.S. Appl. No. 14/465,252.
USPTO; Non-Final Office Action dated Mar. 6, 2017 in U.S. Appl. No. 14/465,252.
USPTO; Final Office Action dated Jun. 9, 2017 in U.S. Appl. No. 14/465,252.
USPTO; Notice of Allowance dated Oct. 3, 2017 in U.S. Appl. No. 14/465,252.
USPTO; Non-Final Office Action dated Nov. 24, 2015 in U.S. Appl. No. 14/498,036.
USPTO; Final Office Action dated Apr. 5, 2016 in U.S. Appl. No. 14/498,036.
USPTO; Advisory Action dated Jun. 16, 2016 in U.S. Appl. No. 14/498,036.
USPTO; Notice of Allowance dated Aug. 17, 2016 in U.S. Appl. No. 14/498,036.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Non-Final Office Action dated Dec. 17, 2015 in U.S. Appl. No. 14/508,296.
USPTO; Final Office Action dated May 26, 2016 in U.S. Appl. No. 14/508,296.
USPTO; Advisory Action dated Aug. 17, 2016 in U.S. Appl. No. 14/508,296.
USPTO; Non-Final Office Action dated Sep. 8, 2016 in U.S. Appl. No. 14/508,296.
USPTO; Final Office Action dated Dec. 7, 2016 in U.S. Appl. No. 14/508,296.
USPTO; Notice of Allowance dated Jan. 27, 2017 in U.S. Appl. No. 14/508,296.
USPTO; Non-Final Office Action dated Apr. 6, 2017 in U.S. Appl. No. 14/508,489.
USPTO; Final Office Action dated Oct. 4, 2017 in U.S. Appl. No. 14/508,489.
USPTO; Non-Final Office Action dated May 15, 2018 in U.S. Appl. No. 14/508,489.
USPTO; Final Office Action dated Nov. 28, 2018 in U.S. Appl. No. 14/508,489.
USPTO; Non-Final Office Action dated Apr. 4, 2019 in U.S. Appl. No. 14/508,489.
USPTO; Final Office Action dated Aug. 20, 2019 in U.S. Appl. No. 14/508,489.
USPTO; Advisory Action dated Oct. 28, 2019 in U.S. Appl. No. 14/508,489.
USPTO; Non-Final Office Action dated Mar. 5, 2020 in U.S. Appl. No. 14/508,489.
USPTO; Non-Final Office Action dated Jan. 16, 2015 in U.S. Appl. No. 14/563,044.
USPTO; Final Office Action dated Jul. 16, 2015 in U.S. Appl. No. 14/563,044.
USPTO; Notice of Allowance dated Oct. 15, 2015 in U.S. Appl. No. 14/563,044.
USPTO; Notice of Allowance dated Dec. 2, 2015 in U.S. Appl. No. 14/563,044.
USPTO; Non-Final Office Action dated May 4, 2016 in U.S. Appl. No. 14/568,647.
USPTO; Final Office Action dated Sep. 29, 2016 in U.S. Appl. No. 14/568,647.
USPTO; Advisory Action dated Dec. 21, 2016 in U.S. Appl. No. 14/568,647.
USPTO; Non-Final Office Action dated Feb. 2, 2017 in U.S. Appl. No. 14/568,647.
USPTO; Final Office Action dated May 19, 2017 in U.S. Appl. No. 14/568,647.
USPTO; Non-Final Office Action dated Sep. 14, 2017 in U.S. Appl. No. 14/568,647.
USPTO; Final Office Action dated Jan. 23, 2018 in U.S. Appl. No. 14/568,647.
USPTO; Advisory Action dated Apr. 12, 2018 in U.S. Appl. No. 14/568,647.
USPTO; Non-Final Office Action dated May 25, 2018 in U.S. Appl. No. 14/568,647.
USPTO; Non-Final Office Action dated Oct. 1, 2015 in U.S. Appl. No. 14/571,126.
USPTO; Final Office Action dated Feb. 22, 2016 in U.S. Appl. No. 14/571,126.
USPTO; Notice of Allowance dated May 18, 2016 in U.S. Appl. No. 14/571,126.
USPTO; Notice of Allowance dated Jun. 2, 2016 in U.S. Appl. No. 14/571,126.
USPTO; Non-Final Office Action dated Nov. 25, 2015 in U.S. Appl. No. 14/598,532.
USPTO; Notice of Allowance dated May 16, 2016 in U.S. Appl. No. 14/598,532.
USPTO; Non-Final Office Action dated Jan. 15, 2016 in U.S. Appl. No. 14/606,364.
USPTO; Final Office Action dated Jun. 14, 2016 in U.S. Appl. No. 14/606,364.
USPTO; Advisory Action dated Aug. 25, 2016 in U.S. Appl. No. 14/606,364.
USPTO; Final Office Action dated Jan. 12, 2017 in U.S. Appl. No. 14/606,364.
USPTO; Non-Final Office Action dated May 10, 2017 in U.S. Appl. No. 14/606,364.
USPTO; Notice of Allowance dated Aug. 16, 2017 in U.S. Appl. No. 14/606,364.
USPTO; Non-Final Office Action dated Mar. 3, 2016 in U.S. Appl. No. 14/622,603.
USPTO; Notice of Allowance dated Aug. 2, 2016 in U.S. Appl. No. 14/622,603.
USPTO; Notice of Allowance dated Feb. 16, 2016 in U.S. Appl. No. 14/634,342.

(56) References Cited

OTHER PUBLICATIONS

USPTO; Non-Final Office Action dated Oct. 19, 2017 in U.S. Appl. No. 14/645,234.
USPTO; Non-Final Office Action dated May 16, 2018 in U.S. Appl. No. 14/645,234.
USPTO; Final Office Action dated Aug. 10, 2018 in U.S. Appl. No. 14/645,234.
USPTO; Notice of Allowance dated Aug. 15, 2019 in U.S. Appl. No. 14/645,234.
USPTO; Non-Final Office Action dated Jun. 7, 2017 in U.S. Appl. No. 14/656,588.
USPTO; Final Office Action dated Dec. 26, 2017 in U.S. Appl. No. 14/656,588.
USPTO; Non-Final Office Action dated Apr. 6, 2018 in U.S. Appl. No. 14/656,588.
USPTO; Notice of Allowance dated Nov. 19, 2018 in U.S. Appl. No. 14/656,588.
USPTO; Non-Final Office Action dated Mar. 21, 2016 in U.S. Appl. No. 14/659,152.
USPTO; Final Office Action dated Jul. 29, 2016 in U.S. Appl. No. 14/659,152.
USPTO; Notice of Allowance dated Nov. 22, 2016 in U.S. Appl. No. 14/659,152.
USPTO; Non-Final Office Action dated Nov. 19, 2015 in U.S. Appl. No. 14/659,437.
USPTO; Final Office Action dated Mar. 17, 2016 in U.S. Appl. No. 14/659,437.
USPTO; Notice of Allowance dated May 31, 2016 in U.S. Appl. No. 14/659,437.
USPTO; Non-Final Office Action dated Sep. 7, 2017 in U.S. Appl. No. 14/660,755.
USPTO; Notice of Allowance dated Oct. 2, 2017 in U.S. Appl. No. 14/660,755.
USPTO; Notice of Allowance dated Mar. 25, 2016 in U.S. Appl. No. 14/693,138.
USPTO; Non-Final Office Action dated Aug. 3, 2017 in U.S. Appl. No. 14/752,712.
USPTO; Final Office Action dated Nov. 29, 2017 in U.S. Appl. No. 14/752,712.
USPTO; Advisory Action dated Feb. 15, 2018 in U.S. Appl. No. 14/752,712.
USPTO; Non-Final Office Action dated Mar. 21, 2018 in U.S. Appl. No. 14/752,712.
USPTO; Final Office Action dated Sep. 5, 2018 in U.S. Appl. No. 14/752,712.
USPTO; Non-Final Office Action dated Dec. 28, 2018 in U.S. Appl. No. 14/752,712.
USPTO; Notice of Allowance dated Jun. 11, 2019 in U.S. Appl. No. 14/752,712.
USPTO; Non-Final Office Action dated Nov. 29, 2017 in U.S. Appl. No. 14/793,323.
USPTO; Final Office Action dated Mar. 29, 2018 in U.S. Appl. No. 14/793,323.
USPTO; Non-Final Office Action dated Aug. 10, 2018 in U.S. Appl. No. 14/793,323.
USPTO; Final Office Action dated Feb. 25, 2019 in U.S. Appl. No. 14/793,323.
UPSTO; Non-Final Office Action dated Jun. 27, 2019 in U.S. Appl. No. 14/793,323.
USPTO; Notice of Allowance dated Nov. 14, 2019 in U.S. Appl. No. 14/793,323.
USPTO; Non-Final Office Action dated Jun. 16, 2017 in U.S. Appl. No. 14/798,136.
USPTO; Notice of Allowance dated Oct. 5, 2017 in U.S. Appl. No. 14/798,136.
USPTO; Non-Final Office Action dated Mar. 30, 2016 in U.S. Appl. No. 14/808,979.
USPTO; Final Office Acton dated Sep. 30, 2016 in U.S. Appl. No. 14/808,979.
USPTO; Non-Final Office Action dated Dec. 20, 2016 in U.S. Appl. No. 14/808,979.
USPTO; Final Office Action dated Jun. 8, 2017 in U.S. Appl. No. 14/808,979.
USPTO; Non-Final Office Action dated Sep. 21, 2017 in U.S. Appl. No. 14/808,979.
USPTO; Final Office Action dated Mar. 14, 2018 in U.S. Appl. No. 14/808,979.
USPTO; Notice of Allowance dated Jun. 27, 2018 in U.S. Appl. No. 14/808,979.
USPTO; Non-Final Office Action dated Feb. 23, 2018 in U.S. Appl. No. 14/817,953.
USPTO; Notice of Allowance dated Jul. 11, 2018 in U.S. Appl. No. 14/817,953.
USPTO; Non-Final Office Action dated Sep. 1, 2016 in U.S. Appl. No. 14/827,177.
USPTO; Notice of Allowance dated Jan. 27, 2017 in U.S. Appl. No. 14/827,177.
USPTO; Non-Final Office Action dated Sep. 9, 2016 in U.S. Appl. No. 14/829,565.
USPTO; Final Office Action dated Feb. 9, 2017 in U.S. Appl. No. 14/829,565.
USPTO; Advisory Action dated Apr. 20, 2017 in U.S. Appl. No. 14/829,565.
USPTO; Non-Final Office Action dated Sep. 19, 2017 in U.S. Appl. No. 14/829,565.
USPTO; Final Office Action dated Mar. 5, 2018 in U.S. Appl. No. 14/829,565.
USPTO; Advisory Action dated Aug. 10, 2018 in U.S. Appl. No. 14/829,565.
USPTO; Non-Final Office Action dated Sep. 6, 2018 in U.S. Appl. No. 14/829,565.
USPTO; Final Office Action dated Apr. 18, 2019 in U.S. Appl. No. 14/829,565.
USPTO; Advisory Action dated Jul. 22, 2019 in U.S. Appl. No. 14/829,565.
USPTO; Non-Final Office Action dated Sep. 19, 2019 in U.S. Appl. No. 14/829,565.
USPTO; Final Office Action dated Mar. 3, 2020 in U.S. Appl. No. 14/829,565.
USPTO; Advisory Action dated Jun. 22, 2020 in U.S. Appl. No. 14/829,565.
USPTO; Non-Final Office Action dated Apr. 29, 2016 in U.S. Appl. No. 14/835,637.
USPTO; Final Office Action dated Nov. 25, 2016 in U.S. Appl. No. 14/835,637.
USPTO; Advisory Action dated Feb. 14, 2017 in U.S. Appl. No. 14/835,637.
USPTO; Notice of Allowance dated Apr. 25, 2017 in U.S. Appl. No. 14/835,637.
USPTO; Non-Final Office Action dated Jul. 29, 2016 in U.S. Appl. No. 14/884,695.
USPTO; Final Office Action dated Feb. 9, 2017 in U.S. Appl. No. 14/884,695.
USPTO; Advisory Action dated Apr. 20, 2017 in U.S. Appl. No. 14/884,695.
USPTO; Non-Final Office Action dated May 18, 2017 in U.S. Appl. No. 14/884,695.
USPTO; Notice of Allowance dated Oct. 20, 2017 in U.S. Appl. No. 14/884,695.
USPTO; Non-Final Office Action dated May 18, 2017 in U.S. Appl. No. 14/886,571.
USPTO; Final Office Action dated Sep. 21, 2017 in U.S. Appl. No. 14/886,571.
USPTO; Notice of Allowance dated Dec. 6, 2017 in U.S. Appl. No. 14/886,571.
USPTO; Non-Final Office Action dated Dec. 1, 2016 in U.S. Appl. No. 14/919,536.
USPTO; Final Office Action dated Mar. 28, 2017 in U.S. Appl. No. 14/919,536.
USPTO; Non-Final Office Action dated Aug. 29, 2017 in U.S. Appl. No. 14/919,536.

(56) References Cited

OTHER PUBLICATIONS

USPTO; Final Office Action dated May 11, 2018 in U.S. Appl. No. 14/919,536.
USPTO; Notice of Allowance dated Oct. 4, 2018 in U.S. Appl. No. 14/919,536.
USPTO; Notice of Allowance dated Nov. 19, 2018 in U.S. Appl. No. 14/919,536.
USPTO; Non-Final Office Action dated May 3, 2016 in U.S. Appl. No. 14/937,053.
USPTO; Notice of Allowance dated Jul. 26, 2016 in U.S. Appl. No. 14/937,053.
USPTO; Non-Final Office Action dated Dec. 15, 2016 in U.S. Appl. No. 14/938,180.
USPTO; Notice of Allowance dated Nov. 9, 2017 in U.S. Appl. No. 14/938,180.
USPTO; Non-Final Office Action dated Apr. 14, 2017 in U.S. Appl. No. 14/956,115.
USPTO; Final Office Action dated Jul. 21, 2017 in U.S. Appl. No. 14/956,115.
USPTO; Notice of Allowance dated Dec. 14, 2017 in U.S. Appl. No. 14/956,115.
USPTO; Notice of Allowance dated Feb. 3, 2017 in U.S. Appl. No. 14/977,291.
USPTO; Non-Final Office Action dated Aug. 12, 2016 in U.S. Appl. No. 14/981,434.
USPTO; Notice of Allowance dated Nov. 21, 2016 in U.S. Appl. No. 14/981,434.
USPTO; Non-Final Office Action dated Jan. 12, 2017 in U.S. Appl. No. 14/981,468.
USPTO; Notice of Allowance dated Jun. 7, 2017 in U.S. Appl. No. 14/981,468.
USPTO; Non-Final Office Action dated Mar. 22, 2016 in U.S. Appl. No. 14/987,420.
USPTO; Final Office Action dated Jun. 10, 2016 in U.S. Appl. No. 14/987,420.
USPTO; Non-Final Office Action dated Dec. 14, 2016 in U.S. Appl. No. 14/997,683.
USPTO; Final Office Action dated Apr. 14, 2017 in U.S. Appl. No. 14/997,683.
USPTO; Non-Final Office Action dated Sep. 1, 2017 in U.S. Appl. No. 14/997,683.
USPTO; Final Office Action dated Feb. 6, 2018 in U.S. Appl. No. 14/997,683.
USPTO; Advisory Action dated May 2, 2018 in U.S. Appl. No. 14/997,683.
USPTO; Non-Final Office Action dated Jun. 20, 2018 in U.S. Appl. No. 14/997,683.
USPTO; Final Office Action dated Dec. 10, 2018 in U.S. Appl. No. 14/997,683.
USPTO; Notice of Allowance dated Mar. 25, 2019 in U.S. Appl. No. 14/997,683.
USPTO; Non-Final Office Action dated Sep. 23, 2016 in U.S. Appl. No. 15/048,422.
USPTO; Notice of Allowance dated May 4, 2017 in U.S. Appl. No. 15/048,422.
USPTO; Non-Final Office Action dated Aug. 4, 2017 in U.S. Appl. No. 15/050,159.
USPTO; Notice of Allowance dated Feb. 7, 2018 in U.S. Appl. No. 15/050,159.
USPTO; Non-Final Office Action dated Apr. 22, 2016 in U.S. Appl. No. 15/055,122.
USPTO; Notice of Allowance dated Sep. 15, 2016 in U.S. Appl. No. 15/055,122.
USPTO; Non-Final Office Action dated Feb. 20, 2018 in U.S. Appl. No. 15/060,412.
USPTO; Final Office Action dated Oct. 19, 2018 in U.S. Appl. No. 15/060,412.
USPTO; Non-Final Office Action dated Jun. 3, 2019 in U.S. Appl. No. 15/060,412.
USPTO; Final Office Action dated Dec. 26, 2019 in U.S. Appl. No. 15/060,412.
USPTO; Notice of Allowance dated Mar. 5, 2020 in U.S. Appl. No. 15/060,412.
USPTO; Non-Final Office Action dated Aug. 27, 2018 in U.S. Appl. No. 15/067,028.
USPTO; Notice of Allowance dated Dec. 21, 2018 in U.S. Appl. No. 15/067,028.
USPTO; Non-Final Office Action dated Sep. 26, 2018 in U.S. Appl. No. 15/074,813.
USPTO; Notice of Allowance dated Feb. 25, 2019 in U.S. Appl. No. 15/074,813.
USPTO; Non-Final Office Action dated Jan. 9, 2018 in U.S. Appl. No. 15/135,224.
USPTO; Notice of Allowance dated Jun. 29, 2018 in U.S. Appl. No. 15/135,224.
USPTO; Non-Final Office Action dated Jan. 9, 2018 in U.S. Appl. No. 15/135,258.
USPTO; Final Office Action dated Jul. 6, 2018 in U.S. Appl. No. 15/135,258.
USPTO; Non-Final Office Action dated Nov. 23, 2018 in U.S. Appl. No. 15/135,258.
USPTO; Final Office Action dated Mar. 14, 2019 in U.S. Appl. No. 15/135,258.
USPTO; Non-Final Office Action dated Jul. 19, 2019 in U.S. Appl. No. 15/135,258.
USPTO; Final Office Action dated Oct. 24, 2019 in U.S. Appl. No. 15/135,258.
USPTO; Advisory Action dated Jan. 3, 2020 in U.S. Appl. No. 15/135,258.
USPTO; Non-Final Office Action dated Feb. 13, 2020 in U.S. Appl. No. 15/135,258.
USPTO; Final Office Action dated Jun. 1, 2020 in U.S. Appl. No. 15/135,258.
USPTO; Non-Final Office Action dated Jan. 9, 2018 in U.S. Appl. No. 15/135,333.
USPTO; Notice of Allowance dated Sep. 14, 2018 in U.S. Appl. No. 15/135,333.
USPTO; Non-Final Office Action dated Nov. 21, 2016 in U.S. Appl. No. 15/144,481.
USPTO; Final Office Action dated May 26, 2017 in U.S. Appl. No. 15/144,481.
USPTO; Non-Final Office Action dated Sep. 21, 2017 in U.S. Appl. No. 15/144,481.
USPTO; Notice of Allowance dated Mar. 26, 2018 in U.S. Appl. No. 15/144,481.
USPTO; Notice of Allowance dated Apr. 11, 2018 in U.S. Appl. No. 15/144,481.
USPTO; Non-Final Office Action dated Apr. 13, 2017 in U.S. Appl. No. 15/144,506.
USPTO; Final Office Action dated Oct. 10, 2017 in U.S. Appl. No. 15/144,506.
USPTO; Final Office Action dated Jul. 26, 2018 in U.S. Appl. No. 15/144,506.
USPTO; Notice of Allowance dated Mar. 13, 2019 in U.S. Appl. No. 15/144,506.
USPTO; Non-Final Office Action dated Oct. 9, 2018 in U.S. Appl. No. 15/182,504.
USPTO; Final Office Action dated Mar. 28, 2019 in U.S. Appl. No. 15/182,504.
USPTO; Notice of Allowance dated Jul. 17, 2019 in U.S. Appl. No. 15/182,504.
USPTO; Non-Final Office Action dated Nov. 28, 2016 in U.S. Appl. No. 15/203,632.
USPTO; Final Office Action dated Jun. 7, 2017 in U.S. Appl. No. 15/203,632.
USPTO; Advisory Action dated Aug. 23, 2017 in U.S. Appl. No. 15/203,632.
USPTO; Notice of Allowance dated Sep. 20, 2017 in U.S. Appl. No. 15/203,632.
USPTO; Non-Final Office Action dated Nov. 29, 2016 in U.S. Appl. No. 15/203,642.

(56) References Cited

OTHER PUBLICATIONS

USPTO; Final Office Action dated Apr. 13, 2017 in U.S. Appl. No. 15/203,642.
USPTO; Advisory Action dated Jun. 22, 2017 in U.S. Appl. No. 15/203,642.
USPTO; Notice of Allowance dated Aug. 7, 2017 in U.S. Appl. No. 15/203,642.
USPTO; Non-Final Office Action dated Jun. 1, 2017 in U.S. Appl. No. 15/205,827.
USPTO; Final Office Action dated Oct. 16, 2017 in U.S. Appl. No. 15/205,827.
USPTO; Non-Final Office Action dated May 14, 2018 in U.S. Appl. No. 15/205,827.
USPTO; Final Office Action dated Oct. 9, 2018 in U.S. Appl. No. 15/205,827.
USPTO; Non-Final Office Action dated Mar. 28, 2019 in U.S. Appl. No. 15/205,827.
USPTO; Final Office Action dated Aug. 9, 2019 in U.S. Appl. No. 15/205,827.
USPTO; Advisory Action dated Oct. 22, 2019 in U.S. Appl. No. 15/205,827.
USPTO; Notice of Allowance dated Dec. 03, 2019 in U.S. Appl. No. 15/205,827.
USPTO; Non-Final Office Action dated Mar. 31, 2017 in U.S. Appl. No. 15/205,890.
USPTO; Notice of Allowance dated Oct. 16, 2017 in U.S. Appl. No. 15/205,890.
USPTO; Non-Final Office Action dated Jan. 20, 2017 in U.S. Appl. No. 15/210,256.
USPTO; Notice of Allowance dated May 18, 2017 in U.S. Appl. No. 15/210,256.
USPTO; Notice of Allowance dated Jul. 24, 2017 in U.S. Appl. No. 15/210,256.
USPTO; Non Final Office Action dated Apr. 21, 2017 in U.S. Appl. No. 15/222,715.
USPTO; Notice of Allowance dated Jul. 14, 2017 in U.S. Appl. No. 15/222,715.
USPTO; Notice of Allowance dated Sep. 27, 2017 in U.S. Appl. No. 15/222,715.
USPTO; Non-Final Office Action dated Feb. 03, 2017 in U.S. Appl. No. 15/222,738.
USPTO; Notice of Allowance dated May 22, 2017 in U.S. Appl. No. 15/222,738.
USPTO; Notice of Allowance dated Aug. 23, 2017 in U.S. Appl. No. 15/222,738.
USPTO; Non-Final Office Action dated Jan. 17, 2017 in U.S. Appl. No. 15/222,749.
USPTO; Final Office Action dated May 5, 2017 in U.S. Appl. No. 15/222,749.
USPTO; Non-Final Office Action dated Sep. 7, 2017 in U.S. Appl. No. 15/222,749.
USPTO: Final Office Action dated Jun. 4, 2018 in U.S. Appl. No. 15/222,749.
USPTO; Notice of Allowance dated Aug. 30, 2018 in U.S. Appl. No. 15/222,749.
USPTO; Non-Final Office Action dated Jan. 3, 2017 in U.S. Appl. No. 15/222,780.
USPTO; Final Office Action dated May 5, 2017 in U.S. Appl. No. 15/222,780.
USPTO; Non-Final Office Action dated Sep. 7, 2017 in U.S. Appl. No. 15/222,780.
USPTO; Final Office Action dated May 17, 2018 in U.S. Appl. No. 15/222,780.
USPTO; Non-Final Office Action dated Oct. 1, 2018 in U.S. Appl. No. 15/222,780.
USPTO; Notice of Allowance dated Apr. 19, 2019 in U.S. Appl. No. 15/222,780.
USPTO; Notice of Allowance dated Jul. 12, 2018 in U.S. Appl. No. 15/254,605.
USPTO; Non-Final Office Action dated Aug. 28, 2017 in U.S. Appl. No. 15/254,724.
USPTO; Notice of Allowance dated Jan. 17, 2018 in U.S. Appl. No. 15/254,724.
USPTO; Notice of Allowance dated Apr. 2, 2018 in U.S. Appl. No. 15/254,724.
USPTO; Non-Final Office Action dated May 22, 2018 in U.S. Appl. No. 15/262,990.
USPTO; Non-Final Office Action dated Sep. 13, 2018 in U.S. Appl. No. 15/262,990.
USPTO; Non-Final Office Action dated Jan. 30, 2019 in U.S. Appl. No. 15/262,990.
USPTO; Final Office Action dated May 13, 2019 in U.S. Appl. No. 15/262,990.
USPTO; Advisory Action dated Jul. 22, 2019 in U.S. Appl. No. 15/262,990.
USPTO; Non-Final Office Action dated Aug. 5, 2019 in U.S. Appl. No. 15/262,990.
USPTO; Final Office Action dated Nov. 19, 2019 in U.S. Appl. No. 15/262,990.
USPTO; Advisory Action dated Jan. 30, 2020 in U.S. Appl. No. 15/262,990.
USPTO; Non-Final Office Action dated Aug. 3, 2018 in U.S. Appl. No. 15/273,488.
USPTO; Final Office Action dated Jan. 11, 2019 in U.S. Appl. No. 15/273,488.
USPTO; Notice of Allowance dated Apr. 19, 2019 in U.S. Appl. No. 15/273,488.
USTPO; Non-Final Office Action dated Jul. 2, 2018 in U.S. Appl. No. 15/286,503.
USPTO; Final Office Action dated Feb. 7, 2019 in U.S. Appl. No. 15/286,503.
USPTO; Non-Final Office Action dated Jun. 27, 2019 in U.S. Appl. No. 15/286,503.
USPTO; Final Office Action dated Jan. 6, 2020 in U.S. Appl. No. 15/286,503.
USPTO; Advisory Action dated Mar. 31, 2020 in U.S. Appl. No. 15/286,503.
USPTO; Non-Final Office Action dated Apr. 16, 2020 in U.S. Appl. No. 15/286,503.
USPTO; Non-Final Office Action dated Dec. 14, 2018 in U.S. Appl. No. 15/340,512.
USPTO; Notice of Allowance dated May 24, 2019 in U.S. Appl. No. 15/340,512.
USPTO; Non-Final Office Action dated Oct. 23, 2017 in U.S. Appl. No. 15/377,439.
USPTO; Final Office Action dated Apr. 16, 2018 in U.S. Appl. No. 15/377,439.
USPTO; Advisory Action dated Aug. 8, 2018 in U.S. Appl. No. 15/377,439.
USPTO; Non-Final Office Action dated Nov. 14, 2018 in U.S. Appl. No. 15/377,439.
USPTO; Final Office Action dated Jun. 25, 2019 in U.S. Appl. No. 15/377,439.
USPTO; Non-Final Office Action dated Nov. 7, 2019 in U.S. Appl. No. 15/377,439.
USPTO; Final Office Action dated May 13, 2020 in U.S. Appl. No. 15/377,439.
USPTO; Notice of Allowance dated Aug. 8, 2017 in U.S. Appl. No. 15/380,895.
USPTO; Notice of Allowance dated Oct. 11, 2017 in U.S. Appl. No. 15/380,895.
USPTO; Non-Final Office Action dated May 31, 2019 in U.S. Appl. No. 15/380,909.
USPTO; Final Office Action dated Dec. 12, 2019 in U.S. Appl. No. 15/380,909.
USPTO; Non-Final Office Action dated Jan. 4, 2018 in U.S. Appl. No. 15/380,921.
USPTO; Final Office Action dated Jun. 28, 2018 in U.S. Appl. No. 15/380,921.
USPTO; Non-Final Office Action dated Feb. 25, 2019 in U.S. Appl. No. 15/380,921.

(56) References Cited

OTHER PUBLICATIONS

USPTO; Final Office Action dated Sep. 18, 2019 in U.S. Appl. No. 15/380,921.
USPTO; Non-Final Office Action dated Jan. 15, 2020 in U.S. Appl. No. 15/380,921.
USPTO; Non-Final Office Action dated Oct. 3, 2017 in U.S. Appl. No. 15/388,410.
USPTO; Final Office Action dated May 15, 2018 in U.S. Appl. No. 15/388,410.
USPTO; Notice of Allowance dated Nov. 14, 2018 in U.S. Appl. No. 15/388,410.
USPTO; Notice of Allowance dated Dec. 28, 2018 in U.S. Appl. No. 15/388,410.
USPTO; Non-Final Office Action dated Aug. 11, 2017 in U.S. Appl. No. 15/397,237.
USPTO; Notice of Allowance dated Dec. 22, 2017 in U.S. Appl. No. 15/397,237.
USPTO; Non-Final Office Action dated Apr. 12, 2017 in U.S. Appl. No. 15/397,319.
USPTO; Final Office Action dated Jul. 12, 2017 in U.S. Appl. No. 15/397,319.
USPTO; Notice of Allowance dated Dec. 15, 2017 in U.S. Appl. No. 15/397,319.
USPTO; Non-Final Office Action dated Feb. 5, 2019 in U.S. Appl. No. 15/402,993.
USPTO; Final Office Action dated May 21, 2019 in U.S. Appl. No. 15/402,993.
USPTO; Advisory Action dated Jul. 29, 2019 in U.S. Appl. No. 15/402,993.
USPTO; Non-Final Office Action dated Oct. 24, 2019 in U.S. Appl. No. 15/402,993.
USPTO; Final Office Action dated Feb. 19, 2020 in U.S. Appl. No. 15/402,993.
USPTO; Advisory Action dated Apr. 2, 2020 in U.S. Appl. No. 15/402,993.
USPTO; Non-Final Office Action dated May 27, 2020 in U.S. Appl. No. 15/402,993.
USPTO; Non-Final Office Action dated Sep. 20, 2018 in U.S. Appl. No. 15/410,503.
USPTO; Final Office Action dated Feb. 4, 2019 in U.S. Appl. No. 15/410,503.
USPTO; Non-Final Office Action dated Apr. 25, 2019 in U.S. Appl. No. 15/410,503.
USPTO; Notice of Allowance dated Aug. 14, 2019 in U.S. Appl. No. 15/410,503.
USPTO; Non-Final Office Action dated Aug. 7, 2018 in U.S. Appl. No. 15/428,808.
USPTO; Final Office Action dated Jan. 11, 2019 in U.S. Appl. No. 15/428,808.
USPTO; Notice of Allowance dated Apr. 25, 2019 in U.S. Appl. No. 15/428,808.
USPTO; Non-Final Office Action dated Apr. 6, 2018 in U.S. Appl. No. 15/434,051.
USPTO; Final Office Action dated Aug. 29, 2018 in U.S. Appl. No. 15/434,051.
USPTO; Advisory Action dated Dec. 4, 2018 in U.S. Appl. No. 15/434,051.
USPTO; Non-Final Office Action dated Jan. 25, 2019 in U.S. Appl. No. 15/434,051.
USPTO; Notice of Allowance dated Jun. 3, 2019 in U.S. Appl. No. 15/434,051.
USPTO; Notice of Allowance dated Oct. 6, 2017 in U.S. Appl. No. 15/450,199.
USPTO; Non-Final Office Action dated Dec. 15, 2017 in U.S. Appl. No. 15/466,149.
USPTO; Notice of Allowance dated Apr. 20, 2018 in U.S. Appl. No. 15/466,149.
USPTO; Non-Final Office Action dated Apr. 6, 2018 in U.S. Appl. No. 15/472,750.
USPTO; Notice of Allowance dated Nov. 30, 2018 in U.S. Appl. No. 15/472,750.
USPTO; Non-Final Office Action dated Oct. 4, 2017 in U.S. Appl. No. 15/489,453.
USPTO; Final Office Action dated Apr. 19, 2018 in U.S. Appl. No. 15/489,453.
USPTO; Non-Final Office Action dated Sep. 10, 2018 in U.S. Appl. No. 15/489,453.
USPTO; Final Office Action dated Feb. 27, 2019 in U.S. Appl. No. 15/489,453.
USPTO; Non-Final Office Action dated Jun. 5, 2019 in U.S. Appl. No. 15/489,453.
USPTO; Notice of Allowance dated Oct. 7, 2019 in U.S. Appl. No. 15/489,453.
USPTO; Notice of Allowance dated Dec. 19, 2017 in U.S. Appl. No. 15/489,660.
USPTO; Non-Final Office Action dated Dec. 6, 2017 in U.S. Appl. No. 15/476,035.
USPTO; Notice of Allowance dated Mar. 21, 2018 in U.S. Appl. No. 15/476,035.
USPTO; Notice of Allowance dated Aug. 14, 2018 in U.S. Appl. No. 15/476,035.
USPTO; Final Office Action dated May 1, 2019 in U.S. Appl. No. 15/491,726.
USPTO; Non-Final Office Action dated May 31, 2018 in U.S. Appl. No. 15/491,726.
USPTO; Non-Final Office Action dated Oct. 3, 2019 in U.S. Appl. No. 15/491,726.
USPTO; Final Office Action dated Apr. 17, 2020 in U.S. Appl. No. 15/491,726.
USPTO; Non-Final Office Action dated Jan. 16, 2018 in U.S. Appl. No. 15/499,647.
USPTO; Notice of Allowance dated May 23, 2018 in U.S. Appl. No. 15/499,647.
USPTO; Non-Final Office Action dated Jun. 21, 2018 in U.S. Appl. No. 15/499,647.
USPTO; Notice of Allowance dated Nov. 1, 2018 in U.S. Appl. No. 15/499,647.
USPTO; Notice of Allowance dated Nov. 15, 2018 in U.S. Appl. No. 15/499,647.
USPTO; Office Action dated Aug. 30, 2018 in U.S. Appl. No. 15/589,849.
USPTO; Final Office Action dated Mar. 6, 2019 in U.S. Appl. No. 15/589,849.
USPTO; Non-Final Office Action dated Jun. 28, 2019 in U.S. Appl. No. 15/589,849.
USPTO; Final Office Action dated Jan. 8, 2020 in U.S. Appl. No. 15/589,849.
USPTO; Notice of Allowance dated Feb. 28, 2020 in U.S. Appl. No. 15/589,849.
USPTO; Office Action dated May 3, 2018 in U.S. Appl. No. 15/589,861.
USPTO; Non-Final Office Action dated Dec. 21, 2018 in U.S. Appl. No. 15/589,861.
USPTO; Final Office Action dated Jun. 26, 2019 in U.S. Appl. No. 15/589,861.
USPTO; Advisory Action dated Sep. 20, 2019 in U.S. Appl. No. 15/589,861.
USPTO; Non-Final Office Action dated Jan. 13, 2020 in U.S. Appl. No. 15/589,861.
USPTO; Non-Final Office Action dated Apr. 4, 2018 in U.S. Appl. No. 15/592,730.
USPTO; Final Office Action dated Nov. 16, 2018 in U.S. Appl. No. 15/592,730.
USPTO; Advisory Action dated Mar. 15, 2019 in U.S. Appl. No. 15/592,730.
USPTO; Notice of Allowance dated Aug. 21, 2019 in U.S. Appl. No. 15/592,730.
USPTO; Non-Final Office Action dated Mar. 7, 2019 in U.S. Appl. No. 15/598,169..
USPTO; Final Office Action dated Jun. 25, 2019 in U.S. Appl. No. 15/598,169

(56) References Cited

OTHER PUBLICATIONS

USPTO; Notice of Allowance dated Sep. 11, 2019 in U.S. Appl. No. 15/598,169.
USPTO; Non-Final Office Action dated Mar. 10, 2020 in U.S. Appl. No. 15/611,707.
USPTO; Ex Parte Quayle Action dated Mar. 21, 2019 in U.S. Appl. No. 15/615,489.
USPTO; Non-Final Office Action dated Sep. 4, 2019 in U.S. Appl. No. 15/615,489.
USPTO; Notice of Allowance dated Feb. 28, 2020 in U.S. Appl. No. 15/615,489.
USPTO; Non-Final Office Action dated Feb. 1, 2019 in U.S. Appl. No. 15/627,189.
USPTO; Notice of Allowance dated May 21, 2019 in U.S. Appl. No. 15/627,189.
USPTO; Non-Final Office Action dated Nov. 9, 2018 in U.S. Appl. No. 15/636,307.
USPTO; Final Office Action dated Mar. 6, 2019 in U.S. Appl. No. 15/636,307.
USPTO; Non-Final Office Action dated Jul. 16, 2019 in U.S. Appl. No. 15/636,307.
USPTO; Final Office Action dated Nov. 12, 2019 in U.S. Appl. No. 15/636,307.
USPTO; Advisory Action dated Jan. 17, 2020 in U.S. Appl. No. 15/636,307.
USPTO; Non-Final Office Action dated Mar. 11, 2020 in U.S. Appl. No. 15/636,307.
USPTO; Final Office Action dated Jun. 16, 2020 in U.S. Appl. No. 15/636,307.
USPTO; Notice of Allowance dated Jul. 18, 2018 in U.S. Appl. No. 15/640,239.
USPTO; Notice of Allowance dated Aug. 30, 2018 in U.S. Appl. No. 15/640,239.
USPTO; Non-Final Office Action dated Jun. 5, 2018 in U.S. Appl. No. 15/650,686.
USPTO; Final Office Action dated Nov. 20, 2018 in U.S. Appl. No. 15/650,686.
USPTO; Notice of Allowance dated Jun. 24, 2019 in U.S. Appl. No. 15/650,686.
USPTO; Non-Final Office Action dated Sep. 21, 2018 in U.S. Appl. No. 15/659,631.
USPTO; Notice of Allowance dated Feb. 21, 2019 in U.S. Appl. No. 15/659,631.
USPTO; Non-Final Office Action dated Jul. 29, 2019 in U.S. Appl. No. 15/660,797.
USPTO; Notice of Allowance dated Nov. 7, 2019 in U.S. Appl. No. 15/660,797.
USPTO; Non-Final Office Action dated Aug. 9, 2018 in U.S. Appl. No. 15/660,805.
USPTO; Non-Final Office Action dated Mar. 1, 2019 in U.S. Appl. No. 15/660,805.
USPTO; Notice of Allowance dated Aug. 22, 2019 in U.S. Appl. No. 15/660,805.
USPTO; Non-Final Office Action dated Aug. 27, 2018 in U.S. Appl. No. 15/662,107.
USPTO; Notice of Allowance dated Feb. 21, 2019 in U.S. Appl. No. 15/662,107.
USPTO; Non-Final Office Action dated Dec. 4, 2018 in U.S. Appl. No. 15/672,063.
USPTO; Notice of Allowance dated Mar. 20, 2019 in U.S. Appl. No. 15/672,063.
USPTO; Non-Final Office Action dated Oct. 10, 2019 in U.S. Appl. No. 15/672,096.
USPTO; Final Office Action dated Mar. 27, 2020 in U.S. Appl. No. 15/672,096.
USPTO; Notice of Allowance dated May 20, 2020 in U.S. Appl. No. 15/672,096.
USPTO; Non-Final Office Action dated Feb. 8, 2019 in U.S. Appl. No. 15/672,119.
USPTO; Final Office Action dated Jul. 16, 2019 in U.S. Appl. No. 15/672,119.
USPTO; Advisory Action dated Sep. 23, 2019 in U.S. Appl. No. 15/672,119.
USPTO; Notice of Allowance dated Feb. 7, 2020 in U.S. Appl. No. 15/672,119.
USPTO; Non-Final Office Action dated Jul. 27, 2018 in U.S. Appl. No. 15/673,110.
USPTO; Notice of Allowance dated Jan. 9, 2019 in U.S. Appl. No. 15/673,110.
USPTO; Non-Final Office Action dated Apr. 25, 2018 in U.S. Appl. No. 15/673,278.
USPTO; Notice of Allowance dated May 6, 2019 in U.S. Appl. No. 15/673,278.
USPTO; Non-Final Office Action dated Jan. 18, 2018 in U.S. Appl. No. 15/683,701.
USPTO; Notice of Allowance dated Jan. 9, 2019 in U.S. Appl. No. 15/683,701.
USPTO; Final Office Action dated Aug. 24, 2018 in U.S. Appl. No. 15/683,701.
USPTO; Advisory Action dated Nov. 26, 2018 in U.S. Appl. No. 15/683,701.
USPTO; Non-Final Office Action dated Dec. 18, 2018 in U.S. Appl. No. 15/690,017.
USPTO; Final Office Action dated Jul. 26, 2019 in U.S. Appl. No. 15/690,017.
USPTO; Non-Final Office Action dated Nov. 20, 2019 in U.S. Appl. No. 15/690,017.
USPTO; Final Office Action dated May 27, 2020 in U.S. Appl. No. 15/690,017.
USPTO; Non-Final Office Action dated Aug. 9, 2018 in U.S. Appl. No. 15/691,241.
USPTO; Final Office Action dated Jan. 11, 2019 in U.S. Appl. No. 15/691,241.
USPTO; Non-Final Office Action dated Mar. 19, 2019 in U.S. Appl. No. 15/691,241.
USPTO; Final Office Action dated Jan. 24, 2020 in U.S. Appl. No. 15/691,241.
USPTO; Advisory Action dated Jun. 19, 2020 in U.S. Appl. No. 15/691,241.
USPTO; Non-Final Office Action dated Dec. 6, 2018 in U.S. Appl. No. 15/705,955.
USPTO; Notice of Allowance dated Apr. 16, 2019 in U.S. Appl. No. 15/705,955.
USPTO; Non-Final Office Action dated Feb. 11, 2019 in U.S. Appl. No. 15/707,786.
USPTO; Final Office Action dated Aug. 12, 2019 in U.S. Appl. No. 15/707,786.
USPTO; Notice of Allowance dated Nov. 7, 2019 in U.S. Appl. No. 15/707,786.
USPTO; Non-Final Office Action dated Jun. 14, 2018 in U.S. Appl. No. 15/711,989.
USPTO; Notice of Allowance dated Dec. 6, 2018 in U.S. Appl. No. 15/711,989.
USPTO; Non-Final Office Action dated May 29, 2018 in U.S. Appl. No. 15/719,208.
USPTO; Final Office Action dated Dec. 13, 2018 in U.S. Appl. No. 15/719,208.
USPTO; Non-Final Office Action dated Jun. 25, 2019 in U.S. Appl. No. 15/719,208.
USPTO; Notice of Allowance dated Jan. 29, 2020 in U.S. Appl. No. 15/719,208.
USPTO; Non-Final Office Action dated Oct. 4, 2018 in U.S. Appl. No. 15/726,222.
USPTO; Notice of Allowance dated Apr. 19, 2019 in U.S. Appl. No. 15/726,222.
USPTO; Non-Final Office Action dated Apr. 19, 2018 in U.S. Appl. No. 15/726,959.
USPTO; Final Office Action dated Nov. 14, 2018 in U.S. Appl. No. 15/726,959.
USPTO; Non-Final Office Action dated Jul. 8, 2019 in U.S. Appl. No. 15/726,959.

(56) References Cited

OTHER PUBLICATIONS

USPTO; Final Office Action dated Jan. 7, 2020 in U.S. Appl. No. 15/726,959.
USPTO; Advisory Action dated Mar. 16, 2020 in U.S. Appl. No. 15/726,959.
USPTO; Non-Final Office Action dated Apr. 3, 2020 in U.S. Appl. No. 15/726,959.
USPTO; Non-Final Office Action dated Sep. 26, 2019 in U.S. Appl. No. 15/727,432.
USPTO; Notice of Allowance dated Jan. 6, 2020 in U.S. Appl. No. 15/727,432.
USPTO; Non-Final Office Action dated May 17, 2018 in U.S. Appl. No. 15/729,485.
USPTO; Notice of Allowance dated Jan. 23, 2019 in U.S. Appl. No. 15/729,485.
USPTO; Non-Final Office Action dated Nov. 28, 2018 in U.S. Appl. No. 15/795,056.
USPTO; Final Office Action dated Apr. 19, 2019 in U.S. Appl. No. 15/795,056.
USPTO; Final Office Action dated Jul. 31, 2019 in U.S. Appl. No. 15/795,056.
USPTO; Non-Final Office Action dated Nov. 20, 2019 in U.S. Appl. No. 15/795,056.
USPTO; Notice of Allowance dated Mar. 12, 2020 in U.S. Appl. No. 15/795,056.
USPTO; Non-Final Office Action dated Jun. 26, 2018 in U.S. Appl. No. 15/796,593.
USPTO; Final Office Action dated Feb. 21, 2019 in U.S. Appl. No. 15/796,593.
USPTO; Non-Final Office Action dated Jun. 14, 2019 in U.S. Appl. No. 15/796,593.
USPTO; Notice of Allowance dated Dec. 31, 2019 in U.S. Appl. No. 15/796,593.
USPTO; Non-Final Office Action dated Dec. 26, 2017 in U.S. Appl. No. 15/798,120.
USPTO; Notice of Allowance dated Jun. 13, 2018 in U.S. Appl. No. 15/798,120.
USPTO; Non-Final Office Action dated Dec. 21, 2018 in U.S. Appl. No. 15/798,150.
USPTO; Notice of Allowance dated May 14, 2019 in U.S. Appl. No. 15/798,150.
USPTO; Non-Final Office Action dated Aug. 9, 2018 in U.S. Appl. No. 15/798,201.
USPTO; Final Office Action dated Dec. 14, 2018 in U.S. Appl. No. 15/798,201.
UPSTO; Non-Final Office Action dated Oct. 2, 2019 in U.S. Appl. No. 15/798,201.
USPTO; Final Office Action dated Mar. 19, 2020 in U.S. Appl. No. 15/798,201.
USPTO; Advisory Action dated May 26, 2020 in U.S. Appl. No. 15/798,201.
USPTO; Non-Final Office Action dated Nov. 15, 2019 in U.S. Appl. No. 15/802,154.
USPTO; Final Office Action dated Mar. 11, 2020 in U.S. Appl. No. 15/802,154.
USPTO; Advisory Action dated May 19, 2020 in U.S. Appl. No. 15/802,154.
USPTO; Non-Final Office Action dated Jul. 2, 2018 in U.S. Appl. No. 15/815,483.
USPTO; Final Office Action dated Mar. 7, 2019 in U.S. Appl. No. 15/815,483.
USPTO; Non-Final Office Action dated Aug. 20, 2019 in U.S. Appl. No. 15/815,483.
USPTO; Final Office Action dated Jan. 13, 2020 in U.S. Appl. No. 15/815,483.
USPTO; Advisory Action dated Mar. 25, 2020 in U.S. Appl. No. 15/815,483.
USPTO; Non-Final Office Action dated Apr. 24, 2020 in U.S. Appl. No. 15/815,483.
USPTO; Non-Final Office Action dated Sep. 26, 2018 in U.S. Appl. No. 15/832,188.
USPTO; Notice of Allowance dated Dec. 5, 2017 in U.S. Appl. No. 15/832,188.
USPTO; Non-Final Office Action dated Mar. 17, 2020 in U.S. Appl. No. 15/835,328.
USPTO; Non-Final Office Action dated Feb. 20, 2020 in U.S. Appl. No. 15/835,352.
USPTO; Non-Final Office Action dated Sep. 10, 2018 in U.S. Appl. No. 15/836,547.
USPTO; Non-Final Office Action dated Mar. 13, 2019 in U.S. Appl. No. 15/836,547.
USPTO; Notice of Allowance dated Aug. 16, 2019 in U.S. Appl. No. 15/836,547.
USPTO; Non-Final Office Action dated Jul. 31, 2019 in U.S. Appl. No. 15/860,564.
USPTO; Final Office Action dated Nov. 13, 2019 in U.S. Appl. No. 15/860,564.
USPTO; Advisory Action dated Jan. 21, 2020 in U.S. Appl. No. 15/860,564.
USPTO; Non-Final Office Action dated Mar. 30, 2020 in U.S. Appl. No. 15/860,564.
USPTO; Non-Final Office Action dated Mar. 20, 2020 in U.S. Appl. No. 15/861,418.
USPTO; Final Office Action dated Jun. 11, 2020 in U.S. Appl. No. 15/861,418.
USPTO; Non-Final Office Action dated Jul. 23, 2018 in U.S. Appl. No. 15/863,340.
USPTO; Notice of Allowance dated Dec. 10, 2018 in U.S. Appl. No. 15/863,340.
USPTO; Non-Final Office Action dated Jan. 11, 2019 in U.S. Appl. No. 15/879,209.
USPTO; Non-Final Office Action dated Jan. 22, 2019 in U.S. Appl. No. 15/879,209.
USPTO; Final Office Action dated Aug. 21, 2019 in U.S. Appl. No. 15/879,209.
USPTO; Advisory Action dated Nov. 5, 2019 in U.S. Appl. No. 15/879,209.
USPTO; Notice of Allowance dated Jan. 16, 2020 in U.S. Appl. No. 15/879,209.
USPTO; Non-Final Office Action dated Apr. 17, 2019 in U.S. Appl. No. 15/886,225.
USPTO; Notice of Allowance dated Sep. 23, 2019 in U.S. Appl. No. 15/886,225.
USPTO; Non-Final Office Action dated Nov. 15, 2018 in U.S. Appl. No. 15/890,037.
USPTO; Final Office Action dated May 2, 2019 in U.S. Appl. No. 15/890,037.
USPTO; Non-Final Office Action dated Oct. 24, 2019 in U.S. Appl. No. 15/890,037.
USPTO; Final Office Action dated Feb. 26, 2020 in U.S. Appl. No. 15/890,037.
USPTO; Advisory Action dated Jun. 5, 2020 in U.S. Appl. No. 15/890,037.
USPTO; Notice of Allowance dated Feb. 8, 2019 in U.S. Appl. No. 15/892,756.
USPTO; Non-Final Office Action dated Apr. 24, 2019 in U.S. Appl. No. 15/896,986.
USPTO; Final Office Action dated Nov. 19, 2019 in U.S. Appl. No. 15/896,986.
USPTO; Advisory Action dated Feb. 7, 2020 in U.S. Appl. No. 15/896,986.
USPTO; Non-Final Office Action dated Mar. 24, 2020 in U.S. Appl. No. 15/896,986.
USPTO; Final Office Action dated Jun. 15, 2020 in U.S. Appl. No. 15/896,986.
USPTO; Non-Final Office Action dated Sep. 19, 2019 in U.S. Appl. No. 15/897,578.
USPTO; Notice of Allowance dated Mar. 27, 2020 in U.S. Appl. No. 15/897,578.
USPTO; Non-Final Office Action dated May 30, 2019 in U.S. Appl. No. 15/900,425.

(56) References Cited

OTHER PUBLICATIONS

USPTO; Notice of Allowance dated Dec. 17, 2019 in U.S. Appl. No. 15/900,425.
USPTO; Non-Final Office Action dated Mar. 8, 2019 in U.S. Appl. No. 15/917,224.
USPTO; Final Office Action dated Aug. 28, 2019 in U.S. Appl. No. 15/917,224.
USPTO; Advisory Action dated Nov. 27, 2019 in U.S. Appl. No. 15/917,224.
USPTO; Non-Final Office Action dated May 1, 2020 in U.S. Appl. No. 15/917,224.
USPTO; Non-Final Office Action dated Feb. 8, 2019 in U.S. Appl. No. 15/917,262.
USPTO; Final Office Action dated Jun. 14, 2019 in U.S. Appl. No. 15/917,262.
USPTO; Notice of Allowance dated Aug. 30, 2019 in U.S. Appl. No. 15/917,262.
USPTO; Non-Final Office Action dated Dec. 23, 2019 in U.S. Appl. No. 15/923,834.
USPTO; Final Office Action dated Mar. 12, 2020 in U.S. Appl. No. 15/923,834.
USPTO; Advisory Action dated May 15, 2020 in U.S. Appl. No. 15/923,834.
USPTO; Non-Final Office Action dated May 8, 2019 in U.S. Appl. No. 15/925,532.
USPTO; Final Office Action dated Nov. 27, 2019 in U.S. Appl. No. 15/925,532.
USPTO; Non-Final Office Action dated May 1, 2020 in U.S. Appl. No. 15/925,532.
USPTO; Non-Final Office Action dated Jul. 22, 2019 in U.S. Appl. No. 15/940,759.
USPTO; Final Office Action dated Feb. 19, 2020 in U.S. Appl. No. 15/940,759.
USPTO; Advisory Action dated Apr. 23, 2020 in U.S. Appl. No. 15/940,759.
USPTO; Non-Final Office Action dated Mar. 29, 2019 in U.S. Appl. No. 15/940,801.
USPTO; Notice of Allowance dated Aug. 26, 2019 in U.S. Appl. No. 15/940,801.
USPTO; Non-Final Rejection dated Nov. 29, 2019 in U.S. Appl. No. 15/949,990.
USPTO; Notice of Allowance dated Mar. 12, 2020 in U.S. Appl. No. 15/949,990.
USPTO; Notice of Allowance dated May 31, 2019 in U.S. Appl. No. 15/957,565.
USPTO; Non-Final Office Action dated Jan. 31, 2020 in U.S. Appl. No. 15/962,980.
USPTO; Final Office Action dated Apr. 30, 2020 in U.S. Appl. No. 15/962,980.
USPTO; Non-Final Office Action dated Apr. 2, 2020 in U.S. Appl. No. 15/974,948.
USPTO; Non-Final Office Action dated May 15, 2020 in U.S. Appl. No. 15/974,988.
USPTO; Non-Final Office Action dated Jan. 16, 2020 in U.S. Appl. No. 15/985,261.
USPTO; Notice of Allowance dated Apr. 3, 2020 in U.S. Appl. No. 15/985,261.
USPTO; Non-Final Office Action dated Apr. 19, 2019 in U.S. Appl. No. 15/985,298.
USPTO; Notice of Allowance dated Aug. 22, 2019 in U.S. Appl. No. 15/985,298.
USPTO; Non-Final Office Action dated Jun. 12, 2020 in U.S. Appl. No. 15/985,539.
USPTO; Non-Final Office Action dated Feb. 21, 2019 in U.S. Appl. No. 15/987,755.
USPTO; Notice of Allowance dated Jul. 31, 2019 in U.S. Appl. No. 15/987,755.
USPTO; Non-Final Office Action dated Feb. 20, 2020 in U.S. Appl. No. 15/996,286.
USPTO; Non-Final Office Action dated Apr. 1, 2020 in U.S. Appl. No. 15/997,445.
USPTO; Non-Final Office Action dated Mar. 3, 2020 in U.S. Appl. No. 16/000,109.
USPTO; Non-Final Office Action dated Jul. 29, 2019 in U.S. Appl. No. 16/000,125.
USPTO; Final Office Action dated Jan. 13, 2020 in U.S. Appl. No. 16/000,125.
USPTO; Advisory Action dated Apr. 3, 2020 in U.S. Appl. No. 16/000,125.
USPTO; Non-Final Office Action dated Jun. 5, 2020 in U.S. Appl. No. 16/000,125.
USPTO; Non-Final Office Action dated Apr. 22, 2020 in U.S. Appl. No. 16/000,156.
USPTO; Non-Final Office Action dated May 7, 2020 in U.S. Appl. No. 16/004,041.
USPTO; Non-Final Office Action dated Jul. 16, 2019 in U.S. Appl. No. 16/014,981.
USPTO; Non-Final Office Action dated Jan. 16, 2020 in U.S. Appl. No. 16/014,981.
USPTO; Notice of Allowance dated Jun. 24, 2020 in U.S. Appl. No. 16/014,981.
USPTO; Non-Final Office Action dated Jan. 24, 2019 in U.S. Appl. No. 16/018,692.
USPTO; Final Office Action dated Aug. 23, 2019 in U.S. Appl. No. 16/018,692.
USPTO; Non-Final Office Action dated Dec. 11, 2019 in U.S. Appl. No. 16/018,692.
USPTO; Notice of Allowance dated Jan. 30, 2020 in U.S. Appl. No. 16/018,692.
USPTO; Non-Final Office Action dated Aug. 7, 2019 in U.S. Appl. No. 16/024,390.
USPTO; Notice of Allowance dated Nov. 26, 2019 in U.S. Appl. No. 16/024,390.
USPTO; Notice of Allowance dated Apr. 9, 2019 in U.S. Appl. No. 16/026,711.
USPTO; Non-Final Office Action dated Mar. 4, 2020 in U.S. Appl. No. 16/036,692.
USPTO; Notice of Allowance dated May 26, 2020 in U.S. Appl. No. 16/036,692.
USPTO; Non-Final Office Action dated Apr. 25, 2019 in U.S. Appl. No. 16/038,024.
USPTO; Final Office Action dated Nov. 29, 2019 in U.S. Appl. No. 16/038,024.
USPTO; Advisory Action dated Feb. 28, 2020 in U.S. Appl. No. 16/038,024.
USPTO; Notice of Allowance dated Mar. 23, 2020 in U.S. Appl. No. 16/038,024.
USPTO; Non-Final Office Action dated Jul. 25, 2019 in U.S. Appl. No. 16/039,867.
USPTO; Final Office Action dated Jan. 28, 2020 in U.S. Appl. No. 16/039,867.
USPTO; Notice of Allowance dated Apr. 3, 2020 in U.S. Appl. No. 16/039,867.
USPTO; Notice of Allowance dated Jul. 10, 2019 in U.S. Appl. No. 16/046,218.
USPTO; Non-Final Office Action dated Apr. 30, 2020 in U.S. Appl. No. 16/055,532.
USPTO; Non-Final Office Action dated May 27, 2020 in U.S. Appl. No. 16/100,012.
USPTO; Non-Final Office Action dated Feb. 20, 2020 in U.S. Appl. No. 16/105,745.
USPTO; Final Office Action dated Jun. 23, 2020 in U.S. Appl. No. 16/105,745.
USPTO; Non-Final Office Action dated Feb. 24, 2020 in U.S. Appl. No. 16/105,761.
USPTO; Final Office Action dated Apr. 21, 2020 in U.S. Appl. No. 16/105,761.
USPTO; Non-Final Office Action dated Mar. 19, 2020 in U.S. Appl. No. 16/105,802.
USPTO; Final Office Action dated Jun. 26, 2020 in U.S. Appl. No. 16/105,802.

(56) References Cited

OTHER PUBLICATIONS

USPTO; Non-Final Office Action dated Mar. 16, 2020 in Application No. 16/116,708.
USPTO; Non-Final Office Action dated Feb. 6, 2020 in U.S. Appl. No. 16/117,530.
USPTO; Non-Final Office Action dated Jun. 22, 2020 in U.S. Appl. No. 16/128,282.
USPTO; Non-Final Office Action dated Apr. 21, 2020 in U.S. Appl. No. 16/130,798.
USPTO; Non-Final Office Action dated Jan. 6, 2020 in U.S. Appl. No. 16/132,142.
USPTO; Final Office Action dated Jun. 5, 2020 in U.S. Appl. No. 16/132,142.
USPTO; Non-Final Office Action dated Feb. 28, 2020 in U.S. Appl. No. 16/137,974.
USPTO; Non-Final Office Action dated Apr. 2, 2019 in U.S. Appl. No. 16/147,047.
USPTO; Final Office Action dated Sep. 25, 2019 in U.S. Appl. No. 16/147,047.
USPTO; Notice of Allowance dated Jan. 3, 2020 in U.S. Appl. No. 16/147,047.
USPTO; Non-Final Office Action dated Nov. 5, 2019 in U.S. Appl. No. 16/152,260.
USPTO; Non-Final Office Action dated Aug. 6, 2019 in U.S. Appl. No. 16/158,077.
USPTO; Final Office Action dated Mar. 2, 2020 in U.S. Appl. No. 16/158,077.
USPTO; Advisory Action dated Jun. 9, 2020 in U.S. Appl. No. 16/158,077.
USPTO; Non-Final Office Action dated Aug. 29, 2019 in U.S. Appl. No. 16/161,744.
USPTO; Final Office Action dated Mar. 17, 2020 in U.S. Appl. No. 16/161,744.
USPTO; Notice of Allowance dated Jun. 19, 2020 in U.S. Appl. No. 16/161,744.
USPTO; Non-Final Office Action dated Aug. 16, 2019 in U.S. Appl. No. 16/167,225.
USPTO; Final Office Action dated Dec. 16, 2019 in U.S. Appl. No. 16/167,225.
USPTO; Notice of Allowance dated Mar. 5, 2020 in U.S. Appl. No. 16/167,225.
USPTO; Notice of Allowance dated Apr. 17, 2019 in U.S. Appl. No. 16/171,098.
USPTO; Notice of Allowance dated May 1, 2019 in U.S. Appl. No. 16/171,098.
USPTO; Non-Final Office Action dated Apr. 2, 2019 in U.S. Appl. No. 16/188,690.
USPTO; Final Office Action dated Sep. 26, 2019 in U.S. Appl. No. 16/188,690.
USPTO; Notice of Allowance dated Dec. 16, 2019 in U.S. Appl. No. 16/188,690.
USPTO; Notice of Allowance dated Oct. 3, 2019 in U.S. Appl. No. 16/200,100.
USPTO; Non-Final Office Action dated May 29, 2020 in U.S. Appl. No. 16/205,899.
USPTO; Non-Final Office Action dated Aug. 19, 2019 in U.S. Appl. No. 16/208,062.
USPTO; Notice of Allowance dated Jan. 28, 2020 in U.S. Appl. No. 16/208,062.
USPTO; Non-Final Office Action dated Sep. 16, 2019 in U.S. Appl. No. 16/213,702.
USPTO; Notice of Allowance dated Dec. 9, 2019 in U.S. Appl. No. 16/213,702.
USPTO; Non-Final Office Action dated Jan. 8, 2020 in U.S. Appl. No. 16/219,555.
USPTO; Final Office Action dated Jun. 19, 2020 in U.S. Appl. No. 16/219,555.
USPTO; Non-Final Office Action dated Feb. 19, 2020 in U.S. Appl. No. 16/242,829.
USPTO; Final Office Action dated Jun. 15, 2020 in U.S. Appl. No. 16/242,829.
USPTO; Non-Final Office Action dated Jan. 30, 2020 in U.S. Appl. No. 16/245,006.
USPTO; Notice of Allowance dated May 29, 2020 in U.S. Appl. No. 16/245,006.
USPTO; Non-Final Office Action dated Sep. 24, 2019 in U.S. Appl. No. 16/251,534.
USPTO; Final Office Action dated Jan. 10, 2020 in U.S. Appl. No. 16/251,534.
USPTO; Advisory Action dated Apr. 3, 2020 in U.S. Appl. No. 16/251,534.
USPTO; Non-Final Office Action dated Apr. 24, 2020 in U.S. Appl. No. 16/251,534.
USPTO; Non-Final Office Action dated May 27, 2020 in U.S. Appl. No. 16/252,567.
USPTO; Non-Final Office Action dated Apr. 16, 2020 in U.S. Appl. No. 16/255,639.
USPTO; Non-Final Office Action dated Jun. 30, 2020 in U.S. Appl. No. 16/258,187.
USPTO; Non-Final Office Action dated Dec. 18, 2019 in U.S. Appl. No. 16/280,964.
USPTO; Notice of Allowance dated May 21, 2020 in U.S. Appl. No. 16/280,964.
USPTO; Non-Final Office Action dated Jan. 9, 2020 in U.S. Appl. No. 16/317,774.
USPTO; Notice of Allowance dated Apr. 15, 2020 in U.S. Appl. No. 16/317,774.
USPTO; Non-Final Office Action dated Mar. 2, 2020 in U.S. Appl. No. 16/356,394.
USPTO; Notice of Allowance dated Jun. 13, 2019 in U.S. Appl. No. 16/396,475.
USPTO; Non-Final Office Action dated Dec. 26, 2019 in U.S. Appl. No. 16/417,938.
USPTO; Notice of Allowance dated Mar. 30, 2020 in U.S. Appl. No. 16/417,938.
USPTO; Non-Final Office Action dated Dec. 31, 2019 in U.S. Appl. No. 16/427,288.
USPTO; Notice of Allowance dated Apr. 16, 2020 in U.S. Appl. No. 16/427,288.
USPTO; Non-Final Office Action dated May 12, 2020 in U.S. Appl. No. 16/454,063.
USPTO; Non-Final Office Action dated Dec. 31, 2019 in U.S. Appl. No. 16/455,406.
USPTO; Notice of Allowance dated Apr. 17, 2020 in U.S. Appl. No. 16/455,406.
USPTO; Non-Final Office Action dated Jun. 11, 2020 in U.S. Appl. No. 16/598,768.
USPTO; Final Office Action dated Jan. 10, 2020 in U.S. Appl. No. 16/674,894.
USPTO; Notice of Allowance dated Apr. 21, 2020 in U.S. Appl. No. 16/674,894.
USPTO; Non-Final Office Action dated Apr. 13, 2020 in U.S. Appl. No. 16/833,279.
USPTO; Notice of Allowance dated May 14, 2012 in U.S. Appl. No. 29/411,637.
USPTO; Notice of Allowance dated Oct. 2, 2013 in U.S. Appl. No. 29/412,887.
USPTO; Non-Final Office Action dated Mar. 16, 2015 in U.S. Appl. No. 29/447,298.
USPTO; Notice of Allowance dated Jul. 6, 2015 in U.S. Appl. No. 29/447,298.
USPTO; Notice of Allowance dated Dec. 19, 2013 in U.S. Appl. No. 29/448,094.
USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Notice of Allowance dated Jan. 12, 2015 in U.S. Appl. No. 29/481,312.
USPTO; Notice of Allowance dated Apr. 30, 2015 in U.S. Appl. No. 29/481,315.

(56) References Cited

OTHER PUBLICATIONS

USPTO; Notice of Allowance dated May 11, 2015 in U.S. Appl. No. 29/511,011.
USPTO; Notice of Allowance dated May 11, 2015 in U.S. Appl. No. 29/514,153.
USPTO; Notice of Allowance dated Dec. 14, 2015 in U.S. Appl. No. 29/514,264.
USPTO; Notice of Allowance dated Jun. 16, 2017 in U.S. Appl. No. 29/570,711.
USPTO; Non-Final Office Action dated Apr. 16, 2019 in U.S. Appl. No. 29/604,101.
USPTO; Notice of Allowance dated Oct. 30, 2019 in U.S. Appl. No. 29/604,101.
USPTO; Notice of Allowance dated Jun. 26, 2018 in U.S. Appl. No. 29/604,288.
USPTO; Ex Parte Quayle Action dated Dec. 17, 2019 in U.S. Appl. No. 29/615,000.
USPTO; Notice of Allowance dated Jun. 10, 2020 in U.S. Appl. No. 29/615,000.
USPTO; Non-Final Office Action dated Aug. 21, 2019 in U.S. Appl. No. 29/634,768.
USPTO; Notice of Allowance dated Jan. 23, 2020 in U.S. Appl. No. 29/634,768.
USPTO; Non-Final Office Action dated Feb. 20, 2019 in U.S. Appl. No. 29/646,377.
USPTO; Final Office Action dated Jul. 15, 2019 in U.S. Appl. No. 29/646,377.
USPTO; Notice of Allowance dated Nov. 14, 2019 in U.S. Appl. No. 29/646,377.
USPTO; Non-Final Office Action dated Apr. 24, 2020 in U.S. Appl. No. 29/726,623.
WIPO; International Search Report and Written Opinion dated Nov. 16, 2017 in Application No. PCT/IB2017/001015.
WIPO; International Search Report and Written Opinion dated Nov. 13, 2017 in Application No. PCT/IB2017/001050.
WIPO; International Search Report and Written Opinion dated Nov. 30, 2017 in Application No. PCT/IB2017/001070.
WIPO; International Search Report and Written Opinion dated Jan. 25, 2018 in Application No. PCT/IB2017/001262.
WIPO; International Search Report and Written Opinion dated Sep. 14, 2018 in Application No. PCT/IB2017/001640.
WIPO: International Search Report and Written Opinion dated Jun. 1, 2018 in Application No. PCT/IB2017/001644.
WIPO; International Search Report and Written Opinion dated Nov. 6, 2018 in Application No. PCT/IB2017/001652.
WIPO: International Search Report and Written Opinion dated Jun. 1, 2018 in Application No. PCT/IB2017/001656.
WIPO; International Search Report and Written Opinion dated Jan. 25, 2019 in Application No. PCT/IB2018/000192.
WIPO; International Search Report and Written Opinion dated Jul. 9, 2018 in Application No. PCT/IB2018/000419.
WIPO; International Search Report and Written Opinion dated Jan. 4, 2019 in Application No. PCT/IB2018/000936.
WIPO; International Search Report and Written Opinion dated Dec. 20, 2018 in Application No. PCT/IB2018/001003.
WIPO; International Search Report and Written Opinion dated Dec. 20, 2018 in Application No. PCT/IB2018/001022.
WIPO; International Search Report and Written Opinion dated Jun. 28, 2019 in Application No. PCT/IB2019/000084.
WIPO; International Search Report and Written Opinion dated Nov. 19, 2019 in Application No. PCT/IB2019/000127.
WIPO; International Search Report and Written Opinion dated Jan. 10, 2020 in Application No. PCT/IB2019/000729.
WIPO; International Search Report and Written Opinion dated Dec. 20, 2019 in Application No. PCT/IB2019/000805.
WIPO; International Search Report and Written Opinion dated Dec. 20, 2019 in Application No. PCT/IB2019/000817.
WIPO; International Search Report and Written Opinion dated May 23, 2019 in Application No. PCT/IB2019/050974.
WIPO; International Search Report and Written Opinion dated Apr. 17, 2019 in Application No. PCT/NL2018/050787.
WIPO; International Search Report and Written Opinion dated Apr. 29, 2019 in Application No. PCT/NL2018/050791.
WIPO; International Preliminary Report on Patentability dated Nov. 24, 2009 and International Search Report dated Jul. 31, 2008 in Application No. PCT/US2008/063919.
WIPO; International Preliminary Report on Patentability dated Feb. 24, 2010 in Application No. PCT/U S2008/074063.
WIPO; International Preliminary Report on Patentability dated Nov. 26, 2009 in Application No. PCT/US2009/043454.
WIPO; International Preliminary Report on Patentability dated Jun. 14, 2011 in Application No. PCT/U S2009/066377.
WIPO; International Search report and Written Opinion dated Nov. 12, 2010 in Application No. PCT/US2010/030126.
WIPO; International Preliminary Report on Patentability dated Oct. 11, 2011 Application No. PCT/US2010/030126.
WIPO; International Preliminary Report on Patentability dated Nov. 9, 2011 in Application No. PCT/U S20 10/033244.
WIPO; International Preliminary Report on Patentability dated Nov. 9, 2011 in Application No. PCT/U S20 10/033248.
WIPO; International Preliminary Report on Patentability dated Nov. 9, 2011 in Application No. PCT/US2010/033252.
WIPO; International Search report and Written Opinion dated Jan. 20, 2011 in Application No. PCT/US2010/045368.
WIPO; International Search report and Written Opinion dated Feb. 6, 2013 in Application No. PCT/US2012/065343.
WIPO; International Search report and Written Opinion dated Feb. 13, 2013 in Application No. PCT/US2012/065347.
Alen, "Atomic layer deposition of TaN, NbN and MoN films for Cu Metallizations," University of Helsinki Finland, 72 pages, (2005).
Arita et al. "Electrical and optical properties of germanium-doped zinc oxide thin films" Materials Transactions, vol. 45, No. 11, pp. 3180-3183 (2004).
Arnold et al., "Novel single-layer vanadium sulphide phases" 2D Materials, 5, 045009, 11 pages (2018).
Athavale et al., "Realization of Atomic Layer Etching of Silicon", Journal of Vacuum Science and Technology B, vol. 14, pp. 3702-3705 (1996).
Bark et al. "Large-area niobium disulfide thin films as transparent electrodes for devices based on two-dimensional materials," Nanoscale, published online, 7 pages (2012)
Barreca et al. "Cobalt oxide nanomaterials by vapor phase synthesis for fast and reversible lithium storage" J Phys Chem C, 114, 10054-10060 (2010).
Basuvalingam et al. "NS-WeA6—Low Temperature ALD for Phase-controlled Synthesis of 2D Transition Metal (M=Ti, Nb) di-(MX2) and Tri-(MX3) Sulfides," AVS 19th International Conference on Atomic Layer Deposition (ALD 2019)), Jul. 22, 2019, Abstract, 1 page (2019).
Bearzotti, et al., "Fast Humidity Response of a Metal Halide-Doped Novel Polymer," Sensors and Actuators B, 7, pp. 451-454, (1992).
Becker et al., "Atomic Layer Deposition of Insulating Hafnium and Zirconium Nitrides," Chem. Mater., 16, 3497-3501 (2004).
Beynet et al. "Low temperature plasma-enhanced ALD enables cost-effective spacer defined double patterning," Proceedings of SPIE, 7520, (2009).
Bhatnagar et al., "Copper Interconnect Advances to Meet Moore's Law Milestones," Solid State Technology, 52, 10 (2009).
Boscher et al., "Atmosphere Pressure Chemical Vapour Deposition of NbSe2 Thin Films on Glass" Eur. J. Inorg. Chem., pp. 1255-1259 (2006).
Buriak, "Organometallic Chemistry on Silicon and Germanium Surfaces," Chemical Reviews, 102, 5 (2002).
Cahiez et al. "Cobalt-Catalyzed cross coupling reaction between functionalized primary and secondary alkyl halides and aliphatic grignard reagents" Adv. Synth. Catal, 350, 1484-1488 (2008).
Cant et al., "Chemisorption Sites on Porous Silica Glass and on Mixed-Oxide Catalysis," Can. J. Chem. 46, 1373 (1968).
Carmalt et al., "Chemical Vapor Deposition of Niobium Disulfide Thin Films" Eur. J. Inorg. Chem., pp. 4470-4476 (2004).
Casey et al. "Chemical Vapor Deposition of Mo onto Si" J. Electrochem. Soc.: Solid State Science, 114 (2), pp. 201-204 (1967).

(56) References Cited

OTHER PUBLICATIONS

Chang et al. "Small-Subthreshold-Swing and Low-Voltage Flexible Organic Thin-Film Transistors Which Use HfLaO as the Gate Dielectric," IEEE Electron Device Letters, Feb. 2009, pp. 133-135; vol. 30, No. 2; IEEE Electron Device Society.
Chatterjee et al. "Chemical Vapor Deposition of Boron Nitride Nanosheets on Metallic Substrates via Decaborane/Ammonia Reactions", Chem. Mater. 23, pp. 4414-4416 (2011).
Chatterjee et al., "Sub-100nm Gate Length Metal Gate NMOS Transistors Fabricated by a Replacement by a Replacement Gate Process," IEEE Semiconductor Process and Device Center, 821-824 (1997).
Chen et al., "A Self-Aligned Airgap Interconnect Scheme," IEEE International Interconnect Technology Conference, vol. 1-3, 146-148 (2009).
Chen et al., "Develop Gap-fill Process of Shallow Trench Isolation in 450mm Wafer by Advanced Flowable CVD Technology for Sub-20nm Node," 2016 27th Annual Semi Advanced Semiconductor.
Cheng et al., "Effect of carrier gas on the structure and electric properties of low dielectric constant SiCOH film using trimethylsilane prepared by plasma enhanced chemical vapor deposition," Thin Solid Films vol. 469-470, pp. 178-183 (2004).
Choi et al., "Improvement of Silicon Direct Bonding using Surfaces Activated by Hydrogen Plasma Treatment," Journal of the Korean Physical Society, 37, 6, 878-881 (2000).
Choi et al., "Low Temperature Formation of Silicon Oxide Thin Films by Atomic Layer Deposition Using NH3/O2 Plasma," ECS Solid State Letters, 2(12) p. 114-p. 116 (2013).
Closser et al., "Molecular Layer Deposition of A Highly Stable Silicon Oxycarbide Thin Film Using An Organic Chlorosilane and Water," ACS Applied Materials & Interfaces 10, pp. 24266-24274.
Coates, "Process Analytical Technology: Spectroscopic Tools and Implementation Strategies for the Chemical and Pharmaceutical Industries." Blackwell Publishing Ltd, 91-132, (2005).
Conroy et al., "The Preparation and Properties of Single Crystals of the IS and 2S Polymorphs of Tantalum Disulfide" J. Solid State Chemistry, 4, pp. 345-350 (1972).
Crowell, "Chemical methods of thin film deposition: Chemical vapor deposition, atomic layer deposition, and related technologies," Journal of Vacuum Science & Technology A 21.5, (2003): S88-S95.
Cui et al., "Impact of Reductive N2/H2 Plasma on Porous Low-Dielectric Constant SiCOH Thin Films," Journal of Applied Physics 97, 113302, 1-8 (2005).
De Silva et al., "Inorganic Hardmask Development For Extreme Ultraviolet Patterning," Journal of Micro/Nanolithography, MEMS, and MOEMS 18(1) (2018).
Dingemans et al., "Comparison Between Aluminum Oxide Surface Passivation Films Deposited with Thermal Aid," Plasma Aid and Pecvd, 35th IEEE PVCS, June (2010).
Drummond et al., "Hydrophobic Radiofrequency Plasma-Deposited Polymer Films: Dielectric Properties and Surface Forces," Colloids and Surfaces A, 129-130, 117-129 (2006).
Duffey et al., "Raman Scattering from 1T-TaS2" Solid State Communications 20, pp. 617-621 (1976).
Easley et al., "Thermal Isolation of Microchip Reaction Chambers for Rapid Non-Contact DNA Amplification," J. Micromech. Microeng. 17, 1758-1766 (2007).
Elam et al., "New Insights into Sequential Infiltration Synthesis", ECS Transactions, vol. 69, pp. 147-157 (2015).
Elers et al. "Film Uniformity in Atomic Layer Deposition," Chemical Vapor Deposition, 12, pp. 13-24 (2006).
Ellis et al. "Nitrous Oxide (N2O) Processing for Silicon Oxynitride Gate Dielectrics." IBM Journal of Research and Development. 1999. 43[3], pp. 287-300. (1999).
Fallica et al., "Dynamic Absorption Coefficients of Chemically Amplified Resists and Nonchemically Amplified Resists at Extreme Ultraviolet", J. Micro/Nanolith. MEMS MOEMS 15(3), pp. 033506-1-033506-7 (2016).
"Fiji F200 200mm Thermal/Plasma ALD Systems: Installation and Use Manual." CAW-02635 Rev. 0.6 (Mar. 13, 2012). Cambridge NanoTech Inc. pp 1-164 (2012).
Fu et al., "Controlled Synthesis of Atomically Thin 1T-TaS2 for Tunable Charge Density Wave Phase Transitions" Chem. Mater. 28, pp. 7613-7618 (2016).
Ge et al., "Carbon Nanotube-Based Synthetic Gecko Tapes," Department of Polymer Science, PNAS, 10792-10795 (2007).
Ge et al. "Large-scale synthesis of NbS2 nanosheets with controlled orientation on graphene by ambient pressure CVD," Nanoscale, vol. 5, 5773-5778 (2013).
George et al., "Atomic Layer Deposition: An Overview," Chem. Rev. 110, 111-131 (2010).
Gesheva et al. "Composition and Micro structure of Black Molybdenum Photothermal Converter Layers Deposited by the Pyrolytic Hydrogen Reduction of $MoO_2Cl_2$" Thin Solid Films, 79, pp. 39-49 (1981).
Glass et al. "The Chemical Vapor Deposition of Metal Boride Thin Films from Polyhedral Cluster Species", Winter and Hoffman, Inorganic Materials Synthesis. ACS Symposium Series; American Cemical Society: Washington DC, Chapter 10, pp. 130-143 (1999).
Gole et al. "Preparation of Nickel Sulfide Thin Films and Nanocrystallites Using Nickel Furfuraldehyde Thiosemicarbazone as Single-source Precursor," Advanced Materials Research, vols. 383-390, pp. 3828-3834 (2012).
Gordon et al. "A Kinetic Model for Step Coverage by Atomic Layer Deposition in Narrow Holes or Trenches." Chemical Vapor Deposition. 9 [2], pp. 73-78 (2003).
Grill et al., "The Effect of Plasma Chemistry on the Damage Induced Porous SiCOH Dielectrics," IBM Research Division, RC23683 (W0508-008), Materials Science, 1-19 (2005).
Guan et al., "Voltage gated ion and molecule transport in engineered nanochannels: theory, fabrication and applications," Nanotechnology 25 (2014) 122001.
Gupta et al., "Charge carrier transport and electroluminescence in atomic layer deposited poly-GaN/c-Si heterojunction diodes," Journal of Applied Physics, 124, 084503 (2018).
Gupta et al., "Conversion of Metal Carbides to Carbide Derived Carbon by Reactive Ion Etching in Halogen Gas," Proceedings of SPIE—The International Society for Optical Engineering and Nanotechnologies for Space Applications, ISSN: 0277-786X (2006).
Habib et al. "Atmospheric oxygen plasma activation of silicon (100) surfaces," American Vacuum Society, 28(3), pp. 476-485 (2010).
Hamalainen et al., "Atomic Layer Deposition of Rhenium Disulfide," Adv. Mater. 30.24, 6 pages (2018).
Han et al., "van der Waals Metallic Transition Metal Dichalcogenides" Chem. Rev. 118, pp. 6297-6336 (2018).
Hansen. "A Primer on Vacuum Pressure Measurement." Vacuum Technology & Coating. Jun. 2009. pp. 36-42 (2009).
Hansen. "Speed, Pressure and Throughput: Part 1 System Diagnostics." Vacuum Technology & Coating. Sep. 2011. pp. 14-17 (2011).
Hansen. "Speed, Pressure and Throughput: Part 2 Managing Gas Flow in High Vacuum Systems." Vacuum Technology & Coating. Oct. 2011. pp. 19-22 (2011).
Hansen. "Speed, Pressure and Throughput: Part 3 Automating the Pressure Control Process." Vacuum Technology & Coating. Nov. 2011. pp. 22-25 (2011).
Hansen. "Speed, Pressure and Throughput: Part 4 Outgassing and Base Pressure." Vacuum Technology & Coating. Dec. 2011. pp. 22-25 (2011).
Hansen. "Speed, Pressure and Throughput: Part 5 Leaks and Gas Flow in Leak Detection." Vacuum Technology & Coating. Jan. 2012. pp. 18-21 (2011).
Hargreaves et al., "New Fluorides and Oxyfluorides of Rhenium," J. Chem. Soc., pp. 1099-1103 (1960).
Harrison et al., "Poly-gate Replacement Through Contact Hole (PRETCH): A New Method for High-K/ Metal Gate and Multi-Oxide Implementation on Chip," IEEE (2004).
Hayashi et al. "Spectroscopic properties of nitrogen doped hydrogenated amorphous carbon films grown by radio frequency plasma-enhanced chemical vapor deposition," Journal of Applied Physics, vol. 89, No. 12, pp. 7924-7931 (2001).

(56) References Cited

OTHER PUBLICATIONS

Heo et al., "Structural Characterization of Nanoporous Low-Dielectric Constant SiCOH Films Using Organosilane Precursors," NSTI-Nanotech, vol. 4, 122-123 (2007).
Henke et al.., "X-Ray Interactions: Photo absorption, Scattering, Transmission, and Reflection at E = 50-30,000 eV, Z = 1-92," Atomic Data and Nuclear Data Tables, 54, 181-342 (1993).
Heyne et al., "The conversion mechanism of amorphous silicon to stoichiometric WS2" J. Materials Chemistry C, 6, pp. 4122-4130 (2018).
Hossain et al., "Recent Advances in Two-Dimensional Materials with Charge Density Waves: Synthesis, Characterization and Applications" Crystals 7, 298, 19 pages (2017).
Hubert et al., "A Stacked SONOS Technology, up to 4 Levels and 6nm Crystalline Nanowires, With Gate-All-Around or Independent Gates (-Flash), Suitable for Full 3D Integration," Minatec, IEDM09-637.
Hudis, "Surface Crosslinking of Polyethylene Using a Hydrogen Glow Discharge," J. Appl. Polym. Sci., 16 (1972) 2397.
Jensen et al. "Titanium, Zirconium, and Hafnium Tetrahydroborates as "Tailored" CVD Precursors for Metal Diboride Thin Films", J. Am. Chem. Soc. 110, pp. 1643-1644 (1988).
Johansson et al. "Towards absolute asymmetric synthesis. Synthesis and crystal structure of stereochemically labile MC12 (M=CO, Ni, Cu, Zn) complexes with diamine ligands," Inorganica Chimica Acta 358, pp. 3293-3302 (2005).
Jones et al., "Growth of Aluminum Films by Low Pressure Chemical Vapour Deposition Using Tritertiarybutylaluminium," Journal of Crystal Growth 135, pp. 285-289, Elsevier Science B.V. (1994).
Jones et al., "Recent Developments in Metalorganic Precursors for Metalorganic Chemical Vapour Deposition," Journal of Crystal Growth 146, pp. 503-510, Elsevier Science B.V. (1995).
Jung et al., "Double Patterning of Contact Array with Carbon Polymer," Proc. of SPIE, 6924, 69240C, 1-10 (2008).
Jung et al. "New Mechanisms for Ozone-Based ALO Growth of High-k Dielectrics via Nitrogen-Oxygen Species" ECS Transactions, 33(2), pp. 91-99 (2010).
Katamreddy et al., "ALD and Characterization of Aluminum Oxide Deposited on Si(100) using Tris(diethylamino) Aluminum and Water Vapor," Journal of The Electrochemical Society, 153 (10).
Kern et al., "Chemically Vapor-Deposited Borophosphosilicate Glasses for Silicon Device Applications" RCE Review, 43, 3, pp. 423-457 (1982).
Kerrigan et al. "Low Temperature, Selective Atomic Layer Deposition of Cobalt Metal Films Using Bis(1,4-di-tert-butyl-l,3-diazadienyl)cobalt and Alkylamine Precursors," Chem. Materials, 29, pp. 7458-7466 (2017).
Khandelwal et al. "Low-temperature Ar/N2 remote plasma nitridation of SiO2 thin films," J. Vacuum Science & Technology A, 20(6), pp. 1989-1996 (2002).
Kim et al., "Passivation Effect on Low-k S/OC Dielectrics by H2 Plasma Treatment," Journal of the Korean Physical Society, 40, 1, 94-98 (2002).
Kim et al., "Characteristics of Low Temperature High Quality Silicon Oxide by Plasma Enhanced Atomic Layer Deposition with In-Situ Plasma Densification Process," The Electrochemical Society, ECS Transactions, College of Information and Communication Engineering, Sungkyunkwan University, 53(1), 321-329 (2013).
Kim et al., "Novel Flowable CVD Process Technology for sub-20nm Interlayer Dielectrics," IEEE International Interconnect Technology Conference (IITC 2012), San Jose, California, USA, Jun. 4-6, 2012, pp. 1-3 (2012).
King, Plasma Enhanced Atomic Layer Deposition of SiNx: H and SiO2, J. Vac. Sci. Technol., A29(4) (2011).
Kliem et al. "Silyl Group Migrations Between Oxygen and Nitrogen in Aminosiloxanes"; Organosilicon Chemistry VI: from Molecules to Materials; pp. 216-221 (2005).
Klug et al., "Atomic Layer Deposition of Amorphous Niobium Carbide-Based Thin Film Superconductors," The Journal of Physical Chemistry C, vol. 115, pp. 25063-25071, (2011).
Kobayshi, et al., "Temperature Dependence of SiO2 Film Growth with Plasma-Enhanced Atomic Layer Deposition," regarding Thin Solid Films, published by Elsevier in the International Journal on the Science and Technology of Condensed Matter, in vol. 520, No. 11, 3994-3998 (2012).
Kogelschatz et al. "Ozone Generation from Oxygen and Air: Discharge Physics And Reaction Mechanisms" Ozone Science & Engineering, 10, pp. 367-378 (1998).
Koo et al., "Characteristics of Al2O3 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).
Koutsokeras et al. "Texture and Microstructure Evolution in Single-Phase TixTa1-xN Alloys of Rocksalt Structure," Journal of Applied Physics, 110, pp. 043535-1-043535-6, (2011).
Knoops et al., "Atomic Layer Deposition of Silicon Nitride from Bis(tert-butyloamino) silane and N2 Plasma," Applied Materials & Interfaces, American Chemical Society, A-E (2015).
Krenek et al. "IR Laser CVD of Nanodisperse Ge—Si—Sn Alloys Obtained by Dielectric Breakdown of GeH4/SiH4/SnH4 Mixtures", NanoCon 2014, Nov. 5-7, Brno, Czech Republic, EU.
Kucheyev et al. "Mechanisms of Atomic Layer Deposition on Substrates with Ultrahigh Aspect Ratios." Langmuir. 24 [3], pp. 943-948 (2008).
Kukli et al., "Influence of atomic layer deposition parameters on the phase content of Ta2O5 films" J. Crystal Growth, 212, pp. 459-468 (2000).
Kukli et al., "Properties of hafnium oxide films grown by atomic layer deposition from hafnium tetraiodide and oxygen". Journal of Applied Physics, vol. 92, No. 10, Nov. 15, 2002, pp. 5698-5703 (2002).
Kukli et al. "Properties of tantalum oxide thin films grown by atomic layer deposition" Thin Solid Films, 260, pp. 135-142 (1995).
Kurosawa et al., "Synthesis and Characterization of Plasma-Polymerized Hexamethyldisiloxane Films," Thin Solid Films, 506-507, 176-179 (2006).
Kwon et al., "Substrate Selectivity of (tBu-Allyl)Co(CO)3 during Thermal Atomic Layer Deposition of Cobalt," Chem. Materials, 24, pp. 1025-1030 (2012).
Lanford et al., "The Hydrogen Content of Plasmadeposited Silicon Nitride," J. Appl. Phys., 49, 2473 (1978).
Lee et al., "Characteristics of Low-K Sioc Films Deposited Via Atomic Layer Deposition," Thin Solid Films 645, pp. 334-339 (2018).
Lee et al., Layer Selection by Multi-Level Permutation in 3-D Stacked NAND Flash Memory, IEEE Electron Device Letters, vol. 37, No. 7, 866-869 (2016).
Levy et al., "Reflow Mechanisms of Contact Vias in VLSI Processing" J. Electrochem. Soc.: Solid-State Science and Technology, 133, 7, pp. 1417-1424 (1986).
Lewis et al. "Hawley's Condensed Chemical Dictionary" 12th Edition; excerpt pp. 1027-1038 (2005).
Li et al., "Metallic Transition-Metal Dichalcogenide Nanocatalysts for Energy Conversion" Chem. 4, pp. 1510-1537 (2018).
Liang et al. "Conversion of Metal Carbides to Carbide Derived Carbon by Reactive Ion Etching in Halogen Gas" Micro (MEMS) and Nantoechnologies for Space Applications, Thomas George et al. vol. 6223, 2006 p. 62230J-I to 62230J-11 lines 3-14 in the "Abstract" section and lines 7-9 in the "Introduction" section of p. 1, lines 3-4 in the "Introduction" section and lines 3-4 in the "Experimental Procedure" section of p. 2 (2006).
Lieberman, et al., "Principles of Plasma Discharges and Materials Processing," Second Edition, 368-381 (2005).
Lim et al., "Low-Temperature Growth of SiO2 Films by Plasma-Enhanced Atomic Layer Deposition," ETRI Journal, 27 (1), 118-121 (2005).
Lim et al. "Synthesis and Characterization of Volatile, Thermally Stable, Reactive Transistion Metal Amidinates," Inorg. Chem., 42, pp. 7951-7958 (2003).
Liu et al., "Research, Design, and Experiment of End Effector for Wafer Transfer Robot," Industrial Robot: An International Journal, 79-91 (2012).

(56) References Cited

OTHER PUBLICATIONS

Liu et al., "Van der Waals metal-semiconductor junction: Weak Fermi level pinning enables effective tuning of Schottky barrier" Sci. Adv. 2: e1600069, 7 pages (2016).
Londergan et al. "Engineered Low Resistivity Titanium-Tantalum Nitride Films by Atomic Layer Deposition," Mat. Res. Soc. Symp. Proc., vol. 714E, pp. L5.3.1-L5.3.6 (2001).
Longrie et al., "Plasma-Enhanced ALD of Platinum with O2, N2 and NH3 Plasmas", ECS Journal of Solid State Science and Technology, vol. 1, pp. Q123-Q129 (2012).
Mackenzie et al. "Stress Control of Si-Based PEVCD Dielectrics," Proc. Symp. Silicon Nitrode and Silicon Dioxide Thin Insulating Films & Other Emerging Dielectrics VIII, 148-159 (2005).
Mackus et al., "Optical Emission Spectroscopy as a Tool for Studying Optimizing and Monitoring Plasma-Assisted Atomic Layer Deposition Processes," Journal of Vacuum Science and Technology, 77-87 (2010).
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea (2008).
Maeno, "Gecko Tape Using Carbon Nanotubes," Nitto Denko Gihou, 47, 48-51 (2009).
Makela et al. "Thermal Atomic Layer Deposition of Continuous and Highly Conducting Gold Thin Films," Chem. Materials, 29, pp. 6130-6136 (2017).
Marsik et al., "Effect of Ultraviolet Curing Wavelength on Low-k Dielectric Material Properties and Plasma Damage Resistance," Sciencedirect.com, 519, 11, 3619-3626 (2011).
Mason et al., "Hydrolysis of Tri-tert-butylaluminum: The First Structural Characterization of Alkylalumoxanes [(R2A1)2O]n and (RAIO)n," J. American Chemical Society, vol. 115, No. 12, pp. 4971-4984 (1993).
Massachusetts Institute of Technology Lincoln Laboratory, "Solid State Research," Quarterly Technical Report (1995).
Mattinen et al., "Crystalline tungsten sulfide thin films by atomic layer deposition and mild annealing" J. Vac. Sci. Tech. 37, 020921, 35 pages (2019).
Maydannik et al., "Spatial atomic layer deposition: Performance of low temperature H2O and 03oxidant chemistry for flexible electronics encapsulation", Journal of Vacuum Science and Technology: Part A AVS/ AIP, vol. 33 (1901).
Meng et al., "Atomic Layer of Deposition of Silicon Nitride Thin Films: A Review of Recent Progress, Challenges, and Outlooks," Materials, 9, 1007 (2016).
Miller et al. "Carbon nitrides: synthesis and characterization of a new class of functional materials," Phys.Chem.Chem.Phys., 19, pp. 15613-15638 (2017).
Mix et al., "Characterization of plasma-polymerized allyl alcohol polymers and copolymers with styrene," Adhes. Sci. Technol., 21 (2007), S. 487-507.
Moeen, "Design, Modelling and Characterization of Si/SiGe Structures for IR Bolometer Applications," KTH Royal Institute of Technology. Information and Communication Technology, Department of Integrated Devices and Circuits, Stockholm Sweden (2015).
Morishige et al., "Thermal Desorption and Infrared Studies of Ammonia Amines and Pyridines Chemisorbed on Chromic Oxide," J. Chem. Soc., Faraday Trans. 1, 78, 2947-2957 (1982).
Mosleh et al., "Enhancement of Material Quality of (Si)GeSn Films Grown by SnC14 Precursor," ECS Transactions, 69 (5), 279-285 (2015).
Mukai et al., "A Study of CD Budget in Spacer Patterning Technology," Proc. of SPIE, 6924, 1-8 (2008).
Naito et al. "Electrical Transport Properties in 2H-NbS2, -NbSe2, -TaS2 and -TaSe2," J. of Physical Society of Japan, vol. 51, No. 1, 219-227 (1982).
Nakano et al., "Layer-by-Layer Epitaxial Growth of Scalable WSe2 on Sapphire by Molecular Beam Epitaxy" Nano. Lett. 17, pp. 5595-5599 (2017).
Ngo et al. "Atomic layer deposition of photoactive CoO/SrTiO3 and CoO/TiO2 on Si(001) for visible light driven photoelectrochemical water oxidation," J. Applied Physics, 114, 9 pages (2013).
Nogueira et al., "Production of Highly Hydrophobic Films Using Low Frequency and High Density Plasma," Revista Brasileira de Aplicacoes de Vacuo, 25(1), 45-53 (2006).
Novaro et al. Theoretical Study on a Reaction Pathway of Ziegler-Natta-Type Catalysis, J. Chem. Phys. 68(5), Mar. 1, 1978 pp. 2337-2351.
Ohchi et al. "Reducing damage to Si substrates during gate etching processes." Japanese Journal of Applied Physics 47.7R 5324 (2008).
Ohtsu et al. "Influences of Gap Distance on Plasma Characteristics in Narrow Gap Capacitatively Coupled Radio-Frequency Discharge," vol. 43, No. 2, pp. 795-799 (2004).
Okamoto et al., "Luminescent Properties of Pr3+—sensitized LaPO4: Gd3+ Ultraviolet-B Phosphor Under Vacuum-Ultraviolet Light Excitation," J. App. Phys. 106, 013522 (2009).
Park, "Substituted Aluminum Metal Gate on High-K Dielectric for Low Work-Function and Fermi-Level Pinning Free," 4 pages, IEEE 0-7803-8684-1/04 (2004).
Peters et al., "Aerosol-Assisted Chemical Vapor Deposition of NbS2 and TaS2 Thin Films from Pentakis(dimethylamido)metal Complexes and 2-Methylpropanethiol" Eur. J. Inorg. Chem., pp. 4179.
Pichler. "Intrinsic Point Defects, Impurities and Their Diffusion in Silicon," Springer-Verlag Wien, p. 367 (2004).
Portet et al., "Impact of Synthesis Conditions on Surface Chemistry and Structure of Carbide-Derived Carbons," Thermochimica Acta, 497, 137-142 (2010).
Potts et al., "Low Temperature Plasma-Enhanced Atomic Layer Deposition of metal Oxide Thin Films," Journal of the Electrochemical Society, 157, 66-74 (2010).
Potts et al., "Room-Temperature ALD of Metal Oxide Thin Films by Energy-Enhanced ALD", Chemical Vapor Deposition, vol. 19, pp. 125-133 (2013).
Presser, et al., "Effect of Pore Size on Carbon Dioxide Sorption by Carbide Derived Carbon," Energy & Environmental Science 4.8, 3059-3066 (2011).
Pro Vine et al., "Correlation of Film Density and Wet Etch Rate in Hydrofluoric Acid of Plasma Enhanced Atomic Layer Deposited Silicon Nitride," AIP Advances, 6 (2016).
Qin et al., "Chemical Vapor Deposition Growth of Degenerate p-Type Mo-Doped ReS2 Films and Their Homojunction," ACS Appl. Mater. Interfaces, 9(18), pp. 15583-15591 (2007).
Radamson et al. "Growth of Sn-alloyed Group IV Materials for Photonic and Electronic Applications" Chapter 5 pp. 129-144, Manufacturing Nano Structures (2014).
Roddy, "Transport Reactions and Vaporization Studies of Some Vanadium Halides", Iowa State university of Science and Technology dissertation, 207 pages (1962).
Rossing et al. "Acoustics of Eastern and Western bells, Old and New" J of Acoustical Society of Japan; 10(5); pp. 241-252 (1989).
Ryu et al., "Persistent Charge-Density-Wave Order in Single-Layer TaSe2" Nano. Lett. 18, pp. 689-694 (2018).
Saeki et al. "Reaction Process of Vanadium Tetrachloride with Ammonia in the Vapor Phase and Properties of the Vanadium Nitride Formed" Bull. Chem. Soc. Jpn., 55, pp. 3446-3449 (1982).
Sakuma et al., "Highly Scalable Horizontal Channel 3-D NAND Memory Excellent in Compatibility with Conventional Fabrication Technology," IEEE Electron Device Letters, vol. 34, No. 9, 1142-1144 (2013).
Salim, "In-situ Fourier Transform Infrared Spectroscopy of Chemistry and Growth in Chemical Vapor Deposition," Massachusetts Institute of Technology, 187 pages (1995).
Salim et al., "In Situ Concentration Monitoring in a Vertical OMVPE Reactor by Fiber-Optics-Based Fourier Transform Infrared Spectroscopy," Journal of Crystal Growth 169, pp. 443-449, Elsevier Science B.V. (1996).
Samal et al., "Low-Temperature (<200° C.) Plasma Enhanced Atomic Deposition of Dense Titanium Nitride Thin Films" (2012).

(56) References Cited

OTHER PUBLICATIONS

Sanders et al., "Crystalline and electronic structure of single-layer $TaS_2$," Phys. Rev. B. 94, 081404, 6 pages (2016).
Schindler, Dissertation, Next Generation High-k Dielectrics for DRAM Produced by Atomic Layer Deposition Studied by Transmission Electron Microscopy (2015).
Schmatz et al., "Unusual Isomerization Reactions in 1.3-Diaza-2-Silcyclopentanes," Organometallics, 23, 1180-1182 (2004).
Sellers, Making Your Own Timber Dogs, Paul Sellers blog, Published on Nov. 18, 2014, [online], [site visted Jun. 10, 2017], Available from Internet, <URL: https://paulsellers.com/2014/11/making-your-own-timber-dogs/>.
Selvaraj et al., "Selective Atomic Layer Deposition of Zirconia on Copper Patterned Silicon Substrates Using Ethanol as Oxygen Source as Well as Copper Reductant," J. Vac. Sci. Technol. A32(1), (2014).
Selvaraj et al., "Surface Selective Atomic Layer Deposition of Hafnium Oxide for Copper Diffusion Barrier Application Using Tetrakis (diethylamino) Hafnium and Ethanol," 225th ECS Meeting, Meeting Abstract, (May 12, 2014).
Seshadri et al., "Ultrathin Extreme Ultraviolet Patterning Stack Using Polymer Brush As An Adhesion Promotion Layer," Journal of Micro/Nanolithography, MEMS, and MOEMS 16(3) (2017).
Shamma et al., "PDL Oxide Enabled Doubling," Proc. of SPIE, 6924, 69240D, 1-10 (2008).
Simchi et al., "Sulfidation of 2D transition metals (Mo, W, Re, Nb, Ta): thermodynamics, processing, and characterization" J. Materials Science 52: 17, 9 pages (2017).
Spear et al., "Chemical Transport Reactions in the Vanadium-Silicon-Oxygen System and the Ternary Phase Diagram", Journal of the Less-Common Metals, 14, pp. 69-75 (1968).
Stanley et al. "Feedgas for Modern High-Performance Ozone Generators" Ozonia Ltd., Duebendorf, Switzerland. 7 pages. Available Jul. 14, 2017 online at: http://www.degremont-technologies.com/cms_medias/pdf/tech_ozonia_feedgas.pdf (1999).
Su et al. "A Polymer Precursor Route to Metal Borides", Chem. Mater., 5, pp. 1659-1668 (1993).
Svetin et al., "Three-dimensional resistivity and switching between correlated electronic states in 1T-$TaS_2$" Nature, Scientific Reports Apr. 12, 2017, 7:46048, 10 pages (2017).
Tatehaba et al., "Adhesion Energy of Polystyrene and Substrate in Function Water," 5th International Symposium of Cleaning Technology in Semiconductor Device Manufacturing, pp. 560-565 (1998).
Tidman et al. "Resistivity of thin TaS2 crystals," Can. J. Phys., vol. 54, 2306-2309 (1976).
Todi et al., "Characterization of Pt-Ru Binary Alloy Thin Films for Work Function Tuning," IEEE Electron Device Letters, vol. 27, No. 7, pp. 542-545 (2006).
Trumbore et al. "Solid solubilities of aluminum and gallium in germanium," J. of Physics and Chemistry of Solids, vol. 11, Issues 3-4, 239-240 (1959).
Tseng et al., "Etch Properties of Resists Modified by Sequential Infiltration Synthesis," American Vacuum Society (2011).
Tseng et al., "Enhanced Block Copolymer Lithography Using Sequntial Infiltration Synthesis," Journal of Physical Chemistry, vol. 5, 17725-17729 (2011).
Ueda et al. "Enhanced Sidewall Grown (ESG) process: towards PEALD with conformality above 100%," Extended Abstracts of the 2011 International Conference on Solid State Devices and Materials, Nagoya, pp. 34-35 (2011).
Varma, et al., "Effect of Metal Halides on Thermal, Mechanical, and Electrical Properties of Polypyromelitimide Films," Journal of Applied Polymer Science, vol. 32, pp. 3987-4000, (1986).
Vasilev, "Borophosphosilicate Glass Films in Silicon Microelectronics, Part 1: Chemical Vapor Deposition, Composition, and Properties" Russian Microelectronics, vol. 33, No. 5, pp. 271-284 (2004).
Voltaix, "Meterial Safety Data Sheet for: Trisilylamine", pp. 1-8, (2014).
Wang et al., "Tritertiarybutylaluminum as an Organometallic Source for Epitaxial Growth of AlGaSb," Appl. Phys. Lett. 67 (10), Sep. 4, pp. 1384-1386, American Institute of Physics (1995).
Wirths, et al., "SiGeSn Growth tudies Using Reduced Pressure Chemical Vapor Deposition Towards Optoeleconic Applications," This Soid Films, 557, 183-187 (2014).
Xing et al., "Ising Superconductivity and Quantum Phase Transition in Macro-Size Monolayer NbSe2" Nano. Lett. 17, pp. 6802-6807 (2017).
Xu et al., "14NM Metal Gate Film Stack Development and Challenges," SMIC et al. (2016).
Xu et al., "Contacts between Two- and Three-Dimensional Materials: Ochmic, Schottky, and p-n Heterojunctions" ACS Nano 10, pp. 4895-4919 (2016).
Yoshida, et al., Threshold Voltage Tuning for 10NM and Beyond CMOS Integration, Solid State Technology, 57(7): 23-25 (2014).
Yu et al., "Modulation of the Ni FUSI Workfunction by Yb Doping: from Midgap to N-Type Band-Edge," 4 pages, IEEE 0-7803-9269-8/05 (2005).
Yuan et al., "Facile Synthesis of Single Crystal Vanadium Disulfide Nanosheets by Chemical Vapor Deposition for Efficient Hydrogen Evolution Reaction" Adv. Mater. 27, pp. 5605-5609 (2015).
Yun et al., "Behavior of Various Organosilicon Molecules in PECVD Processes for Hydrocarbon-Doped Silicon Oxide Films," Solid State Phenomena, vol. 124-126, 347-350 (2007).
Yun et al., "Comparison of Atomic Scale Etching of Poly-Si in Inductively Coupled Ar and He Plasmas", Korean Journal of Chemical Engineering, vol. 24, 670-673 (2007).
Yun et al., "Single-Crystalline Si Stacked Array (Star) NAND Flash Memory," IEEE Transactions on Electron Devices, vol. 58, No. 4, 1006-1014 (2011).
Yun et al., "Effect of Plasma on Characteristics of Zirconium Oxide Films Deposited by Plasma-Enhanced Atomic Layer Deposition," Electrochemical and Solid State Letters, 8(11) F47-F50 (2005).
Yushin et al., "Carbon-Derived Carbon," Department of Materials Science and Engineering, Taylor & Francis Group, LLC (2006).
Zhou et al., "A library of atomically thin metal chalcogenides" Nature 556, pp. 355-361 (2018).
Chemistry Stack Exchange, "Why is CF4 Non-Polar and CHF Polar," https://chemistry.stackexchange.com/questions/31604/why-is-cf4-non-polar-and-chf3-polar, (2015).
Crystal IS "Application Note: Using UV Reflective Materials to Maximize Disinfection"; AN011; Jun. 16, 2016.
IPS Water Heater Pan Adapter Kit, Nov. 1, 2015, [online], [site visited Dec. 4, 2019]; URL: http://es.ipscorp.com/watertite/protectivesystem/whpanadapter (2015).
"Polyurethane_HF"; webpage; no date. Cited in Notice of References dated May 18, 2017 in U.S. Appl. No. 14/884,695.
Rhenium trioxide; https://en.wikipedia.org/wiki/Rhenium trioxide [online]; last edited on Feb. 18, 2017.
Scientific and Technical Information Center EIC 2800 Search Report dated Feb. 16, 2012.
CNIPA; Office Action dated Oct. 16, 2020 in Application No. 201610131743.1.
CNIPA; Office Action dated Jun. 16, 2020 in Application No. 201610897958.4.
CNIPA; Office Action dated Jul. 3, 2020 in Application No. 201610898822.5.
CNIPA; Notice of Allowance dated Oct. 9, 2020 in Application No. 2016108988225.
CNIPA; Notice of Allowance dated Nov. 4, 2020 in Application No. 201710173292.2.
CNIPA; Office Action dated Aug. 31, 2020 in Application No. 201780044761.9.
CNIPA; Office Action dated Apr. 27, 2020 in Application No. 201810379112.0.
CNIPA; Office Action dated Apr. 27, 2020 in Application No. 201810836604.8.
CNIPA; Office Action dated Jul. 30, 2020 in Application No. 201810836604.8.
CNIPA; Office Action dated Apr. 22, 2020 in Application No. 201810994464.7.

(56) References Cited

OTHER PUBLICATIONS

CNIPA; Notice of Allowance dated Aug. 7, 2020 in Application No. 202030053609.1.
EPO; Office Action dated Jul. 29, 2008 in Application No. 00902194.0.
EPO; Office Action dated Jun. 27, 2003 in Application No. 97929595.3.
EPO; Office Action dated Feb. 18, 2004 in Application No. 97929595.3.
EPO; Notice of Allowance dated Apr. 29, 2004 in Application No. 97929595.3.
EPO; Notice of Allowance dated Jan. 10, 2001 in Application No. 98911263.6.
EPO; Office Action dated Jun. 6, 2001 in Application No. 98911277.6.
EPO; Office Action dated Jun. 27, 2003 in Application No. 98967122.7.
EPO; Notice of Allowance dated Feb. 23, 2004 in Application No. 98967122.7.
EPO; Office Action dated Sep. 22, 2003 in Application No. 99946447.2.
EPO; Office Action dated Nov. 25, 2003 in Application No. 99946447.2.
EPO; Office Action dated Mar. 30, 2004 in Application No. 99946447.2.
EPO; Office Action dated Jul. 19, 2004 in Application No. 99946447.2.
EPO; Notice of Allowance dated Sep. 22, 2004 in Application No. 99946447.2.
EPO; Supplementary European Search Report dated May 27, 2002 in Application No. 99973123.
EPO; Notice of Allowance dated Jun. 11, 2004 in Application No. 99973123.
JPO; Office Action dated Jun. 1, 2020 in Application No. 2016-206625.
JPO; Office Action dated Aug. 28, 2020 in Application No. 2017-139817.
JPO; Notice of Allowance dated Jul. 1, 2020 in Application No. 2019-025168.
JPO; Office Action dated Aug. 24, 2020 in Application No. 2019-119908.
JPO; Office Action dated Jun. 29, 2020 in Application No. 2020-502653.
KIPO; Decision of Intellectual Property Trial and Appeal Board dated Jun. 23, 2020 in Application No. 10-2012-0076564.
KIPO; Notice of Allowance dated Sep. 25, 2020 in Application No. 10-2013-0049598.
KIPO; Notice of Allowance dated Aug. 13, 2020 in Application No. 10-2013-0098575.
KIPO; Notice of Allowance dated Oct. 27, 2020 in Application No. 10-2014-0011764.
KIPO; Office Action dated Jul. 21, 2020 in Application No. 10-2014-0011765.
KIPO; Notice of Allowance dated Sep. 8, 2020 in Application No. 10-2014-0021615.
KIPO; Office Action dated Oct. 26, 2020 in Application No. 10-2014-0027217.
KIPO; Notice of Allowance dated Oct. 12, 2020 in Application No. 10-2014-0027305.
KIPO; Office Action dated Jul. 9, 2020 in Application No. 10-2014-0060120.
KIPO; Office Action dated Aug. 18, 2020 in Application No. 10-2014-0071653.
KIPO; Notice of Allowance dated Oct. 19, 2020 in Application No. 10-2014-0086902.
KIPO; Notice of Allowance dated Sep. 27, 2020 in Application No. 10-2014-0091092.
KIPO; Office Action dated Oct. 5, 2020 in Application No. 10-2014-0103853.
KIPO; Office Action dated Oct. 7, 2020 in Application No. 10-2014-0128626.
KIPO; Office Action dated Jul. 21, 2020 in Application No. 10-2017-0087308.
KIPO; Notice of Allowance dated Oct. 26, 2020 in Application No. 10-2017-0087308.
KIPO; Office Action dated Jun. 30, 2020 in Application No. 10-2019-0044213.
KIPO; Notice of Allowance dated Oct. 28, 2020 in Application No. 10-2020-0009462.
KIPO; Notice of Allowance dated Jul. 20, 2020 in Application No. 10-2020-7000992.
KIPO; Notice of Allowance dated Oct. 20, 2020 in Application No. 30-2019-0054013 M001.
KIPO; Notice of Allowance dated Oct. 20, 2020 in Application No. 30-2019-0054013 M002.
KIPO; Notice of Allowance dated Oct. 22, 2020 in Application No. 30-2019-0058076.
TIPO; Notice of Allowance dated Jul. 1, 2020 in Application No. 105101537.
TIPO; Notice of Allowance dated Sep. 4, 2020 in Application No. 105111990.
TIPO; Office Action dated Sep. 7, 2020 in Application No. 105122394.
TIPO; Notice of Allowance dated Aug. 31, 2020 in Application No. 105122586.
TIPO; Office Action dated Sep. 18, 2020 in Application No. 105129977.
TIPO; Notice of Allowance dated Sep. 25, 2020 in Application No. 105130130.
TIPO; Office Action Received Aug. 25, 2020 in Application No. 105131284.
TIPO; Office Action dated Aug. 25, 2020 in Application No. 105131896.
TIPO; Office Action dated Sep. 30, 2020 in Application No. 105142668.
TIPO; Office Action dated Aug. 11, 2020 in Application No. 106100823.
TIPO; Office Action dated Jun. 17, 2020 in Application No. 106108152.
TIPO; Office Action dated Oct. 7, 2020 in Application No. 106108522.
TIPO; Office Action dated Aug. 21, 2020 in Application No. 106111548.
TIPO; Office Action dated Oct. 8, 2020 in Application No. 106111693.
TIPO; Office Action dated Sep. 30, 2020 in Application No. 106113604.
TIPO; Office Action dated Jul. 15, 2020 in Application No. 106120365.
TIPO; Office Action dated Nov. 12, 2020 in Application No. 106120365.
TIPO; Office Action dated Nov. 18, 2020 in Application No. 106120902.
TIPO; Office Action dated Oct. 8, 2020 in Application No. 106123203.
TIPO; Office Action dated Jun. 24, 2020 in Application No. 108135004.
TIPO; Office Action dated Jun. 29, 2020 in Application No. 108137226.
TIPO; Office Action dated Jul. 9, 2020 in Application No. 108137227.
TIPO; Office Action dated Aug. 17, 2020 in Application No. 108139018.
TIPO; Notice of Allowance dated Oct. 19, 2020 in Application No. 108306935.
TIPO; Notice of Allowance dated Oct. 19, 2020 in Application No. 108306935D01.
TIPO; Notice of Allowance dated Jul. 15, 2020 in Application No. 108307027.
TIPO; Notice of Allowance dated Oct. 19, 2020 in Application No. 108307027D01.
TIPO; Notice of Allowance dated Sep. 15, 2020 in Application No. 108307301.
TIPO; Notice of Allowance dated Sep. 25, 2020 in Application No. 108307759.
USPTO; Non-Final Office Action dated Mar. 28, 2001 in U.S. Appl. No. 09/452,844.
USPTO; Final Office Action dated Sep. 11, 2001 in U.S. Appl. No. 09/452,844.
USPTO; Advisory Action dated Jan. 24, 2002 in U.S. Appl. No. 09/452,844.

(56) References Cited

OTHER PUBLICATIONS

USPTO; Non-Final Office Action dated Apr. 9, 2002 in U.S. Appl. No. 09/452,844.
USPTO; Final Office Action dated Sep. 27, 2002 in U.S. Appl. No. 09/452,844.
USPTO; Notice of Allowance dated Jun. 17, 2003 in U.S. Appl. No. 09/452,844.
USPTO; Non-Final Office Action dated Oct. 31, 2003 in U.S. Appl. No. 09/452,844.
USPTO; Notice of Allowance dated Mar. 26, 2004 in U.S. Appl. No. 09/452,844.
USPTO; Non-Final Office Action dated Dec. 10, 2002 in U.S. Appl. No. 09/771,673.
USPTO; Final Office Action dated May 29, 2003 in U.S. Appl. No. 09/771,673.
USPTO; Final Office Action dated Feb. 6, 2004 in U.S. Appl. No. 09/771,673.
USPTO; Advisory Action dated Apr. 20, 2004 in U.S. Appl. No. 09/771,673.
USPTO; Notice of Allowance dated Jul. 29, 2004 in U.S. Appl. No. 09/771,673.
USPTO; Non-Final Office Action dated Jan. 3, 2002 in U.S. Appl. No. 09/807,580.
USPTO; Final Office Action dated Jun. 21, 2002 in U.S. Appl. No. 09/807,580.
USPTO; Advisory Action dated Aug. 27, 2002 in U.S. Appl. No. 09/807,580.
USPTO; Non-Final Action dated Nov. 27, 2002 in U.S. Appl. No. 09/807,580.
USPTO; Final Office Action dated May 27, 2003 in U.S. Appl. No. 09/807,580.
USPTO; Advisory Action dated Oct. 22, 2003 in U.S. Appl. No. 09/807,580.
USPTO; Examiner's Answer to Appeal Brief dated May 6, 2004 in U.S. Appl. No. 09/807,580.
USPTO; Decision on Appeal dated Feb. 16, 2005 in U.S. Appl. No. 09/807,580.
USPTO; Non-Final Action dated May 19, 2005 in U.S. Appl. No. 09/807,580.
USPTO; Final Action dated Nov. 21, 2005 in U.S. Appl. No. 09/807,580.
USPTO; Notice of Allowance dated Feb. 23, 2006 in U.S. Appl. No. 09/807,580.
USPTO; Non-Final Office Action dated Feb. 9, 2004 in U.S. Appl. No. 10/603,515.
USPTO; Notice of Allowance dated Jun. 18, 2004 in U.S. Appl. No. 10/603,515.
USPTO; Non-Final Office Action dated Oct. 17, 2006 in U.S. Appl. No. 10/932,633.
USPTO; Non-Final Office Action dated Apr. 19, 2007 in U.S. Appl. No. 10/932,633.
USPTO; Notice of Allowance dated Sep. 10, 2007 in U.S. Appl. No. 10/932,633.
USPTO; Notice of Allowance dated Jul. 6, 2020 in U.S. Appl. No. 13/184,351.
USPTO; Examiner's Answer to Appeal Brief dated Apr. 20, 2018 in U.S. Appl. No. 13/187,300.
USPTO; Patent Board Decision dated Sep. 23, 2019 in U.S. Appl. No. 13/187,300.
USPTO; Advisory Action dated Nov. 10, 2015 in U.S. Appl. No. 14/079,302.
USPTO; Notice of Allowance dated Sep. 3, 2020 in U.S. Appl. No. 14/444,744.
USPTO; Notice of Allowance dated Aug. 6, 2020 in U.S. Appl. No. 14/457,058.
USPTO; Final Office Action dated Aug. 20, 2020 in U.S. Appl. No. 14/508,489.
USPTO; Notice of Allowance dated Nov. 3, 2020 in U.S. Appl. No. 14/508,489.
USPTO; Non-Final Office Action dated Aug. 3, 2020 in U.S. Appl. No. 14/829,565.
USPTO; Notice of Allowance dated Aug. 18, 2020 in U.S. Appl. No. 15/135,258.
USPTO; Non-Final Office Action dated Oct. 6, 2020 in U.S. Appl. No. 15/262,990.
USPTO; Final Office Action dated Oct. 2, 2020 in U.S. Appl. No. 15/286,503.
USPTO; Non-Final Office Action dated Sep. 2, 2020 in U.S. Appl. No. 15/377,439.
USPTO; Non-Final Office Action dated Jul. 1, 2020 in U.S. Appl. No. 15/380,909.
USPTO; Final Office Action dated Jul. 23, 2020 in U.S. Appl. No. 15/380,921.
USPTO; Final Office Action dated Sep. 8, 2020 in U.S. Appl. No. 15/402,993.
USPTO; Advisory Action dated Nov. 9, 2020 in U.S. Appl. No. 15/402,993.
USPTO; Non-Final Office Action dated Sep. 30, 2020 in U.S. Appl. No. 15/491,726.
USPTO; Final Office Action dated Jul. 8, 2020 in U.S. Appl. No. 15/589,861.
USPTO; Notice of Allowance dated Oct. 16, 2020 in U.S. Appl. No. 15/589,861.
USPTO; Final Office Action dated Sep. 16, 2020 in U.S. Appl. No. 15/611,707.
USPTO; Advisory Action dated Nov. 20, 2020 in U.S. Appl. No. 15/611,707.
USPTO; Non-Final Office Action dated Sep. 3, 2020 in U.S. Appl. No. 15/636,307.
USPTO; Notice of Allowance dated Jul. 2, 2020 in U.S. Appl. No. 15/672,096.
USPTO; Advisory Action dated Aug. 6, 2020 in U.S. Appl. No. 15/690,017.
USPTO; Non-Final Office Action dated Aug. 24, 2020 in U.S. Appl. No. 15/690,017.
USPTO; Non-Final Office Action dated Oct. 6, 2020 in U.S. Appl. No. 15/691,241.
USPTO; Final Office Action dated Sep. 24, 2020 in U.S. Appl. No. 15/726,959.
USPTO; Non-Final Office Action dated Jul. 10, 2020 in U.S. Appl. No. 15/798,201.
USPTO; Notice of Allowance dated Oct. 21, 2020 in U.S. Appl. No. 15/798,201.
USPTO; Non-Final Office Action dated Jul. 2, 2020 in U.S. Appl. No. 15/802,154.
USPTO; Notice of Allowance dated Oct. 26, 2020 in U.S. Appl. No. 15/802,154.
USPTO; Notice of Allowance dated Sep. 30, 2020 in U.S. Appl. No. 15/815,483.
USPTO; Final Office Action dated Sep. 17, 2020 in U.S. Appl. No. 15/835,328.
USPTO; Final Office Action dated Aug. 6, 2020 in U.S. Appl. No. 15/835,352.
USPTO; Notice of Allowance dated Aug. 17, 2020 in U.S. Appl. No. 15/843,899.
USPTO; Notice of Allowance dated Jun. 30, 2020 in U.S. Appl. No. 15/860,564.
USPTO; Notice of Allowance dated Aug. 19, 2020 in U.S. Appl. No. 15/861,418.
USPTO; Non-Final Office Action dated Sep. 2, 2020 in U.S. Appl. No. 15/890,037.
USPTO; Notice of Allowance dated Aug. 26, 2020 in U.S. Appl. No. 15/896,986.
USPTO; Non-Final Office Action dated Sep. 9, 2020 in U.S. Appl. No. 15/909,705.
USPTO; Final Office Action dated Sep. 24, 2020 in U.S. Appl. No. 15/917,224.
USPTO; Non-Final Office Action dated Jul. 6, 2020 in U.S. Appl. No. 15/923,834.
USPTO; Final Office Action dated Oct. 19, 2020 in U.S. Appl. No. 15/923,834.

(56) References Cited

OTHER PUBLICATIONS

USPTO; Final Office Action dated Oct. 15, 2020 in U.S. Appl. No. 15/925,532.
USPTO; Non-Final Office Action dated Oct. 6, 2020 in U.S. Appl. No. 15/940,729.
USPTO; Non-Final Office Action dated Aug. 3, 2020 in U.S. Appl. No. 15/940,759.
USPTO; Advisory Action dated Jul. 2, 2020 in U.S. Appl. No. 15/962,980.
USPTO; Non-Final Office Action dated Sep. 14, 2020 in U.S. Appl. No. 15/962,980.
USPTO; Non-Final Office Action dated Oct. 6, 2020 in U.S. Appl. No. 15/967,146.
USPTO; Final Office Action dated Sep. 3, 2020 in U.S. Appl. No. 15/974,948.
USPTO; Notice of Allowance dated Oct. 14, 2020 in U.S. Appl. No. 15/974,988.
USPTO; Final Office Action dated Nov. 25, 2020 in U.S. Appl. No. 15/985,539.
USPTO; Final Office Action dated Jul. 24, 2020 in U.S. Appl. No. 15/996,286.
USPTO; Advisory Action dated Oct. 7, 2020 in U.S. Appl. No. 15/996,286.
USPTO; Final Office Action dated Oct. 2, 2020 in U.S. Appl. No. 15/997,445.
USPTO; Notice of Allowance dated Jul. 10, 2020 in U.S. Appl. No. 15/998,775.
USPTO; Final Office Action dated Sep. 14, 2020 in U.S. Appl. No. 16/000,109.
USPTO; Final Office Action dated Oct. 6, 2020 in U.S. Appl. No. 16/000,125.
USPTO; Final Office Action dated Oct. 22, 2020 in U.S. Appl. No. 16/000,156.
USPTO; Final Office Action dated Oct. 15, 2020 in U.S. Appl. No. 16/004,041.
USPTO; Non-Final Office Action dated Sep. 8, 2020 in U.S. Appl. No. 16/039,817.
USPTO; Non-Final Office Action dated Nov. 24, 2020 in U.S. Appl. No. 16/039,938.
USPTO; Non-Final Office Action dated Aug. 4, 2020 in U.S. Appl. No. 16/042,791.
USPTO; Final Office Action dated Jul. 30, 2020 in U.S. Appl. No. 16/055,532.
USPTO; Final Office Action dated Nov. 3, 2020 in U.S. Appl. No. 16/055,532.
USPTO; Notice of Allowance dated Sep. 14, 2020 in U.S. Appl. No. 16/100,012.
USPTO; Advisory Action dated Aug. 25, 2020 in U.S. Appl. No. 16/105,745.
USPTO; Non-Final Office Action dated Nov. 25, 2020 in U.S. Appl. No. 16/105,745.
USPTO; Advisory Action dated Jul. 8, 2020 in U.S. Appl. No. 16/105,761.
USPTO; Non-Final Office Action dated Nov. 25, 2020 in U.S. Appl. No. 16/105,761.
USPTO; Final Office Action dated Nov. 17, 2020 in U.S. Appl. No. 16/105,802.
USPTO; Non-Final Office Action dated Sep. 8, 2020 in U.S. Appl. No. 16/108,950.
USPTO; Final Office Action dated Sep. 2, 2020 in U.S. Appl. No. 16/116,708.
USPTO; Advisory Action dated Nov. 17, 2020 in U.S. Appl. No. 16/116,708.
USPTO; Final Office Action dated Nov. 19, 2020 in U.S. Appl. No. 16/128,282.
USPTO; Notice of Allowance dated Aug. 5, 2020 in U.S. Appl. No. 16/130,798.
USPTO; Advisory Action dated Aug. 24, 2020 in U.S. Appl. No. 16/132,142.
USPTO; Non-Final Office Action dated Oct. 16, 2020 in U.S. Appl. No. 16/132,142.
USPTO; Final Office Action dated Aug. 20, 2020 in U.S. Appl. No. 16/137,974.
USPTO; Notice of Allowance dated Nov. 3, 2020 in U.S. Appl. No. 16/137,974.
USPTO; Non-Final Office Action dated Jul. 30, 2020 in U.S. Appl. No. 16/151,074.
USPTO; Advisory Action dated Sep. 16, 2020 in U.S. Appl. No. 16/152,260.
USPTO; Final Office Action dated Jul. 15, 2020 in U.S. Appl. No. 16/152,260.
USPTO; Non-Final Office Action dated Nov. 9, 2020 in U.S. Appl. No. 16/152,260.
USPTO; Notice of Allowance dated Jul. 24, 2020 in U.S. Appl. No. 16/158,077.
USPTO; Non-Final Office Action dated Jul. 23, 2020 in U.S. Appl. No. 16/167,164.
USPTO; Non-Final Office Action dated Aug. 7, 2020 in U.S. Appl. No. 16/172,535.
USPTO; Final Office Action dated Oct. 16, 2020 in U.S. Appl. No. 16/172,535.
USPTO; Non-Final Office Action dated Nov. 4, 2020 in U.S. Appl. No. 16/176,517.
USPTO; Non-Final Office Action dated Oct. 29, 2020 in U.S. Appl. No. 16/183,258.
USPTO; Notice of Allowance dated Jul. 28, 2020 in U.S. Appl. No. 16/193,789.
USPTO; Notice of Allowance dated Jul. 7, 2020 in U.S. Appl. No. 16/194,041.
USPTO; Final Office Action dated Nov. 27, 2020 in U.S. Appl. No. 16/205,899.
USPTO; Non-Final Office Action dated Jul. 15, 2020 in U.S. Appl. No. 16/210,922.
USPTO; Advisory Action dated Sep. 11, 2020 in U.S. Appl. No. 16/219,555.
USPTO; Non-Final Office Action dated Sep. 30, 2020 in U.S. Appl. No. 16/219,555.
USPTO; Advisory Action dated Aug. 11, 2020 in U.S. Appl. No. 16/242,829.
USPTO; Notice of Allowance dated Sep. 23, 2020 in U.S. Appl. No. 16/242,829.
USPTO; Non-Final Office Action dated Sep. 3, 2020 in U.S. Appl. No. 16/242,852.
USPTO; Final Office Action dated Oct. 14, 2020 in U.S. Appl. No. 16/251,534.
USPTO; Final Office Action dated Nov. 18, 2020 in U.S. Appl. No. 16/252,567.
USPTO; Notice of Allowance dated Aug. 6, 2020 in U.S. Appl. No. 16/255,639.
USPTO; Notice of Allowance dated Aug. 5, 2020 in U.S. Appl. No. 16/258,187.
USPTO; Final Office Action dated Jun. 30, 2020 in U.S. Appl. No. 16/356,394.
USPTO; Notice of Allowance dated Aug. 31, 2020 in U.S. Appl. No. 16/356,394.
USPTO; Non-Final Office Action dated Aug. 5, 2020 in U.S. Appl. No. 16/397,045.
USPTO; Non-Final Office Action dated Aug. 19, 2020 in U.S. Appl. No. 16/400,814.
USPTO; Notice of Allowance dated Sep. 18, 2020 in U.S. Appl. No. 16/454,063.
USPTO; Non-Final Office Action dated Nov. 27, 2020 in U.S. Appl. No. 16/468,258.
USPTO; Non-Final Office Action dated Nov. 5, 2020 in U.S. Appl. No. 16/546,543.
USPTO; Notice of Allowance dated Sep. 16, 2020 in U.S. Appl. No. 16/598,768.
USPTO; Non-Final Office Action dated Oct. 16, 2020 in U.S. Appl. No. 16/679,885.
USPTO; Non-Final Office Action dated Nov. 16, 2020 in U.S. Appl. No. 16/713,311.

(56) References Cited

OTHER PUBLICATIONS

USPTO; Final Office Action dated Oct. 2, 2020 in U.S. Appl. No. 16/833,279.
USPTO; Non-Final Office Action dated Jul. 9, 2020 in U.S. Appl. No. 16/897,158.
USPTO; Notice of Allowance dated Nov. 12, 2020 in U.S. Appl. No. 16/897,158.
USPTO; Non-Final Office Action dated Aug. 4, 2020 in U.S. Appl. No. 16/926,192.
USPTO; Final Office Action dated Sep. 9, 2020 in U.S. Appl. No. 29/726,623.
USPTO; Notice of Allowance dated Nov. 23, 2020 in U.S. Appl. No. 29/726,623.
WIPO; International Search Report dated Oct. 13, 1998 in Application No. PCT/FI1998/000571.
WIPO; International Search Report dated Jul. 13, 1990 in Application No. PCT/NL1990/000027.
WIPO; International Search Report dated Jan. 11, 1990 in Application No. PCT/NL1990/000042.
WIPO; International Search Report dated Feb. 26, 1991 in Application No. PCT/NL1990/000166.
WIPO; International Search Report dated Oct. 25, 1991 in Application No. PCT/NL1991/000108.
WIPO; International Search Report dated Oct. 17, 1997 in Application No. PCT/NL1997/000398.
WIPO; International Preliminary Examination Report dated Oct. 2, 1998 in Application No. PCT/NL1997/000398.
WIPO; International Search Report dated Apr. 24, 1998 in Application No. PCT/NL1998/000055.
WIPO; International Preliminary Examination Report dated Feb. 24, 1999 in Application No. PCT/NL1998/000055.
WIPO; International Search Report dated May 27, 1998 in Application No. PCT/NL1998/000105.
WIPO; International Search Report dated May 8, 1998 in Application No. PCT/NL1998/000151.
WIPO; International Preliminary Examination Report dated Mar. 23, 1999 in Application No. PCT/NL1998/000151.
WIPO; International Search Report dated May 27, 1998 in Application No. PCT/NL1998/000167.
WIPO; International Preliminary Examination Report dated Jul. 13, 1999 in Application No. PCT/NL1998/000167.
WIPO; International Search Report dated Jul. 8, 1998 in Application No. PCT/NL1998/000204.
WIPO; International Search Report dated Aug. 21, 1998 in Application No. PCT/NL1998/000246.
WIPO; International Search Report dated Oct. 16, 1998 in Application No. PCT/NL1998/000383.
WIPO; International Preliminary Examination Report dated Sep. 16, 1999 in Application No. PCT/NL1998/000383.
WIPO; International Search Report dated Apr. 15, 1999 in Application No. PCT/NL1999/000047.
WIPO; International Search Report dated Oct. 12, 1999 in Application No. PCT/NL1999/000487.
WIPO; International Search Report dated Dec. 16, 1999 in Application No. PCT/NL1999/000583.
WIPO; Written Opinion dated Jul. 24, 2000 in Application No. PCT/NL1999/000583.
WIPO; International Preliminary Examination Report dated Jan. 22, 2001 in Application No. PCT/NL1999/000583.
WIPO; International Search Report dated Apr. 19, 2000 in Application No. PCT/NL2000/000020.
WIPO; Written Opinion dated Oct. 17, 2000 in Application No. PCT/NL2000/000020.
WIPO; International Search Report dated Dec. 16, 1999 in Application No. PCT/RU1999/000328.
WIPO; International Preliminary Examination Report dated Jun. 29, 2001 in Application No. PCT/RU1999/000328.
Akiyama et al. "Macro- and micro-scale simulation of growth rate and composition in MOCVD of yttria-stabilized zirconia" J. Crystal Growth 241, pp. 352-362 (2002).
Altiere et al. "Review Article: Plasma-surface interactions at the atomic scale for patterning metals" J. Vac. Sci. Technol. A 35, 05C203, 13 pages (2017).
Ande et al. "Role of Surface Termination in Atomic Layer Deposition of Silicon Nitride" J. Phys. Chem. Lett, 6(18), 16 pages (2015).
Atta et al. "The Catalytic Activity of Ruthenates ARuO3 (A = Ca, Sr or Ba) for the Hydrogen Evolution Reaction in Acidic Medium" Int. J. Electrochem. Sci. 7, pp. 725-746 (2012).
Ballal "Mass Transfer in Porous Solids under Pulsating Pressure Conditions" SLJ International, vol. 35, Nov. 4, pp. 446-448 (1995).
Brewin et al. "UPS to deploy Bluetooth, wireless LAN network" Internet, pp. 1-5 (2001).
Bulletin Plasma Source—Dec. 2002: Type AX7610—Downstream Plasma Source. Source location: MKS Instruments, Inc. http://www.mksinst.com/. Accessed: Aug. 6, 2015. pp. 1-4 (2002).
Bulletin ASTRONe—Apr. 2002: Type AX7680—Reactive Gas Generator. Source location: MKS Instruments, Inc. http://www.mksinst.com/. Accessed: Aug. 6, 2015. pp. 1-2 (2002).
Bulletin ASTRONex—Jul. 2009: Type AX7685—Reactive Gas Generator. Source location: MKS Instmments, Inc. http://www.mksinst.com/. Accessed: Aug. 6, 2015. pp. 1-2 (2002).
Bulletin ASTRON hf-s—Mar. 2005: Type AX7645—Reactive Gas Generator. Source location: MKS Instruments, Inc. http://www.mksinst.com/. Accessed: Aug. 6, 2015. pp. 1-2 (2005).
Bulletin ENG-XSTREAM-340-09 OM Aug. 2006: Xstream with Active Matching Network Remote Plasma Source. Advanced Energy Industries, Inc. http://www.advanced-energy.net.cn/upload/File/Sources/ENG-Xstream-340-09. pdf. Accessed: Jul. 19, 2016. pp. 1-4 (2006).
Bulletin R*evolution—Sep. 2006: Type AX7690—Remote Plasma Source. Source location: MKS Instruments, Inc. http://www.mksinst.com/. Accessed: Aug. 6, 2015. pp. 1-2 (2006).
Callaghan et al. "Magnetic Interactions in Ternary Ruthenium Oxides" Inorganic Chemistry, vol. 5, No. 9, pp. 1572-1576 (1966).
Choi et al. "UV irradiation effects on the bonding structure and electrical properties of ultra low-k SiOC(-H) thin films for 45 nm technology node" Current Applied Physics, 11, S109-S113 (2011).
Closser et al., "Molecular Layer Deposition Of A Highly Stable Silicon Oxycarbide Thin Film Using An Organic Chlorosilane And Water," ACS Applied Materials & Interfaces 10, pp. 24266-24274 (2018).
Crystal IS "Application Note: Using UV Reflective Materials to Maximize Disinfection"; AN011; Jun. 16, 2016, found at https://www.klaran.com/using-uv-reflective-materials-to-maximize-disinfection.
Dufond et al. "Quantifying the Extent of Ligand Incorporation and the Effect on Properties of TiO 2 Thin Films Grown by Atomic Layer Deposition Using an Alkoxide or an Alkylamide" Chemistry of Material, American Chemical Society 32(4), pp. 1393-1407 (2020).
Dultsev et al. "Effect of UV radiation on the reactivity of porous methyl-doped SiO2 layers" Phys. Status Solidi C, 8, No. 6, pp. 1946-1949 (2011).
Esposito et al. "Preparation and characterization of lead ruthenate based composite cathodes for SOFC applications" Mater. Res. Soc. Symp. Proc., vol. 835, 6 pages (2005).
Fray et al. "Aspects of the Application of Electrochemistry to the Extraction of Titanium and Its Applications" Materials Transactions, vol. 58, No. 3, pp. 306-312 (2017)
Freund et al. "Single crystal growth from separated educts and its application to lithum transition-metal oxides" Sci. Rep. 6, 35362, pp. 1-5 (2016).
Frequestly Asked Question, "What is a load lock chamber?", Kurt J. Lesker Company, www.lesker.com, p. 1 (2020).
Hong et al. "Ultralow-dielectric-constant amoprhous boron nitride" Nature, vol. 582, 16 pages (2020).
Hubert et al., "A Stacked SONOS Technology, up to 4 Levels and 6nm Crystalline Nanowires, With Gate-All-Around or Independent Gates (-Flash), Suitable for Full 3D Integration," Minatec, IEDM09-637-640 (2009).

(56) References Cited

OTHER PUBLICATIONS

Ivanova et al. " ALD of Sc2O3 using Sc(Cp)3 and a Novel Heteroleptic Precursors" Presented on the AVS 19th International Conference on Atomic Layer Deposition, Jul. 23, 2019, Abstract, 1 page (2019).
Johnson et al. "A brief review of atomic layer deposition: from fundamentals to applications" Materials Today, vol. 17, Issue 5, pp. 236-246 (2014).
Juppo et al. "Deposition of molybdenum thin films by an alternate supply of MoCl 5 and Zn" J of Vacuumn Science & Technology A, 16, pp. 2845-2850 (1998).
Katamreddy et al., "ALD and Characterization of Aluminum Oxide Deposited on Si(100) using Tris(diethylamino) Aluminum and Water Vapor," Journal of The Electrochemical Society, 153 (10) C701-C706 (2006).
Kim et al. "Thermal Decomposition of Tetrakis(ethylmethylamido) Titanium for Chemical Vapor Deposition of Titanium Nitride" Bull. Korean Chem. Soc., vol. 27, No. 2, 5 pages (2006).
Kirsch et al. "Dipole model explaining high-k/metal gate field effect transistor threshold voltage tuning" Applied Physics Letters 92, 092901, 3 pages (2008).
Kjesbu, ABB Corporate Research, Internet, pp. 1-37 (2002).
Kofuji et al. "Line-edge roughness increase due to wiggling enhanced by initial pattern waviness" Jpn. J. Appl. Phys. 53, 03DE01, pp. 1-7 (2014).
Kofuji et al. "Mechanism of wiggling enhancement due to HBr gas addition during amorphous carbon etching" Jpn. J. Appl. Phys. 54, 06FH04, pp. 107 (2015).
Kovalgin et al. "Hot-Wire Assisted ALD: A Study Powered by In Situ Spectroscopic Ellipsometry" Adv. Mater. Interfaces 4, 1700058, 11 pages (2017).
Krumdieck et al. "Experimental Characterization and Modeling of Pulsed MOCVD with Ultrasonic Atomization of Liquid Precusor" Chem. Vap. Deposition, 7 (2), pp. 85-90 (2001).
Krumdieck "Kinetic Model of Low Pressure Film Deposition from Single Precursor Vapor in a Well-Mixed, Cold-Wall Reactor" Acta mater., 49, pp. 583-588 (2001).
Kuchumov et al. "Pulsed MO CVD Processes of MgO Layer Deposition from Mg(thd)2" ECS Trans. 25, pp. 927-934 (2009).
Kukli et al. "Atomic Layer Deposition and Chemical Vapor Deposition of Tantalum Oxide by Successive and Simultaneous Pulsing of Tantalum Ethoxide and Tantalum Chloride" Chem. Mater. 12, pp. 1914-1920 (2000).
Kukli et al. "Atomic Layer Epitaxy Growth of Tantalum Oxide Thin Films from Ta(OC2H5)5 and H20" The Electrochemical Society, vol. 142, No. 5, pp. 1670-1674 (1995).
Kumar et al. "Bringing the benefits of Java to Bluetooth" http://www.allembedded.eom/story/OEG20020519S001, pp. 1-3 (2002).
Mameli et al. "Area-Selective Atomic Layer Deposition of SiO2 Using Acetylacetone as a Chemoselective Inhibitor in an ABC-Type Cycle" ACS Nano 11, pp. 9303-9311 (2017).
Mameli et al. "Isotropic Atomic Layer Etching of ZnO Using Acetylacetone and O2 Plama" ACS Appl. Mater. Interfaces 10, pp. 38588-38595 (2018).
Naslain et al. "Synthesis of highly tailored ceramic matrix composites by pressure-pulsed CVI" Solid State Ionics, 141-142, pp. 541-548 (2001).
Niinisto et al. "Advanced electronic and optoelectronic materials by Atomic Layer Deposition: An overview with special emphasis on recent progress in processing of high-k dielectrics and other oxide materials" Pus. Stat. Sol. (a) 201, No. 7, pp. 1443-1452 (2004).
Ohzawa et al. "Preparation of fibrous SiC shape using pressure-pulsed chemical vapour infiltration and its properties as a high-temperature filter" J. of Materials Processing Technology, 96, pp. 151-156 (1999).
O'Malley et al. "Structure and properties of ordered Li2IrO3 and Li2PtO3" Journal of Solid State Chemistry 181, pp. 1803-1809 (2008).
Park et al. "Atomic layer deposition of Y2O3 films using hetroleptic liquid (iPrCp)2Y(iPr-amd) precursor" J. Mater. Chem. C, 2, 9 pages (2014).
Peters et al., "Aerosol-Assisted Chemical Vapor Deposition of NbS2 and TaS2 Thin Films from Pentakis(dimethylamido)metal Complexes and 2-Methylpropanethiol" Eur. J. Inorg. Chem., pp. 4179-4185 (2005).
Posseme et al. "Alternative process for thin layer etching: Application to nitride spacer etching stopping on silicon germanium" Apply. Phys. Lett. 105, 051604, pp. 1-4 (2014).
Provine et al. "Atomic Layer Deposition: Introduction to the Theory and Cambridge Nanotech Savannah & Fiji" NNIN ALD Roadshow Presentation, 49 pages (2012).
Rosemount 1199 Diaphragm Seal Systems, Product Data Sheet, 92 pages (2008).
Senateur et al. "Pulsed Injection MOCVD of Functional Electronic Oxides" Adv. Mater. Opt. Electron, 10, pp. 155-161 (2000).
Shevtsov et al. "An Apparatus for Pulse Chemical Vapor Deposition of Layers" Instruments and Experimental Techniques, vol. 56, No. 3, pp. 353-357 (2013).
Shevtsov et al. "Effect of Spatial Image Transfer in a Pulse MOCVD Process" Physics Procedia 46, pp. 27-32 (2013).
Stannowski et al. "Growth process and properties of silicon nitride deposited by hot-wire chemical vapor deposition" J Applied Physics, vol. 93 No. 5, 9 pages (2013).
Tomozeiu et al. "Effects of UV photon irradiation on SiOx (0<x<2) structural properties" Applied Surface Science 253, pp. 376-380 (2006).
US PPA 60394086 filed Jul. 3, 2002 in the name of Jacques Schmitt, and entitled "ALD on a Rotary Susceptor" pp. 1-23 (2002).
US PPA 62293897 filed Feb. 11, 2016 in the names of Bernardo Donoso et al., and entitled "Vapor Based Site-Isolated Processing Systems and Methods" pp. 1-51 (2016).
Vallat et al. "Area selective deposition of TiO2 by intercalation of plasma etching cycles in PEALD process: A bottom up approach for the simplification of 3D integration scheme" Journal of Vacuum Science & Technology A 37(2), 12 pages (2019).
Vallat et al. "Selective deposition of Ta2O5 by adding plasma etching super-cycles in plasma enhanced atomic layer deposition steps" Journal of Vacuum Science & Technology A 35(1), 7 pages (2016)
Venkatesan et al. "A rugged lead-ruthenate pyrochlore membrane catalyst for highly seelctive oxidation of alcohols" J. Molecular Catalysis A: Chemical 250, pp. 87-93 (2006).
Xiao "Introduction to Semiconductor Manufacturing Technology" SPIE Press, ISBN 978-0-08194-9092-6, pp. 237-245 (2012).
Yuan et al. "A Bifunctional Air Electrode Catalyzed by Lead Ruthenate for Li-Air Batteries" ECS Transactions 69(19), pp. 23-32 (2015).
Zhao et al. "Surface Chemistry of Thermal Dry Etching of Cobalt Thin Films Using Hexafluoroacetylacetone (hfacH)" Appl Surf Sci. 455, pp. 438-445 (2018).
Zhao et al. "Thermal and Plasma-Enhanced Atomic Layer Deposition of Yttrium Oxide Films and the Properties of Water Wettability" Appl. Mater. Interfac. 12(2), 9 pages (2019).
CNIPA; Notice of Allowance dated Dec. 21, 2020 in Application No. 201610982040.X.
CNIPA; Office Action dated Nov. 20, 2020 in Application No. 201710762817.6.
CNIPA; Notice of Allowance dated Dec. 28, 2020 in Application No. 201930704935.1.
CNIPA; Notice of Allowance dated Dec. 10, 2020 in Application No. 202030352604.9.
CNIPA; Office Action dated Jan. 25, 2021 in Application No. 202030579755.8.
JPO; Notice of Allowance dated Nov. 27, 2020 in Application No. 2016-206625.
JPO; Office Action dated Jan. 26, 2021 in Application No. 2017-139817.
JPO; Notice of Allowance dated Nov. 26, 2020 in Application No. 2020-502653.
KIPO; Office Action dated Jan. 25, 2021 in Application No. 10-2014-0011765.

(56) References Cited

OTHER PUBLICATIONS

KIPO; Notice of Allowance dated Jan. 4, 2021 in Application No. 10-2014-0060120.
KIPO; Notice of Allowance dated Jan. 4, 2021 in Application No. 10-2014-0071653.
KIPO; Office Action dated Nov. 29, 2020 in Application No. 10-2014-0105478.
KIPO; Office Action dated Feb. 17, 2021 in Application No. 10-2014-0122903.
KIPO; Office Action dated Jan. 25, 2021 in Application No. 10-2014-0145220.
KIPO; Office Action dated Jan. 6, 2021 in Application No. 10-2015-0025314.
KIPO; Office Action dated Dec. 23, 2020 in Application No. 10-2019-0044213.
KIPO; Office Action dated Nov. 14, 2020 in Application No. 10-2020-0101096.
KIPO; Notice of Allowance dated Oct. 20, 2020 in Application No. 30-2019-0054642.
KIPO; Notice of Allowance dated Oct. 22, 2020 in Application No. 30-2019-0058566 (M001).
KIPO; Notice of Allowance dated Oct. 22, 2020 in Application No. 30-2019-0058566 (M002).
KIPO; Notice of Allowance dated Dec. 1, 2020 in Application No. 30-2019-0061607.
KIPO; Office Action dated Jan. 26, 2021 in Application No. 30-2020-0005953 (M001).
KIPO; Office Action dated Jan. 26, 2021 in Application No. 30-2020-0005953 (M002).
KIPO; Notice of Allowance dated Dec. 23, 2020 in Application No. 30-2020-0006059.
KIPO; Notice of Allownace dated Dec. 25, 2020 in Application No. 30-2020-0006223.
KIPO; Notice of Allowance dated Feb. 1, 2021 in Application No. 30-2020-0006385.
KIPO; Notice of Allowance dated Feb. 1, 2021 in Application No. 30-2020-0006391.
TIPO; Office Action dated Dec. 2, 2020 in Application No. 105131896.
TIPO; Notice of Allowance dated Jan. 29, 2021 in Application No. 105142668.
TIPO; Notice of Allowance dated Dec. 10, 2020 in Application No. 106108152.
TIPO; Notice of Allowance dated Jan. 25, 2021 in Application No. 106111548.
TIPO; Office Action dated Jan. 6, 2021 in Application No. 106115126.
TIPO; Office Action dated Dec. 21, 2020 in Application No. 106122231.
TIPO; Office Action dated Dec. 29, 2020 in Application No. 106124126.
TIPO; Office Action dated Dec. 9, 2020 in Application No. 106124128.
TIPO; Office Action dated Jan. 25, 2021 in Application No. 106124129.
TIPO; Office Action dated Dec. 9, 2020 in Application No. 106124130.
TIPO; Office Action dated Jan. 20, 2021 in Application No. 106129491.
TIPO; Office Action dated Feb. 8, 2021 in Application No. 106133152.
TIPO; Notice of Allowance dated Nov. 24, 2020 in Application No. 108307599.
TIPO; Notice of Allowance dated Jan. 11, 2021 in Application No. 108307599D01.
TIPO; Notice of Allowance dated Jan. 11, 2021 in Application No. 109300591.
TIPO; Notice of Allowance dated Jan. 11, 2021 in Application No. 109300593.
TIPO; Office Action dated Jan. 11, 2021 in Application No. 109300594.
USPTO; Non-Final Office Action dated Dec. 1, 2020 in U.S. Appl. No. 14/219,879.
USPTO; Final Office Action dated Feb. 1, 2021 in U.S. Appl. No. 14/829,565.
USPTO; Non-Final Office Action dated Dec. 24, 2020 in U.S. Appl. No. 15/286,503.
USPTO; Final Office Action dated Feb. 12, 2021 in U.S. Appl. No. 15/377,439.
USPTO Non-Final Office Action dated Dec. 10, 2020 in Appl. No. 15/380,921.
USPTO; Non-Final Office Action dated Feb. 3, 2021 in U.S. Appl. No. 15/611,707.
USPTO; Final Office Action dated Jan. 19, 2021 in U.S. Appl. No. 15/636,307.
USPTO; Non-Final Office Action dated Jan. 6, 2021 in U.S. Appl. No. 15/726,959.
USPTO; Advisory Action dated Dec. 15, 2020 in U.S. Appl. No. 15/835,328.
USPTO; Notice of Allowance dated Jan. 14, 2021 in U.S. Appl. No. 15/835,352.
USPTO; Final Office Action dated Jan. 11, 2021 in U.S. Appl. No. 15/890,037.
USPTO; Advisory Action dated Jan. 8, 2021 in U.S. Appl. No. 15/923,834.
USPTO; Advisory Action dated Dec. 24, 2020 in U.S. Appl. No. 15/925,532.
USPTO; Non-Final Office Action dated Jan. 25, 2021 in U.S. Appl. No. 15/925,532.
USPTO; Final Office Action dated Feb. 18, 2021 in U.S. Appl. No. 15/940,729.
USPTO; Final Office Action dated Jan. 12, 2021 in U.S. Appl. No. 15/940,759.
USPTO; Final Office Action dated Dec. 15, 2020 in U.S. Appl. No. 15/962,980.
USPTO; Advisory Action dated Oct. 27, 2020 in U.S. Appl. No. 15/974,948.
USPTO; Advisory Action dated Dec. 10, 2020 in U.S. Appl. No. 16/000,109.
USPTO; Advisory Action dated Dec. 15, 2020 in U.S. Appl. No. 16/000,125.
USPTO; Advisory Action dated Dec. 14, 2020 in U.S. Appl. No. 16/000,156.
USPTO; Advisory Action dated Dec. 22, 2020 in U.S. Appl. No. 16/004,041.
USPTO; Advisory Action dated Jan. 14, 2021 in U.S. Appl. No. 16/055,532.
USPTO; Final Office Action dated Dec. 15, 2020 in U.S. Appl. No. 16/108,950.
USPTO; Final Office Action dated Jan. 6, 2021 in U.S. Appl. No. 16/117,530.
USPTO; Notice of Allowance dated Feb. 12, 2021 in U.S. Appl. No. 16/128,282.
USPTO; Notice of Allowance dated Feb. 8, 2021 in U.S. Appl. No. 16/132,142.
USPTO; Final Office Action dated Dec. 14, 2020 in U.S. Appl. No. 16/151,074.
USPTO; Advisory Action dated Feb. 16, 2021 in U.S. Appl. No. 16/151,074.
USPTO; Final Office Action dated Dec. 18, 2020 in U.S. Appl. No. 16/167,164.
USPTO; Advisory Action dated Dec. 21, 2020 in U.S. Appl. No. 16/172,535.
USPTO; Final Office Action dated Jan. 29, 2021 in U.S. Appl. No. 16/176,517.
USPTO; Non-Final Office Action dated Dec. 11, 2021 in U.S. Appl. No. 16/202,941.
USPTO; Final Office Action dated Dec. 9, 2020 in U.S. Appl. No. 16/210,922.
USPTO; Notice of Allowance dated Dec. 15, 2020 in U.S. Appl. No. 16/242,852.
USPTO; Advisory Action dated Jan. 22, 2021 in U.S. Appl. No. 16/252,567.
USPTO; Final Office Action dated Dec. 8, 2020 in U.S. Appl. No. 16/397,045.
USPTO; Advisory Action dated Jan. 27, 2021 in U.S. Appl. No. 16/397,045.
USPTO; Final Office Action dated Dec. 14, 2020 in U.S. Appl. No. 16/400,814.

(56) References Cited

OTHER PUBLICATIONS

USPTO; Non-Final Office Action dated Jan. 12, 2021 in U.S. Appl. No. 16/453,249.
USPTO; Non-Final Office Action dated Dec. 28, 2020 in U.S. Appl. No. 16/517,122.
USPTO; Non-Final Office Action dated Feb. 11, 2021 in U.S. Appl. No. 16/565,460.
USPTO; Notice of Allowance dated Jan. 25, 2021 in U.S. Appl. No. 16/679,885.
USPTO; Non-Final Office Action dated Feb. 8, 2021 in U.S. Appl. No. 16/685,787.
USPTO; Non-Final Office Action dated Jan. 8, 2021 in U.S. Appl. No. 16/752,514.
USPTO; Notice of Allowance dated Dec. 28, 2020 in U.S. Appl. No. 16/833,279.
Aoyagi et al. "Laser-assisted atomic layer epitaxy" Materials Science and Engineering, pp. 121-132 (1991).
Galesic et al. "Formation of vanadium nitride by rapid thermal processing" Thin Solid Films 349(1), 7 pages (1999).
Kim et al. "High Growth Rate in Atomic Layer Deposition of TiO2 Thin Films by UV Irradiation" Electrochemical and Solid-State Letters, 14(4), pp. H146-H148 (2011).
Lee et al. "Enahancement of Iodine Adsorption on Ruthenium Glue Layer for Seedless CECVD of Cu" Electrochemical and Solid-State Letters, 8(2) C39-C42 (2005).
Lee et al. "Growth without Postannealing of Monoclinic VO2 Thin Film by Atomic Layer Deposition Using VC14 as Precursor" Coatings, 8, 431, pp. 1-11 (2018).
Lee et al. "Photo-Induced Atomic Layer Deposition of Tantalum Oxide Thin Films from Ta(OC2H5)5 and O2" J of the Electrochemical Society. 151(1) pp. C52-C55 (2004).
Merdrignac-Conanec et al. "Nitridation under ammonia of high surface area vanadium aerogels" Journal of Solid State Chemistry 178(1), 8 pages (2005).
Nikolic et al. "The dependence of the work function of rare earth metals on their electron structure" Microelectronics Journal 27, 93-96 (1996).
Putkonen et al. "Low-Temperature ALE Deposition of Y2O3 Thin Films from β-Diketonate Precursors" Chemical Vapor Deposition 7(1) pp. 44-50 (2001).
US PPA 62274238 filed Jan. 1, 2016 in the names of Alexander S. Polyak et al., and entitled "Non-Metallic Thermal CVD/ALD Gas Injector and Purge System" pp. 1-63 (2016).
Vayrynen et al. "Photo-Assisted Atomic Layer Deposition and Chemical Vapor Deposition of Metal and Metal Oxide Thin Films" Thesis, Oct. 2015, 146 pages (2005).
CNIPA; Office Action dated Mar. 30, 2021 in Application No. 201610131743.1.
CNIPA; Office Action dated Mar. 1, 2021 in Application No. 201710131319.1.
CNIPA; Notice of Allowance dated Mar. 30, 2021 in Application No. 201710762817.6.
CNIPA; Office Action dated Jan. 28, 2021 in Application No. 201711057557.9.
CNIPA; Office Action dated Jan. 26, 2021 in Application No. 201711057929.8.
CNIPA; Office Action dated Apr. 19, 2021 in Application No. 201711328250.8.
CNIPA; Notice of Allowance dated Apr. 7, 2021 in Application No. 201780044761.9.
CNIPA; Office Action dated Jan. 29, 2021 in Application No. 201780076230.8.
CNIPA; Office Action dated Jan. 27, 2021 in Application No. 201780076321.1.
CNIPA; Office Action dated Mar. 24, 2021 in Application No. 201880048547.5.
CNIPA; Office Action dated Dec. 22, 2020 in Application No. 201910378791.4.
CNIPA; Notice of Allowance dated Apr. 7, 2021 in Application No. 202030579755.8
EPO; Extended European Search Report dated Apr. 6, 2021 in Application No. 21150514.4.
JPO; Notice of Allowance dated Apr. 6, 2021 in Application No. 2017-139817.
JPO; Office Action dated Mar. 31, 2021 in Application No. 2018-024655.
JPO; Notice of Allowance dated Mar. 17, 2021 in Application No. 2020-010953.
KIPO; Office Action dated Mar. 23, 2021 in Application No. 10-2014-0011765.
KIPO; Office Action dated Apr. 27, 2021 in Application No. 10-2014-0027217.
KIPO; Notice of Allowance dated Apr. 15, 2021 in Application No. 10-2014-0103853.
KIPO; Notice of Allowance dated Mar. 25, 2021 in Application No. 10-2014-0128626.
KIPO; Office Action dated Apr. 20, 2021 in Application No. 10-2014-0136089.
KIPO; Office Action dated Mar. 19, 2021 in Application No. 10-2014-0156196.
KIPO; Office Action dated Mar. 29, 2021 in Application No. 10-2014-0165685.
KIPO; Office Action dated Apr. 5, 2021 in Application No. 10-2015-0031720.
KIPO; Office Action dated Apr. 19, 2021 in Application No. 10-2015-0035094.
KIPO; Office Action dated Mar. 8, 2021 in Application No. 10-2017-0054647.
KIPO; Office Action dated Mar. 10, 2021 in Application No. 10-2017-0055703.
KIPO; Notice of Allowance dated May 24, 2021 in Application No. 10-2020-0101096.
KIPO; Notice of Allowance dated Apr. 1, 2021 in Application No. 30-2020-0030139 (M001).
KIPO; Notice of Allowance dated Apr. 1, 2021 in Application No. 30-2020-0030139 (M002).
TIPO; Notice of Allowance dated May 13, 2021 in Application No. 105122394.
TIPO; Notice of Allowance dated Mar. 5, 2021 in Application No. 105131284.
TIPO; Office Action dated Feb. 25, 2021 in Application No. 105134275.
TIPO; Notice of Allowance dated Mar. 4, 2021 in Application No. 106100823.
TIPO; Notice of Allowance dated May 6, 2021 in Application No. 106108522.
TIPO; Notice of Allowance dated Mar. 4, 2021 in Application No. 106111693.
TIPO; Office Action dated Feb. 25, 2021 in Application No. 106121797.
TIPO; Office Action dated Apr. 26, 2021 in Application No. 106122231.
TIPO; Office Action dated Apr. 22, 2021 in Application No. 106124126.
TIPO; Office Action dated Apr. 22, 2021 in Application No. 106124128.
TIPO; Notice of Allowance dated Mar. 25, 2021 in Application No. 106124130.
TIPO; Office Action dated Mar. 4, 2021 in Application No. 106127948.
TIPO; Office Action dated Mar. 15, 2021 in Application No. 106129971.
TIPO; Office Action dated Apr. 7, 2021 in Application No. 106135925.
TIPO; Office Action dated Apr. 7, 2021 in Application No. 106136905.
TIPO; Office Action dated Mar. 29, 2021 in Application No. 106143559.
TIPO; Office Action dated Mar. 31, 2021 in Application No. 106143570.
TIPO; Office Action dated Jan. 15, 2021 in Application No. 108142842.
TIPO; Office Action dated Jan. 25, 21 in Application No. 108143562.
TIPO; Notice of Allowance dated May 18, 2021 in Application No. 109300595.
TIPO; Notice of Allowance dated Mar. 30, 2021 in Application No. 109305460.

(56) References Cited

OTHER PUBLICATIONS

USPTO; Notice of Allowance dated Feb. 10, 2021 in U.S. Appl. No. 14/219,839.
USPTO; Advisory Action dated Apr. 13, 2021 in U.S. Appl. No. 14/829,565.
USPTO; Non-Final Office Action dated May 12, 2021 in U.S. Appl. No. 14/829,565.
USPTO; Final Office Action dated Feb. 24, 2021 in U.S. Appl. No. 15/262,990.
USPTO; Advisory Action dated Apr. 28, 2021 in U.S. Appl. No. 15/262,990.
USPTO; Final Office Action dated Mar. 25, 2021 in U.S. Appl. No. 15/286,503.
USPTO; Advisory Action dated Apr. 30, 2021 in U.S. Appl. No. 15/377,439.
USPTO; Final Office Action dated Jan. 7, 2021 in U.S. Appl. No. 15/380,909.
USPTO; Non-Final Office Action dated Feb. 9, 2021 in U.S. Appl. No. 15/402,993.
USPTO; Final Office Action dated May 21, 2021 in U.S. Appl. No. 15/402,993.
USPTO; Final Office Action dated Jun. 2, 2021 in U.S. Appl. No. 15/611,707.
USPTO; Advisory Action dated Mar. 25, 2021 in U.S. Appl. No. 15/636,307.
USPTO; Non-Final Office Action dated Apr. 21, 2021 in U.S. Appl. No. 15/636,307.
USPTO; Final Office Action dated Mar. 10, 2021 in U.S. Appl. No. 15/690,017.
USPTO; Notice of Allowance dated Apr. 16, 2021 in U.S. Appl. No. 15/691,241.
USPTO; Non-Final Office Action dated Mar. 18, 2021 in U.S. Appl. No. 15/835,328.
USPTO; Notice of Allowance dated Mar. 19, 2021 in U.S. Appl. No. 15/890,037.
USPTO; Final Office Action dated Apr. 19, 2021 in U.S. Appl. No. 15/909,705.
USPTO; Non-Final Office Action dated May 20, 2021 in U.S. Appl. No. 15/917,224.
USPTO; Non-Final Office Action dated Feb. 18, 2021 in U.S. Appl. No. 15/923,834.
USPTO; Advisory Action dated Apr. 28, 2021 in U.S. Appl. No. 15/940,729.
USPTO; Notice of Allowance dated Apr. 7, 2021 in U.S. Appl. No. 15/940,759.
USPTO; Advisory Action dated Feb. 22, 2021 in U.S. Appl. No. 15/962,980.
USPTO; Final Office Action dated Apr. 13, 2021 in U.S. Appl. No. 15/967,146.
USPTO; Advisory Action dated Jun. 2, 2021 in U.S. Appl. No. 15/967,146.
USPTO; Non-Final Office Action dated Feb. 19, 2021 in U.S. Appl. No. 15/974,948.
USPTO; Non-Final Office Action dated May 25, 2021 in U.S. Appl. No. 15/985,539.
USPTO; Non-Final Office Action dated Apr. 5, 2021 in U.S. Appl. No. 15/996,286.
USPTO; Non-Final Office Action dated Feb. 4, 2021 in U.S. Appl. No. 16/000,109.
USPTO; Non-Final Office Action dated May 19, 2021 in U.S. Appl. No. 16/000,125.
USPTO; Notice of Allowance dated Feb. 5, 2021 in U.S. Appl. No. 16/000,156.
USPTO; Non-Final Office Action dated Mar. 19, 2021 in U.S. Appl. No. 16/004,041.
USPTO; Final Office Action dated Mar. 23, 2021 in U.S. Appl. No. 16/039,817.
USPTO; Advisory Action dated May 28, 2021 in U.S. Appl. No. 16/039,817.
USPTO; Final Office Action dated Mar. 8, 2021 in U.S. Appl. No. 16/042,791.
USPTO; Advisory Action dated May 14, 2021 in U.S. Appl. No. 16/042,791.
USPTO; Notice of Allowance dated Mar. 10, 2021 in U.S. Appl. No. 16/055,532.
USPTO; Final Office Action dated Mar. 23, 2021 in U.S. Appl. No. 16/105,745.
USPTO; Final Office Action dated Mar. 24, 2021 in U.S. Appl. No. 16/105,761.
USPTO; Advisory Action dated May 20, 2021 in U.S. Appl. No. 16/105,761.
USPTO; Final Office Action dated Mar. 18, 2021 in U.S. Appl. No. 16/105,802.
USPTO; Advisory Action dated May 27, 2021 in U.S. Appl. No. 16/105,802.
USPTO; Advisory Action dated Feb. 17, 2021 in U.S. Appl. No. 16/108,950.
USPTO; Non-Final Office Action dated Apr. 13, 2021 in U.S. Appl. No. 16/108,950.
USPTO; Notice of Allowance dated Mar. 23, 2021 in U.S. Appl. No. 16/116,708.
USPTO; Advisory Action dated Mar. 10, 2021 in U.S. Appl. No. 16/117,530.
USPTO; Non-Final Office Action dated Mar. 23, 2021 in U.S. Appl. No. 16/151,074.
USPTO; Final Office Action dated May 6, 2021 in U.S. Appl. No. 16/152,260.
USPTO; Notice of Allowance dated Feb. 24, 2021 in U.S. Appl. No. 16/167,164.
USPTO; Non-Final Office Action dated Feb. 19, 2021 in U.S. Appl. No. 16/172,535.
USPTO; Final Office Action dated May 27, 2021 in U.S. Appl. No. 16/172,535.
USPTO; Advisory Action dated Apr. 5, 2021 in U.S. Appl. No. 16/176,517.
USPTO; Notice of Allowance dated May 13, 2021 in U.S. Appl. No. 16/176,517.
USPTO; Notice of Allowance dated Feb. 19, 2021 in U.S. Appl. No. 16/183,258.
USPTO; Notice of Allowance dated Feb. 10, 2021 in U.S. Appl. No. 16/205,899.
USPTO; Non-Final Office Action dated Mar. 29, 2021 in U.S. Appl. No. 16/206,589.
USPTO; Advisory Action dated Feb. 25, 2021 in U.S. Appl. No. 16/210,922.
USPTO; Final Office Action dated Mar. 29, 2021 in U.S. Appl. No. 16/219,555.
USPTO; Non-Final Office Action dated May 2, 2021 in U.S. Appl. No. 16/240,392.
USPTO; Advisory Action dated Jan. 26, 2021 in U.S. Appl. No. 16/251,534.
USPTO; Non-Final Office Action dated Feb. 23, 2021 in U.S. Appl. No. 16/251,534.
USPTO; Non-Final Office Action dated Mar. 30, 2021 in U.S. Appl. No. 16/252,567.
USPTO; Non-Final Office Action dated Mar. 4, 2021 in U.S. Appl. No. 16/252,569.
USPTO; Non-Final Office Action dated Apr. 20, 2021 in U.S. Appl. No. 16/397,045.
USPTO; Notice of Allowance dated Mar. 10, 2021 in U.S. Appl. No. 16/400,814.
USPTO; Non-Final Office Action dated May 7, 2021 in U.S. Appl. No. 16/423,824.
USPTO; Notice of Allowance dated Apr. 28, 2021 in U.S. Appl. No. 16/453,249.
USPTO; Final Office Action dated May 20, 2021 in U.S. Appl. No. 16/468,258.
USPTO; Notice of Allowance dated Apr. 26, 2021 in U.S. Appl. No. 16/517,122.
USPTO; Non-Final Office Action dated Feb. 1, 2021 in U.S. Appl. No. 16/563,473.

(56) References Cited

OTHER PUBLICATIONS

USPTO; Non-Final Office Action dated May 10, 2021 in U.S. Appl. No. 16/601,593.
USPTO; Non-Final Office Action dated Feb. 24, 2021 in U.S. Appl. No. 16/637,134.
USPTO; Notice of Allowance dated Jun. 2, 2021 in U.S. Appl. No. 16/637,134.
USPTO; Notice of Allowance dated Apr. 30, 2021 in U.S. Appl. No. 16/685,787.
USPTO; Non-Final Office Action dated Apr. 5, 2021 in U.S. Appl. No. 16/704,83 5
USPTO; Final Office Action dated Feb. 22, 2021 in U.S. Appl. No. 16/713,311.
USPTO; Notice of Allowance dated May 20, 2021 in U.S. Appl. No. 16/752,514.
USPTO; Notice of Allowance dated May 24, 2021 in U.S. Appl. No. 16/765,125.
USPTO; Non-Final Office Action dated Apr. 15, 2021 in U.S. Appl. No. 16/789,138.
USPTO; Notice of Allowance dated May 12, 2021 in U.S. Appl. No. 16/800,114.
USPTO; Non-Final Office Action dated Apr. 5, 2021 in U.S. Appl. No. 16/816,078.
USPTO; Non-Final Office Action dated May 19, 2021 in U.S. Appl. No. 16/828,753.
USPTO; Non-Final Office Action dated May 4, 2021 in U.S. Appl. No. 16/872,045.
USPTO; Non-Final Office Action dated May 3, 2021 in U.S. Appl. No. 16/878,443.
USPTO; Non-Final Office Action dated Dec. 31, 2020 in U.S. Appl. No. 16/924,595.
USPTO; Non-Final Office Action dated May 25, 2021 in U.S. Appl. No. 16/935,280.
USPTO; Non-Final Office Action dated Apr. 14, 2021 in U.S. Appl. No. 17/009,093.
USPTO; Ex Parte Quayle Action dated Apr. 13, 2021 in U.S. Appl. No. 29/679,620.
USPTO; Notice of Allowance dated May 19, 2021 in U.S. Appl. No. 29/702,881.
Aubin et al. "Very low temperature (450° C.) selective epitaxial growth of heavily in situ boron-doped SiGe layers" Semiconductor Science and Technology, 30, 10 pages (2015).
Barnscheidt et al. "Highly boron-doped germanium layers on Si(001) grown by carbon-mediated epitaxy" Semiconductor Science and Technology, 33, 9 pages (2018).
Belyansky et al. "Low Temperature Borophosphosilicate Glass (BPSG) Process for High Aspect Ratio Gap Fill" www.electrochem.org/dl/ma/201/pdfs/0705.pdf, downloaded May 15, 2021, 1 page.
Cheremisin et al. "UV-laser modification and selective ion-beam etching of amorphous vanadium pentoxide thin films" Phys. Status Solidi A, Applications and materials science, 206 (7), pp. 1484-1487 (2009).
Dingemans et al. "Plasma-Assisted ALD for the Conformal Deposition of SiO2: Process, Material and Electronic Properties" J of the Electrochemical Society, 159(3), H277-H285 (2012).
G02-1152 "Atomic Layer Deposition of A12O3 with Alcohol Oxidants for Impeding Substrate Oxidation" Abstract. October 16, 2019 (2019).
Imamura et al. "Cyclic C4F8 and O2 plasma etching of TiO2 for high-aspect-ratio three-dimensional devices" Template for JJAP Regular Papers, Jan. 2014, pp. 29 (2014).
Kim et al. "A process for topographically selective deposition on 3D nanostructures by ion implantation" ACS Nano, 10, 4, 4451-4458 (2016).
Lee et al. "Ultraviolet light enhancement of Ta2O5 dry etch rates" J. of Vacuum Science & Technology B: Microelectronics and Nanometer Structures Processing, Measurement, and Phenomena, 18, pp. 293-295 (2000).
Musschoot et al. "Atomic layer deposition of titanium nitride from TDMAT precursor" Microelectronic Engineering, 86, pp. 72-77 (2009).
Noircler et al. "Transmission electron microscopy characterization of low temperature boron doped silicon epitaxial films" CrystEngComm, 22(33), pp. 5464-5472 (2020).
Oyama et al. "Topotactic synthesis of vanadium nitride solid foams" Journal of Materials Research vol. 8. No. 6, pp. 1450-1454 (1993).
Rimoldi et al. "Atomic Layer Deposition of Rhenium-Aluminum Oxide Thin Films and ReOx Incorporation in a Metal-Organic Framework" Applied Materials & Interfaces, 9, pp. 35067-35074 (2017).
Standard Motor Products LX249 Ignition Pick Up, Nov. 11, 2005, Amazon.com, May 10, 2021. URL: https://www.amazon.com/Standard-Motor-Products-LX249-Ignition/dp/B000C7ZTS4/ (2005).
Tao et al. "Improved performance of GeON as charge storage layer in flash memory by optimal annealing" Microelectronics Reliability, vol. 52, pp. 2597-2601 (2012).
Wirths et al. "Low temperature RPCVD epitaxial growth of SilxGex using Si2H6 and Ge2H6" Solid-State Electronics, 88, pp. 2-9 (2013).
Yanguas-Gil et al. "Modulation of the Growth Per Cycle in Atomic Layer Deposition Using Reversible Surface Functionalization" Chemistry of Materials, 25, pp. 4849-4860 (2013).
CNIPA; Office Action dated Jul. 21, 2021 in Application No. 201610131743.1.
CNIPA; Office Action dated Jul. 23, 2021 in Application No. 201710131319.1.
CNIPA; Notice of Allowance dated Jun. 3, 2021 in Application No. 201711057929.8.
CNIPA; Office Action dated Sep. 13, 2021 in Application No. 201780076230.8.
CNIPA; Office Action dated Sep. 13, 2021 in Application No. 201780076321.1.
CNIPA; Office Action dated Apr. 30, 2021 in Application No. 201810018936.5
CNIPA; Office Action dated Apr. 16, 2021 in Application No. 201810116717.0.
CNIPA; Notice of Allowance dated Sep. 15, 2021 in Application No. 201810116717.0.
CNIPA; Office Action dated May 26, 2021 in Application No. 201810215131.X.
CNIPA; Office Action dated Jun. 16, 2021 in Application No. 201810344382.8.
CNIPA; Notice of Allowance dated Oct. 11, 2021 in Application No. 201810344382.8.
CNIPA; Office Action dated Jul. 5, 2021 in Application No. 201810530514.6.
CNIPA; Office Action dated Jun. 30, 2021 in Application No. 201810755771.X.
CNIPA; Office Action dated Sep. 23, 2021 in Application No. 201880048547.5.
CNIPA; Office Action dated May 19, 2021 in Application No. 201880072606.2.
CNIPA; Office Action dated May 31, 2021 in Application No. 201910857144.1.
CNIPA; Office Action dated Jun. 2, 2021 in Application No. 201910920881.1.
CNIPA; Office Action dated Jul. 5, 2021 in Application No. 201911042495.3.
CNIPA; Office Action dated Apr. 27, 2021 in Application No. 201911250100.9.
CNIPA; Office Action dated Jul. 7, 2021 in Application No. 201980011788.7.
CNIPA; Notice of Allowance dated Jun. 16, 2021 in Application No. 202130111248.6.
EPO; Extended European Search Report dated Aug. 11, 2021 in Application No. 21169226.4.
JPO; Notice of Allowance dated Aug. 11, 2021 in Application No. 2018-024655.
JPO; Office Action dated Aug. 2, 2021 in Application No. 2019-504674.

(56) References Cited

OTHER PUBLICATIONS

JPO; Office Action dated Sep. 10, 2021 in Application No. 2019-531445.
JPO; Notice of Allowance dated Jun. 30, 2021 in Application No. 2021-004208.
KIPO; Office Action dated Jun. 28, 2021 in Application No. 10-2014-0027217.
KIPO; Notice of Allowance dated May 27, 2021 in Application No. 10-2014-0105478.
KIPO; Notice of Allowance dated Aug. 17, 2021 in Application No. 10-2014-0122903
KIPO; Notice of Allowance dated Sep. 8, 2021 in Application No. 10-2014-0136089.
KIPO; Notice of Allowance dated Jul. 6, 2021 in Application No. 10-2014-0145220.
KIPO; Notice of Allowance dated Sep. 23, 2021 in Application No. 2014-0156196.
KIPO; Notice of Allowance dated Jul. 21, 2021 in Application No. 10-2015-0025314.
KIPO; Office Action dated May 19, 2021 in Application No. 10-2015-0036819.
KIPO; Office Action dated Jun. 23, 2021 in Application No. 10-2015-0037658.
KIPO; Office Action dated Sep. 6, 2021 in Application No. 10-2015-0046393.
KIPO; Office Action dated Jun. 10, 2021 in Application No. 2015-61391.
KIPO; Office Action dated Sep. 3, 2021 in Application No. 2017-37847.
KIPO; Office Action dated Aug. 2, 2021 in Application No. 2017-43865.
KIPO; Office Action dated Oct. 1, 2021 in Application No. 2017-43919.
KIPO; Office Action dated Sep. 28, 2021 in Application No. 2017-49172.
KIPO; Notice of Allowance dated Sep. 28, 2021 in Application No. 2017-54647.
KIPO; Office Action dated in Aug. 30, 2021 in Application No. 2017-81515.
KIPO; Office Action dated Sep. 10, 2021 in Application No. 2017-86083.
KIPO; Office Action dated Jun. 29, 2021 in Application No. 10-2017-0066979.
KIPO; Notice of Allowance dated Jun. 24, 2021 in Application No. 10-2019-0044213.
KIPO; Office Action dated Jun. 17, 2021 in Application No. 10-2021-0051860.
KIPO; Office Action dated Aug. 18, 2021 in Application No. 10-2021-0090283.
KIPO; Notice of Allowance dated Sep. 2, 2021 in Application No. 30-2020-0047043.
IIPO; Office Action dated Jun. 22, 2021 in Application No. 104108277.
I'IPO; Notice of Allowance dated Sep. 22, 2021 in Application No. 104108277.
TIPO; Office Action dated Jun. 2, 2021 in Application No. 105129977.
TIPO; Notice of Allowance dated Sep. 9, 2021 in Application No. 105129977.
TIPO; Notice of Allowance dated Jun. 4, 2021 in Application No. 105131896.
TIPO; Notice of Allowance dated Jul. 30, 2021 in Application No. 105134275.
TIPO; Notice of Allowance dated Feb. 24, 2021 in Application No. 106113604.
TIPO; Notice of Allowance dated Sep. 3, 2021 in Application No. 106115126.
TIPO; Office Action dated Jun. 21, 2021 in Application No. 106120902.
TIPO; Notice of Allowance dated Jun. 30, 2021 in Application No. 106121797.
TIPO; Notice of Allowance dated Sep. 1, 2021 in Application No. 106122231.
TIPO; Notice of Allowance dated Jun. 3, 2021 in Application No. 106123203.
TIPO; Notice of Allowance dated Aug. 24, 2021 in Application No. 106124129.
TIPO; Notice of Allowance dated Jul. 28, 2021 in Application No. 106129491.
TIPO; Notice of Allowance dated Aug. 10, 2021 in Application No. 106129971.
TIPO; Office Action dated Jun. 15, 2021 in Application No. 106133152.
TIPO; Notice of Allowance dated Oct. 12, 2021 in Application No. 106135925.
TIPO; Office Action dated Jul. 13, 2021 in Application No. 106138996.
TIPO; Notice of Allowance dated Sep. 24, 2021 in Application No. 106143559.
TIPO; Office Action dated Aug. 5, 2021 in Application No. 106143566.
TIPO; Office Action dated May 26, 2021 in Application No. 106143568.
TIPO; Notice of Allowance dated Jul. 30, 2021 in Application No. 106143570.
TIPO; Office Action dated Jun. 7, 2021 in Application No. 107103230.
TIPO; Office Action dated Aug. 10, 2021 in Application No. 107103230.
TIPO; Office Action dated Sep. 8, 2021 in Application No. 107105788.
TIPO; Office Action dated Aug. 3, 2021 in Application No. 107105982.
TIPO; Office Action dated Aug. 16, 2021 in Application No. 107114888.
TIPO; Office Action dated Sep. 28, 2021 in Application No. 109112983.
TIPO; Office Action dated Sep. 13, 2021 in Application No. 109119438.
TIPO; Office Action dated Oct. 18, 2021 in Application No. 109300594.
TIPO; Notice of Allowance dated Jun. 9, 2021 in Application No. 109303437.
TIPO; Notice of Allowance dated Oct. 1, 2021 in Application No. 110118827.
TIPO; Notice of Allowance dated Jun. 30, 2021 in Application No. 110301018.
TIPO; Notice of Allowance dated Jul. 29, 2021 in Application No. 110301101.
TIPO; Notice of Allowance dated Jul. 27, 2021 in Application No. 110302670.
USPTO; Final Office Action dated Aug. 4, 2021 in U.S. Appl. No. 14/219,879.
USPTO; Non-Final Office Action dated Jun. 10, 2021 in U.S. Appl. No. 15/262,990.
USPTO; Final Office Action dated Oct. 1, 2021 in U.S. Appl. No. 15/262,990.
USPTO; Non-Final Office Action dated Jul. 9, 2021 in U.S. Appl. No. 15/286,503.
USPTO; Notice of Allowance dated Jun. 29, 2021 in U.S. Appl. No. 15/377,439.
USPTO; Non-Final Office Action dated Jun. 25, 2021 in U.S. Appl. No. 15/380,909.
USPTO; Final Office Action dated Jun. 21, 2021 in U.S. Appl. No. 15/380,921.
USPTO; Advisory Action dated Aug. 30, 2021 in U.S. Appl. No. 15/380,921.
USPTO; Non-Final Office Action dated Oct. 6, 2021 in U.S. Appl. No. 15/380,921.
USPTO; Advisory Action dated Jul. 27, 2021 in U.S. Appl. No. 15/402,993.
USPTO; Final Office Action dated Jun. 9, 2021 in U.S. Appl. No. 15/491,726.
USPTO; Advisory Action dated Aug. 24, 2021 in U.S. Appl. No. 15/491,726.
USPTO; Non-Final Office Action dated Sep. 28, 2021 in U.S. Appl. No. 15/491,726.
USPTO; Notice of Allowance dated Aug. 25, 2021 in U.S. Appl. No. 15/611,707.
USPTO; Non-Final Office Action dated Sep. 16, 2021 in U.S. Appl. No. 15/636,307.

(56) References Cited

OTHER PUBLICATIONS

USPTO; Advisory Action dated Jun. 11, 2021 in U.S. Appl. No. 15/690,017.
USPTO; Non-Final Office Action dated Jun. 17, 2021 in U.S. Appl. No. 15/690,017.
USPTO; Final Office Action dated Jul. 15, 2021 in U.S. Appl. No. 15/726,959.
USPTO; Advisory Action dated Sep. 21, 2021 in U.S. Appl. No. 15/726,959.
USPTO; Notice of Allowance dated Sep. 15, 2021 in U.S. Appl. No. 15/835,328.
USPTO; Advisory Action dated Jun. 11, 2021 in U.S. Appl. No. 15/909,705.
USPTO; Notice of Allowance dated Jun. 4, 2021 in U.S. Appl. No. 15/923,834.
USPTO; Final Office Action dated Jun. 28, 2021 in U.S. Appl. No. 15/925,532.
USPTO; Advisory Action dated Aug. 27, 2021 in U.S. Appl. No. 15/925,532.
USPTO; Non-Final Office Action dated Oct. 6, 2021 in U.S. Appl. No. 15/925,532.
USPTO; Non-Final Office Action dated Jun. 16, 2021 in U.S. Appl. No. 15/940,729.
USPTO; Notice of Allowance dated Sep. 28, 2021 in U.S. Appl. No. 15/940,729.
USPTO; Non-Final Office Action dated Aug. 2, 2021 in U.S. Appl. No. 15/962,980.
USPTO; Non-Final Office Action dated Oct. 4, 2021 in U.S. Appl. No. 15/967,146.
USPTO; Final Office Action dated Aug. 3, 2021 in U.S. Appl. No. 15/974,948.
USPTO; Advisory Action dated Oct. 21, 2021 in U.S. Appl. No. 15/974,948.
USPTO; Final Office Action dated Oct. 12, 2021 in U.S. Appl. No. 15/996,286.
USPTO; Non-Final Office Action dated Jul. 9, 2021 in U.S. Appl. No. 15/997,445.
USPTO; Final Office Action dated Aug. 5, 2021 in U.S. Appl. No. 16/000,109.
USPTO; Final Office Action dated Oct. 20, 2021 in U.S. Appl. No. 16/000,125.
USPTO; Final Office Action dated Sep. 3, 2021 in U.S. Appl. No. 16/004,041.
USPTO; Non-Final Office Action dated Oct. 22, 2021 in U.S. Appl. No. 16/042,791
USPTO; Non-Final Office Action dated Sep. 28, 2021 in U.S. Appl. No. 16/105,745.
USPTO; Non-Final Office Action dated Sep. 29, 2021 in U.S. Appl. No. 16/105,761.
USPTO; Non-Final Office Action dated Jun. 25, 2021 in U.S. Appl. No. 16/105,802.
USPTO; Final Office Action dated Jul. 27, 2021 in U.S. Appl. No. 16/108,950.
USPTO; Advisory Action dated Oct. 1, 2021 in U.S. Appl. No. 16/108,950.
USPTO; Non-Final Office Action dated Jun. 18, 2021 in U.S. Appl. No. 16/117,530.
USPTO; Final Office Action dated Jul. 8, 2021 in U.S. Appl. No. 16/151,074.
USPTO; Notice of Allowance dated Sep. 17, 2021 in U.S. Appl. No. 16/151,074.
USPTO; Non-Final Office Action dated Sep. 16, 2021 in U.S. Appl. No. 16/152,260.
USPTO; Advisory Action dated Aug. 2, 2021 in U.S. Appl. No. 16/172,535.
USPTO; Non-Final Office Action dated Oct. 15, 2021 in U.S. Appl. No. 16/172,535.
USPTO; Final Office Action dated Jun. 14, 2021 in U.S. Appl. No. 16/202,941.
USPTO; Advisory Action dated Aug. 16, 2021 in U.S. Appl. No. 16/202,941.
USPTO; Non-Final Office Action dated Sep. 20, 2021 in U.S. Appl. No. 16/202,941.
USPTO; Final Office Action dated Jul. 26, 2021 in U.S. Appl. No. 16/206,589.
USPTO; Notice of Allowance dated Sep. 13, 2021 in U.S. Appl. No. 16/206,589.
USPTO; Non-Final Office Action dated Aug. 25, 2021 in U.S. Appl. No. 16/210,922.
USPTO; Final Office Action dated Sep. 1, 2021 in U.S. Appl. No. 16/240,392.
USPTO; Notice of Allowance dated Oct. 15, 2021 in U.S. Appl. No. 16/240,392.
USPTO; Final Office Action dated Sep. 7, 2021 in U.S. Appl. No. 16/251,534.
USPTO; Final Office Action dated Aug. 18, 2021 in U.S. Appl. No. 16/252,567.
USPTO; Final Office Action dated Jul. 21, 2021 in U.S. Appl. No. 16/252,569.
USPTO; Advisory Action dated Jul. 15, 2021 in U.S. Appl. No. 16/468,258.
USPTO; Non-Final Office Action dated Oct. 21, 2021 in U.S. Appl. No. 16/468,258.
USPTO; Final Office Action dated May 12, 2021 in U.S. Appl. No. 16/546,543.
USPTO; Advisory Action dated Jul. 8, 2021 in U.S. Appl. No. 16/546,543.
USPTO; Ex Parte Quayle Action dated Aug. 6, 2021 in U.S. Appl. No. 16/563,473.
USPTO; Notice of Allowance dated Sep. 30, 2021 in U.S. Appl. No. 16/563,473.
USPTO; Non-Final Office Action dated Oct. 5, 2021 in U.S. Appl. No. 16/588,807.
USPTO; Notice of Allowance dated Oct. 18, 2021 in U.S. Appl. No. 16/601,593.
USPTO; Non-Final Office Action dated Jun. 11, 2021 in U.S. Appl. No. 16/671,847.
USPTO; Non-Final Office Action dated Jun. 24, 2021 in U.S. Appl. No. 16/673,860.
USPTO; Non-Final Office Action dated Sep. 28, 2021 in U.S. Appl. No. 16/692,859.
USPTO; Notice of Allowance dated Jul. 20, 2021 in U.S. Appl. No. 16/704,835.
USPTO; Non-Final Office Action dated Aug. 31, 2021 in U.S. Appl. No. 16/712,707.
USPTO; Non-Final Office Action dated Sep. 21, 2021 in U.S. Appl. No. 16/736,336.
USPTO; Final Office Action dated Sep. 15, 2021 in U.S. Appl. No. 16/789,138.
USPTO; Non-Final Office Action dated Jun. 24, 2021 in U.S. Appl. No. 16/792,058.
USPTO; Notice of Allowance dated Oct. 19, 2021 in U.S. Appl. No. 16/792,058.
USPTO; Non-Final Office Action dated Oct. 6, 2021 in U.S. Appl. No. 16/792,544.
USPTO; Notice of Allowance dated Sep. 27, 2021 in U.S. Appl. No. 16/792,571.
USPTO; Non-Final Office Action dated Aug. 17, 2021 in U.S. Appl. No. 16/797,346.
USPTO; Notice of Allowance dated Jul. 21, 2021 in U.S. Appl. No. 16/816,078.
USPTO; Non-Final Office Action dated Jun. 23, 2021 in U.S. Appl. No. 16/827,012.
USPTO; Non-Final Office Action dated Feb. 23, 2021 in U.S. Appl. No. 16/827,506.
USPTO; Notice of Allowance dated May 27, 2021 in U.S. Appl. No. 16/827,506.
USPTO; Final Office Action dated Oct. 6, 2021 in U.S. Appl. No. 16/828,753.
USPTO; Non-Final Office Action dated Jul. 28, 2021 in U.S. Appl. No. 16/835,283.

(56) References Cited

OTHER PUBLICATIONS

USPTO; Non-Final Office Action dated Oct. 4, 2021 in U.S. Appl. No. 16/840,960.
USPTO; Non-Final Office Action dated Aug. 3, 2021 in U.S. Appl. No. 16/849,793.
USPTO; Non-Final Office Action dated Jun. 15, 2021 in U.S. Appl. No. 16/861,144.
USPTO; Final Office Action dated Sep. 17, 2021 in U.S. Appl. No. 16/861,144.
USPTO; Non-Final Office Action dated Sep. 1, 2021 in U.S. Appl. No. 16/867,385.
USPTO; Final Office Action dated Oct. 7, 2021 in U.S. Appl. No. 16/872,045.
USPTO; Final Office Action dated Oct. 14, 2021 in U.S. Appl. No. 16/878,443.
USPTO; Non-Final Office Action dated Oct. 4, 2021 in U.S. Appl. No. 16/886,405.
USPTO; Non-Final Office Action dated Jul. 28, 2021 in U.S. Appl. No. 16/888,423.
USPTO; Non-Final Office Action dated Oct. 13, 2021 in U.S. Appl. No. 16/893,206.
USPTO; Notice of Allowance dated Jun. 17, 2021 in U.S. Appl. No. 16/924,595.
USPTO; Non-Final Office Action dated Jul. 27, 2021 in U.S. Appl. No. 16/930,193.
USPTO; Non-Final Office Action dated Jun. 25, 2021 in U.S. Appl. No. 16/930,305.
USPTO; Non-Final Office Action dated Sep. 14, 2021 in U.S. Appl. No. 16/932,707.
USPTO; Non-Final Office Action dated Oct. 4, 2021 in U.S. Appl. No. 16/935,275.
USPTO; Notice of Allowance dated Sep. 22, 2021 in U.S. Appl. No. 16/935,280.
USPTO; Non-Final Office Action dated Aug. 23, 2021 in U.S. Appl. No. 16/938,868.
USPTO; Non-Final Office Action dated Oct. 12, 2021 in U.S. Appl. No. 16/944,763.
USPTO; Non-Final Office Action dated Aug. 19, 2021 in U.S. Appl. No. 16/992,806.
USPTO; Non-Final Office Action dated Jul. 7, 2021 in U.S. Appl. No. 16/999,065.
USPTO; Final Office Action dated Oct. 21, 2021 in U.S. Appl. No. 16/999,065.
USPTO; Final Office Action dated Jul. 23, 2021 in U.S. Appl. No. 17/009,093.
USPTO; Advisory Action dated Oct. 5, 2021 in U.S. Appl. No. 17/009,093.
USPTO; Non-Final Office Action dated Sep. 28, 2021 in U.S. Appl. No. 17/023,129.
USPTO; Notice of Allowance dated Oct. 14, 2021 in U.S. Appl. No. 17/024,092.
USPTO; Notice of Allowance dated Oct. 4, 2021 in U.S. Appl. No. 17/028,066.
USPTO; Non-Final Office Action dated Sep. 10, 2021 in U.S. Appl. No. 17/038,514.
USPTO; Non-Final Office Action dated Oct. 22, 2021 in U.S. Appl. No. 17/073,544.
USPTO; Non-Final Office Action dated Sep. 30, 2021 in U.S. Appl. No. 17/093,224.
USPTO; Non-Final Office Action dated Sep. 22, 2021 in U.S. Appl. No. 17/126,275.
USPTO; Non-Final Office Action dated Sep. 23, 2021 in U.S. Appl. No. 17/254,111.
USPTO; Non-Final Office Action dated Sep. 27, 2021 in U.S. Appl. No. 17/254,366.
USPTO; Notice of Allowance dated Jul. 1, 2021 in U.S. Appl. No. 29/679,620.
USPTO; Notice of Allowance dated Jul. 9, 2021 in U.S. Appl. No. 29/692,490.
USPTO; Non-Final Office Action dated Jul. 14, 2021 in U.S. Appl. No. 29/695,044.
USPTO; Notice of Allowance dated Jun. 8, 2021 in U.S. Appl. No. 29/696,472.
USPTO; Notice of Allowance dated Sep. 21, 2021 in U.S. Appl. No. 29/702,865.
Alen et al. "Atomic layer deposition of molybdenum nitride thin films for cu metallizations" J of The Electrochemical Society, 152(5) G361-G366 (2005).
Best et al. "Complex Halides of the Transition Metals. 24.1 Reactions of Dimeric Molybdenum (II) Halide Complexes Containing Strong Metal-Metal Bonds with Bidentate Tertiary Phosphines and Arsines" Inorganic Chemistry, vol. 17, No. 1, pp. 99-104 (1978).
Blakeney et al. "Atomic Layer Deposition of Aluminum Metal Films Using a Thermally Stable Aluminum Hydride Reducing Agent" Chem. Mater., 30, pp. 1844-1848 (2018).
Buitrago et al. "SnOx high-efficiency EUV interference lithography gratings towards the ultimate resolution in photolithography" Abstract, 1 page (2016).
Buitrago et al. "State-of-the-art EUV materials and processes for the 7 nm node and beyond" Proc of SPIE, vol. 10143, 8 pages (2017).
Cheng et al. "Improved High-Temperature Leakage in High-Density MIM Capcitors by Using a TiLaO Dielectric and an Ir Electrode" IEEE Electron Device Letters, vol. 28, No. 12, 3 pages (2007).
Firestop Support Plate, Type B, 6 In Apr. 4, 2012, Amazon. Com, May 10, 2021, https://www.amazon.com/AmeriVent-Firestop-Support-Plate-Type/dp/B007R7W951/(2012).
Gertsch et al. "SF4 as the Fluorination Reactant for Al2O3 and VO2 Thermal Atomic Layer Etching" Chem. Mater., 31, pp. 3624-3635 (2019).
Han et al. "Synthesis and characterization of novel zinc precursors for ZnO thin film deposition by atomic layer deposition" Dalton Transactions 49.14 (2020): 4306-4314.
Hayashi et al. "2,2-Difluoro-1,3-dimethylimidazolidine (DFI). A new fluorinating agent" Chem. Commun. pp. 1618-1619 (2002).
Imai et al. "Energetic stability and magnetic moment of tri-, tetra-, and octa-ferromagnetic element nitrides predicted by first-principle calculations" J of Alloys and Compounds, vol. 611, 19 pages (2019).
Jacoby "Chemical deposition methods to the rescue" Cen. Acs. Org., pp. 29-32 (2018).
Jiang et al. "Sensitizer for EUV Chemically Amplified Resist: Metal versus Halogen" J of Photopolymer Science and Technology, vol. 32, No. 1, pp. 21-25 (2019).
Kang et al. "Optical Performance of Extreme Ultraviolet Lithography Mask with an Indium Tin Oxide Absorber" J of Nanoscience and Nanotechnology, vol. 12, pp. 3330-3333 (2012).
Kim et al. "Atomic layer deposition of transition metals for silicide contact formation: Growth characteristics and silicidation" Microelectronic Engineering, 106, pp. 69-75 (2013).
Lim et al. "Atomic layer deposition of transition metals" Nature Materials, vol. 2 pp. 749-754 (2003).
Maina et al. "Atomic layer deposition of transition metal films and nanostructures for electronic and catalytic applications" Critical Reviews in Solid State and Materials Sciences, Abstract, 2 pages (2020).
Miikkulainen et al. "Crystallinity of inorganic films grown by atomic layer deposition: Overview and general trends" Journal of Applied Physics, 112, 102 pages (2013).
Niskanen et al. "Radical-enhanced atomic layer deposition of metallic copper thin films" Journal of the Electrochemical Society 152(1) pages, G25-G28 (2004).
O'Hanlon "A User's Guide to Vacuum Technology" Third Edition, Chapter 19, pp. 359-378 (2003).
Ovanesyan et al. "Atomic Layer Deposition of SiCxNy Using Si2C16 and CH3NH2 Plasma" Chem. Mater. 2017, 29, pp. 6269-6278 (2017).
Park et al. "Superfilling CVD of copper using a catalytic surfactant" Proceedings of the IEEE 2001 International Interconnect Technology Conference, 3 pages (2001).

(56) References Cited

OTHER PUBLICATIONS

Petrov et al. "1,1,2,2-Tetrafluoroethyl-N,N-dimethylamine: a new selective fluorinating agent" J of Fluorine Chemistry, 109, pp. 25-31 (2001).
Popov et al. "Atomic Layer Deposition of PbI2 Thin Films" Chem. Mater. 31, pp. 1101-1109 (2019).
Popovici et al. "High-performance (EOT<0.4nm, Jg~10-7 A/cm2) ALD-deposited Ru\SrTiO3 stack for next generations DRAM pillar capacitor" 2018 IEEE International Electron Devices Meeting (IEDM), 4 pages (2018).
Puurunen "Surface Chemistry of Atomic Layer Depostion: A Case Study for the Trimethylaluminum/Water Process" Journal of Applied Physics, 97, 55 pages (2005).
Rahemi et al. "Variation in electron work function with temperature and its effect on the Young's modulus of metals" Scripta Materialia, 99, pp. 41-44 (2015).
SciFinder Search Results on hydrazido-based precursor for boron nitride films, search conducted Nov. 5, 2020, 5 pages (2020).
Shiba et al. "Stable yttrium oxyfluoride used in plasma process chamber" J. Vac. Sci. Technol. A, 35(2), 6 pages (2017).
Shigemoto et al. "Thermal cleaning of silicon nitride with fluorine and additive mixture" 1 page (2007).
Takaoka et al. "F-Propene-Dialkylamine Reaction Products as Fluorinating Agents" Bulletin of the Chemical Socity of Japan, vol. 52 (11), pp. 3377-3380 (1979).
Tsoutsou et al. "Atomic layer deposition of LaxZr1—xO2-d (x=0. 25) high-k dielectrics for advanced gate stacks" Applied Physics Letters, 94, 3 pages (2009).
US PPA 60545181 filed Feb. 13, 2004 in the names of Matthew G. Goodman et al., and entitled "Forced Flow Susceptor with Exit Holes and Veins for Improvided Process" pp. 1-15 (2004).
US PPA 60591258 filed Jul. 26, 2004 in the names of Jeroen Stoutyesdijk et al., and entitled "Susceptor Support for Eliminating Backside Nodules" pp. 1-71 (2004).
US PPA 62504470 filed May 10, 2017 in the names of Jennifer Y. Sun et al., and entitled "Metal-Oxy-Fluoride Films for Chamber Components" pp. 1-82 (2017).
Van Asselt et al. "New Palladium Complexes of Cis-Fixed Bidentate Nitrogen Ligands as Catalysts for Carbon-Carbon Bond Formation" Organometallics, 11, pp. 1999-2001 (1992).
Van Asselt et al. "On the Mechanism of Formation of Homocoupled Products in the Carbon-Carbon Cross-Coupling Reaction Catalyzed by Palladium Complexes Containing Rigid Bidentate Nitrogen Ligands" Organometallics, 13, pp. 1972-1980 (1994).
Vayrynen et al. "Atomic Layer Deposition of Nickel Nitride Thin Films Using NiCL2 (TMPDA) and Tert-Butylhydrazine as Precursors" Phy. Status Solidi A, 216, 9 pages (2019).
Vesters et al. "Sensitizers in EUV Chemically Amplified Resist: Mechamsm of sensitivity improvement" Proc. SPIE 10583 Extreme Ultraviolet (EUV) Lithography IX, 1058307, 11 pages (2018).
Wilklow-Marnell et al. "First-row transitional-metal oxalate resists for EUV" J. Micro/Nanolith. MEMS MOEMS 17(4) Oct.-Dec. 2018, 9 pages (2018).
Zhang et al. "Mechanical Stability of Air-gap Interconnects" Proc. Future Fab International, pp. 81-87 (2008).
Zientara et al. Journal of the European Ceramic Society, 27, Abstract, 1 page (2007).

(a)

(b)

METHOD OF DEPOSITING MATERIAL ONTO A SURFACE AND STRUCTURE FORMED ACCORDING TO THE METHOD

CROSS-REFERENCE TO RELATED APPLICATIONS

This application claims the benefit of U.S. Provisional Patent Application No. 62/846,424 filed on May 10, 2019, the disclosure of which is incorporated herein in its entirety by reference.

FIELD OF INVENTION

The present disclosure generally relates to methods of depositing material onto a surface of a substrate, to structures formed using the method, and to systems for depositing the material.

BACKGROUND OF THE DISCLOSURE

Conformal film deposition may be desirable for a variety of reasons. For example, during the manufacture of devices, such as semiconductor devices, it is often desirable to conformally deposit material over features formed on the surface of a substrate. Such techniques can be used for shallow trench isolation, inter-metal dielectric layers, passivation layers, and the like. However, with miniaturization of devices, it becomes increasingly difficult to conformally deposit material, particularly over high aspect ratio features, such as features having an aspect ratio of three or more.

Atomic layer deposition (ALD) can be used to conformally deposit material onto a surface of a substrate. For some applications, such as when precursors and/or reactants otherwise require a relatively high temperature for ALD deposition and/or when it is desired to keep a processing temperature relatively low, it may be desirable to use plasma-enhanced ALD (PE-ALD).

Unfortunately, material deposited using PE-ALD on high aspect-ratio features tends to exhibit poor conformality/poor step coverage, because less material is deposited at the bottom of a feature (e.g., a trench or via), compared to at or near the top of the feature. The poor conformality of the deposited material can be attributed to a loss of activated species, such as radicals, that can occur by surface recombination of the radicals at, for example, the sidewalls of the features.

Efforts to improve low conformality of PE-ALD deposited material have focused on tuning process parameters, such as RF power, plasma exposure time, pressure, and the like, so as to provide adequate activated species, such as radicals, near the bottom of a feature, so as to increase an amount of material deposited at the bottom of the feature. However, because recombination of radicals is an intrinsic phenomenon, such efforts have been limited. And moreover, recent device manufacturing specifications often demand low plasma near the bottom of a feature. For such applications, conventional methods that include increasing activated species and/or activated species energy at the bottom of a feature cannot be used.

To overcome such problems, several techniques have been proposed. For example, U.S. Pat. No. 9,887,082 to Pore et al. discloses a method for filling a gap. The method includes providing a precursor into a reaction chamber to form adsorbed species on a surface of a substrate, exposing the adsorbed species to a nitrogen plasma to form species at the top of the feature that include nitrogen, and providing a reactant plasma to the reaction chamber, wherein nitrogen acts as an inhibitor to the reactant, resulting in less material being deposited at the top of the feature, compared to traditional PE-ALD techniques. However, it is often difficult to find suitable combinations of an inhibitor for desired reactant activated species.

U.S. Pat. No. 8,569,184, to Oka et al. discloses another PE-ALD processes. The method of Oka et al. includes a precursor feed step, wherein the precursor includes silicon and a non-metal element (such as N, C, B), which is adsorbed onto a substrate surface; an inert gas plasma exposure step, wherein the precursor is decomposed by inert gas plasma; and a reactant plasma exposure step. The decomposed precursor is oxidized to be complex anion compound of silicon. However, this process may not adequately address concerns of using conventional PE-ALD methods.

Accordingly, improved methods for conformally depositing material onto a substrate and structures formed using such methods are desired. Any discussion of problems and solutions involved in the related art has been included in this disclosure solely for the purposes of providing a context for the present invention and should not be taken as an admission that any or all of the discussion were known at the time the invention was made.

SUMMARY OF THE DISCLOSURE

Various embodiments of the present disclosure relate to methods of depositing material onto a surface of a substrate–e.g., conformally depositing material over features on the substrate surface. While the ways in which various embodiments of the present disclosure address drawbacks of prior methods and systems are discussed in more detail below, in general, various embodiments of the disclosure provide improved methods suitable for conformally depositing material over high aspect ratio features on a surface of a substrate, while mitigating any plasma-related damage at or near bottoms of the features.

Exemplary methods include adsorbing a precursor onto a surface of a substrate and removing a portion of the adsorbed precursor—e.g., by sputtering—prior to providing a reactant into the reaction chamber. Removing a portion of the adsorbed precursor slows the deposition rate and increases conformality of material deposited using PE-ALD, particularly in high-aspect ratio features.

In accordance with at least one embodiment of the disclosure, a method of depositing material onto a surface of a substrate includes providing a substrate within a reaction chamber; exposing a surface of the substrate to a precursor, such that the precursor reacts with species on the surface to form adsorbed species; removing a portion of the adsorbed species, leaving residual species on the surface; and providing a reactant to the reaction chamber, wherein the reactant reacts with the residual species to form the material. The step of removing can include, for example, sputtering. The sputtering can be performed using activated species of an inert gas, such as one or more of argon, helium, neon, krypton, and xenon. A direct or remote plasma system can be used during the step of removing. A direct or remote plasma system can also be used during a portion or all of the step of providing a reactant to the reaction chamber. In accordance with some aspects, the precursor and the reactant can be provided to the reaction chamber during at least a portion of a precursor pulse interval—i.e., a time interval in which the precursor is supplied to the reaction chamber. Exemplary methods can also include steps of purging the reaction chamber—e.g., after exposing a surface of the substrate to a precursor and/or after providing a reactant to the reaction chamber—using a vacuum source and/or a purge gas, such as argon, helium, neon, krypton, and/or xenon. Additionally, the reactant (e.g., without being exposed to a plasma) can be used to facilitate purging of the precursor. In accordance with some examples, a purge gas is continuously provided to the reaction chamber during the steps of exposing the surface of the substrate to a precursor, removing a portion of the adsorbed species, and providing the reactant to the reaction chamber.

In accordance with yet further exemplary embodiments of the disclosure, a deposition apparatus configured to perform a method as described herein is provided.

In accordance with yet further exemplary embodiments of the disclosure, a device structure comprises a layer deposited according to a method described herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
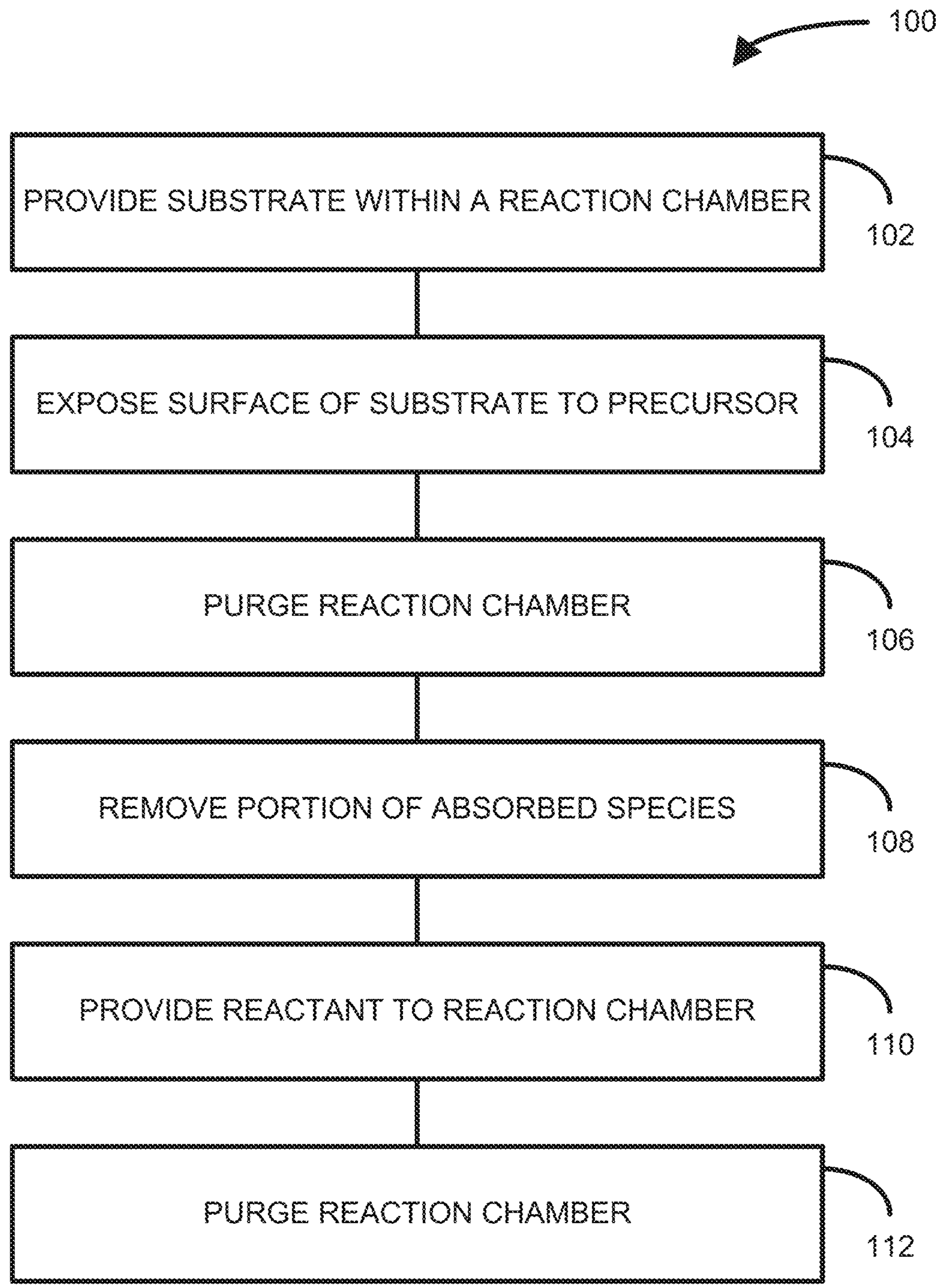
FIG. 1 illustrates a method of depositing material in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of depositing material onto a surface of a substrate, to deposition apparatus for performing the methods, and to structures formed using the method. The methods as described herein can be used to process substrates, such as semiconductor wafers, to form, for example, electronic devices. By way of examples, the systems and methods described herein can be used to conformally deposit material onto a surface of a substrate, which can include high-aspect ratio features.

In this disclosure, "gas" may include material that is a gas at room temperature and pressure, a vaporized solid and/or a vaporized liquid, and may be constituted by a single gas or a mixture of gases, depending on the context. A gas other than the process gas, i.e., a gas introduced without passing through a gas distribution assembly, such as a showerhead, other gas distribution device, or the like, may be used for, e.g., sealing the reaction space, which includes a seal gas such as a rare gas. In some embodiments, the term "precursor" refers generally to a compound that participates in the chemical reaction that produces another compound, and particularly to a compound that constitutes a film matrix or a main skeleton of a film, whereas the term "reactant" refers to a compound, other than precursors, that activates a precursor, modifies a precursor, or catalyzes a reaction of a precursor, wherein the reactant may provide an element (such as O, N, C) to a film matrix and become a part of the film matrix, when RF power is applied. The term "inert gas" refers to a gas that does not take part in a chemical reaction and/or a gas that excites a precursor when RF power is applied, but unlike a reactant, it may not become a part of a film matrix to an appreciable extent.

As used herein, the term "substrate" may refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various topologies, such as recesses, lines, and the like formed within or on at least a portion of a layer of the substrate.

In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers.

As used herein, the term "atomic layer deposition" (ALD) may refer to a vapor deposition process in which deposition cycles, preferably a plurality of consecutive deposition cycles, are conducted in a process chamber. Typically, during each cycle, the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor composition(s), reactive gas, and purge (e.g., inert carrier) gas. PE-ALD refers to an ALD process, in which a plasma is applied during one or more of the ALD steps.

Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

In this disclosure, "continuously" can refer to one or more of without breaking a vacuum, without interruption as a timeline, without any material intervening step, without changing treatment conditions, immediately thereafter, as a next step, or without an intervening discrete physical or chemical structure between two structures other than the two structures in some embodiments.

Turning now to the figures, FIG. 1 illustrates a method 100 in accordance with at least one embodiment of the disclosure. Method 100 includes the steps of providing a substrate within a reaction chamber (step 102), exposing a surface of the substrate to a precursor (step 104), removing a portion of the adsorbed species (step 108), and providing a reactant to the reaction chamber (step 110). As illustrated, method 100 can also include one or more purging steps (step 106 and/or step 112). Method 100 can include an ALD process, such as a PE-ALD process.

Step 102 includes providing at least one substrate into a reaction chamber and bringing the substrate to a desired deposition temperature. The reaction chamber may comprise PE-ALD reaction chamber, available from, for example, ASM International N.V. A temperature within the reaction chamber during step 102 can be brought to a temperature for subsequent processing—e.g., between about −30° C. and about 650° C. or about 50° C. to about 500° C. Similarly, a pressure within the reaction chamber may be controlled to provide a reduced atmosphere in the reaction chamber for subsequent processing. For example, the pressure within the reaction chamber can be brought to less than 5000 Pa, or less than 2000 Pa, or less than 1000 Pa, or be between about 100 and about 3000 Pa or about 200 and about 1000 Pa or about 300 and about 500 Pa.

During step 104, a surface of a substrate is exposed to a precursor. During this step, the temperature and/or pressure can be as set forth above in connection with step 102. The precursor can react with species on a surface of a substrate to form adsorbed species. Exemplary precursors suitable for use with step 104 include compounds having a general formula of MpCqNrOsBtXuHv, wherein p, q, r, s, t, u, v are integers including zero, wherein M is B, Si, Ti, or Zr; X is F, Cl, Br, or I; and C, H, N, O, B, represent their respective elements. By way of particular examples, one or more precursors can be selected to obtain a target compound, such as SiO, SiN, SiC, SiOC, SiON, TiO, TiN, ZrO, BN. Particular exemplary precursors include bis(dimethylamino) silane, bis(diethylamino) silane, tris(dimethylamino) cyclopentadienyl zirconium, $Ti[N(CH_3)_2]_4$, $Si(OC_2H_5)_4$, $P(CH_3O)_3$, $B(CH_3O)_3$, $PO(CH_3O_3)$, $B(OC_2H_5)_3)$, $Si(CH_3)_2(OCH_3)_2$, $SiH(CH_3)_3$, $Si(CH_3)_4$, and the like. Exemplary gas flow rates during step 104 can be about 500 sccm to about 20000 sccm or about 1000 sccm to about 4000 sccm. A pulse time for precursor flow during step 104 can be about 0.05 seconds to about 10 seconds or about 0.1 seconds to about 3 seconds.

Figure 2:
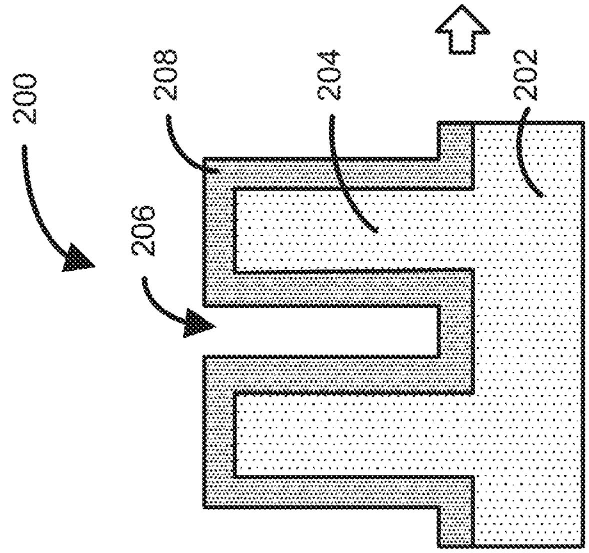
FIGS. 2-4 illustrate structures formed in accordance with at least one embodiment of the disclosure.

FIG. 2 illustrates a structure 200, which includes a substrate 202, including features 204 having a gap or recess 206 therebetween, and adsorbed species 208 on the surface of substrate 202, which can be formed according to step 104. As illustrated, adsorbed species 208 can be conformally adsorbed onto the surface of substrate 202 over features with relatively high aspect ratio of, for example, greater than 2, greater than 5, greater than 10, or between about 2 and about 30 or between about 5 and about 20. The adsorbed species can form, for example, about one monolayer of species on the surface of substrate 202.

Referring again to FIG. 1, step 108 includes removing a portion of the adsorbed species (e.g., adsorbed species 208), leaving residual species on the surface of the substrate. In accordance with various examples of the disclosure, the portion of the adsorbed species is removed using sputtering—e.g., using a plasma formed of an inert gas, such as one or more gases of the group consisting of argon, helium, neon, krypton, and xenon. The plasma can be formed as a direct plasma or by using a remote plasma system coupled to the reaction chamber. A power used to form the plasma can be between about 50 W and about 2000 W, or between about 300 W and about 1500 W. The temperature and pressure within the reaction chamber can be the same as set forth above in connection with step 102. Exemplary gas flow rates during step 108 can be about 500 sccm to about 20000 sccm or about 1000 sccm to about 8000 sccm. A pulse time for the plasma during step 108 can be about 0.05 seconds to about 15 seconds or about 0.2 seconds to about 5 seconds.

Figure 3:
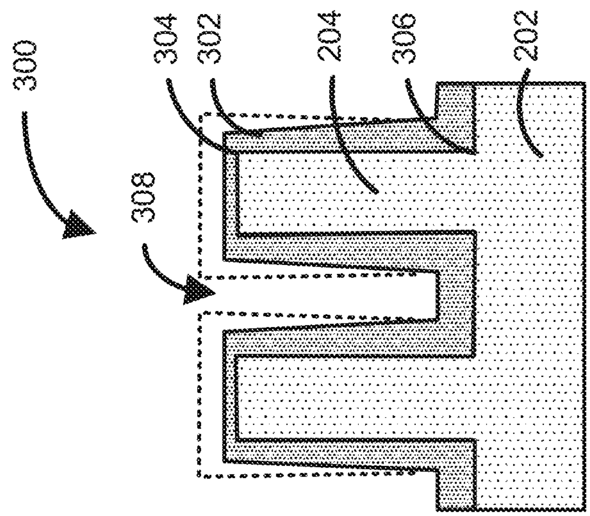

FIG. 3 illustrates a structure 300 after completion of step 108, where the dotted line represents a boundary of the adsorbed species before the removal of the portion of adsorbed species. Structure 300 includes substrate 202 and residual species 302 on the surface of substrate 202.

As illustrated in FIG. 3, a power, a reaction chamber pressure, or other parameter, can be selected, such that the portion of the adsorbed species removed near a top 304 of feature 204 is greater than the portion of the adsorbed species removed near a bottom 306 of feature 204, such that an opening 308 is wider near top 304, relative to bottom 306. Removing more adsorbed species near top 304 relative to bottom 306 can facilitate filling opening or recess 206 without a gap or a seam in the deposited material, which may be desirable for many applications. Furthermore, damage near a bottom 306 can be mitigated or eliminated, because the sputtering can be controlled to occur and desirably occurs mainly or exclusively near top 304, relative to bottom 306.

At step 110, a reactant is provided to the reaction chamber. The reactant can react with the residual species to form the material. A pressure and/or temperature in the reaction chamber during step 110 can be the same or similar to the pressure and/or temperature set forth above in connection with step 102.

Exemplary reactants suitable for step 110 include one or more elements that are incorporated into the material. By way of examples, the reactant can include one or more of $O_2$, $O_3$, $CO_2$, $N_2O$, $N_2$, $NH_3$, $H_2$, $CH_4$, and other hydrocarbons. By way of particular examples, the reactant can be selected from one or more of the group consisting of $O_2$, $N_2$, $CO_2$, $N_2O$, $NH_3$. Exemplary gas flow rates during step 110 can be about 500 sccm to about 20000 sccm or about 1000 sccm to about 8000 sccm.

Figure 4:
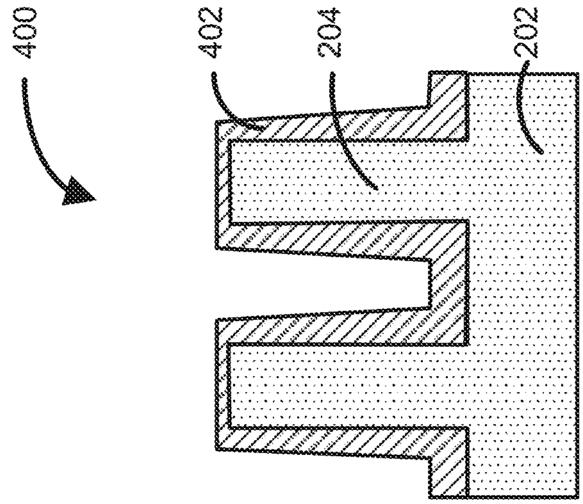

FIG. 4 illustrates a structure 400 after step 110. Structure 400 includes substrate 202 and material 402 deposited thereon. Each cycle (steps 104-110) can deposit, for example, about one monolayer of material.

As noted above, method 100 can additionally include one or more purge steps 106, 112. During purge steps 106, 112, any excess precursor, reactant, or byproducts thereof, can be removed from the reaction chamber using a purge gas and/or with the aid of a vacuum, generated by a pumping system, in fluid communication with the reaction chamber. Exemplary purge gases include argon, helium, neon, krypton, and/or xenon. A phase is generally considered to immediately follow another phase if a purge (i.e., purging gas pulse) or other reactant removal step intervenes. Exemplary gas flow rates during steps 106, 112 can be about 500 sccm to about 20000 sccm or about 1000 sccm to about 8000 sccm. A duration for purge steps 106, 112 can be about 0.1 seconds to about 10 seconds or about 0.2 seconds to about 5 seconds.

Method steps 102-112 of method 100 can be repeated a number of time. For example, steps 102-112 can be repeated until recess 206 is filled with material 402. In some embodiments, method 100 can include repeating step 104 one or more times prior to performing step 108 and similarly may additionally or alternatively include repeating step 110 one or more times prior to repeating method 100.

Figure 5:
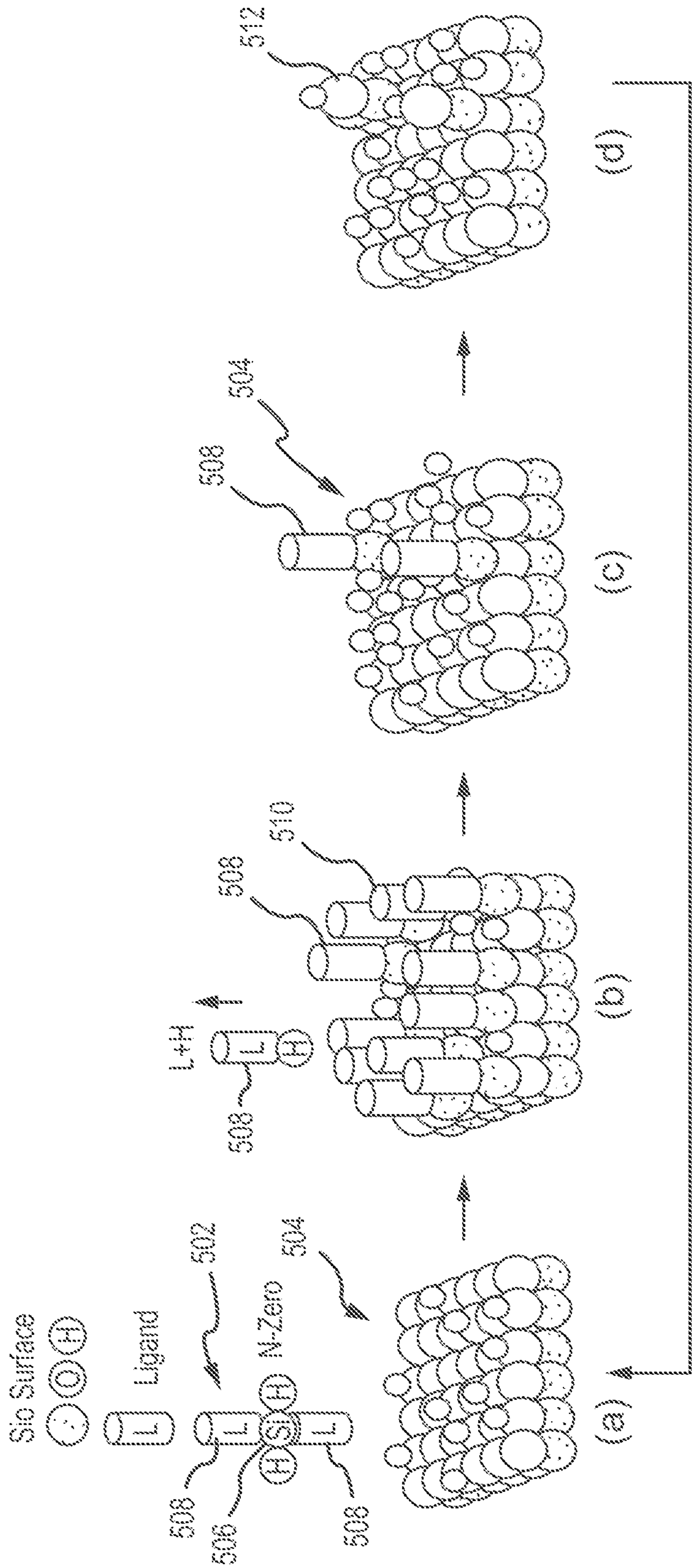
FIG. 5 illustrates a method in accordance with at least one embodiment of the disclosure.

FIG. 5 illustrates deposition of a silicon oxide using method 100. In the illustrated example, during step (a), a silicon precursor 502 is provided within a reaction chamber that includes a surface of a substrate 504. Silicon precursor 502 can include silicon and one or more ligands 508. During step (b), silicon precursor 502 reacts with surface 504 to form adsorbed species 510, which can include a ligand 508, wherein another ligand 508 is liberated. During step (c), a portion of adsorbed species 510 is removed. Then, during step (d), a reactant reacts with the adsorbed species to form material 512. Steps (a) and (b) can correspond to step 104, step (c) can correspond to step 108, and step (d) can correspond to step 110 of method 100. Although described in connection with a silicon precursor, the method illustrated in FIG. 5 can be similarly practiced with other precursors, such as those noted herein.

Use of methods 100 and 500 has several advantages over conventional PE-ALD processing, including:

High conformality and high gap-fill properties: Because the precursor can be etched mainly at the top of the features/pattern by a plasma, a thickness of the material at the top is effectively reduced, which results in high conformality, which can be useful for gap-fill process in which void-free/seamless fill between features is desired.

No impurity element: Inert gas, such as argon, helium, neon, krypton, and xenon, can be used for the removal of adsorbed species step; therefore, resulting in no or substantially no chemical reaction between impurity elements (from the plasma) and deposited material.

Low plasma damage/low oxidation of under-layer: Deposition with high power plasma or high oxidation condition is not needed, which are conventionally used for improving conformality of PE-ALD films on high aspect ratio patterns. Rather, plasma conditions are set to preferentially remove material at the top of the features.

Fast run-rate: This process can use only one removal step in addition to the usual PE-ALD steps. The removal step can add only several seconds to the deposition method.

Figure 6:
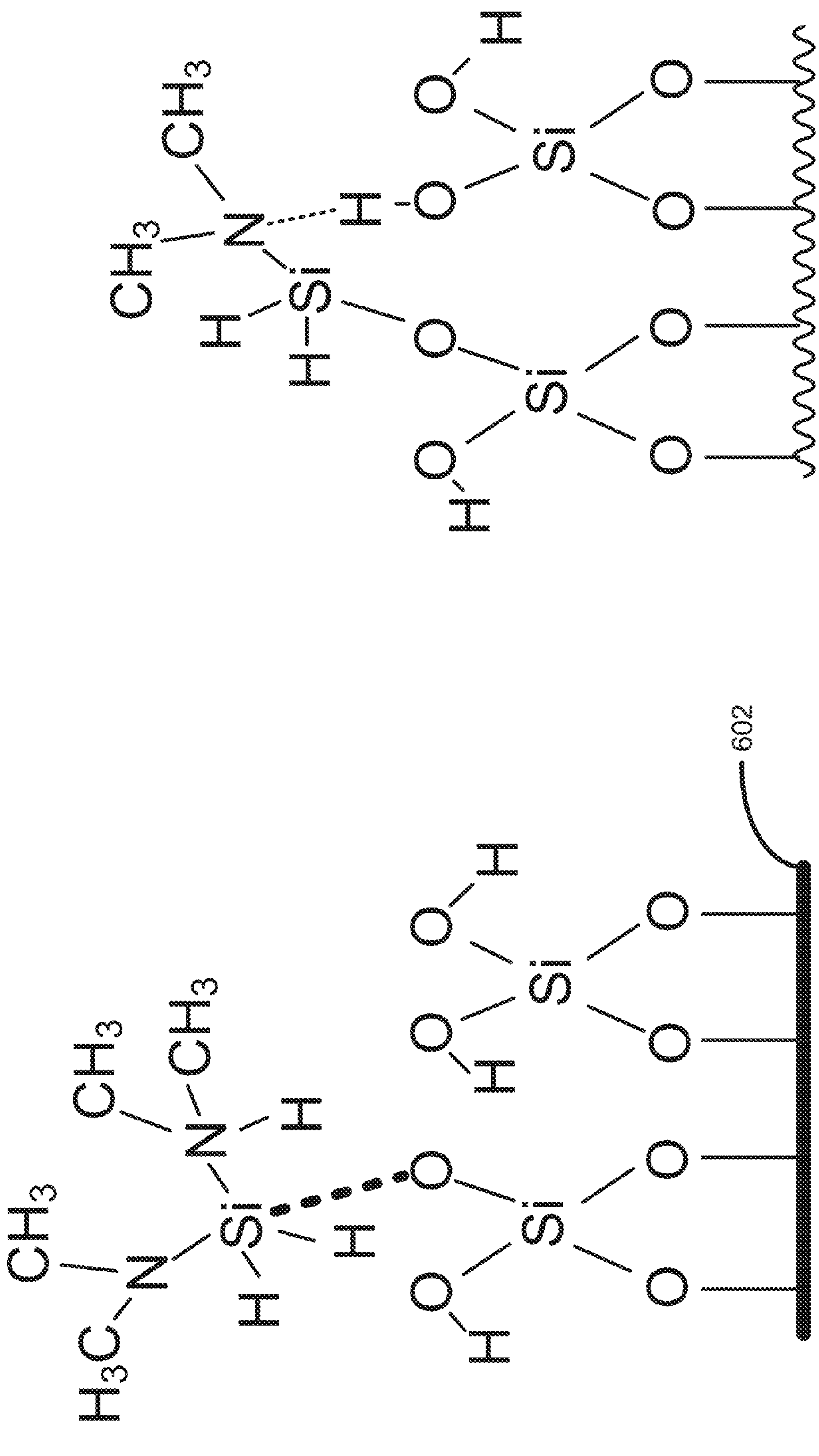
FIG. 6 illustrates adsorption states of a precursor in accordance with at least one embodiment of the disclosure.

FIG. 6 illustrates adsorption states of a particular precursor, bis(dimethylamino) silane, as an example. The precursor can react with —OH ligands at the surface of a substrate 602: (a) is the initial stage of precursor adsorption, and (b) is the chemical adsorption state which is after several meta-stable states are undergone. The bonding energy of the chemical adsorption state, (b), is about 2 eV, which is higher than the mean kinetic energy of Ar ion, ~1 eV, of Ar plasma etching. Therefore, dissociation of the precursor from (b) is not likely to occur. On the other hand, bonding energy of (a) and also of meta-stable states is less than 1 eV, therefore, dissociation of the precursor can occur by plasma sputtering (e.g., argon). Removal, such as by sputtering, as described herein can remove weakly adsorbed precursor from a substrate, and may not remove strongly bonded chemically adsorbed precursor. Therefore, it may be desirable to remove a portion of the adsorbed species that are in the state illustrated in (a).

Figure 7:
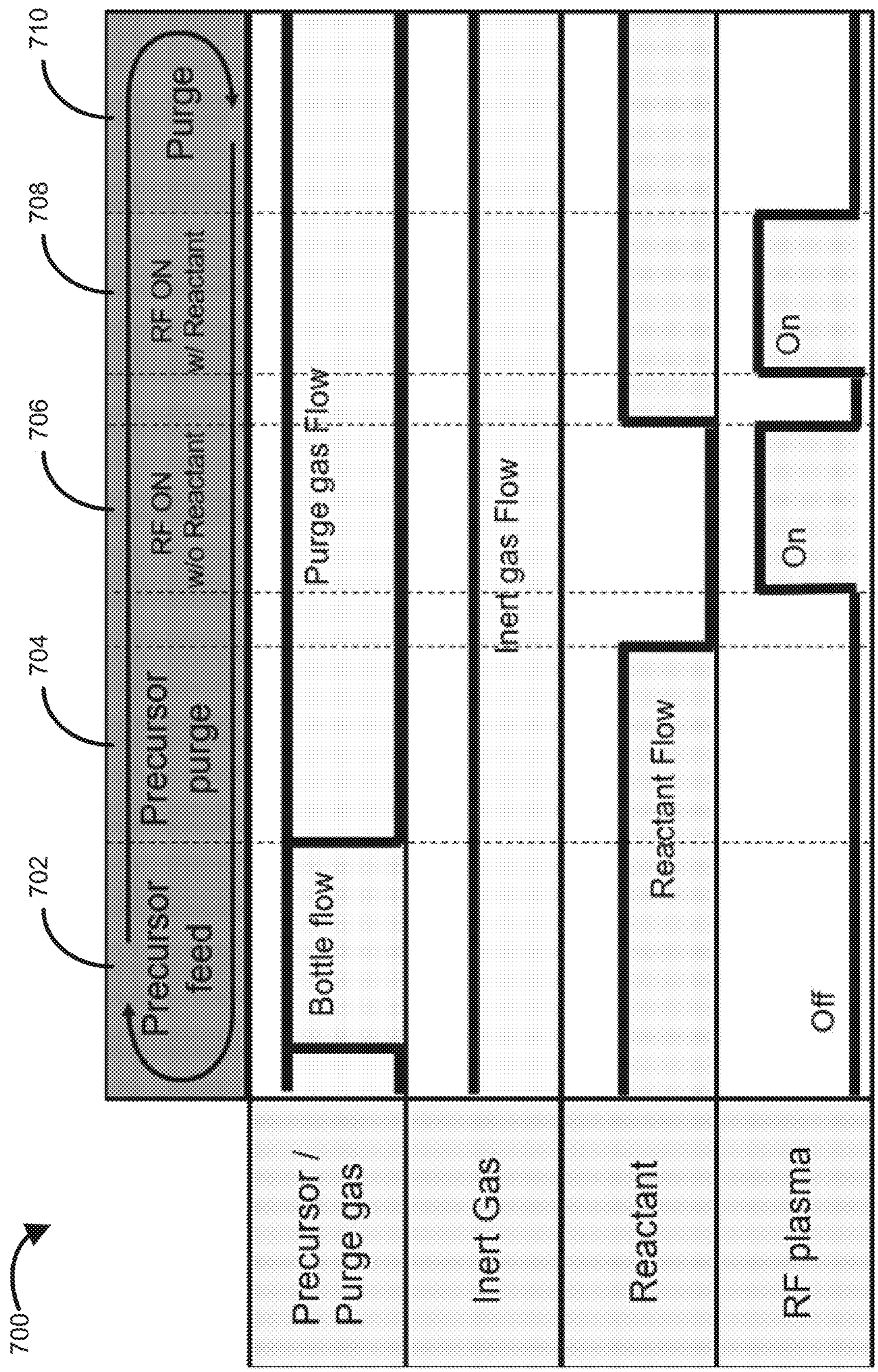
FIG. 7 illustrates a timing sequence for deposition of material in accordance with exemplary embodiments of the disclosure.

FIG. 7 illustrates a timing sequence 700 for deposition of material in accordance with exemplary embodiments of the disclosure. The illustrated timing sequence 700 includes a precursor pulse step 702, a precursor purge step 704, an RF on (without a reactant flowing) step 706, an RF on (with reactant flowing) step 708, and a purge step 710.

Step 702 can be the same or similar to step 104. During step 702, an inert gas and optionally a reactant gas can flow. The precursor can be pulsed after the inert gas and/or reactant flow has started. At step 704, the precursor flow has ceased, and the reactant and/or inert gas continues to flow to facilitate purging of the reaction chamber. At step 706, a plasma is initiated, and the reactant gas does not flow. This allows removal of a portion of adsorbed species that form during step 702. Then, during step 708, the reactant flow is on, and activated reactant species are formed to react with residual species that remain after step 706 to form the material. Another purge step 710 with inert and/or reactant gas can be performed after step 708. Steps 702, 704, 706, 708, and 710 can be the same as steps 104, 106, 108, 110, and 112 described above. Further, steps 702-710 can be repeated as desired.

Figure 8:
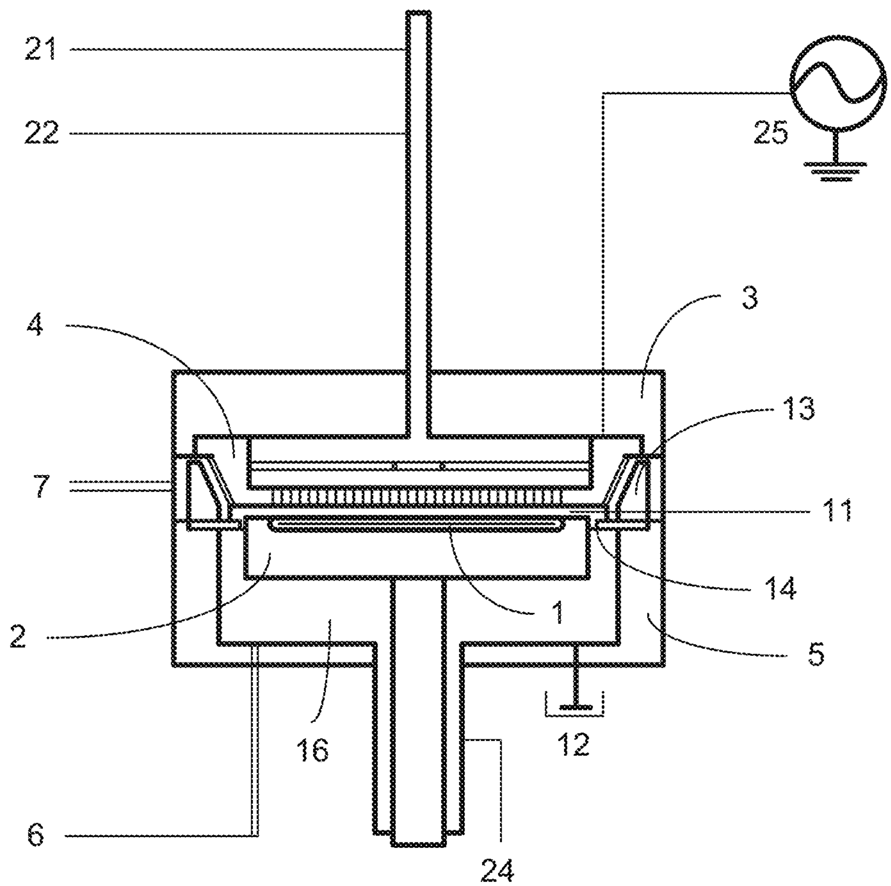
FIG. 8 illustrates a schematic view of a PE-ALD apparatus in accordance with exemplary embodiments of the disclosure.

The methods described herein can be performed using any suitable apparatus including an apparatus illustrated in FIG. 8, for example. FIG. 8 is a schematic view of a PE-ALD apparatus, desirably in conjunction with controls programmed to conduct the sequences described herein, usable in at least some embodiments of the present invention. In the example illustrated in FIG. 8, by providing a pair of electrically conductive flat-plate electrodes 4, 2 in parallel and facing each other in the interior 11 (reaction zone) of a reaction chamber 3, applying RF power (e.g., 13.56 MHz or 27 MHz) from a power source 25 to one side, and electrically grounding the other side 12, a plasma is excited between the electrodes. A temperature regulator is provided in a lower stage 2 (the lower electrode), and a temperature of a substrate 1 placed thereon is kept constant at a given temperature. The upper electrode 4 can serve as a shower plate as well, and reactant gas and/or dilution gas, if any, and precursor gas can be introduced into the reaction chamber 3 through a gas line 21 and a gas line 22, respectively, and through the shower plate 4. Additionally, in the reaction chamber 3, a circular duct 13 with an exhaust line 7 is provided, through which gas in the interior 11 of the reaction chamber 3 is exhausted. Additionally, a transfer chamber 5 disposed below the reaction chamber 3 is provided with a seal gas line 24 to introduce seal gas into the interior 11 of the reaction chamber 3 via the interior 16 (transfer zone) of the transfer chamber 5 wherein a separation plate 14 for separating the reaction zone and the transfer zone is provided (a gate valve through which a wafer is transferred into or from the transfer chamber 5 is omitted from this figure). The transfer chamber is also provided with an exhaust line 6.

Figure 9:
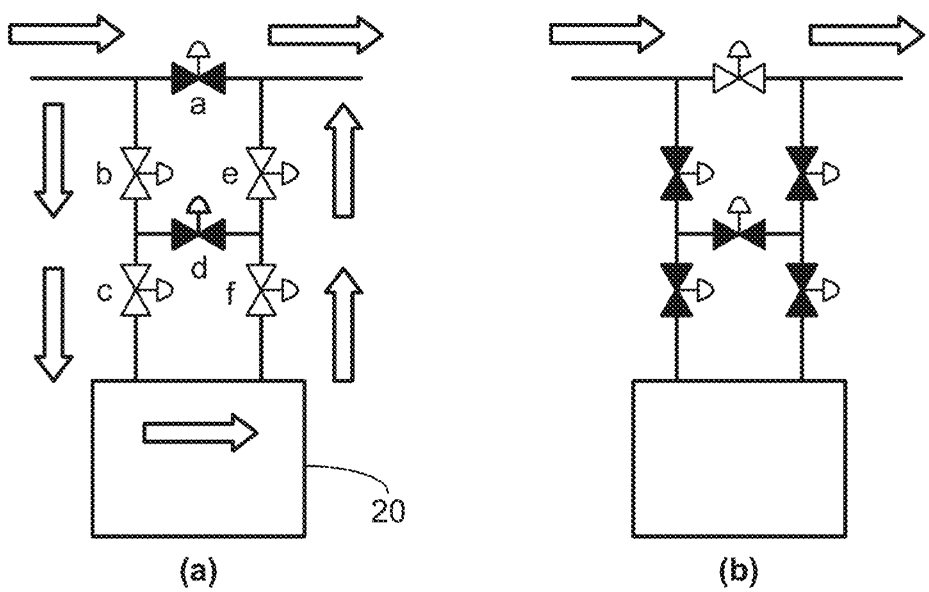
FIG. 9 illustrates a precursor supply system using a flow-pass system (FPS) according to an embodiment of the present disclosure.

In some embodiments, in the apparatus depicted in FIG. 8, the system of switching flow of an inactive gas and flow of a precursor gas illustrated in FIG. 9 can be used to introduce the precursor gas in pulses without substantially fluctuating pressure of the reaction chamber. The continuous flow of the carrier gas can be accomplished using a flow-pass system (FPS) wherein a carrier gas line is provided with a detour line having a precursor reservoir (bottle), and the main line and the detour line are switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the carrier gas can continuously flow into the reaction chamber and can carry the precursor gas in pulses by switching the main line and the detour line. FIG. 9 illustrates a precursor supply system using a flow-pass system (FPS) according to an embodiment of the present disclosure (black valves indicate that the valves are closed). As shown in (a) in FIG. 9, when feeding a precursor to a reaction chamber (not shown), first, a carrier gas such as Ar (or He or the like) flows through a gas line with valves b and c, and then enters a bottle (reservoir) 20. The carrier gas flows out from the bottle 20 while carrying a precursor gas in an amount corresponding to a vapor pressure inside the bottle 20 and flows through a gas line with valves f and e and is then fed to the reaction chamber together with the precursor. In the above, valves a and d are closed. When feeding only the carrier gas (noble gas) to the reaction chamber, as shown in (b) in FIG. 9, the carrier gas flows through the gas line with the valve a while bypassing the bottle 20.

The example embodiments of the disclosure described above do not limit the scope of the invention, since these embodiments are merely examples of the embodiments of the invention. For example, although illustrated using sputtering, other techniques can be used to remove adsorbed species. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

I claim:

1. A method of depositing material onto a surface of a substrate, the method comprising the steps of:
- providing a substrate within a reaction chamber;
- providing a flow of a reactant gas comprising a reactant within the reaction chamber;
- during the step of providing the flow of the reactant gas, exposing a surface of the substrate to a precursor, wherein the precursor reacts with species on the surface to form adsorbed species;
- stopping the flow of the reactant gas to the reaction chamber;
- removing a portion of the adsorbed species, leaving residual species on the surface;
- resuming the flow of the reactant gas to the reaction chamber; and
- forming a plasma within the reaction chamber,
- wherein the reactant reacts with the residual species to form the material.

2. The method of claim 1, wherein the step of removing comprises sputtering.

3. The method of claim 2, wherein the sputtering comprises using an activated species formed from an inert gas.

4. The method of claim 3, wherein the inert gas is selected from one or more gases of the group consisting of argon, helium, neon, krypton, and xenon.

5. The method of claim 1, wherein during the step of removing, a plasma is formed.

6. The method of claim 5, wherein the plasma is formed using a direct plasma system.

7. The method of claim 5, wherein the plasma is formed using a remote plasma system.

8. The method of claim 1, wherein the plasma is formed during at least a portion of the step of resuming the flow of the reactant gas to the reaction chamber.

9. The method of claim 1, wherein the precursor and the reactant gas are provided to the reaction chamber during at least a portion of a precursor pulse interval.

10. The method of claim 1, wherein a purge gas is continuously provided to the reaction chamber during the steps of exposing the surface of the substrate to a precursor, removing a portion of the adsorbed species, and providing the reactant gas to the reaction chamber.

11. The method of claim 1, further comprising a step of purging the precursor from the reaction chamber, wherein the step of purging comprises providing an inert gas and the reactant gas to the reaction chamber.

12. The method of claim 1, wherein the precursor has a general formula of MpCqNrOsBtXuHv, wherein p, q, r, s, t, u, v are integers including zero, M comprises B, Si, Ti, or Zr, and X comprises F, Cl, Br, or I.

13. The method of claim 1, wherein the reactant is selected from one or more of the group consisting of $O_2$, $O_3$, $CO_2$, $N_2O$, $N_2$, $NH_3$, $H_2$, $CH_4$, and other hydrocarbons.

14. A deposition apparatus configured to perform the method of claim 1.

15. A method of depositing material onto a surface of a substrate, the method comprising the steps of:
- providing a substrate within a reaction chamber;
- providing a flow of a reactant gas within the reaction chamber;
- during the step of providing the flow of the reactant gas, providing a precursor to the reaction chamber for a precursor pulse interval to form adsorbed species on a surface of the substrate;
- purging the reaction chamber;
- stopping the flow of the reactant gas to the reaction chamber;
- removing a portion of the adsorbed species and leaving residual species on the surface;
- resuming the flow of the reactant gas for forming activated reactant species to the reaction chamber; and
- forming a plasma within the reaction chambers, wherein the activated reactant species react with the residual species to form the material.

16. The method of claim 15, wherein the step of removing a portion of the adsorbed species comprises sputtering.

17. The method of claim 16, wherein a power applied to generate a plasma during the step of sputtering is between about 50 W and about 2000 W.

18. The method of claim 16, wherein the sputtering comprises using an activated species formed from an inert gas.

19. The method of claim 18, wherein the inert gas is selected from one or more gases of the group consisting of argon, helium, neon, krypton, and xenon.

20. The method of claim 15, wherein a temperature within the reaction chamber during the step of removing a portion of the adsorbed species is between about −30° C. and about 650° C.

* * * * *